United States Patent
Rhodes et al.

(10) Patent No.: US 6,232,417 B1
(45) Date of Patent: May 15, 2001

(54) PHOTORESIST COMPOSITIONS COMPRISING POLYCYCLIC POLYMERS WITH ACID LABILE PENDANT GROUPS

(75) Inventors: Larry F Rhodes, Silverlake; Andrew Bell, Lakewood; Saikumar Jayaraman, Cuyahoga Falls; John-Henry Lipian, Broadview Heights; Brian L. Goodall, Akron; Robert A. Shick, Strongsville, all of OH (US)

(73) Assignee: The B. F. Goodrich Company, Brecksville, OH (US)

( * ) Notice: Subject to any disclaimer, the term of this patent is extended or adjusted under 35 U.S.C. 154(b) by 0 days.

(21) Appl. No.: 08/928,573

(22) Filed: Sep. 12, 1997

(51) Int. Cl.$^7$ ......................................................... C08F 4/80
(52) U.S. Cl. ......................... 526/171; 526/283; 526/308; 526/309
(58) Field of Search .................................... 526/283, 171, 526/308, 309

(56) References Cited

U.S. PATENT DOCUMENTS

| | | |
|---|---|---|
| 4,491,628 | 1/1985 | Ito et al. . |
| 5,155,188 | 10/1992 | Goodall et al. . |
| 5,372,912 | 12/1994 | Allen et al. . |
| 5,399,647 | 3/1995 | Nozaki . |
| 5,468,819 | 11/1995 | Goodall et al. . |
| 5,585,219 | 12/1996 | Kaimoto et al. . |
| 5,585,222 | 12/1996 | Kaimoto et al. . |
| 5,705,503 | 1/1998 | Goodall et al. . |
| 5,843,624 | 12/1998 | Houlihan et al. . |

FOREIGN PATENT DOCUMENTS

| | | |
|---|---|---|
| 0789278 | 8/1997 | (EP) . |
| 0836119 | 4/1998 | (EP) . |
| 5297591 | 11/1993 | (JP) . |
| 9230595 | 9/1997 | (JP) . |

OTHER PUBLICATIONS

J. V. Crivello et al., Chemically Amplified Electron–Beam Photoresists, Chem. Mater., 1996, 8, 376–381.

Louis A. Cappino et al., Novel Carboxylic Acid and Carboxamide Protective Groups Based on the Exceptional Stabilization of the Cyclopropylmethyl Cation, J. Org. Chem. 1995, 60, 7718–7719.

Patent Abstracts of Japan, vol. 018, No. 096 (P–1694), Feb. 16, 1994.

Robert G. Gastinger et al., π–Arene Complexes of Nickel (II). Synthesis (from Metal Atoms) of (π–Arene)bis(pentafluorophenyl)nickel(II). Properties, π–Arene Lability, and Chemistry, J. Am. Chem. Soc., 1980, 102, 4959–4966.

Primary Examiner—Donald R. Wilson
Assistant Examiner—Caixia Lu
(74) Attorney, Agent, or Firm—Thoburn T. Dunlap

(57) ABSTRACT

The present invention relates to a radiation sensitive photoresist composition comprising a photoacid initiator and a polycyclic polymer comprising repeating units that contain pendant acid labile groups. Upon exposure to an imaging radiation source the photoacid initiator generates an acid which cleaves the pendant acid labile groups effecting a polarity change in the polymer. The polymer is rendered soluble in an aqueous base in the areas exposed to the imaging source. The polymer repeating units are polymerized from polycyclic monomers in the presence of single or multicomponent catalyst systems containing a Group VIII metal

13 Claims, 3 Drawing Sheets

PHOTORESIST COMPOSITIONS COMPRISING POLYCYCLIC POLYMERS WITH ACID LABILE PENDANT GROUPS

BACKGROUND OF THE INVENTION

1. Technical Field

The present invention is related to polycyclic polymers and methods for their use as photoresists in the manufacture of integrated circuits. More specifically, the invention is directed to photoresist compositions comprising a polycyclic polymer and a cationic photoinitiator. The polycyclic polymer contains recurring acid labile groups that are pendant from the polymer backbone. The acid labile groups can be selectively cleaved to form recurring polar groups along the backbone of the polymer. The polymers are transparent to short wave lengths of imaging radiation and exhibit resistance to reactive ion etching.

2. Background

Integrated circuits (IC's) are paramount in the manufacture of an array of electronic devices. They are fabricated from the sequential formation of alternating and interconnecting bands of conductive, semiconductive and nonconductive layers on an appropriate substrate (e.g., silicon wafer) that are selectively patterned to form circuits and interconnections to produce specific electrical functions. The patterning of IC's is carried out according to various lithography techniques known in the art. Photolithography employing ultraviolet (UV) light and increasingly deep UV light or other radiation is a fundamental and important technology utilized in the production of IC devices. A photosensitive polymer film (photoresist) is applied over the wafer surface and dried. A photomask containing the desired patterning information is then placed in close proximity to the photoresist film. The photoresist is irradiated through the overlying photomask by one of several types of imaging radiation including UV light, e-beam electrons, x-rays, or ion beam. Upon exposure to radiation, the photoresist undergoes a chemical change with concomitant changes in solubility. After irradiation, the wafer is soaked in a solution that develops (i.e., selectively removes either the exposed or unexposed regions) the patterned images in the photosensitive polymer film. Depending on the type of polymer used, or the polarity of the developing solvent, either the exposed or nonexposed areas of film are removed in the developing process to expose the underlying substrate, after which the patterned exposed or unwanted substrate material is removed or changed by an etching process leaving the desired pattern in a functional layer of the wafer. Etching is accomplished by plasma etching, sputter etching, and reactive ion etching (RIE). The remaining photoresist material functions as a protective barrier against the etching process. Removal of the remaining photoresist material gives the patterned circuit.

In the manufacture of patterned IC devices, the processes of etching different layers on the wafer are among the most crucial steps involved. One method is to immerse the substrate and patterned resist in a chemical bath which attacks the exposed substrate surfaces while leaving the resist itself intact. This "wet" chemical process suffers from the difficulty of achieving well defined edges on the etched surfaces. This is due to chemical undercutting of the resist material and the formation of an isotropic image. In other words, conventional chemical processes do not provide the selectivity of direction (anisotropy) considered necessary to achieve optimum dimensional specifications consistent with current processing requirements. In addition, the wet processes suffer because of the undesirable environmental and safety ramifications.

Various "dry" processes have been developed to overcome the drawbacks of the wet chemical process. Such dry processes generally involve passing a gas through a chamber and ionizing the gas by applying a potential across two electrodes in the presence of the gas. The plasma containing the ionic species generated by the potential is used to etch a substrate placed in the chamber. The ionic species generated in the plasma are directed to the exposed substrate where they interact with the surface material forming volatile products that are removed from the surface. Typical examples of dry etching are plasma etching, sputter etching and reactive ion etching.

Reactive ion etching provides well defined vertical sidewall profiles in the substrate as well as substrate to substrate etching uniformity. Because of these advantages, the reactive ion etching technique has become the standard in IC manufacture.

Two types of photoresists are used in the industry, negative and positive photoresists. Negative resists, upon exposure to imaging radiation, polymerize, crosslink, or change solubility characteristics such that the exposed regions are insoluble to the developer. Unexposed areas remain soluble and are washed away. Positive resists function in the opposite way, becoming soluble in the developer solution after exposure to imaging radiation.

One type of positive photoresist material is based upon phenol-formaldehyde novolac polymers. A particular example is the commercially utilized Shipley AZ1350 material which comprises an m-cresol formaldehyde novolak polymer composition and a diazoketone (2-diazo-1-napthol-5-sulphonic acid ester). When exposed to imaging radiation, the diazoketone is converted to a carboxylic acid, which in turn converts the phenolic polymer to one that is readily soluble in weak aqueous base developing agent.

U.S. Pat. No. 4,491,628 to Ito et al. discloses positive and negative photoresist compositions with acid generating photoinitiators and polymers with acid labile pendant groups. Because each acid generated causes deprotection of multiple acid labile groups this approach is known as chemical amplification which serves to increase the quantum yield of the overall photochemical process. The disclosed polymers include vinylic polymers such as polystyrenes, polyvinylbenzoates, and polyacrylates that are substituted with recurrent pendant groups that undergo acidolysis to produce products that differ in solubility than their precursors. The preferred acid labile pendant groups include t-butyl esters of carboxylic acids and t-butyl carbonates of phenols. The photoresist can be made positive or negative depending on the nature of the developing solution employed.

Trends in the electronics industry continually require IC's that are faster and consume less power. To meet this specification the IC must be made smaller. Conducting pathways (i.e., lines) must be made thinner and placed closer together. The significant reduction in the size of the transistors and the lines produced yields a concomitant increase in the efficiency of the IC, e.g., greater storage and processing of information on a computer chip. To achieve thinner line widths, higher photoimaging resolution is necessary. Higher resolutions are possible with shorter wave lengths of the exposure source employed to irradiate the photoresist material. However, the prior art photoresists such as the phenol-formaldehyde novolac polymers and the substituted styrenic polymers contain aromatic groups that inherently become increasingly absorptive as the wave length of light falls below about 300 nm, (ACS Symposium Series 537, *Polymers for Microelectronics, Resists and Dielectrics*, 203rd National Meeting of the American Chemical Society, Apr. 5–10, 1992, p.2–24; *Polymers for Electronic and Photonic Applications*, Edited by C. P. Wong, Academic Press, p. 67–118). Shorter wave length sources are typically less bright than traditional sources which necessitate a chemical amplification approach using photoacids. The opacity of these aromatic polymers to short wave length light is a drawback in that the photoacids below the polymer surface are not uniformly exposed to the light source and, consequently, the polymer is not developable. To overcome the transparency deficiencies of these polymers, the aromatic content of photoresist polymers must be reduced. If deep UV transparency is desired (i.e., for 248 nm and particularly 193 nm wave length exposure), the polymer should contain a minimum of aromatic character.

U.S. Pat. No. 5,372,912 concerns a photoresist composition containing an acrylate based copolymer, a phenolic type binder, and a photosensitive acid generator. The acrylate based copolymer is polymerized from acrylic acid, alkyl acrylate or methacrylate, and a monomer having an acid labile pendant group. While this composition is sufficiently transparent to UV radiation at a wave length of about 240 nm, the use of aromatic type binders limits the use of shorter wave length radiation sources. As is common in the polymer art, the enhancement of one property is usually accomplished at the expense of another. When employing acrylate based polymers, the gain in transparency to shorter wave length UV is achieved at the expense of sacrificing the resist's resistance to the reactive ion etch process.

In many instances, the improvement in transparency to short wave length imaging radiation results in the erosion of the resist material during the subsequent dry etching process. Because photoresist materials are generally organic in nature and substrates utilized in the manufacture of IC's are typically inorganic, the photoresist material has an inherently higher etch rate than the substrate material when employing the RIE technique. This necessitates the need for the photoresist material to be much thicker than the underlying substrate. Otherwise, the photoresist material will erode away before the underlying substrate could be fully etched. It follows that lower etch rate resist materials can be employed in thinner layers over the substrate to be etched. Thinner layers of resist material allow for higher resolution which, ultimately, allows for narrower conductive lines and smaller transistors.

J. V. Crivello et al. (Chemically Amplified Electron-Beam Photoresists, *Chem. Mater.*, 1996, 8, 376–381) describe a polymer blend comprising 20 weight % of a free radically polymerized homopolymer of a norbornene monomer bearing acid labile groups and 80 weight % of a homopolymer of 4-hydroxy-α-methylstyrene containing acid labile groups for use in electron-beam photoresists. As discussed supra, the increased absorbity (especially in high concentrations) of aromatic groups renders these compositions opaque and unusable for short wave length imaging radiation below 200 nm.

The disclosed compositions are suitable only for electron-beam photoresists and can not be utilized for deep UV imaging (particularly not for 193 nm resists).

Crivello et al. investigated blend compositions because they observed the oxygen plasma etch rate to be unacceptably high for free radically polymerized homopolymers of norbornene monomers bearing acid labile groups.

Accordingly, there is a need for a photoresist composition which is compatible with the general chemical amplification scheme and provides transparency to short wave length imaging radiation while being sufficiently resistant to a reactive ion etching processing environment.

SUMMARY OF THE INVENTION

It is a general object of the invention to provide a photoresist composition comprising a polycyclic polymer backbone having pendant acid labile groups and a photoinitiator.

It is another object of the invention to provide polycyclic polymers that have recurrent pendant acid labile groups that can be cleaved to form polar groups.

It is still another object of the invention to provide polymer compositions that are transparent to short wave length imaging radiation.

It is a further object of the invention to provide polymer compositions that are resistant to dry etching processes.

It is a still further object of the invention to provide polymer compositions that are transparent to short wave length imaging radiation and are resistant to dry etching processes.

It is yet another object of the invention to provide polycyclic monomers that contain acid labile pendant groups that can be polymerized to form polymers amenable to aqueous base development.

These and other objects of the invention are accomplished by polymerizing a reaction mixture comprising an acid labile group functionalized polycycloolefinic monomer, a solvent, a single or multicomponent catalyst system each containing a Group VIII metal ion source. In the multicomponent catalyst systems of the invention the Group VIII ion source is utilized in combination with one or both of an organometal cocatalyst and a third component. The single and multicomponent catalyst systems can be utilized with an optional chain transfer agent (CTA) selected from a compound having a terminal olefinic double bond between adjacent carbon atoms, wherein at least one of said adjacent carbon atoms has two hydrogen atoms attached thereto. The CTA is selected from unsaturated compounds that are typically cationically non-polymerizable and, therefore, exclude styrenes, vinyl ethers, and conjugated dienes.

The polymers obtained are useful in photoresist compositions that include a radiation-sensitive acid generator.

DETAILED DESCRIPTION

Figure 1:
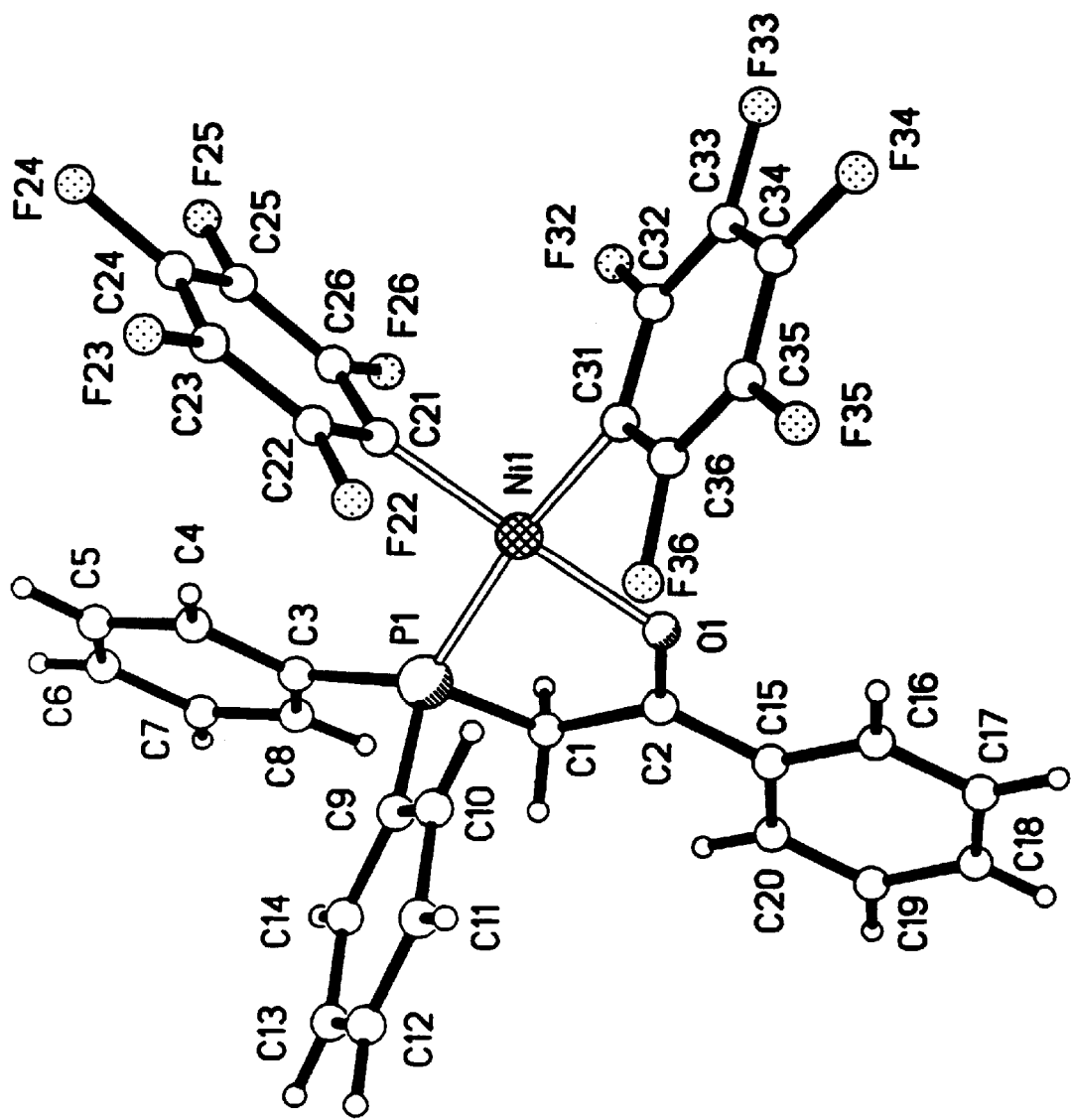
FIG. 1 is a ball and stick molecular representation of the catalyst $(PPh_2CH_2C(O)Ph)Ni(C_6F_5)_2$.

The present invention relates to a radiation-sensitive resist composition comprising an acid-generating initiator and a polycyclic polymer containing recurring acid labile pendant groups along the polymer backbone. The polymer containing the initiator is coated as a thin film on a substrate, baked under controlled conditions, exposed to radiation in a patterned configuration, and optionally post baked under controlled conditions to further promote the deprotection. In the portions of the film that have been exposed to radiation, the recurrent acid labile pendant groups on the polymer backbone are cleaved to form polar recurring groups. The exposed areas so treated are selectively removed with an alkaline developer. Alternatively, the unexposed regions of the polymer remain nonpolar and can be selectively removed by treatment with a suitable nonpolar solvent for a negative tone development. Image reversal can easily be achieved by proper choice of developer owing to the difference in the solubility characteristics of the exposed and unexposed portions of the polymer.

The polymers of the present invention comprise polycyclic repeating units, a portion of which are substituted with acid labile groups. The instant polymers are prepared by polymerizing the polycyclic monomers of this invention. By the term "polycyclic" (norbornene-type or norbornene-functional) is meant that the monomer contains at least one norbornene moiety as shown below:

The simplest polycyclic monomer of the invention is the bicyclic monomer, bicyclo[2.2.1]hept-2-ene, commonly referred to as norbornene. In one embodiment of the invention, the acid labile functionality is introduced into the polymer chain by polymerizing a reaction medium comprising one or more acid labile substituted polycyclic monomers set forth under Formula I below in optional combination with one or more polycyclic monomers set forth under Formulae II, III, IV, and V below in the presence of the Group VIII metal catalyst system.

In another embodiment of the invention one or more of the acid labile substituted polycyclic monomers of Formula I are copolymerized with one or more of the polycyclic monomers set forth under Formula II.

Monomers

The acid labile polycyclic monomers useful in the practice of the present invention are selected from a monomer represented by the formula below:

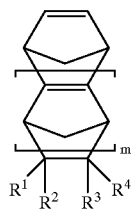

I wherein $R^1$ to $R^4$ independently represent a substituent selected from the group —$(A)_n$C(O)OR*, —$(A)_n$—C(O)OR, —$(A)_n$—OR, —$(A)_n$—OC(O)R, —$(A)_n$—C(O)R, —$(A)_n$—OC(O)OR, —$(A)_n$—OCH$_2$C(O)OR*, —$(A)_n$—C(O)O—A'—OCH$_2$C(O)OR*, —$(A)_n$—OC(O)—A'—C(O)OR*, —$(A)_n$—C(R)$_2$CH(R)(C(O)OR), and —$(A)_n$—C(R)$_2$CH(C(O)OR)$_2$ subject to the proviso that at least one of $R^1$ to $R^4$ is selected from the acid labile group —$(A)_n$C(O)OR*. A and A' independently represent a divalent bridging or spacer radical selected from divalent hydrocarbon radicals, divalent cyclic hydrocarbon radicals, divalent oxygen containing radicals, and divalent cyclic ethers and cyclic diethers, and n is an integer of 0 or 1. When n is 0 it should be apparent that A and A' represent a single covalent bond. By divalent is meant that a free valence at each terminal end of the radical are attached to two distinct groups. The divalent hydrocarbon radicals can be represented by the formula —$(C_dH_{2d})$— where d represents the number of carbon atoms in the alkylene chain and is an integer from 1 to 10. The divalent hydrocarbon radicals are preferably selected from linear and branched ($C_1$ to $C_{10}$) alkylene such as methylene, ethylene, propylene, butylene, pentylene, hexylene, heptylene, octylene, nonylene, and decylene. When branched alkylene radicals are contemplated, it is to be understood that a hydrogen atom in the linear alkylene chain is replaced with a linear or branched ($C_1$ to $C_5$) alkyl group.

The divalent cyclic hydrocarbon radicals include substituted and unsubstituted ($C_3$ to $C_8$) cycloaliphatic moieties represented by the formula:

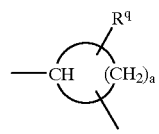

wherein a is an integer from 2 to 7 and $R^q$ when present represents linear and branched ($C_1$ to $C_{10}$) alkyl groups. Preferred divalent cycloalkylene radicals include cyclopentylene and cyclohexylene moieties represented by the following structures:

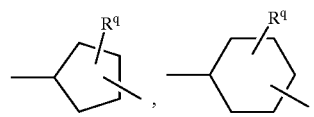

wherein $R^q$ is defined above. As illustrated here and throughout this specification, it is to be understood that the bond lines projecting from the cyclic structures and/or formulae represent the divalent nature of the moiety and indicate the points at which the carbocyclic atoms are bonded to the adjacent molecular moieties defined in the respective formulae. As is conventional in the art, the diagonal bond line projecting from the center of the cyclic structure indicates that the bond is optionally connected to any one of the carbocyclic atoms in the ring. It is also to be understood that the carbocyclic atom to which the bond line is connected will accommodate one less hydrogen atom to satisfy the valence requirement of carbon.

Preferred divalent cyclic ethers and diethers are represented by the structures:

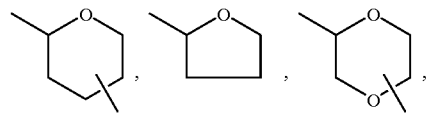

The divalent oxygen containing radicals include ($C_2$ to $C_{10}$) alkylene ethers and polyethers. By ($C_2$ to $C_{10}$) alkylene ether is meant that the total number of carbon atoms in the divalent ether moiety must at least be 2 and can not exceed 10. The divalent alkylene ethers are represented by the formula -alkylene-O-alkylene- wherein each of the alkylene groups that are bonded to the oxygen atom can be the same or different and are selected from methylene, ethylene, propylene, butylene, pentylene, hexylene, heptylene, octylene, and nonylene. The simplest divalent alkylene ether of the series is the radical —$CH_2$—O—$CH_2$—. Preferred polyether moieties include divalent radicals of the formula:

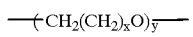

wherein x is an integer from 0 to 5 and y is an integer from 2 to 50 with the proviso that the terminal oxygen atom on the polyether spacer moiety can not be directly linked to a terminal oxygen atom on an adjacent group to form a peroxide linkage. In other words, peroxide linkages (i.e., —O—O—) are not contemplated when polyether spacers are linked to any of the terminal oxygen containing substituent groups set forth under $R^1$ to $R^4$ above.

In the above formulae R represents hydrogen, linear and branched ($C_1$ to $C_{10}$) alkyl, and m is an integer from 0 to 5. $R^*$ represents moieties (i.e., blocking or protecting groups) that are cleavable by photoacid initiators selected from —$C(CH_3)_3$, —$Si(CH_3)_3$, —$CH(R^P)OCH_2CH_3$, —$CH(R^P)OC(CH_3)_3$, or the following cyclic groups:

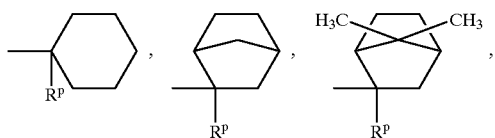

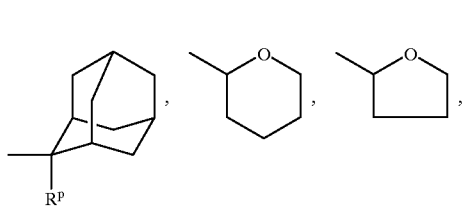

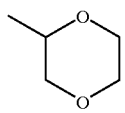

wherein $R^P$ represents hydrogen or a linear or branched ($C_1$ to $C_5$) alkyl group. The alkyl substituents include methyl, ethyl, propyl, i-propyl, butyl, i-butyl, t-butyl, pentyl, t-pentyl and neopentyl. In the above structures, the single bond line projecting from the cyclic groups indicates the carbon atom ring position where the protecting group is bonded to the respective substituent. Examples of acid labile groups include 1-methyl-1-cyclohexyl, isobornyl, 2-methyl-2-isobornyl, 2-methyl-2-adamantyl, tetrahydrofuranyl, tetrahydropyranoyl, 3-oxocyclohexanonyl, mevalonic lactonyl, 1-ethoxyethyl, 1-t-butoxy ethyl, dicyclopropylmethyl (Dcpm), and dimethylcyclopropylmethyl (Dmcp) groups. The alkyl substituents on the protecting groups set forth above are selected from linear and branched ($C_1$ to $C_5$) alkyl groups. $R^{**}$ independently represents R and $R^*$ as defined above. The Dcpm and Dmcp groups are respectively represented by the following structures:

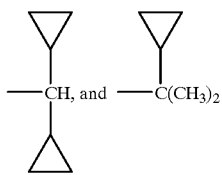

Polycyclic monomers of the above formula with a substituent selected from the group —$(CH_2)_nC(R)_2CH(R)(C(O)OR^{})$ or —$(CH_2)_nC(R)_2CH(C(O)OR^{})_2$ can be represented as follows:

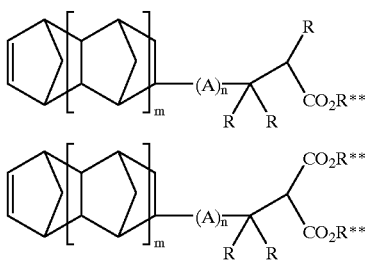

wherein m and —A— are defined above.

In the above formulae m is preferably 0 or 1, more preferably m is 0. When m is 0 the preferred structures are represented below:

Ia

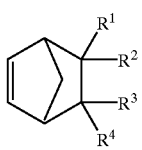

wherein $R^1$ to $R^4$ are previously defined.

It should be apparent to those skilled in the art that any photoacid cleavable moiety is suitable in the practice of the invention so long as the polymerization reaction is not substantially inhibited by same.

The preferred acid labile group is a protected organic ester group in which the protecting or blocking group undergoes a cleavage reaction in the presence of an acid. Tertiary butyl esters of carboxylic acids are especially preferred.

The monomers described under Formula I, when polymerized into the polymer backbone, provide recurring pendant acid sensitive groups that are subsequently cleaved to confer polarity or solubility to the polymer.

The optional second monomer is represented by the structure set forth under Formula II below:

II

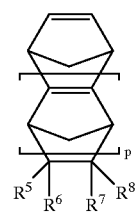

wherein $R^5$ to $R^8$ independently represent a neutral or polar substituent selected from the group: —$(A)_n$—C(O)OR'', —(A)$_n$—OR", —(A)$_n$—OC(O)R", —(A)$_n$—OC(O)OR", —(A)$_n$—C(O)R", —(A)$_n$—OC(O)C(O)OR", —(A)$_n$—O—A'—C(O)OR", —(A)$_n$—OC(O)—A'—C(O)OR", —(A)$_n$—C(O)O—A'—C(O)OR", —(A)$_n$—C(O)—A'—OR", —(A)$_n$—C(O)O—A'—OC(O)OR", —(A)$_n$—C(O)O—A'—O—A'—C(O)OR", —(A)$_n$—C(O)O—A'—OC(O)C(O)OR", —(A)$_n$—C(R")$_2$CH(R")(C(O)OR"), and —(A)$_n$—C(R")$_2$CH(C(O)OR")$_2$, or the succinic and carboxyimide moieties:

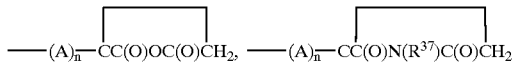

wherein $R^{37}$ is hydrogen, linear and branched ($C_1$ to $C_{10}$) alkyl, or ($C_6$ to $C_{15}$) aryl.

The moieties A and A' independently represent a divalent bridging or spacer radical selected from divalent hydrocarbon radicals, divalent cyclic hydrocarbon radicals, divalent oxygen containing radicals, and divalent cyclic ethers and cyclic diethers, and n is an integer 0 or 1. When n is 0 it should be apparent that A and A'represent a single covalent bond. By divalent is meant that a free valence at each terminal end of the radical are attached to two distinct groups. The divalent hydrocarbon radicals can be represented by the formula —$(C_dH_{2d})$— where d represents the number of carbon atoms in the alkylene chain and is an integer from 1 to 10. The divalent hydrocarbon radicals are preferably selected from linear and branched ($C_1$ to $C_{10}$) alkylene such as methylene, ethylene, propylene, butylene, pentylene, hexylene, heptylene, octylene, nonylene, and decylene. When branched alkylene radicals are contemplated, it is to be understood that a hydrogen atom in the linear alkylene chain is replaced with a linear or branched ($C_1$ to $C_5$) alkyl group.

The divalent cyclic hydrocarbon radicals include substituted and unsubstituted ($C_3$ to $C_8$) cycloaliphatic moieties represented by the formula:

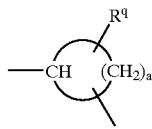

wherein a is an integer from 2 to 7 and $R^q$ when present represents linear and branched ($C_1$ to $C_{10}$) alkyl groups. Preferred divalent cycloalkylene radicals include cyclopentylene and cyclohexylene moieties represented by the following structures:

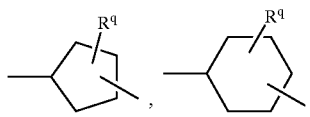

wherein $R^q$ is defined above. As illustrated here and throughout this specification, it is to be understood that the bond lines projecting from the cyclic structures and/or formulae represent the divalent nature of the moiety and indicate the points at which the carbocyclic atoms are bonded to the adjacent molecular moieties defined in the respective formulae. As is conventional in the art, the diagonal bond line projecting from the center of the cyclic structure indicates that the bond is optionally connected to any one of the carbocyclic atoms in the ring. It is also to be understood that the carbocyclic atom to which the bond line is connected will accommodate one less hydrogen atom to satisfy the valence requirement of carbon.

Preferred divalent cyclic ethers and diethers are represented by the structures:

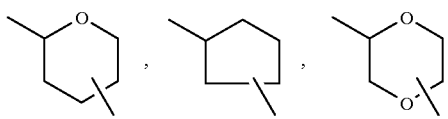

The divalent oxygen containing radicals include ($C_2$ to $C_{10}$) alkylene ethers and polyethers. By ($C_2$ to $C_{10}$) alkylene ether is meant that the total number of carbon atoms in the divalent ether moiety must at least be 2 and can not exceed 10. The divalent alkylene ethers are represented by the formula -alkylene-O-alkylene- wherein each of the alkylene groups that are bonded to the oxygen atom can be the same or different and are selected from methylene, ethylene, propylene, butylene, pentylene, hexylene, heptylene, octylene, and nonylene. The simplest divalent alkylene ether of the series is the radical —$CH_2$—O—$CH_2$—. Preferred polyether moieties include divalent radicals of the formula:

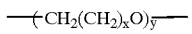

wherein x is an integer from 0 to 5 and y is an integer from 2 to 50 with the proviso that the terminal oxygen atom on the polyether spacer moiety can not be directly linked to a terminal oxygen atom on an adjacent group to form a peroxide linkage. In other words, peroxide linkages (i.e., —O—O—) are not contemplated when polyether spacers are linked to any of the terminal oxygen containing substituent groups set forth under $R^5$ to $R^8$ above.

$R^5$ to $R^8$ can also independently represent hydrogen, linear and branched ($C_1$ to $C_{10}$) alkyl, so long as at least one of the remaining $R^5$ to $R^8$ substituents is selected from one of the neutral or polar groups represented above. In the formula above p is an integer from 0 to 5 (preferably 0 or 1, more preferably 0). R" independently represents hydrogen, linear and branched ($C_1$ to $C_{10}$) alkyl, linear and branched ($C_1$ to $C_{10}$) alkoxyalkylene, polyethers, monocyclic and polycyclic ($C_4$ to $C_{20}$) cycloaliphatic moieties, cyclic ethers, cyclic ketones, and cyclic esters (lactones). By ($C_1$ to $C_{10}$) alkoxyalkylene is meant that a terminal alkyl group is linked through an ether oxygen atom to an alkylene moiety. The radical is a hydrocarbon based ether moiety that can be generically represented as -alkylene-O-alkyl wherein the alkylene and alkyl groups independently contain 1 to 10 carbon atoms each of which can be linear or branched. The polyether radical can be represented by the formula:

wherein x is an integer from 0 to 5, y is an integer from 2 to 50 and $R^a$ represents hydrogen or linear and branched ($C_1$ to $C_{10}$) alkyl. Preferred polyether radicals include poly (ethylene oxide) and poly(propylene oxide). Examples of monocyclic cycloaliphatic monocyclic moieties include cyclopropyl, cyclobutyl, cyclopentyl, cyclohexyl, and the like. Examples of cycloaliphatic polycyclic moieties include, norbornyl, adamantyl, tetrahydrodicyclopentadienyl(tricyclo[5.2.1.0$^{2,6}$]decanyl), and the like. Examples of cyclic ethers include tetrahydrofuranyl and tetrahydropyranyl moieties. An example of a cyclic ketone is a 3-oxocyclohexanonyl moiety. An example of a cyclic ester or lactone is a mevalonic lactonyl moiety.

Insofar as the substituents described for R" in Formula II overlap with the acid labile or protecting groups described under R* in Formula I, it should be understood that R" in Formula II can not represent an ester moiety containing an acid labile group. For example, when R" is a norbornyl, adamantyl, tetrahydrodicyclopentadienyl(tricyclo[5.2.1.0$^{2,6}$]decanyl), tetrahydrofuranyl tetrahydropyranyl, 3-oxocyclohexanonyl or a mevalonic lactonyl moiety, it can not be directly attached to the oxygen atom in a ester moiety (—C(O)O). When any of $R^5$ to $R^8$ represent a succinic or carboxyimide moiety and A is present (i.e., n is 1) A can only represent a linear or branched (C1 to C10) alkylene group.

Preferred neutral or polar substituents include the alkyl esters of carboxylic acids, the spaced oxalate containing moieties (e.g., —(A)$_n$—OC(O)—A'—C(O)OR"), and the oxalate containing moieties (e.g., —(A)$_n$—OC(O)C(O)OR") wherein the formulae are as defined above. The ester, spaced oxalate, and oxalate containing functionalities impart exceptional hydrophilicity, promote good wetting of the developer and improve film mechanical properties without the concomitant problems associated with excessive carboxylic acid functionalities.

$R^5$ and $R^8$ can be taken together with the ring carbon atoms to which they are attached to form an anhydride or dicarboxyimide group as shown in the structures below:

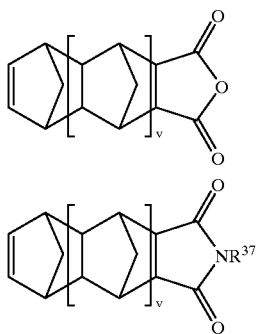

IIa wherein $R^{37}$ is hydrogen, ($C_1$ to $C_{10}$) alkyl, or ($C_6$ to $C_{15}$) aryl and V is an integer from 0 to 5.

The optional third monomer component is represented by the structure under Formula III below:

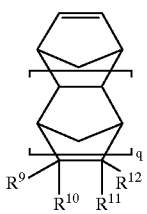

III wherein $R^9$ to $R^{12}$ independently represent a carboxylic or sulfonic acid substituent or salts thereof selected from the formulae —(CH$_2$)$_n$C(O)OH, —(CH$_2$)$_n$SO$_3$H, —(CH$_2$)$_n$C(O)O$^-$X$^+$, —(CH$_2$)$_n$SO$_3^-$X$^+$ where n X represents tetraalkylammonium cations and the alkyl substituents bonded to the nitrogen atom are independently selected from linear and branched ($C_1$ to $C_{10}$) alkyl, and q is an integer from 0 to 5 (preferably 0 or 1, more preferably 0) and n is an integer from 0 to 10 (preferably 0). $R^9$ to $R^{12}$ can independently represent hydrogen, linear and branched ($C_1$ to $C_{10}$) alkyl, so long as at least one of the remaining $R^9$ to $R^{12}$ substituents is selected from one of the acids or acid salts set forth above.

The monomers containing carboxylic acid functionality contribute to the hydrophilicity of the polymer consequently aiding in the developability of the polymer in aqueous base systems at high rates.

The optional monomers under Formula IV are represented by the structure below:

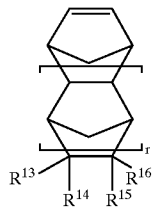

IV wherein $R^{13}$ to $R^{16}$ independently represent linear or branched ($C_1$ to $C_1$) alkyl and r is an integer from 0 to 5 (preferably 0 or 1, more preferably 0). Any of $R^{13}$ to $R^{16}$ can represent hydrogen so long as at least one of the remaining $R^{13}$ to $R^{16}$ substituents is selected from an alkyl group set defined above. Of the above alkyl substituents, decyl is especially preferred.

The polymerization of alkyl substituted monomers into the polymer backbone is a method to control the Tg of the polymer as disclosed in U.S. Pat. No. 5,468,819 to Goodall et al.

An economical route for the preparation of the functional or hydrocarbyl substituted polycyclic monomers of the invention relies on the Diels-Alder reaction in which cyclopentadiene (CPD) or substituted CPD is reacted with a suitably substituted dienophile at elevated temperatures to form a substituted polycyclic adduct generally shown by the following reaction scheme:

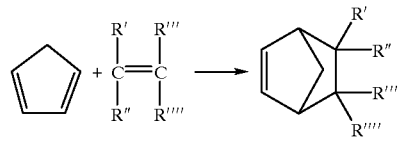

Other polycyclic adducts can be prepared by the thermal pyrolysis of dicyclopentadiene (DCPD) in the presence of a suitable dienophile. The reaction proceeds by the initial pyrolysis of DCPD to CPD followed by the Diels-Alder addition of CPD and the dienophile to give the adducts as shown below:

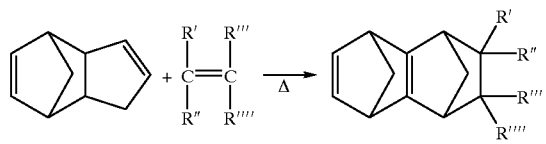

wherein R' to R"" independently represents the substituents defined under $R^1$ to $R^{16}$ in Formulae I, II, III, and IV above.

For example the 2-norbornene-5-carboxylic acid (bicyclo [2.2.1]hept-5-ene-2-carboxylylic acid) can be prepared by the Diels-Alder reaction of cyclopentadiene with acrylic acid in accordance with the following reaction scheme:

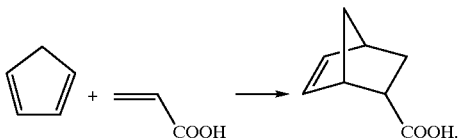

The corresponding t-butyl ester of the carboxylic acid can be prepared by reacting the carboxylic acid functionality with isobutylene in the presence of triflic acid at reduced temperatures (i.e., −30 to −20° C.) as shown in the reaction scheme below:

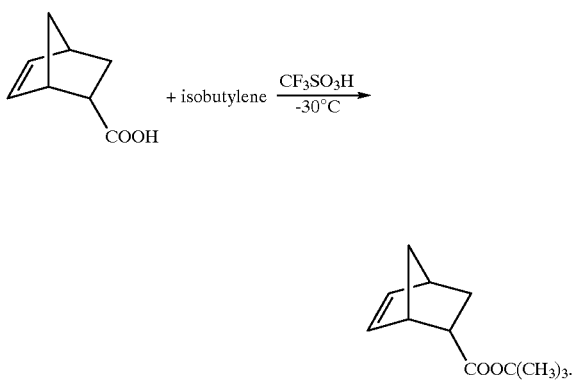

Another more preferred route to the t-butyl ester of the norbornene carboxylic acid involves the Diels-Alder reaction of cyclopentadiene with t-butyl acrylate.

Another synthesis route to the acid and ester substituted monomers of the present invention is through an ortho ester substituted polycyclic monomer with subsequent hydrolysis to a carboxylic functionality or partial hydrolysis to an ester functionality. The carboxylic functionality can be esterified to the desired ester. The ortho ester substituted monomers of the invention are represented by Formula V below:

V

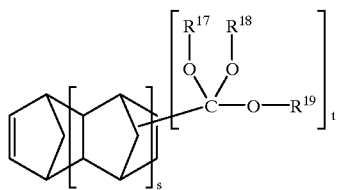

wherein $R^{17}$, $R^{18}$, and $R^{19}$ independently represent a linear or branched ($C_1$ to $C_5$) alkyl group or any $R^{17}$, $R^{18}$, and $R^{19}$ can be taken together along with the oxygen atoms to which they are attached to form a substituted or unsubstituted 5 to 10 membered cyclic or bicyclic ring containing 3 to 8 carbon atoms (excluding substituent groups), s is an integer from 0 to 5 (preferably 0), and t is an integer from 1 to 5 (preferably 1). Representative structures wherein s is 0, t is 1, and $R^{17}$, $R^{18}$, and $R^{19}$ are taken with the oxygen atoms to which they are attached to form a cyclic or bicyclic ring are set forth below:

Va

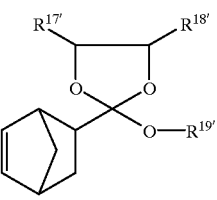

Vb

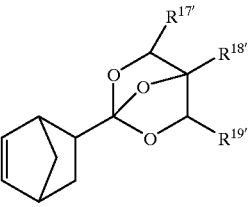

Vc

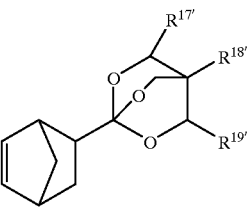

wherein $R^{17'}$, $R^{18'}$, and $R^{19'}$ independently represent hydrogen and linear and branched ($C_1$ to $C_5$) alkyl. The ortho esters of the present invention can be synthesized in accordance with the so-called Pinner synthesis (A. Pinner, *Chem. Ber.*, 16, 1643 (1883), and via the procedure set forth by S. M. McElvain and J. T. Venerable, *J Am. Chem. Soc.*, 72, 1661 (1950); S. M. McElvain and C. L. Aldridge, *J Am. Chem. Soc.*, 75, 3987 (1953). A typical synthesis is set forth in the reaction scheme below:

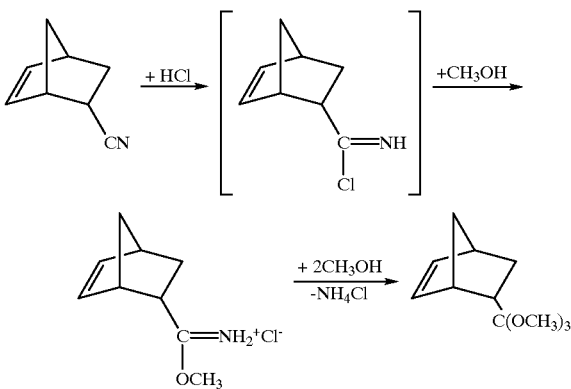

An alternative synthesis route wherein an alkyl acrylate is treated with a trialkyloxonium tetrafluoroborate salt followed by an alkali metal (sodium alcoholate) to yield the trialkoxymethyl ortho ester (H. Meerwein, P. Borner, O. Fuchs, H. J. Sasse, H. Schrodt, and J. Spille, *Chem. Ber.*, 89, 2060 (1956).

As discussed above the otho ester can undergo a hydrolysis reaction in the presence of dilute acid catalysts such as hydrobromic, hydroiodic, and acetic acid to yield the carboxylic acid. The carboxylic acid can in turn be esterified in the presence of an aliphatic alcohol and an acid catalyst to yield the respective ester. It should be recognized that in the case of polycyclic monomers that are di- or multi-substituted with ortho ester groups that the ortho ester moieties can be partially hydrolyzed to yield the acid and a conventional ester on the same monomer as illustrated below:

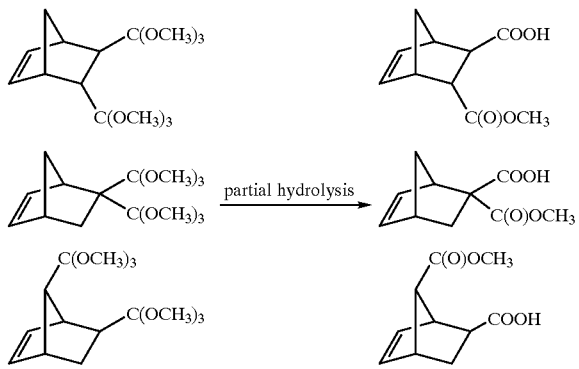

Another and more preferred route to difunctional polycyclic monomers is through the hydrolysis and partial hydrolysis of nadic anhydride(endo-5-norbornene-2,3-dicarboxylic anhydride). Nadic anhydride can be fully hydrolyzed to the dicarboxylic acid or partially hydrolyzed to the an acid and ester functionality or diester functionality as shown below:

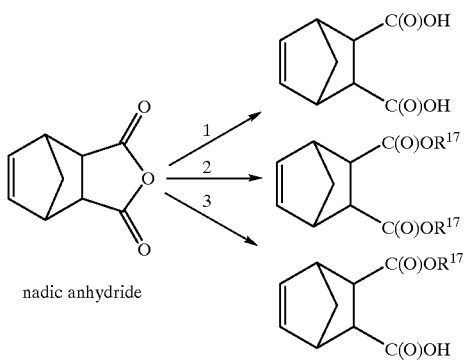

wherein $R^{17}$ independently represents linear and branched ($C_1$ to $C_5$) alkyl. Preferably $R^{17}$ is methyl, ethyl, or t-butyl. In a preferred synthesis the nadic anhydride starting material is the exo-isomer. The exo-isomer is easily prepared by heating the endo-isomer at 190° C. followed by recrystallization from an appropriate solvent (toluene). To obtain the diacid under reaction scheme 1, nadic anhydride is simply hydrolyzed in boiling water to obtain almost a quantitative yield of the diacid product. The mixed carboxylic acid-alkyl ester functionality shown in scheme 3 is obtained by heating nadic anhydride under reflux for 3 to 4 hours in the presence of the appropriate aliphatic alcohol ($R^{17}OH$). Alternatively, the same product can be prepared by first reacting the nadic anhydride starting material with an aliphatic alcohol and trialkyl amine followed by treatment with dilute HCl. The diester product substituted with identical alkyl ($R^{17}$) groups can be prepared from the diacid by reacting the diacid with a trialkyloxonium tetrafluoroborate, e.g., $R^{17}_3O[BF_4]$, in methylene chloride at ambient temperature, in the presence of diisopropylethylamine. To obtain esters with differing $R^{17}$ alkyl groups the mixed acid-ester product obtained in scheme 3 is employed as the starting material. In this embodiment the acid group is esterified as set forth in reaction scheme 2. However, a trialkyloxonium tetrafluoroborate having a differing alkyl group than the alkyl group already present in the ester functionality is employed.

It should be noted that the foregoing monomers containing the precursor functionalities can be converted to the desired functional groups before they are polymerized or the monomers can be first polymerized and then the respective polymers containing the precursor functional substituents can then be post reacted to give the desired functionality.

It is contemplated within the scope of this invention that the monomers described under Formulae I to V wherein m, p. q, r, and s is 0 the methylene bridge unit can be replaced by oxygen to give 7-oxo-norbornene derivatives.

It is also contemplated that for applications at 248 nm wave length and above $R^5$ to $R^{16}$ and $R^{11}$ in Formulae II, III, and IV can be aromatic such as phenyl.

Polymers

One or more of the acid labile substituted polycyclic monomers described under Formula I are copolymerized alone or in combination with one or more of the polycyclic monomers described under Formula II, in optional combination with one or more of the polycyclic monomers described under Formulae III, IV, and V. It is also contemplated that the polycyclic monomers of Formulae I to V can be copolymerized with carbon monoxide to afford alternating copolymers of the polycyclic and carbon monoxide. Copolymers of norbornene having pendant carboxylic acid groups and carbon monoxide have been described in U.S. Pat. No. 4,960,857 the disclosure of which is hereby incorporated by reference. The monomers of Formulae I to V and carbon monoxide can be copolymerized in the presence of a palladium containing catalyst system as described in Chem. Rev. 1996, 96, 663–681. It should be readily understood by those skilled in the art that the alternating copolymers of polycyclic/carbon monoxide can exist in either the keto or spiroketal isomeric form. Accordingly, the present invention contemplates copolymers containing random repeating units derived (polymerized) from a monomer or monomers represented by Formulae I and II in optional combination with any monomer(s) represented by Formulae II to V. In addition, the present invention contemplates alternating copolymers containing repeating units derived (polymerized) from carbon monoxide and a monomer(s) represented by Formulae I to V.

Pendant carboxylic acid functionality is important from the standpoint of imparting hydrophilic character, adhesion characteristics and clean dissolution (development) properties to the polymer backbone. In some photoresist applications, however, polymers bearing excessive carboxylic acid functionalities are undesirable. Such polymers do not perform well in industry standard developers (0.26N tetramethylammonium hydroxide, TMAH). Swelling of the polymer in unexposed regions, uncontrolled thinning during application, and swelling of the polymer during exposed dissolution are inherent disadvantages associated with these highly acidic polymers. Accordingly, in situations where excessive carboxylic acid functionality is undesirable but where hydrophilicity and good wetting characteristics are essential, copolymers polymerized from the monomers of Formula I in necessary combination with the monomers of Formula II are preferred. Especially preferred are the monomers of Formula II that contain alkyl ester, alkyl carbonate spaced alkyl oxalate, and alkyl oxalate substituents such as —(A)$_n$—C(O)OR"—, —(A)$_n$—OC(O)OR", —(A)$_n$—OC(O)—A'—C(O)OR" and —(A)$_n$—OC(O)C(O)OR", respectively, wherein A, A', n, and R" are as defined above.

The polymers of the present invention are the key ingredient of the composition. The polymer will generally comprise about 5 to 100 mole % of the monomer (repeating unit)

that contains the acid labile group component. Preferably the polymer contains about 20 to 90 mole % of the monomer that contains the acid labile group. More preferably the polymer contains about 30 to 70 mole % of the monomeric unit that contains the acid labile functionality. The remainder of polymer composition is made up of repeating units polymerized from the optional monomers set forth above under Formulae III to V. The choice and the amount of specific monomers employed in the polymer can be varied according to the properties desired. For example, by varying the amount of carboxylic acid functionality in the polymer backbone, the solubility of the polymer to various developing solvents can be adjusted as desired. Monomers containing the ester functionality can be varied to enhance the mechanical properties of the polymer and radiation sensitivity of the system. Finally, the glass transition temperature properties of the polymer can be adjusted by incorporating cyclic repeating units that contain long chain alkyl groups such as decyl.

There are several routes to polymerize cyclic olefin monomers such as norbornene and higher cyclic (polycyclic) monomers containing the norbornene moiety. These include: (1) ring-opening metathesis polymerization (ROMP); (2) ROMP followed by hydrogenation; and (3) addition polymerization. Each of the foregoing routes produces polymers with specific structures as shown in the diagram 1 below:

polymerization (ROMP) preferably with subsequent hydrogenation. The cyclic polymers of the present invention are represented by the following structures:

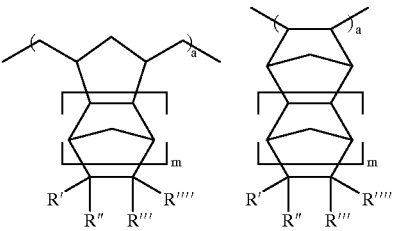

wherein R' to R"" independently represents $R^1$ to $R^{19}$ as defined in Formulae I to V above, m is an integer from 0 to 5 and a represents the number of repeating units in the polymer backbone.

The ROMP polymers of the present invention are polymerized in the presence of a metathesis ring-opening polymerization catalyst in an appropriate solvent. Methods of polymerizing via ROMP and the subsequent hydrogenation of the ring-opened polymers so obtained are disclosed in U.S. Pat. Nos. 5,053,471 and 5,202,388 which are incorporated herein by reference.

In one ROMP embodiment the polycyclic monomers of the invention can be polymerized in the presence of a single Diagram 1

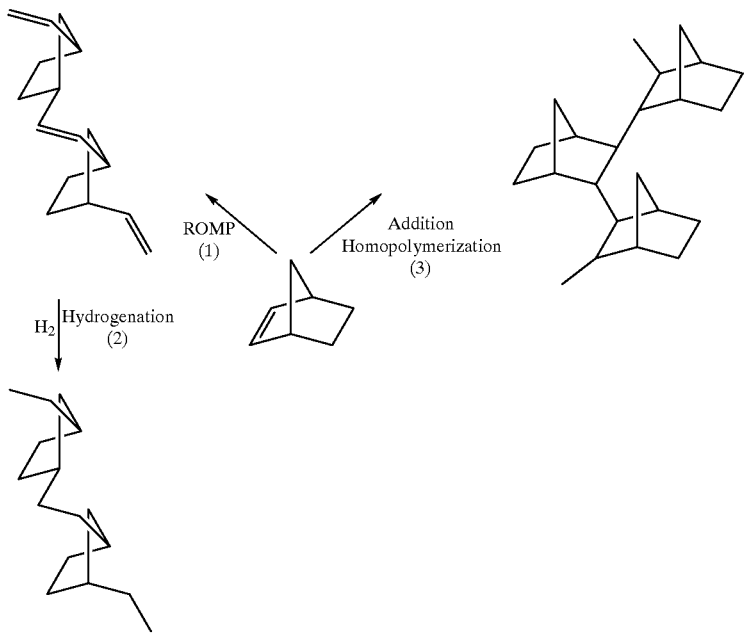

A ROMP polymer has a different structure than that of an addition polymer. A ROMP polymer contains a repeat unit with one less cyclic unit than did the starting monomer. The repeat units are linked together in an unsaturated backbone as shown above. Because of this unsaturation the polymer preferably should subsequently be hydrogenated to confer oxidative stability to the backbone. Addition polymers on the other hand have no C=C unsaturation in the polymer backbone despite being formed from the same monomer.

The monomers of this invention can be polymerized by addition polymerization and by ring-opening metathesis component ruthenium or osmium metal carbene complex catalyst such as those disclosed in WO 95-US9655. The monomer to catalyst ratio employed should range from about 100:1 to about 2,000:1, with a preferred ratio of about 500:1. The reaction can be conducted in halohydrocarbon solvent such as dichloroethane, dichloromethane, chlorobenzene and the like or in a hydrocarbon solvent such as toluene. The amount of solvent employed in the reaction medium should be sufficient to achieve a solids content of about 5 to about 40 weight percent, with 6 to 25 weight percent solids to solvent being preferred. The reaction can be conducted at a temperature ranging from about 0° C. to about 60° C., with about 20° C. to 50° C. being preferred.

A preferred metal carbene catalyst is bis(tricyclohexylphosphine)benzylidene ruthenium. Surprisingly and advantageously, it has been found that this catalyst can be utilized as the initial ROMP reaction catalyst and as an efficient hydrogenation catalyst to afford an essentially saturated ROMP polymer. No additional hydrogenation catalyst need be employed. Following the initial ROMP reaction, all that is needed to effect the hydrogenation of the polymer backbone is to maintain hydrogen pressure over the reaction medium at a temperature above about 100° C. but lower than about 220° C., preferably between about 150 to about 200° C.

The addition polymers of the present invention can be prepared via standard free radical solution polymerization methods that are well-known by those skilled in the art. The monomers of Formulae I to V can be homopolymerized or copolymerized in the presence of maleic anhydride. Free radical polymerization techniques are set forth in the *Encyclopedia of polymer Science*, John Wiley & Sons, 13, 708 (1988).

Alternatively, and preferably, the monomers of this invention are polymerized in the presence of a single or multi-component catalyst system comprising a Group VIII metal ion source (preferably palladium or nickel). Surprisingly, it has been found that the addition-polymers so produced possess excellent transparency to deep UV light (193 nm) and exhibit excellent resistance to reactive ion etching.

The preferred polymers of this invention are polymerized from reaction mixtures comprising at least one polycyclic monomer selected from Formulae I and II, a solvent, a catalyst system containing a Group VIII metal ion source, and an optional chain transfer agent. The catalyst system can be a preformed single component Group VIII metal based catalyst or a multicomponent Group VIII metal catalyst.

Single Component Systems

In one embodiment, the single component catalyst system of this invention comprises a Group VIII metal cation complex and a weakly coordinating counteranion as represented by the following formula:

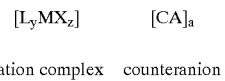

cation complex   counteranion wherein L represents a ligand containing 1, 2, or 3 π-bonds; M represents a Group VIII transition metal; X represents a ligand containing 1 σ-bond and between 0 to 3 π-bonds; y is 0, 1, or 2 and z is 0 or 1 and wherein y and z cannot both be 0 at the same time, and when y is 0, a is 2 and when y is 1, a is 1; and CA is a weakly coordinating counteranion.

The phrase "weakly coordinating counteranion" refers to an anion which is only weakly coordinated to the cation, thereby remaining sufficiently labile to be displaced by a neutral Lewis base. More specifically the phrase refers to an anion which when functioning as a stabilizing anion in the catalyst system of this invention does not transfer an anionic substituent or fragment thereof to the cation, thereby forming a neutral product. The counteranion is non-oxidative, non-reducing, non-nucleophilic, and relatively inert.

L is a neutral ligand that is weakly coordinated to the Group VIII metal cation complex. In other words, the ligand is relatively inert and is readily displaced from the metal cation complex by the inserting monomer in the growing polymer chain. Suitable π-bond containing ligands include ($C_2$ to $C_{12}$) monoolefinic (e.g., 2,3-dimethyl-2-butene), dioolefinic ($C_4$ to $C_{12}$) (e.g., norbornadiene) and ($C_6$ to $C_{20}$) aromatic moieties. Preferably ligand L is a chelating bidentate cyclo($C_6$ to $C_{12}$) diolefin, for example cyclooctadiene (COD) or dibenzo COD, or an aromatic compound such as benzene, toluene, or mesitylene.

Group VIII metal M is selected from Group VIII metals of the Periodic Table of the Elements. Preferably M is selected from the group consisting of nickel, palladium, cobalt, platinum, iron, and ruthenium. The most preferred metals are nickel and palladium.

Ligand X is selected from (i) a moiety that provides a single metal-carbon σ-bond (no π bonds) to the metal in the cation complex or (ii) a moiety that provides a single metal carbon σ-bond and 1 to 3 π-bonds to the metal in the cation complex. Under embodiment (i) the moiety is bound to the Group VIII metal by a single metal-carbon σ-bond and no π-bonds. Representative ligands defined under this embodiment include ($C_1$ to $C_{10}$) alkyl moieties selected from methyl, ethyl, linear and branched moieties such as propyl, butyl, pentyl, neopentyl, hexyl, heptyl, octyl, nonyl and decyl and ($C_7$ to $C_{15}$) aralkyl such as benzyl. Under embodiment (ii) generally defined above, the cation has a hydrocarbyl group directly bound to the metal by a single metal-carbon σ-bond, and also by at least one, but no more than three π-bonds. By hydrocarbyl is meant a group that is capable of stabilizing the Group VIII metal cation complex by providing a carbon-metal σ-bond and one to three olefinic π-bonds that may be conjugated or non-conjugated. Representative hydrocarbyl groups are ($C_3$ to $C_{20}$) alkenyl which may be non-cyclic, monocyclic, or polycyclic and can be substituted with linear and branched ($C_1$ to $C_{20}$) alkoxy, ($C_6$ to $C_{15}$) aryloxy or halo groups (e.g., Cl and F).

Preferably X is a single allyl ligand, or, a canonical form thereof, which provides a σ-bond and a π-bond; or a compound providing at least one olefinic π-bond to the metal, and a σ-bond to the metal from a distal carbon atom, spaced apart from either olefinic carbon atom by at least two carbon-carbon single bonds (embodiment iii).

It should be readily apparent to those skilled in the art that when ligand L or X is absent (i.e., y or z is zero), the metal cation complex will be weakly ligated by the solvent in which the reaction was carried out. Representative solvents include but are not limited to halogenated hydrocarbons such as carbon tetrachloride, chloroform, dichloromethane, 1,2-dichloroethane and aromatic solvents such as benzene, toluene, mesitylene, chlorobenzene, and nitrobenzene, and the like. A more detailed discussion on appropriate solvents will follow.

Selected embodiments of the Group VIII metal cation complexes of the single component catalyst systems of this invention are shown below.

Structure VII illustrates embodiment (i) wherein ligand X is a methyl group that is bound to the metal via a single metal-carbon σ-bond, and ligand L is COD that is weakly coordinated to the palladium metal via two olefinic π-bonds. In the structure below M preferably represents palladium or nickel.

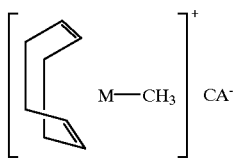

VII

Structures VIII, IX, and X illustrate various examples of embodiment (ii) wherein X is an allyl group that is bound to the metal (palladium is shown for illustrative purposes only) via a single metal-carbon σ-bond and at least one but no more than three π-bonds.

In Structure VIII, L is not present but an aromatic group providing three π-bonds is weakly coordinated to the palladium metal; X is an allyl group providing a single metal-carbon σ-bond and an olefinic π-bond to the palladium.

In Structure IX, L is COD and X is an allyl group providing a metal-carbon σ-bond and an olefinic π-bond to the palladium.

Structure X illustrates an embodiment wherein ligand X is an unsaturated hydrocarbon group that provides a metal-carbon σ-bond, a conjugated π-bond and two additional π-bonds to the palladium; L is absent.

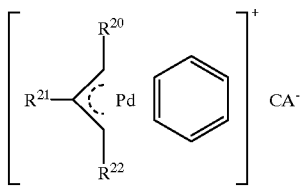

VIII

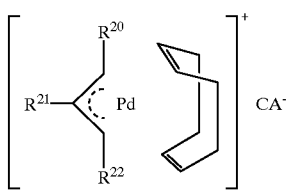

IX

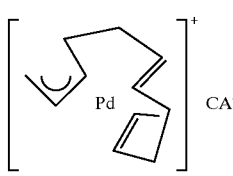

X

Substituents $R^{20}$, $R^{21}$, $R^{22}$ will be described in detail below.

Structures XI and XII illustrate examples of embodiment (iii) wherein L is COD and X is a ligand that provides at least one olefinic π-bond to the Group VIII metal and a σ-bond to the metal from a distal carbon atom, spaced apart from either olefinic carbon atom by at least two carbon-carbon single bonds.

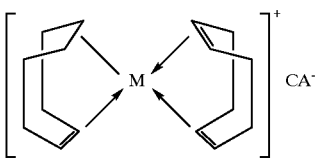

XI

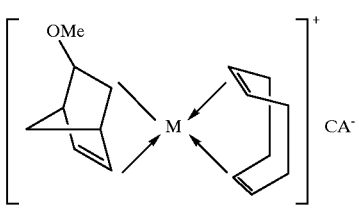

XII

The above-described Group VIII cation complexes are associated with a weakly coordinating or non-coordinating counteranion, CA⁻, which is relatively inert, a poor nucleophile and provides the cation complex with essential solubility in the reaction solvent. The key to proper anion design requires that it be labile, and stable and inert toward reactions with the cationic Group VIII metal complex in the final catalyst species and that it renders the single component catalyst soluble in the solvents of this invention. The anions which are stable toward reactions with water or Bronsted acids, and which do not have acidic protons located on the exterior of the anion (i.e., anionic complexes which do not react with strong acids or bases) possess the stability necessary to qualify as a stable anion for the catalyst system. The properties of the anion which are important for maximum lability include overall size, and shape (i.e., large radius of curvature), and nucleophilicity.

In general, a suitable anion may be any stable anion which allows the catalyst to be dissolved in a solvent of choice, and has the following attributes: (1) the anion should form stable salts with the aforementioned Lewis acid, Bronsted acids, reducible Lewis Acids, protonated Lewis bases, thallium and silver cations; (2) the negative charge on the anion should be delocalized over the framework of the anion or be localized within the core of the anion; (3) the anion should be a relatively poor nucleophile; and (4) the anion should not be a powerful reducing or oxidizing agent.

Anions that meet the foregoing criteria can be selected from the group consisting of a tetrafluoride of Ga, Al, or B; a hexafluoride of P, Sb, or As; perfluoro-acetates, propionates and butyrates, hydrated perchlorate; toluene sulfonates, and trifluoromethyl sulfonate; and substituted tetraphenyl borate wherein the phenyl ring is substituted with fluorine or trifluoromethyl moieties. Selected examples of counteranions include $BF_4^-$, $PF_6^-$, $AlF_3O_3SCF_3^-$, $SbF_6^-$, $SbF_5SO_3F^-$, $AsF_6^-$, trifluoroacetate ($CF_3CO_2^-$), pentafluoropropionate ($C_2F_5CO_2^-$), heptafluorobutyrate ($CF_3CF_2CF_2CO_2^-$), perchlorate ($ClO_4^-\cdot H_2O$), p-toluenesulfonate (p-$CH_3C_6H_4SO_3^-$) and tetraphenyl borates represented by the formula:

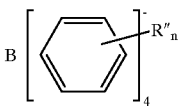

wherein R" independently represents hydrogen, fluorine and trifluoromethyl and n is 1 to 5.

A preferred single component catalyst of the foregoing embodiment are represented by the formula:

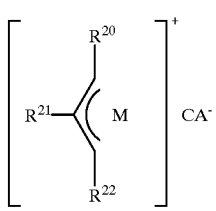

XIII

The catalyst comprises a π-allyl Group VIII metal complex with a weakly coordinating counteranion. The allyl group of the metal cation complex is provided by a compound containing allylic functionality which functionality is bound to the M by a single carbon-metal σ-bond and an olefinic π-bond. The Group VIII metal M is preferably selected from nickel and palladium with palladium being the most preferred metal. Surprisingly, it has been found that these single component catalysts wherein M is palladium and the cation complex is devoid of ligands other than the allyl functionality (i.e., $L_y$=0), exhibit excellent activity for the polymerization of functional polycyclic monomers such as the silyl containing monomers of this invention. As discussed above, it will be understood that the catalysts are solvated by the reaction diluent which diluent can be considered very weak ligands to the Group VIII metal in the cation complex.

Substituents $R^{20}$, $R^{21}$, and $R^{22}$ on the allyl group set forth above in Structures VIII, IX and XIII are each independently hydrogen, branched or unbranched ($C_1$ to $C_5$) alkyl such as methyl, ethyl, n-propyl, isopropyl, and t-butyl, ($C_6$ to $C_{14}$) aryl, such as phenyl and naphthyl, ($C_7$ to $C_{10}$) aralkyl such as benzyl, —$COOR^{16}$, —$(CH_2)_nOR^{16}$, Cl and ($C_5$ to $C_6$) cycloaliphatic, wherein $R^{16}$ is ($C_1$ to $C_5$) alkyl, such as methyl, ethyl, n-propyl, isopropyl, n-butyl and i-butyl, and n is 1 to 5.

Optionally, any two of $R^{20}$, $R^{21}$, and $R^{22}$ may be linked together to form a cyclic- or multi-cyclic ring structure. The cyclic ring structure can be carbocyclic or heterocyclic. Preferably any two of $R^{20}$, $R^{21}$, and $R^{22}$ taken together with the carbon atoms to which they are attached form rings of 5 to 20 atoms. Representative heteroatoms include nitrogen, sulfur and carbonyl. Illustrative of the cyclic groups with allylic functionality are the following structures:

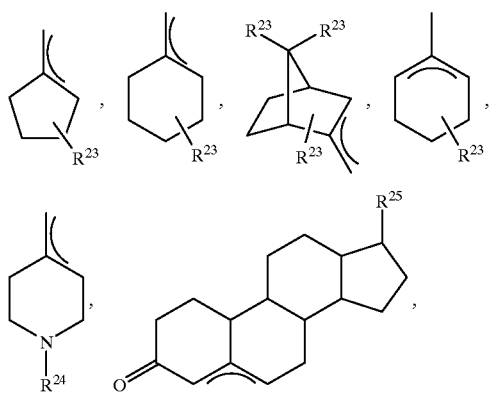

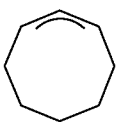

-continued wherein $R^{23}$ is hydrogen, linear or branched ($C_1$ to $C_5$) alkyl such as methyl, ethyl, n-propyl, isopropyl, n-butyl, isobutyl, and pentyl, $R^{24}$ is methylcarbonyl, and $R^{25}$ is linear or branched ($C_1$ to $C_{20}$) alkyl. Counteranion $CA^-$ is defined as above.

Additional examples of π-allyl metal complexes are found in R. G. Guy and B. L. Shaw, *Advances in Inorganic Chemistry and Radiochemistry*, Vol. 4, Academic Press Inc., New York, 1962; J. Birmingham, E. de Boer, M. L. H. Green, R. B. King, R. Köster, P. L. I. Nagy, G. N. Schrauzer, *Advances in Organometallic Chemistry*, Vol. 2, Academic Press Inc., New York, 1964; W. T. Dent, R. Long and A. J. Wilkinson, J. Chem. Soc., (1964) 1585; and H. C. Volger, Rec. Trav. Chim. Pay Bas, 88 (1969) 225; which are all hereby incorporated by reference.

The single component catalyst of the foregoing embodiment can be prepared by combining a ligated Group VIII metal halide component with a salt that provides the counteranion for the subsequently formed metal cation complex. The ligated Group VIII metal halide component, counteranion providing salt, and optional π-bond containing component, e.g., COD, are combined in a solvent capable of solvating the formed single component catalyst. The solvent utilized is preferably the same solvent chosen for the reaction medium. The catalyst can be preformed in solvent or can be formed in situ in the reaction medium.

Suitable counteranion providing salts are any salts capable of providing the counteranions discussed above. For example, salts of sodium, lithium, potassium, silver, thallium, and ammonia, wherein the anion is selected from the counteranions ($CA^-$) defined previously. Illustrative counteranion providing salts include $TlPF_6$, $AgPF_6$, $AgSbF_6$, $LiBF_4$, $NH_4PF_6$, $KAsF_6$, $AgC_2F_5CO_2$, $AgBF_4AgCF_3CO_2$, $AgClO_4.H_2O$, $AgAsF_6$, $AgCF_3CF_2CF_2CO_2$, $AgC_2F_5CO_2$, $(C_4H_9)_4NB(C_6F_5)_4$, and

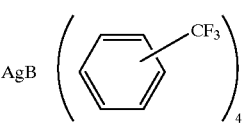

The specific catalyst: [allyl-Pd-COD]$^+$PF$_6^-$ is preformed by forming a ligated palladium halide component, i.e., bis(allyl Pd bromide), which is then subjected to scission with a halide abstracting agent in the form of a counteranion providing salt, i.e., TlPF$_6$ in the presence of COD. The reaction sequence is written as follows:

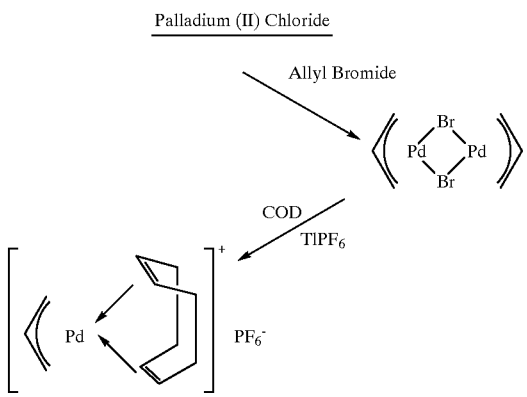

When partitioned, only one COD ligand remains, which is bonded by two π-bonds to the palladium. The allyl functionality is bonded by one metal-carbon σ-bond and one π-bond to the palladium.

For the preparation of the preferred π-allyl Group VIII metal/counteranion single component catalysts represented in Structure XIII above, i.e., when M is palladium, allylpalladium chloride is combined with the desired counteranion providing salt, preferably silver salts of the counteranion, in an appropriate solvent. The chloride ligand comes off the allyl palladium complex as a precipitate of silver chloride (AgCl) which can be filtered out of the solution. The allylpalladium cation complex/counteranion single component catalyst remains in solution. The palladium metal is devoid of any ligands apart from the allylic functionality.

An alternative single component catalyst that is useful in the present invention is represented by the formula below:

wherein $R^{27}$ independently represents linear and branched ($C_1$ to $C_{10}$) alkyl and $CA^-$ is a counteranion defined as above.

Preformed single component catalyst system useful in making polymers utilized in this invention is represented by the formula:

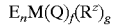

M is a Group VIII transition metal preferably selected from nickel, palladium, platinum, iron, rhodium and cobalt. Q is an electron withdrawing ligand preferably selected from linear and branched ($C_1$ to $C_{10}$) perhaloalkyl, ($C_7$ to $C_{24}$) perhaloalkaryl and perhaloaryl, n is an integer of 0, 1, 2 or 3; f is 1, 2, or 3 with the proviso that when M is rhodium f must be 3; and g is an integer of 0 or 1, when f is 1 $R^z$ must be present. The perhaloalkyl ligands are preferably selected from trifluoromethyl, and perfluoroethyl. The perhaloaryl ligands are preferably selected from, pentafluorophenyl, pentachlorophenyl, and pentabromophenyl groups. The perhaloalkaryl ligand is preferably 2,4,6-tris (trifluoromethylphenyl). E is selected from a monodentate or bidentate ligand.

Examples of monodentate ligands include π-arenes such as benzene, toluene, and mesitylene; ethers, polyethers such as glme, diglyme, triglyme, tetraglyme and thioethers represented by the formulae $R^i$—O—$R^i$ and $R^i$—S—$R^i$ wherein $R^i$ can be the same or different and represents a linear and branched ($C_1$ to $C_{10}$) alkyl group, the $R^i$ groups that are connected to the heteroatom can be taken together to represent heterocyclic ring containing 4 to 8 carbon atoms, representative ethers include methyltertbutylether, diethylether, furan, tetrahydrofuran, representative thioethers include thiophene, tetrahydrothiophene; cyclic diethers such as dioxane; ketones represented by the formula $R^i$—C(O)—$R^i$ wherein $R^i$ is as defined above and the $R^i$ groups connected to the carbonyl moiety can be taken together to form a substituted or unsubstituted cyclic ketone containing 5 to 8 carbon atoms, substituents include linear or branched ($C_1$ to $C_{10}$) alkyl and ($C_6$ to $C_{24}$) aryl, representative ketones include acetone, methylethylketone and methylphenylketone; amines of the formula $N(R^d)_3$ wherein $R^d$ independently represents linear or branched ($C_1$ to $C_{10}$) alkyl, ($C_7$ to $C_{10}$)aralkyl such as benzyl, ($C_6$ to $C_{24}$) aryl and cycloaliphatic groups containing 5 to 8 carbon atoms, the alkyl, aryl and cycloaliphatic substituents optionally contain halogen atoms selected from chlorine, bromine, fluorine and iodine, representative amines include triethylamine, tripropylamine and tributylamine; pyridine, linear and branched ($C_1$ to $C_{10}$) alkyl group substituted pyridines; phosphines of the formula $P(R^d)_3$ wherein $R^d$ is as defined above including alkylphosphines, arylphosphines and alkarylphosphines with trialkyl, triperfluoroalkyl, and triarylphosphines being preferred; alkylphosphine oxides, arylphosphine oxides, and alkarylphosphine oxides of the formula $(R^d)_3PO$ wherein $R^d$ is as defined above, preferred are the trialkyl triperfluoroalkyl, and triarylphosphine oxides; alkylphosphites, arylphosphites and alkarylphosphites of the formula $P(OR^d)_3$ wherein $R^d$ is as defined above, preferred are the trialkyl, triperfluoroalkyl and triarylphosphites; esters of the formula $R^iC(O)OR^i$ wherein $R^i$ is defined above and wherein the $R^i$ substituents bonded to the carbonyl and oxygen atom can be taken together therewith to form an unsubstituted or substituted lactone ring containing 3 to 8 carbon atoms, representative esters include ethyl acetate, representative lactones include β-propiolactone and γ-butyrolactone. $R^z$ represents a substituted or unsubstituted allyl ligand set forth below:

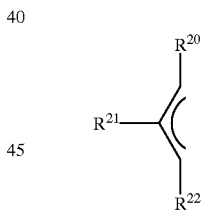

wherein $R^{20}$, $R^{21}$, and $R^{22}$ are as previously defined.

A representative preformed catalyst that contains no ligands other than the electron withdrawing group ligand is bis(2,4,6-tris(trifluoromethylphenyl)) nickel.

Representative preformed catalysts containing monodentate ligands are (toluene)bis(perfluorophenyl) nickel, (mesitylene)bis(perfluorophenyl) nickel, (benzene)bis (perfluorophenyl) nickel, bis(tetrahydroftiran)bis (perfluorophenyl) nickel, (dimethoxyethane)bis(2,4,6-tris (trifluoromethylphenyl)) nickel, bis(dioxane)bis (perfluorophenyl) nickel, (methallyl)nickel (pentafluorophenyl)(triphenylphosphine), and (methallyl) nickel(pentafluorophenyl)(tricyclohexylphosphine), and the compound $[Ni(C_6F_5)_2Cl]_2{}^{2-}$.

Examples of bidentate ligands include hemilabile chelating ligands containing phosphorus, oxygen, nitrogen and sulfur represented by the formula

wherein Y and Z independently represent phosphorus, oxygen, carbonyl, nitrogen and sulfur and K is an unsubstituted and substituted hydrocarbon backbone moiety containing from 2 to 25 carbon atoms or a divalent alkylene ether moiety wherein the alkylene radicals independently contain 1 to 10 carbon atoms. The phosphorus, oxygen, sulfur, nitrogen atoms and the carbonyl carbon can optionally be substituted with linear and branched($C_1$ to $C_{10}$) alkyl and ($C_6$ to $C_{24}$) aryl groups. The hydrocarbon backbone moiety can be substituted with pendant linear and branched alkyl groups containing 1 to 10 carbon atoms, alicyclic groups of 5 to 15 carbon atoms, aryl groups of containing 6 to 20 carbon atoms, and amines. The pendant substituents on the hydrocarbon backbone can optionally be substituted with linear and branched ($C_1$ to $C_{10}$) alkyl, phenyl groups, halides, and amino groups. Catalysts of the invention containing the above described bidentate ligands can be represented by the formula

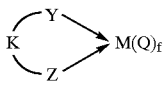

wherein K, Y, Z, M, and Q are as defined above. Illustrative of the catalysts containing bidentate chelating ligands where Y and Z are phosphorus, oxygen or carbonyl are represented by the formulae

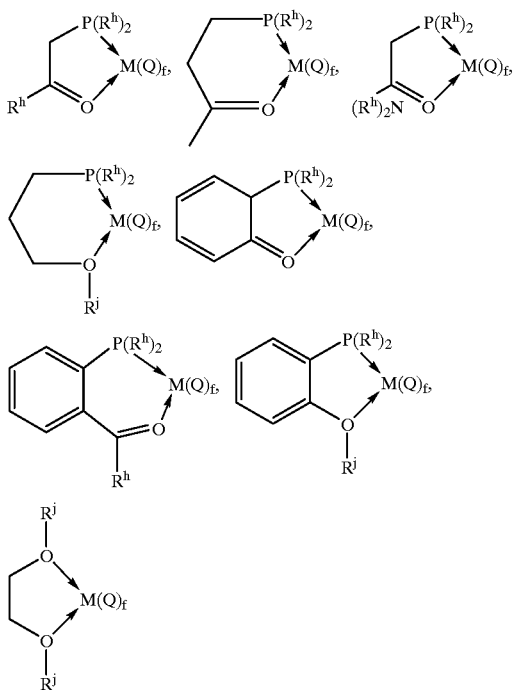

wherein $R^h$ independently represents hydrogen, linear and branched($C_1$ to $C_{10}$) alkyl and ($C_6$ to $C_{24}$) aryl and Ri represents linear and branched($C_1$ to $C_{10}$) alkyl and ($C_6$ to $C_{24}$) aryl.

The ratio of monomer to catalyst in the reaction medium can range from about 50,000:1 to about 50:1, preferably from about 20,000:1 to about 100:1, more preferably from about 2000:1 to about 100:1, and most preferably from about 500:1 to about 100:1. The reaction can be run in the organic solvents, specified hereinabove. Preferred solvents include the previously described aliphatic hydrocarbons such as hexane, alicyclic hydrocarbons such as cyclohexane and aromatic hydrocarbons such as benzene, toluene and mesitylene as well as polar organic hydrocarbons which are described below. The foregoing solvents can be used alone or in mixtures of two or more. Polar organic solvents include the ethers, esters and ketones described as ligands in the description of the catalyst formula set forth immediately above. Suitable polar organic solvents include ethyl acetate, methyltertbutylether, diethylether, tetrahydrofuran, dioxane, acetone, methylethylketone, methylphenylketone, β-propiolactone and γ-butyrolactone. The reaction temperature employed can range from about 0° C. to about 70° C., preferably from about 10° C. to about 50° C., and more preferably from about 20° C. to about 40° C. The preferred concentration of monomer in reaction solvent or diluent ranges from about 5 weight percent monomer in solvent to about to about 50 weight percent.

When employing the preformed catalyst systems of the formula $E_nM(Q)_f(R^z)_g$, it has been found that effective reduction of molecular weight of the polymer product can be attained by in increasing the catalyst concentration in the monomer along with decreasing the concentration of monomer in reaction solvent. We have found a relative effect between catalyst concentration and monomer concentration in the reaction medium. When operating within the preferred monomer to catalyst ratios and monomer to reaction solvent ranges an increase in catalyst loading with a concomitant decrease in monomer to solvent concentration a reduction in the molecular weight of the polymer product is observed. We have also observed that by conducting the polymerization reaction in the presence of a dual component solvent system while maintaining a relatively high catalyst to monomer and monomer to solvent concentration provides an effective reduction in molecular weight of the polymer product. By dual component solvent system is meant that a non-polar hydrocarbon diluent such as cyclohexane is used in combination with a polar organic solvent such as ethyl acetate. Suitable non-polar solvents include any solvent that is a diluent, i.e., miscible with the polar organic solvent. The polar organic solvents are preferably organic esters that are suitable solvents for the catalyst component. The ratio of non-polar hydrocarbon solvent to polar organic solvent can range from 75:25 w/w to 25:75 w/w with 50:50 w/w being preferred. The dual component solvent system method of molecular weight reduction is advantageous from the standpoint of allowing for higher concentrations of monomer to be employed in the reaction medium.

The preformed single component catalysts of the above formula can be synthesized via several routes. In one synthesis route a Group VIII metal ion source, e.g., nickel trifluoroacetate, is reacted with a reagent (e.g., bis(pentafluorophenyl) zinc, or a Grignard reagent such as pentafluorophenyl magnesium bromide) that is capable of transferring the appropriate electron withdrawing ligand to the Group VIII metal. The reaction is conducted in an appropriate solvent such as diethylether or THF. The solvent system can provide the source of the remaining ligand(s). For example, if THF is employed as the solvent, the catalyst product of the synthesis is $(THF)_2Ni(C_6F_5)_2$. The synthesis can be conducted in a temperature range of from about −100° C. to about 100° C. Typically the reaction can be conducted at room temperature but elevated temperatures can be employed to increase the rate of reaction. In another synthesis route the THF ligand on the catalyst can be substituted by a mono- or bidentate ligand such as toluene or triphenyl phosphine simply by reacting the $(THF)_2Ni(C_6F_5)_2$ catalyst with toluene or triphenylphosphine. Representative reaction schemes are set forth below.

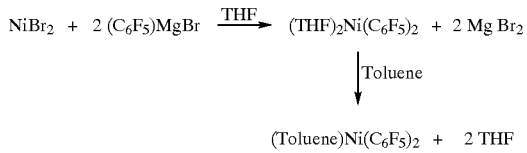

In an alternate synthesis route a reagent containing the Group VIII metal compound containing the desired the mono- or bidentate ligand can be reacted with a reagent containing the electron withdrawing group ligand. For example, bis(triphenylphosphine) nickel dibromide can be reacted in a suitable solvent with the Grignard reagent, pentafluorophenyl magnesium bromide, to give the catalyst $((C_6H_5)_3P)_2Ni(C_6F_5)_2$. The reaction scheme is represented below.

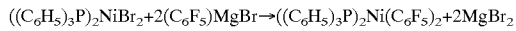

In another method for preparing the preformed catalyst, a neutral (zero oxidation state) Group VIII metal reagent, e.g., $Ni(COD)_2$, in combination with an appropriate ligand reagent (e.g., THF) is reacted in a solvent with an electron withdrawing group ligand reagent capable of undergoing oxidative addition to the Group VIII metal. Pentafluorobenzoyl chloride can be employed as an electron withdrawing ligand reagent. The reaction scheme is set forth below.

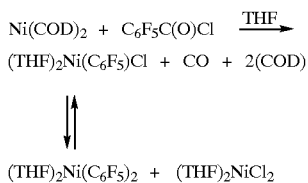

In another synthesis route the catalyst can be prepared via the metal vapor and activated metal synthesis procedure described by R. G. Gastinger, B. B. Anderson, K. J. Klabunde, *J. Am. Chem. Soc.* 1980, 102, 4959–4966 and R. D. Rieke, W. J. Wolf, N. Kujundzic, A. V. Kavaliunas, *J. Am. Chem. Soc.* 1977, 99, 4159–4160, respectively. The electron withdrawing ligand reagent undergoes oxidative addition to the activated zero valent Group VIII metal to form the preformed catalyst.

It is to be understood that the catalysts described under the formula $E_nM(Q)_f(R^2)_g$ above can be prepared in situ by reacting a Group VIII metal containing (M) reagent with the desired electron withdrawing ligand (Q) reagent and the mono- and bidentate ligand (E) reagent in the presence of the monomer solution in the reaction medium. Alternatively, these catalysts are prepared in situ by arylating or alkylating the Group VIII metal in the optional presence of activating agents. The Group VIII metal containing reagents can be selected from a compound containing nickel, palladium, platinum cobalt, iron, and rhodium, with nickel and palladium being most preferred. There are no restrictions on the Group VIII metal compound so long as the compound provides a source of Group VIII metal ions that are capable of being arylated or alkylated. In other words, the Group VIII metal containing moiety should contain groups or ligands that can be easily displaced by the electron withdrawing ligand provided by the arylation or alkylation agent. Preferably, the Group VIII metal compound is soluble or can be made to be soluble (by the attachment of appropriate ligands) in the reaction medium. Examples of reagents containing the Group VIII metal include anionic ligands selected from the halides such as chloride, bromide, iodide or fluoride ions; pseudohalides such as cyanide, cyanate, thiocyanate, hydride; carbanions such as branched and unbranched ($C_1$ to $C_{40}$) alkylanions, phenyl anions; cyclopentadienylide anions; π-allyl groupings; enolates of β-dicarbonyl compounds such as acetylacetonate (4-pentanedionate), 2,2,6,6-tetramethyl-3,5-heptanedionate, and halogenated acetylacetonoates such as 1,1,1,5,5,5-hexafluoro-2,4-pentanedionate, 1,1,1-trifluoro-2,4-pentanedionate; anions of acidic oxides of carbon such as carboxylates and halogenated carboxylates (e.g., acetates, 2-ethylhexanoate, neodecanoate, trifluoroacetate, etc.) and oxides of nitrogen (e.g., nitrates, nitrites, etc.) of bismuth (e.g., bismuthate, etc.), of aluminum (e.g., aluminates, etc.), of silicon (e.g., silicate, etc.), of phosphorous (e.g., phosphates, phosphites, phosphines, etc.) of sulfur (e.g., sulfates such as triflate, p-toluene sulfonate, sulfites, etc.); ylides; amides; imides; oxides; phosphides; sulfides; ($C_6$ to $C_{24}$) aryloxides, ($C_1$ to $C_{20}$) alkoxides, hydroxide, hydroxy ($C_1$ to $C_{20}$) alkyl; catechols; oxalate; chelating alkoxides and aryloxides.

Examples of Group VIII transition metal compounds suitable as the Group VIII metal ion source include: palladium ethylhexanoate, trans-Pd $Cl_2(PPh_3)_2$, palladium (II) bis(trifluoroacetate), palladium (II) bis(acetylacetonate), palladium (II) 2-ethylhexanoate, $Pd(acetate)_2(PPh_3)_2$, palladium (II) bromide, palladium (II) chloride, palladium (II) iodide, monoacetonitriletris(triphenylphosphine) palladium (II) tetrafluoroborate, tetrakis(acetonitrile) palladium (II) tetrafluoroborate, dichlorobis(acetonitrile) palladium (II), dichlorobis(triphenylphosphine) palladium (II), dichlorobis (benzonitrile) palladium (II), palladium acetylacetonate, palladium bis(acetonitrile) dichloride, palladium bis (dimethylsulfoxide) dichloride, nickel acetylacetonates, nickel carboxylates, nickel dimethylglyoxime, nickel ethylhexanoate, $NiCl_2(PPh_3)_2$, $NiCl_2(PPh_2CH_2)_2$, $(P(cyclohexyl)_3)H\ Ni(Ph_2P(C_6H_4)CO_2)$, $(PPh_3)\ (C_6H_5)Ni\ (Ph_2\ PCH=C(O)Ph)$, bis(2,2,6,6-tetramethyl-3,5-heptanedionate) nickel (II), nickel (II) hexafluoroacetylacetonate tetrahydrate, nickel (II) trifluoroacetylacetonate dihydrate, nickel (II) acetylacetonate tetrahydrate, nickelocene, nickel (II) acetate, nickel bromide, nickel chloride, dichlorohexyl nickel acetate, nickel lactate, nickel tetrafluoroborate, bis(allyl)nickel, bis(cyclopentadienyl) nickel, cobalt neodecanoate, cobalt (II) acetate, cobalt (II) acetylacetonate, cobalt (III) acetylacetonate, cobalt (II) benzoate, cobalt chloride, cobalt bromide, dichlorohexyl cobalt acetates, cobalt (II) stearate, cobalt (II) tetrafluoroborate, iron naphthenate, iron (II) chloride, iron (III) chloride, iron (II) bromide, iron (III) bromide, iron (II) acetate, iron (III) acetylacetonate, ferrocene, rhodium chloride, rhodium tris(triphenylphosphine) trichloride.

The arylating or alkylating agent or cocatalyst contains perhalophenyl and 2,4,6-tris(trifluoromethylphenyl) moieties. Preferred cocatalysts or arylation and alkylation agents include bis(pentahalophenyl)zinc-dimethoxyethane (e.g., $(C_6X_5)_2Zn.dme$) where X represents a halogen substituent, preferably fluorine, bromine and chlorine, and dme is dimethoxyethane, tris(perfluorophenyl)boron (e.g., $B(C_6F_5)_3$), tris(perfluorophenyl)boron hydrate (e.g., B(C$_6$F$_5$)$_3$.3H$_2$O) tris(2,4,6-trifluoromethyl) phenyl lithium, bis(2,4,6-trifluoromethyl) phenyl zinc, bis(2,4,6-trifluoromethyl) phenyl magnesium, and bis(trifluoromethyl)cadmium.dme (e.g., Cd(CF$_3$)$_2$.dme).

Activating agents include trialkyl aluminum compounds such as triethylaluminum, dialkylmagnesium compounds such as dibutylmagnesium, dialkylzinc such as diethylzinc. We have found that for most of the catalyst systems these activators increase the rate of initiation of the polymerization reaction. When aluminum alkyls are employed as activators, it is preferable that an oxygen containing compound is employed therewith. Suitable oxygen containing compounds can be selected from tetraethoxysilane, dimethyldiethoxysilane, diethylether, propanol or monomers of the invention that contain oxygen substituents. When aluminum alkyls are employed as the activator there is no need to add an oxygen containing compound so long as the cyclic monomer(s) to be polymerized bears an oxygen containing substituent such as an carboxylic acid, ester, carbonyl, ether, or alcohol containing substituent. When utilizing non-polar hydrocarbon solvents, e.g., hexane, cyclohexane, toluene, etc., as the reaction diluent, relatively small amounts of the oxygen containing compounds are employed (about 10 moles of oxygen containing compound per mole of Group VIII metal). When halohydrocarbon diluents, e.g., dichloromethane, dichloroethane, etc., are used in the polymerization, higher levels of oxygen containing compound (up to about 1000 moles of oxygen containing compound per mole of Group VIII metal) are employed in the reaction medium.

We have found that the Group IVB metals, preferably, titanium, zirconium and hafnium; the lanthanide series metals, preferably, samarium and europium; the Group VB metals, preferably, vanadium; and the Group VA metals, preferably, silicon, germanium, tin and lead can be arylated in situ to form active catalysts for cyclic olefin polymerzation. These metals include ligands such as halide groups, acetate groups and acetoacetonate groups that are easily displaced by the aryl groups provided by the arylating or alkylating agent described above.

In addition to being effective catalysts for the addition polymerization of monomers suitable for photoresist polymer applications, the above described catalysts are suitable for polymerizing many types of substituted and unsubstituted cyclic olefin monomer classes. Preformed or in situ prepared catalysts of the formula E$_n$M(Q)$_f$(R$^z$)$_g$ are useful for polymerizing any combination of monomers of Formulae I, II, III, IV and V defined above. Further to the cyclic olefin monomers of decribed under Formulae I to V, we have found that these catalysts are useful for polymerizing cyclic olefin monomers of Formulae VI and VII set forth below:

VI

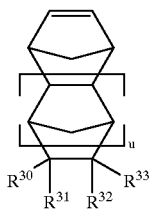

wherein R$^{30}$, R$^{31}$, R$^{32}$, and R$^{33}$ independently represent hydrogen, linear or branched (C$_1$ to C$_{20}$) alkyl, (C$_6$ to C$_{24}$) aryl and at least one of R$^{30}$ to R$^{33}$ representing the group —(B)$_n$—SiR$^{34}$R$^{35}$R$^{36}$ wherein B is a divalent bridging or spacer radical and n is an integer of 0 or 1. The divalent radical is an alkylene group represented by the formula —(C$_d$H$_{2d}$)— where d represents the number of carbon atoms in the alkylene chain and is an integer from 1 to 10. The divalent radicals are preferably selected from linear and branched (C$_1$ to C$_{10}$) alkylene such as methylene, ethylene, propylene, butylene, pentylene, hexylene, heptylene, octylene, nonylene, and decylene. When branched alkylene radicals are contemplated, it is to be understood that a hydrogen atom in the linear alkylene chain is replaced with a linear or branched (C$_1$ to C$_5$) alkyl group. When n is 0 it should be apparent that the spacer radical is not present and B represents a covalent bond. In other words the silyl group, —SiR$^{34}$R$^{35}$R$^{36}$, is attached directly to the cyclic ring. Substituents R$^{34}$, R$^{35}$, and R$^{36}$ independently represent halogen selected from the group consisting of chlorine, fluorine, bromine and iodine, linear or branched (C$_1$ to C$_{20}$) alkyl, linear or branched (C$_1$ to C$_{20}$) alkoxy, substituted or unsubstituted (C$_6$ to C$_{20}$) aryloxy, linear or branched (C$_1$ to C$_{20}$) alkyl carbonyloxy, and (C$_1$ to C$_{20}$) alkyl peroxy. Preferably, at least one of R$^{34}$, R$^{35}$, or R$^{36}$ is selected from a linear or branched (C$_1$ to C$_{10}$) alkoxy group or a halogen group. More preferably, each of R$^{34}$, R$^{35}$, and R$^{36}$ are the same and are selected from methoxy, ethoxy, propoxy, butoxy, pentoxy, and chlorine groups. Still more preferably, n is 0, and R$^{34}$, R$^{35}$ and R$^{36}$ are ethoxy, e.g., at least one of R$^{30}$ to R$^{33}$ is a triethoxysilyl substituent.

In another embodiement, the arylated and alkylated catalysts of the formula E$_n$M(Q)$_f$(R$^z$)$_g$ are useful to homo- and copolymerize one or more monomers of the monomer formula

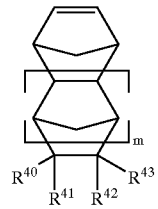

wherein R$^{40}$, R$^{41}$, R$^{42}$, and R$^{43}$ independently represent hydrogen, linear and branched (C$_1$ to C$_{20}$) alkyl, hydrocarbyl substituted and unsubstituted (C$_5$ to C$_{12}$) cycloalkyl, (C$_7$ to C$_{15}$) aralkyl, (C$_3$ to C$_{20}$) alkynyl, linear and branched (C$_3$ to C$_{20}$) alkenyl, vinyl; any of R$^{40}$ and R$^{41}$ or R$^{42}$ and R$^{43}$ can be taken together to form a (C$_1$ to C$_{10}$) alkylidenyl group, R$^{40}$ and R$^{43}$ can be taken together with the two ring carbon atoms to which they are attached can represent saturated and unsaturated cyclic groups containing 4 to 12 carbon atoms or an aromatic ring containing 6 to 17 carbon atoms, or an anhydride or dicarboxyimide group; —(B)$_n$—SiR$^{34}$R$^{35}$R$^{36}$ wherein B is a divalent bridging or spacer radical selected from linear and branched (C$_1$ to C$_{10}$) alkylene, n is an integer of 0 or 1, R$^{34}$, R$^{35}$, and R$^{36}$ independently represent halogen, linear or branched (C$_1$ to C$_{20}$) alkyl, linear or branched (C$_1$ to C$_{20}$) alkoxy, substituted or unsubstituted (C$_6$ to C$_{20}$) aryloxy, linear or branched (C$_1$ to C$_{20}$) alkyl carbonyloxy, and (C$_1$ to C$_{20}$) alkyl peroxy; —(A)$_n$—C(O)OR", —(A)$_n$—OR", —(A)$_n$—OC(O)R", —(A)$_n$—OC(O)OR", —(A)$_n$—C(O)R", —(A)$_n$—OCH$_2$C(O)OR*, —(A)$_n$—C(O)O—A'—OCH$_2$C(O)OR*, —(A)$_n$—OC(O)C(O)OR", —(A)$_n$—O—A'—C(O)OR", —(A)$_n$—OC(O)—A'—C(O)OR", —(A)$_n$—C(O)O—A'—C(O)OR", —(A)$_n$—C(O)—A'—OR", —(A)$_n$—C(O)O—A'—OC(O)OR", —(A)$_n$—C(O)O—A'—O—A'—C(O)OR", —(A)$_n$—C(O)O—A'—OC(O)C(O)OR", —(A)$_n$—C(R")$_2$CH(R")(C(O)OR"), and —(A)$_n$—C(R")$_2$CH(C(O)OR")$_2$, —(A)$_n$—R"

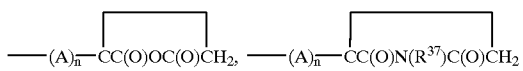

wherein $R^{37}$ is hydrogen, linear and branched ($C_1$ to $C_{10}$) alkyl, or ($C_6$ to $C_{15}$) aryl, wherein n is 0 or 1, m is an integer from 0 to 5, —A— and —A'— independently represent a divalent radical selected from the group consisting of linear and branched ($C_1$ to $C_{10}$) alkylene, ($C_2$ to $C_{10}$) alkylene ethers, polyethers, or a cyclic group of the formula:

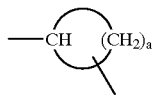

wherein a is an integer from 2 to 7, R" represents hydrogen or linear and branched ($C_1$ to $C_{10}$) alkyl, —C(CH$_3$)$_3$, —Si(CH$_3$)$_3$, —CH(R$^P$)OCH$_2$CH$_3$, —CH(R$^P$)OC(CH$_3$)$_3$,

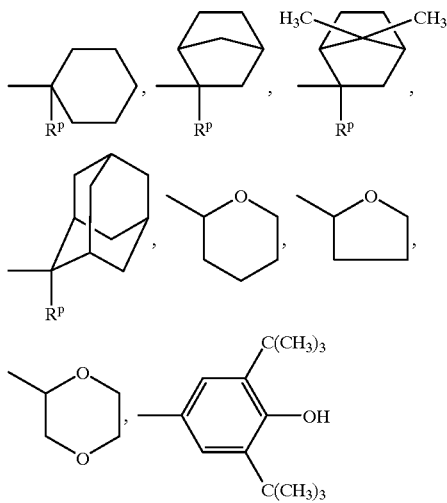

wherein $R^P$ represents hydrogen or a linear or branched ($C_1$ to $C_5$) alkyl group; linear and branched ($C_1$ to $C_{10}$) alkoxyalkylene, polyethers, monocyclic and polycyclic ($C_4$ to $C_{20}$) cycloaliphatic moieties, cyclic ethers, cyclic diethers, cyclic ketones, and cyclic esters (lactones), when any of $R^{40}$ to $R^{43}$ represent a succinic or carboxyimide moiety and n is 1 A can only represent a linear or branched ($C_1$ to $C_{10}$) alkylene group.

Accordingly, homopolymers and copolymers comprising repeating units polymerized from one or more of the monomers of Formulae I to VI can be easily prepared.

Multicomponent Systems

The multicomponent catalyst system embodiment of the present invention comprises a Group VIII metal ion source, in combination with one or both of an organometal cocatalyst and a third component. The cocatalyst is selected from organoaluminum compounds, dialkylaluminum hydrides, dialkyl zinc compounds, dialkyl magnesium compounds, and alkyllithium compounds.

The Group VIII metal ion source is preferably selected from a compound containing nickel, palladium, cobalt, iron, and ruthenium with nickel and palladium being most preferred. There are no restrictions on the Group VIII metal compound so long as it provides a source of catalytically active Group VIII metal ions. Preferably, the Group VIII metal compound is soluble or can be made to be soluble in the reaction medium.

The Group VIII metal compound comprises ionic and/or neutral ligand(s) bound to the Group VIII metal. The ionic and neutral ligands can be selected from a variety of monodentate, bidentate, or multidentate moieties and combinations thereof.

Representative of the ionic ligands that can be bonded to the metal to form the Group VIII compound are anionic ligands selected from the halides such as chloride, bromide, iodide or fluoride ions; pseudohalides such as cyanide, cyanate, thiocyanate, hydride; carbanions such as branched and unbranched ($C_1$ to $C_{40}$) alkylanions, phenyl anions; cyclopentadienylide anions; π-allyl groupings; enolates of β-dicarbonyl compounds such as acetylacetonate (4-pentanedionate), 2,2,6,6-tetramethyl-3,5-heptanedionate, and halogenated acetylacetonoates such as 1,1,1,5,5,5-hexafluoro-2,4-pentanedionate, 1,1,1-trifluoro-2,4, pentanedionate; anions of acidic oxides of carbon such as carboxylates and halogenated carboxylates (e.g., acetates, 2-ethylhexanoate, neodecanoate, trifluoroacetate, etc.) and oxides of nitrogen (e.g., nitrates, nitrites, etc.) of bismuth (e.g., bismuthate, etc.), of aluminum (e.g., aluminates, etc.), of silicon (e.g., silicate, etc.), of phosphorous (e.g., phosphates, phosphites, phosphines, etc.) of sulfur (e.g., sulfates such as triflate, p-toluene sulfonate, sulfites, etc.); ylides; amides; imides; oxides; phosphides; sulfides; ($C_6$ to $C_{24}$) aryloxides, ($C_1$ to $C_{20}$) alkoxides, hydroxide, hydroxy ($C_1$ to $C_{20}$) alkyl; catechols; oxalate; chelating alkoxides and aryloxides. Palladium compounds can also contain complex anions such as $PF^-_6$, $AlF_3O_3SCF^-_3$, $SbF^-_6$ and compounds represented by the formulae:

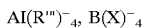

$Al(R''')^-_4$, $B(X)^-_4$ wherein R''' and X independently represent a halogen atom selected from Cl, F, I, and Br, or a substituted or unsubstituted hydrocarbyl group. Representative of hydrocarbyl are ($C_1$ to $C_{25}$) alkyl such as methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonodecyl, eicosyl, heneicosyl, docosyl, tricosyl, tetracosyl, pentacosyl, and isomeric forms thereof; ($C_2$ to $C_{25}$) alkenyl such as vinyl, allyl, crotyl, butenyl, pentenyl, hexenyl, octenyl, nonenyl, decenyl, undecenyl, dodecenyl, tridecenyl, tetradecenyl pentadecenyl, hexadecenyl, heptadecenyl, octadecenyl, nonadecenyl, pentacosenyl, and isomeric forms thereof. ($C_6$ to $C_{25}$) aryl such as phenyl, tolyl, xylyl, naphthyl, and the like; ($C_7$ to $C_{25}$) aralkyl such as benzyl, phenethyl, phenpropyl, phenbutyl, phenhexyl, napthoctyl, and the like; ($C_3$ to $C_8$) cycloalkyl such as cyclopropyl, cyclobutyl, cyclopentyl, cyclohexyl, cycloheptyl, cyclooctyl, 2-norbornyl, 2-norbornenyl, and the like. In addition to the above definitions X represents the radical:

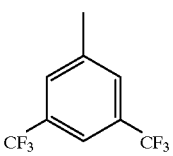

The term "substituted hydrocarbyl" means the hydrocarbyl group as previously defined wherein one or more hydrogen atoms have been replaced with a halogen atom such as Cl, F, Br, and I (e.g., as in the perfluorophenyl radical); hydroxyl; amino; alkyl; nitro; mercapto, and the like.

The Group VIII metal compounds can also contain cations such as, for example, organoanmonium, organoarsonium, organophosphonium, and pyridinium compounds represented by the formulae:

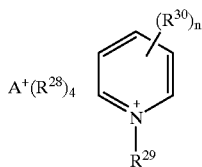

wherein A represents nitrogen, arsenic, and phosphorous and the $R^{28}$ radical can be independently selected from hydrogen, branched or unbranched ($C_1$ to $C_{20}$) alkyl, branched or unbranched ($C_2$ to $C_{20}$) alkenyl, and ($C_5$ to $C_{16}$) cycloalkyl, e.g., cyclopentyl, cyclohexyl, cycloheptyl, cyclooctyl, and the like. $R^{29}$ and $R^{30}$ are independently selected from hydrogen, branched and unbranched ($C_1$ to $C_{50}$) alkyl, linear and branched ($C_2$ to $C_{50}$) alkenyl and ($C_5$ to $C_{16}$) cycloalkyl groups as defined above; and n is 1 to 5, preferably n is 1, 2, or 3, most preferably n is 1. The $R^{30}$ radicals preferably are attached to positions 3, 4, and 5 on the pyridine ring.

It should be noted that increasing the sum of the carbon atoms contained in the $R^{28}$ radicals confers better solubility of the transition metal compound in organic media such as organic solvents and polycyclic the monomer. Preferably, the $R^{28}$ radicals are selected from ($C_1$ to $C_{18}$) alkyl groups wherein the sum of carbon atoms for all $R^{28}$ radicals is 15 to 72, preferably 25 to 48, more preferably 21 to 42. The $R^{21}$ radical is preferably selected from linear and branched ($C_1$ to $C_{50}$) alkyl, more preferably ($C_{10}$ to $C_{40}$) alkyl. $R^{30}$ is preferably selected from linear and branched ($C_1$ to $C_{40}$) alkyl, more preferably ($C_2$ to $C_{30}$) alkyl.

Specific examples of organoammonium cations include tridodecylammonium, methyltricaprylammonium, tris(tridecyl)ammonium and trioctylammonium. Specific examples of organoarsonium and organophosphonium cations include tridodecylarsonium and phosphonium, methyltricaprylarsonium and phosphonium, tris(tridecyl)arsonium and phosphonium, and trioctylarsonium and phosphonium. Specific pyridinium cations include eicosyl-4-(1-butylpentyl)pyridinium, docosyl-4-(13-pentacosyl)pyridinium, and eicosyl-4-(1-butylpentyl)pyridinium.

Suitable neutral ligands which can be bonded to the palladium transition metal are the olefins; the acetylenes; carbon monoxide; nitric oxide, nitrogen compounds such as ammonia, alkylisocyanide, alkylisocyanate, alkylisothiocyanate; pyridines and pyridine derivatives (e.g., 1,10-phenanthroline, 2,2'-dipyridyl), 1,4-dialkyl-1,3-diazabutadienes, 1,4-diaryl-1,3-diazabutadienes and amines such as represented by the formulae:

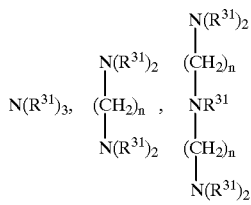

wherein $R^{31}$ is independently hydrocarbyl or substituted hydrocarbyl as previously defined and n is 2 to 10. Ureas; nitriles such as acetonitrile, benzonitrile and halogenated derivatives thereof; organic ethers such as dimethyl ether of diethylene glycol, dioxane, tetrahrydrofuran, furan diallyl ether, diethyl ether, cyclic ethers such as diethylene glycol cyclic oligomers; organic sulfides such as thioethers (diethyl sulfide); arsines; stibines; phosphines such as triarylphosphines (e.g., triphenylphosphine), trialkylphosphines (e.g., trimethyl, triethyl, tripropyl, tripentacosyl, and halogenated derivatives thereof), bis(diphenylphosphino)ethane, bis(diphenylphosphino)propane, bis(dimethylphosphino) propane, bis(diphenylphosphino)butane, (S)-(–)2,2'-bis(diphenylphosphino)-1,1'-binaphthyl, (R)-(+)-2,2'-bis(diphenylphosphino)-1,1'-binaphthyl, and bis(2-diphenylphosphinoethyl)phenylphosphine; phosphine oxides, phosphorus halides; phosphites represented by the formula:

$P(OR^{31})_3$ wherein $R^{31}$ independently represents a hydrocarbyl or substituted hydrocarbyl as previously defined; phosphorus oxyhalides; phosphonates; phosphonites, phosphinites, ketones; sulfoxides such as ($C_1$ to $C_{20}$) alkylsulfoxides; ($C_6$ to $C_{20}$) arylsulfoxides, ($C_7$ to $C_{40}$) alkarylsulfoxides, and the like. It should be recognized that the foregoing neutral ligands can be utilized as optional third components as will be described hereinbelow.

Examples of Group VIII transition metal compounds suitable as the Group VIII metal ion source include: palladium ethylhexanoate, trans-Pd $Cl_2(PPh_3)_2$, palladium (II) bis(trifluoroacetate), palladium (II) bis(acetylacetonate), palladium (II) 2-ethylhexanoate, $Pd(acetate)_2(PPh_3)_2$, palladium (II) bromide, palladium (II) chloride, palladium (II) iodide, palladium (II) oxide, monoacetonitriletris(triphenylphosphine) palladium (II) tetrafluoroborate, tetrakis(acetonitrile) palladium (II) tetrafluoroborate, dichlorobis(acetonitrile) palladium (II), dichlorobis(triphenylphosphine) palladium (II), dichlorobis(benzonitrile) palladium (II), palladium acetylacetonate, palladium bis(acetonitrile) dichloride, palladium bis(dimethylsulfoxide) dichloride, nickel acetylacetonates, nickel carboxylates, nickel dimethylglyoxime, nickel ethylhexanoate, $NiCl_2(PPh_3)_2$, $NiCl_2(PPh_2CH_2)_2$, $(P(cyclohexyl)_3)H$ $Ni(Ph_2P(C_6H_4)CO_2)$, $(PPh_3)$ $(C_6H_5)Ni$ $(Ph_2$ $PCH=C(O)Ph)$, bis(2,2,6,6-tetramethyl-3,5-heptanedionate) nickel (II), nickel (II) hexafluoroacetylacetonate tetrahrydrate, nickel (II) trifluoroacetylacetonate dihydrate, nickel (II) acetylacetonate tetrahrydrate, nickelocene, nickel (II) acetate, nickel bromide, nickel chloride, dichlorohexyl nickel acetate, nickel lactate, nickel oxide, nickel tetrafluoroborate, bis(allyl)nickel, bis(cyclopentadienyl)nickel, cobalt neodecanoate, cobalt (II) acetate, cobalt (II) acetylacetonate, cobalt (III) acetylacetonate, cobalt (II) benzoate, cobalt chloride, cobalt bromide, dichlorohexyl cobalt acetates, cobalt (II) stearate, cobalt (II) tetrafluoroborate, iron napthenate, iron (II) chloride, iron (III) chloride, iron (II) bromide, iron (III) bromide, iron (II) acetate, iron (III) acetylacetonate, ferrocene, ruthenium tris(triphenylphosphine) dichloride, ruthenium tris(triphenylphosphine) hydrido chloride, ruthenium trichloride, ruthenium tetrakis(acetonitrile) dichloride, ruthenium tetrakis(dimethylsulfoxide) dichloride, rhodium chloride, rhodium tris(triphenylphosphine) trichloride.

The organoaluminum component of the multicomponent catalyst system of the present invention is represented by the formula:

$AlR^{32}_{3-x}Q_x$ wherein $R^{32}$ independently represents linear and branched ($C_1$ to $C_{20}$) alkyl, ($C_6$ to $C_{24}$) aryl, ($C_7$ to $C_{20}$) aralkyl, ($C_3$ to $C_{10}$) cycloalkyl; Q is a halide or pseudohalide selected from chlorine, fluorine, bromine, iodine, linear and branched ($C_1$ to $C_{20}$) alkoxy, ($C_6$ to $C_{24}$) aryloxy; and x is 0 to 2.5, preferably 0 to 2.

Representative organoaluminum compounds include trialkylaluminums such as trimethylaluminum, triethylaluminum, tripropylaluminum, triisopropylaluminum, triisobutylaluminum, tri-2-methylbutylaluminum, tri-3-methylbutylaluminum, tri-2-methylpentylaluminum, tri-3-methylpentylaluminum, tri-4-methylpentylaluminum, tri-2-methylhexylaluminum, tri-3-methylhexylaluminum, trioctylaluminum, tris-2-norbornylaluminum, and the like; dialkylaluminum halides such as dimethylaluminum chloride, diethylaluminum chloride, diisopropylaluminum chloride, diisobutylaluminum chloride, and the like; monoalkylaluminum dihalides such as methylaluminum dichloride, ethylaluminum dichloride, ethylaluminum diiodide, propylaluminum dichloride, isopropylaluminum dichloride, butylaluminum dichloride, isobutylaluminum dichloride, and the like; and alkylaluminum sesquihalides such as methylaluminum sesquichloride, ethylaluminum sesquichloride, propylaluminum sesquichloride, isobutylaluminum sesquichloride, and the like.

The dialkylaluminum hydride is selected from linear and branched ($C_1$ to $C_{10}$) dialkylaluminum hydride, with diisobutylaluminum hydride being a preferred dialkylaluminum hydride compound.

The dialkyl zinc compounds are selected from linear and branched ($C_1$ to $C_{10}$) dialkyl zinc compounds with diethyl zinc being preferred. The dialkyl magnesium compounds are selected from linear and branched ($C_1$ to $C_{10}$) dialkyl magnesium with dibutyl magnesium being the most preferred. The alkyl lithiums are selected from linear and branched ($C_1$ to $C_{10}$) alkyl lithium compounds. Butyllithium is the preferred alkyl lithium.

In the practice of the present invention, the catalytic system obtained from the Group VIII metal ion source is utilized with one or both of a component selected from the group of cocatalyst compounds, and third component compounds.

Examples of third components are Lewis acids such as the $BF_3$.etherate, $TiCl_4$, $SbF_5$, tris(perfluorophenyl)boron, $BCl_3$, $B(OCH_2CH_3)_3$; strong Brønsted acids such as hexafluoroantimonic acid ($HSbF_6$), $HPF_6$ hydrate, trifluoroacetic acid ($CF_3CO_2H$), and $FSO_3H.SbF_5$, $H_2C(SO_2CF_3)_2$ $CF_3SO_3H$, and paratoluenesulfonic acid; halogenated compounds such as hexachloroacetone, hexafluoroacetone, 3-butenoic acid-2,2,3,4,4-pentachlorobutylester, hexafluoroglutaric acid, hexafluoroisopropanol, and chloranil, i.e.,

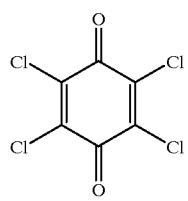

electron donors such as phosphines and phosphites and olefinic electron donors selected from ($C_4$ to $C_{12}$) aliphatic and ($C_6$ to $C_{12}$) cycloaliphatic diolefins, such as butadiene, cyclooctadiene, and norbornadiene.

Acidity of strong Brønsted acids can be gauged by determining their Hammett acidity function $H_0$. A definition of the Hammett acidity function is found in *Advanced Inorganic Chemistry* by F. A. Cotton and G. Wilkinson, Wiley-Interscience, 1988, p. 107.

As set forth above the neutral ligands can be employed as optional third components with electron donating properties.

In one embodiment of the invention, the multicomponent catalyst system can be prepared by a process which comprises mixing the catalyst components, i.e., the Group VIII metal compound, the cocatalyst compound, and third component (if employed), together in a hydrocarbon or halohydrocarbon solvent and then mixing the premixed catalyst system in the reaction medium comprising at least one silyl functional polycyclic monomer. Alternatively, (assuming the optional third component is utilized), any two of the catalyst system components can be premixed in a hydrocarbon or halohydrocarbon solvent and then introduced into the reaction medium. The remaining catalyst component can be added to the reaction medium before or after the addition of the premixed components.

In another embodiment, the multicomponent catalyst system can be prepared in situ by mixing together all of the catalyst components in the reaction medium. The order of addition is not important.

In one embodiment of the multicomponent catalyst system of the present invention, a typical catalyst system comprises a Group VIII transition metal salt, e.g., nickel ethylhexanoate, an organoaluminum compound, e.g., triethylaluminum, and a mixture of third components, e.g., $BF_3$.etherate and hexafluoroantimonic acid ($HSbF_6$), in a preferred molar ratio of Al/$BF_3$.etherate/Ni/acid of 10/9/1/0.5-2. The reaction scheme is written as follows:

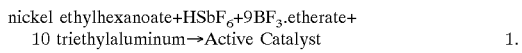

In another embodiment of the multicomponent catalyst system of the invention, the catalyst system comprises a nickel salt, e.g., nickel ethylhexanoate, an organoaluminum compound, e.g., triethylaluminum, and a third component Lewis acid, e.g., tris(perfluorophenyl)boron as shown in the following scheme:

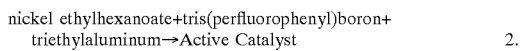

In another embodiment of the multicomponent catalyst system of the invention the third component is a halogenated compound selected from various halogenated activators. A typical catalyst system comprises a Group VIII transition metal salt, an organoaluminum, and a third component halogenated compound as shown below:

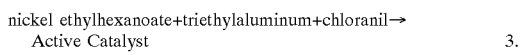

In still another embodiment of the multicomponent catalyst system of this invention no cocatalyst is present. The catalyst system comprises a Group VIII metal salt (e.g. 3-allylnickelbromide dimer and a Lewis acid (e.g. tris(perfluorophenyl)boron as shown below:

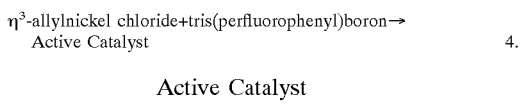

Active Catalyst

We have found that the choice of Group VIII metal in the metal cation complex of both the single and multicomponent catalyst systems of this invention influences the microstructure and physical properties of the polymers obtained. For example, we have observed that palladium catalysts typically afford norbornene units which are exclusively 2,3 enchained and showing some degree of tacticity. The polymers catalyzed by the type 2 catalyst systems and the single component catalyst systems of the formula $E_nNi(C_6F_5)_2$ described above contain a perfluorophenyl group at at least one of the two terminal ends of the polymer chain. In other words, a perfluorophenyl moiety can be located at one or both terminal ends of the polymer. In either case the perfluorophenyl group is covalently bonded to and pendant from a terminal polycyclic repeating unit of the polymer backbone.

Reactions utilizing the single and multicomponent catalysts of the present invention are carried out in an organic solvent which does not adversely interfere with the catalyst system and is a solvent for the monomer. Examples of organic solvents are aliphatic (non-polar) hydrocarbons such as pentane, hexane, heptane, octane and decane; alicyclic hydrocarbons such as cyclopentane and cyclohexane; aromatic hydrocarbons such as benzene, chlorobenzene, o-dichlorobenzene, toluene, and xylenes; halogenated (polar) hydrocarbons such as methylene chloride, chloroform, carbon tetrachloride, ethyl chloride, 1,1-dichloroethane, 1,2-dichloroethane, 1,2-dichloroethylene, 1-chloropropane, 2-chloropropane, 1-chlorobutane, 2-chlorobutane, 1-chloro-2-methylpropane, and 1-chloropentane.

The choice of reaction solvent is made on the basis of a number of factors including the choice of catalyst and whether it is desired to run the polymerization as a slurry or solution process. For most of the catalysts described in this invention, the preferred solvents are chlorinated hydrocarbons such as methylene chloride and 1,2-dichloroethane and aromatic hydrocarbons such as chlorobenzene and nitrobenzene, with simple hydrocarbons being less preferred due to the resulting lower conversion of the functional NB-type monomer(s). Surprisingly we have discovered that certain of the catalyst systems, most notably the multicomponent catalysts based on Group VIII metal compounds and alkylaluminum halides, specifically, monoalkylaluminum dihalides, (e.g., ethylaluminum dichloride), and the type 2 catalysts referred to above also give excellent results (and high monomer conversion) when run in simple hydrocarbons such as heptane, cyclohexane, and toluene.

The molar ratio of total monomer to Group VIII metal for the single and multicomponent catalysts can run from 20:1 to 100,000:1, preferably 50:1 to 20,000:1, and most preferably 100:1 to 10,000:1.

In the multicomponent catalyst systems, the cocatalyst metal (e.g., aluminum, zinc, magnesium, and lithium) to Group VIII metal molar ratio ranges from less than or equal to 100:1, preferably less than or equal to 30:1, and most preferably less than or equal to 20:1.

The third component is employed in a molar ratio to Group VIII metal ranging from 0.25:1 to 20:1. When acids are employed as third components, the acid to Group VIII metal range is less than or equal to 4:1, preferably less than or equal to 2:1.

The temperature at which the polymerization reactions of the present invention are carried out typically ranges from −100° C. to 120° C., preferably −60° C. to 90° C., and most preferably −10° C. to 80° C.

The optimum temperature for the present invention is dependent on a number of variables, primarily the choice of catalyst and the choice of reaction diluent. Thus, for any given polymerization the optimum temperature will be experimentally determined taking these variables into account.

In the course of developing these catalyst and polymer systems we have observed that the palladium-carbon bond which links the palladium catalysts to the growing polymer chain is particularly stable. This is a major benefit in polymerizing polycyclic monomers bearing acid labile groups, esters and carboxylic acid functionalities since the palladium catalysts are extremely tolerant to such functionalities. However, this stability also makes it very difficult to remove the palladium catalyst residues from the resulting polymer. During the development of these new compositions, we discovered that the palladium-carbon bond can be conveniently cleaved (resulting in precipitation of palladium metal which can be removed by filtration or centrifugation) using carbon monoxide, preferably in the presence of a protic solvent such as an alcohol, moisture, or a carboxylic acid.

The polymers obtained by the process of the present invention are produced in a molecular weight ($M_n$) range from about 1,000 to about 1,000,000, preferably from about 2,000 to about 700,000, and more preferably from about 5,000 to about 500,000 and most preferably from about 10,000 to about 50,000.

Molecular weight can be controlled by changing the catalyst to monomer ratio, i.e., by changing the initiator to monomer ratio. Lower molecular weight polymers and oligomers may also be formed in the range from about 500 to about 500,000 by carrying out the polymerization in the presence of a chain transfer agent. Macromonomers or oligomers comprising from 4 to 50 repeating units can be prepared in the presence of a CTA (Chain Transfer Agent) selected from a compound having a terminal olefinic double bond between adjacent carbon atoms, wherein at least one of the adjacent carbon atoms has two hydrogen atoms attached thereto. The CTA is exclusive of styrenes (non-styrenes), vinyl ethers (non-vinyl ether) and conjugated dienes. By non-styrenic, non-vinyl ether is meant that compounds having the following structures are excluded from the chain transfer agents of this invention:

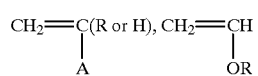

wherein A is an aromatic substituent and R is hydrocarbyl.

The preferred CTA compounds of this invention are represented by the following formula:

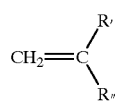

wherein R, and R,, independently represent hydrogen, branched or unbranched ($C_1$ to $C_{40}$) alkyl, branched or unbranched ($C_2$ to $C_{40}$) alkenyl, and halogen.

Of the above chain transfer agents the α-olefins having 2 to 10 carbon atoms are preferred, e.g., ethylene, propylene, 4-methyl-1-pentene, 1-hexene, 1-decene, 1,7-octadiene, and 1,6-octadiene, or isobutylene. Other CTA's include allyl halides such as allyl chlorides, allyl bromides, etc., allyl trifluoro-acetates, β-pineres, α-pineres.

While the optimum conditions for any given result should be experimentally determined by a skilled artisan taking into the account all of the above factors there are a number of general guidelines which can be conveniently utilized where appropriate. We have learned that, in general, α-olefins (e.g., ethylene, propylene, 1-hexene, 1-decene, 4-methyl-1-pentene) are the most effective chain transfer agents with 1,1-disubstituted olefins (e.g., isobutylene) being less efficient. In other words, all other things being equal, the concentration of isobutylene required to achieve a given molecular weight will be much higher than if ethylene were chosen. Styrenic olefins, conjugated dienes, and vinyl ethers are not effective as chain transfer agents due to their propensity to polymerize with the catalysts described herein.

The CTA can be employed in an amount ranging from about 0.10 mole % to over 50 mole % relative to the moles of total NB-type monomer. Preferably, the CTA is employed in the range of 0.10 to 10 mole %, and more preferably from 0.1 to 5.0 mole %. As discussed above, depending on catalyst type and sensitivities, CTA efficiencies and desired end group, the concentration of CTA can be in excess of 50 mole % (based on total NB-functional monomer present), e.g., 60 to 80 mole %. Higher concentrations of CTA (e.g., greater than 100 mole %) may be necessary to achieve the low molecular weight embodiments of this invention such as in oligomer and macromonomer applications. It is important and surprising to note that even such high concentrations the CTA's (with the exception of isobutylene) do not copolymerize into the polymer backbone but rather insert as terminal end-groups on each polymer chain. Besides chain transfer, the process of the present invention affords a way by which a terminal α-olefinic end group can be placed at the end of a polymer chain.

Polymers of the present invention that are prepared in the presence of the instant CTA's have molecular weights ($M_n$) ranging from about 1,000 to about 500,000, preferably from about 2,000 to about 300,000, and most preferably from about 5,000 to about 200,000.

The photoresist compositions of the present invention comprise the disclosed polycyclic compositions, a solvent, and an photosensitive acid generator (photoinitiator). Optionally, a dissolution inhibitor can be added in an amount of up to about 20 weight % of the composition. A suitable dissolution inhibitor is t-butyl cholate (J. V. Crivello et al., Chemically Amplified Electron-Beam Photoresists, *Chem. Mater.*, 1996, 8, 376–381).

Upon exposure to radiation, the radiation sensitive acid generator generates a strong acid. Suitable photoinitiators include triflates (e.g., triphenylsulfonium triflate), pyrogallol (e.g., trimesylate of pyrogallol); onium salts such as triarylsulfonium and diaryliodium hexafluoroantimonates, hexafluoroarsenates, trifluoromethanesulfonates; esters of hydroxyimides, α,α'-bis-sulfonyl-diazomethanes, sulfonate esters of nitro-substituted benzyl alcohols and napthoquinone-4-diazides. Other suitable photoacid initiators are disclosed in Reichmanis et al., *Chem. Mater.* 3, 395, (1991). Compositions containing triarylsulfonium or diaryliodonium salts are preferred because of their sensitivity to deep UV light (193 to 300 nm) and give very high resolution images. Most preferred are the unsubstituted and symmetrically or unsymmetrically substituted diaryliodium or triarylsulfonium salts. The photoacid initiator component comprises about 1 to 100 w/w % to polymer. The preferred concentration range is 5 to 50 w/w %.

The photoresist compositions of the present invention optionally contain a sensitizer capable of sensitizing the photoacid initiator to longer wave lengths ranging from mid UV to visible light. Depending on the intended application, such sensitizers include polycyclic aromatics such as pyrene and perlene. The sensitization of photoacid initiators is well-known and is described in U.S. Pat. Nos. 4,250,053; 4,371,605; and 4,491,628 which are all incorporated herein by reference. The invention is not limited to a specific class of sensitizer or photoacid initiator.

The present invention also relates to a process for generating a positive tone resist image on a substrate comprising the steps of: (a) coating a substrate with a film comprising the positive tone resist composition of the present invention; (b) imagewise exposing the film to radiation; and (c) developing the image.

The first step involves coating the substrate with a film comprising the positive tone resist composition dissolved in a suitable solvent. Suitable substrates are comprised of silicon, ceramics, polymer or the like. Suitable solvents include propylene glycol methyl ether acetate (PGMEA) cyclohexanone, butyrolactate, ethyl lactate, and the like. The film can be coated on the substrate using art known techniques such as spin or spray coating, or doctor blading. Preferably, before the film has been exposed to radiation, the film is heated to an elevated temperature of about 90° C. to 150° C. for a short period of time of about 1 min. In the second step of the process, the film is imagewise exposed to radiation suitably electron beam or electromagnetic preferably electromagnetic radiation such as ultraviolet or x-ray, preferably ultraviolet radiation suitably at a wave length of about 193 to 514 nm preferably about 193 nm to 248 nm. Suitable radiation sources include mercury, mercury/xenon, and xenon lamps, x-ray or e-beam. The radiation is absorbed by the radiation-sensitive acid generator to produce free acid in the exposed area. The free acid catalyzes the cleavage of the acid labile pendant group of the copolymer which converts the copolymer from dissolution inhibitor to dissolution enhancer thereby increasing the solubility of the exposed resist composition in an aqueous base. Surprisingly, the exposed resist composition is readily soluble in aqueous base. This solubility is surprising and unexpected in light of the complex nature of the cycloaliphatic backbone and the high molecular weight of the norbornene monomer units bearing the carboxylic acid functionality. Preferably, after the film has been exposed to radiation, the film is again heated to an elevated temperature of about 90° C. to 150° C. for a short period of time of about 1 minute.

The third step involves development of the positive tone image with a suitable solvent. Suitable solvents include aqueous base preferably an aqueous base without metal ions such as tetramethyl ammonium hydroxide or choline. The composition of the present invention provides positive images with high contrast and straight walls. Uniquely, the dissolution property of the composition of the present invention can be varied by simply varying the composition of the copolymer.

The present invention also relates to an integrated circuit assembly such as an integrated circuit chip, multichip module, or circuit board made by the process of the present invention. The integrated circuit assembly comprises a circuit formed on a substrate by the steps of: (a) coating a substrate with a film comprising the positive tone resist composition of the present invention; (b) imagewise exposing the film to radiation; (c) developing the image to expose the substrate; and (d) forming the circuit in the developed film on the substrate by art known techniques.

After the substrate has been exposed, circuit patterns can be formed in the exposed areas by coating the substrate with a conductive material such as conductive metals by art known techniques such as evaporation, sputtering, plating, chemical vapor deposition, or laser induced deposition. The surface of the film can be milled to remove any excess conductive material. Dielectric materials may also be deposited by similar means during the process of making circuits.

Inorganic ions such as boron, phosphorous, or arsenic can be implanted in the substrate in the process for making p or n doped circuit transistors. Other means for forming circuits are well known to those skilled in the art.

The following examples are detailed descriptions of methods of preparation and use of certain compositions of the present invention. The detailed preparations fall within the scope of, and serve to exemplify, the more generally described methods of preparation set forth above. The examples are presented for illustrative purposes only, and are not intended as a restriction on the scope of the invention.

As discussed above, photoresists are used to create and replicate a pattern from a photomask to a substrate. The efficacy of this transfer is determined by the wave length of the imaging radiation, the sensitivity of the photoresist and the ability of the photoresist to withstand the etch conditions which pattern the substrate in the exposed regions. Photoresists are most often used in a consumable fashion, where the photoresist is etched in the non-exposed regions (for a positive tone photoresist) and the substrate is etched in the exposed regions. Because the photoresist is organic and the substrate is typically inorganic, the photoresist has an inherently higher etch rate in the reactive ion etch (RIE) process, which necessitates that the photoresist needs to be thicker than the substrate material. The lower the etch rate of the photoresist matter, the thinner the photoresist layer has to be. Consequently, higher resolution can be obtained. Therefore, the lower the RIE rate of the photoresist, the more attractive it is from a process point of view. The etch rate is primarily determined by the polymer backbone, as shown below for the chlorine plasma etch process which is a RIE technique typically employed in semiconductor processing.

As used in the examples and throughout the specification the ratio of monomer to catalyst is based on a mole to mole basis.

| No. | Polymer | Normalized RIE Rate ($\mu$m/min) |
|---|---|---|
| 1 | Novolac resist | 1.0 |
| 2 | polyhydroxystyrene resist | 0.98 |
| 3 | 248 nm (Deep UV) (acrylate terpolymer/novolac blend, U.S. Pat. No. 5,372,912) | 1.14 |
| 4 | 193 nm (polyacrylate terpolymer, Allen et al., Proceedings SPIE, 2438(1), 474 (1995)) | 1.96 |
| 5 | homopolynorbornene | 0.83 |

Polymers 1 and 2 are primarily aromatic, whereas polymer 3 was copolymerized with a small amount of acrylate which increased its etch rate. Polymer 4 is completely based on acrylates to allow transparency at 193 nm (aromatic rings render the material opaque in this region, hence there are no viable resist candidates at 193 nm based on the traditional novolacs or p-hydroxystyrene). The etch rate almost doubled for this polymer. Polymer 5 had an etch rate even lower than the standard photoresist materials (1 & 2) in addition to providing transparency at 193 nm. Therefore, the backbone of polymer 5 (an addition cyclic olefin) prepared by a nickel multicomponent catalyst of this invention is an improvement over all previous attempts in the literature to provide a resist which functions at 193 nm with RIE characteristics comparable to commercial materials exposed at longer wave lengths. In fact, the addition cyclic olefin polymer may offer advantages in terms of etch resistance at longer wave lengths as well. It is in the literature (H. Gokan, S. Esho, and Y. Ohnishi, *J. Electrochem. Soc.* 130(1), 143 (1983)) that higher C/H ratios decreases the etch rate of polymeric materials. Based on this assumption, the etch rate of polymer 5 should be between the aromatic based systems and the acrylate systems. It is surprising that the addition cyclic olefin exhibits etch resistance superior to even the aromatic systems.

Catalyst A

Synthesis of $(PhC(O)CH_2PPh_2)Ni(C_6F_5)_2$ $[(PhC(O)CHPPh_2)Ni(Ph)]_2$ (0.150 g, 0.171 mol) was weighed into a 100 ml Kjeldahl flask in the dry box. Also in the dry box, 0.194 g of $B(C_6F_5)_3 \cdot 3H_2O$ (0.342 mol) was weighed into a separate flask. After each solid was dissolved separately in a minimum of toluene (about 15 ml each), the solution of $B(C_6F_5)_3 \cdot 3H_2O$ was added to the solution/slurry of the nickel dimer (it was not completely soluble in toluene). The mixture changed from a cloudy orange to a translucent red-brown color upon addition of the boron reagent. The solution was stirred for approximately one hour, after which time the toluene was removed in vacuo. The yellowish-brown solid was redissolved in a small amount of toluene and cooled to −20° C. A yellow solid formed which was filtered and dried in vacuo. Yield 0.108 g (45% yield). $^1$H NMR ($CD_2Cl_2$): 7.90 (d, 2H), 7.67 (t, 3H), 7.48 (m, 4H), 7.20 (m, 6H), 4.19 (d, $J_{PH}$=5 Hz, 2H). $^{31}P\{^1H\}$ NMR ($C_6D_6$): 26.8 (s). $^{19}$F NMR ($C_6D_6$): −115.8 (m, 2F), −119.0 (m, 2F), −159.8 (t, 1F), −160.9 (t, 1F), −162.9 (apparent t of d, 2F), −163.7 (apparent t, 2F). FD-MS: m/e 696 [M$^+$] exhibits expected isotope pattern for nickel, exact mass 696.021080, calculated 696.021083. CI-MS: m/e 529 [M$^+$-$C_6F_5$] exhibits expected isotope pattern for nickel, exact mass 529.029065, calculated mass 529.029067.

Catalyst A

Alternative synthesis of $(PhC(O)CH_2PPh_2)Ni(C_6F_5)_2$ $PhC(O)CH_2PPh_2$ was prepared as described in *Inorg. Chem.* 1986, 25, 3765. ($^6$-toluene)Ni$(C_6F_5)_2$ (0.10 g, 0.21 mmol) was dissolved in 10 ml of toluene. To this solution $PPh_2CH_2C(O)Ph$ (0.063 g, 0.21 mmol) in 10 ml of toluene was added dropwise. The color of the solution turned yellow-brown after 10 min., and a yellow powder began to precipitate from solution. After stirring at room temperature for 1 hour, the solvent was removed in vacuo resulting in a yellow solid. This was dissolved in 10 ml of $CH_2Cl_2$, filtered and stored at −20° C. Bright yellow crystals were obtained in quantitative yield after 2 days. The x-ray crystal structure of $(PhC(O)CH_2PPh_2)Ni(C_6F_5)_2$ is shown in FIG. 1.

Catalyst B

Synthesis of cis-Ni(THF)$_2$(C$_6$F$_5$)$_2$

Figure 2:
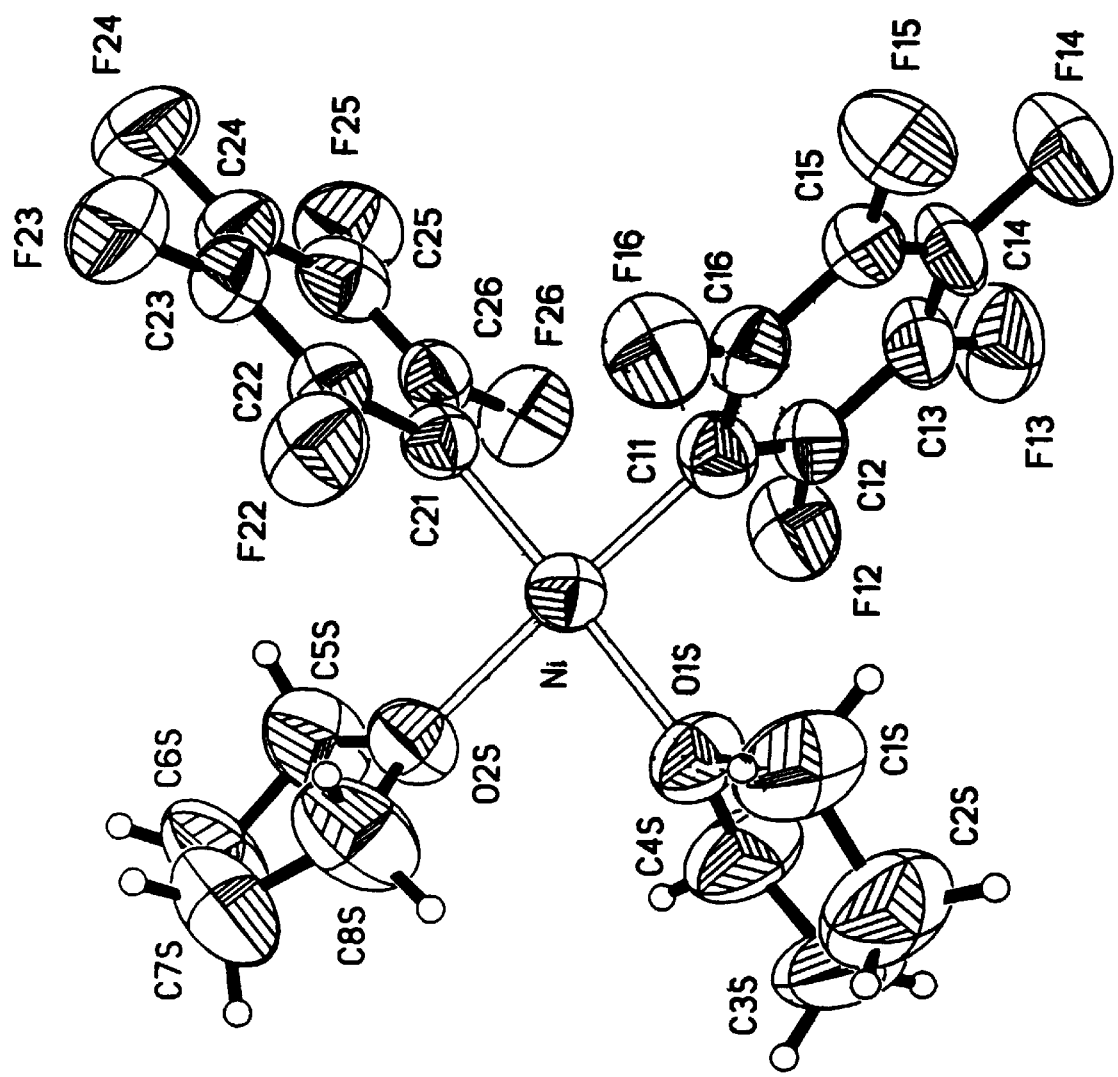
FIG. 2 is an ORTEP drawing of the catalyst $(THF)_2Ni(C_6F_5)_2$.

Pentafluorophenylbromide (12.9 g) was added slowly (1 ml every 20 min.) via an addition funnel to a flask containing of magnesium turnings in 50 ml of THF equipped with a stir bar and a condenser. During the addition of the bromide, the THF solution turned dark and began to reflux. After about 2 hours, the resulting brown solution was added to a flask containing NiBr$_2$ (5.03 g) in 25 ml of THF. The resulting mixture was then refluxed for 2 hours to give a red solution. The solution was allowed to cool and 35 ml of 1,4-dioxane was added. The solution became orange and insoluble material appeared. The mixture was stored at 5° C. overnight. The next day, the solution was allowed to warm to room temperature and then filtered to remove insoluble material. The insoluble material was washed with 1,4-dioxane to give a grey material. The red-orange filtrate was placed stored at −20° C. overnight. The next day 3.0 g (23% yield) of orange crystalline cis-Ni(THF)$_2$(C$_6$F$_5$)$_2$ were collected. The x-ray crystal structure of cis-Ni(THF)$_2$(C$_6$F$_5$)$_2$ is shown in FIG. 2.

Catalyst B
Alternative Synthesis of cis-Ni(THF)$_2$(C$_6$F$_5$)$_2$

To a cold (−78° C.) slurry of Ni(COD)$_2$ (10.0 g) in a mixture of THF (30 ml) and diethylether (40 ml) was added a solution of C$_6$F$_5$C(O)Cl (8.4 g) in 25 ml of diethylether dropwise. No color change was evident after addition. The mixture was warmed to 0° C. for 1 hour. During this time the color of the solution changed to orange and an orange precipitate formed. After warming to room temperature all of the yellow nickel starting material was consumed to yield an orange solution and solid. The slurry was concentrated in vacuo (to ca. 20 ml) and cyclohexane was added (120 ml) to precipitate out any remaining soluble material. The solvents were decanted and washed with cyclohexane (2×25 ml). The solid was dried in vacuo.

The orange solid was extracted twice with 50 ml of toluene. During the extractions, the initial light orange solution became red-orange. The extractions were combined and cooled to −20° C. to yield orange crystals. The mother liquor was stripped of solvent and extracted once again with toluene (2×50 ml), combined and cooled to −20° C. After a few days, this solution yielded a second batch of orange crystals. The combined yields were 13%. The crystals decomposed at 183° C. and were pure by NMR spectroscopy.

Catalyst C
Synthesis of (Toluene)Ni(C$_6$F$_5$)$_2$

This procedure followed a previously published method found in *Organometallics* 1985, 4, 571. Magnesium turnings (0.945 g) was weighed in a three neck 250 ml flask equipped with gas inlet, stir bar, and addition funnel (a reflux condenser is also recommended). After purging with argon, 10 ml of dry diethylether was added. With stirring, bromopentafluorobenzene (1 ml) was added dropwise at room temperature. Ten minutes after the addition of bromopentafluorobenzene, a light brown color appeared in the ethereal solution. At this point, a solution of bromopentafluorobenzene (3.38 ml) in 15 ml of ether was added dropwise at a rate which maintained reflux of the ether. The brown color became very dark. The mixture was stirred for 1 hour at room temperature.

In the dry box, anhydrous nickel bromide (3.83 g) was weighed into a 200 ml Kjeldahl flask equipped with a stir bar. Only finely divided nickel bromide powder was used. Also in the dry box silver trifluoroacetate (7.78 g) was weighed into a solid addition tube which was subsequently attached to the Kjeldahl. About 75 ml of diethylether was added to the nickel bromide to give an orange slurry. To this slurry was added the solid silver salt which gave a slightly exothermic reaction and a green solution of the soluble nickel salt. The reaction mixture was allowed to continue to stir for three hours. The orange color of the insolubles changed to a dull yellow-orange as silver bromide replaced the nickel bromide. The mixture was filtered to yield a green solution that was used in the step below.

The Grignard solution was cooled to 0° C. and the nickel trifluoroacetate solution was added dropwise over 30 min. The solution was stirred for one hour at 0° C. and then allowed to warm to room temperature. Then 40 ml of toluene was added to the solution. The resulting dark brown solution was evaporated to dryness. To the resulting dark brown solid was added 100 ml of toluene and the brown solution with a grey solid was stirred overnight. The slurry was concentrated to about 25 ml with heating to 45–50° C. The grey solid was filtered and washed with toluene (2×20 ml). The solutions were combined and dried overnight in vacuo. The resulting light brown solid was extracted with 50 ml of toluene and filtered. The insoluble grey solid was washed with 5 ml of toluene and the solutions were combined. Slow evaporation of the dark brown solution to ca. 5 ml gave a crystalline material. The remaining solvent was evaporated and the crystals were washed with heptane and filtered and dried in vacuo to give 4.59 g (54%) of brick red crystals.

Catalyst A
Synthesis of (PhC(O)CH$_2$PPh$_2$)Ni(C$_6$F$_5$)$_2$

[(PhC(O)CHPPh$_2$)Ni(Ph)]$_2$ (0.150 g, 0.171 mol) was weighed into a 100 ml Kjeldahl flask in the dry box. Also in the dry box, 0.194 g of B(C$_6$F$_5$)$_3$·3H$_2$O (0.342 mol) was weighed into a separate flask. After each solid was dissolved separately in a minimum of toluene (about 15 ml each), the solution of B(C$_6$F$_5$)$_3$·3H$_2$O was added to the solution/slurry of the nickel dimer (it was not completely soluble in toluene). The mixture changed from a cloudy orange to a translucent red-brown color upon addition of the boron reagent. The solution was stirred for approximately 1 hour, after which time the toluene was removed in vacuo. The yellowish-brown solid was redissolved in a small amount of toluene and cooled to −20° C. A yellow solid formed which was filtered and dried in vacuo. Yield 0.108 g (45% yield). $^1$H NMR (CD$_2$Cl$_2$): 7.90 (d, 2H), 7.67 (t, 3H), 7.48 (m, 4H), 7.20 (m, 6H), 4.19 (d, J$_{PH}$=5 Hz, 2H). $^{31}$P{$^1$H} NMR (C$_6$D$_6$): 26.8 (s). $^{19}$F NMR (C$_6$D$_6$): −115.8 (m, 2F), −119.0 (m, 2F), −159.8 (t, 1F), −160.9 (t, 1F), −162.9 (apparent t of d, 2F), −163.7 (apparent t, 2F). FD-MS: m/e 696 [M$^+$] exhibits expected isotope pattern for nickel, exact mass 696.021080, calculated 696.021083. CI-MS: m/e 529 [M$^+$C$_6$F$_5$] exhibits expected isotope pattern for nickel, exact mass 529.029065, calculated mass 529.029067.

Catalyst A
Alternative Synthesis of (PhC(O)CH$_2$PPh$_2$)Ni(C$_6$F$_5$)

PhC(O)CH$_2$PPh$_2$ was prepared as described in *Inorg Chem.* 1986, 25, 3765. (η$^6$-toluene)Ni(C$_6$F$_5$)$_2$ (0.10 g, 0.21 mmol) was dissolved in 10 ml of toluene. To this solution PPh$_2$CH$_2$C(O)Ph (0.063 g, 0.21 mmol) in 10 ml of toluene was added dropwise. The color of the solution turned yellow-brown after 10 min., and a yellow powder began to precipitate from solution. After stirring at room temperature for 1 hour, the solvent was removed in vacuo resulting in a yellow solid. This was dissolved in 10 ml of CH$_2$Cl$_2$, filtered and stored at −20° C. Bright yellow crystals were obtained in quantitative yield after 2 days. The x-ray crystal structure of (PhC(O)CH$_2$PPh$_2$)Ni(C$_6$F$_5$)$_2$ is shown in FIG. 1.

Catalyst B
Synthesis of cis-Ni(THF)$_2$(C$_6$F$_5$)$_2$

Pentafluorophenylbromide (12.9 g) was added slowly (1 ml every 20 min.) via an addition funnel to a flask containing magnesium turnings in 50 ml of THF equipped with a stir bar and a condenser. During the addition of the bromide, the THF solution turned dark and began to reflux. After about 2 hours, the resulting brown solution was added to a flask containing NiBr$_2$ (5.03 g) in 25 ml of THF. The resulting mixture was then refluxed for 2 hours to give a red solution. The solution was allowed to cool and 35 ml of 1,4-dioxane was added. The solution became orange and insoluble material appeared. The mixture was stored at 5° C. overnight. The next day, the solution was allowed to warm to room temperature and then filtered to remove insoluble material. The insoluble material was washed with 1.4-dioxane to give a grey material. The red-orange filtrate was placed stored at −20° C. overnight. The next day 3.0 g (23% yield) of orange crystalline cis-Ni(THF)$_2$(C$_6$F$_5$)$_2$ were collected. The x-ray crystal structure of cis-Ni(THF)$_2$(C$_6$F$_5$)$_2$ is shown in FIG. 2.

Catalyst B
Alternative Synthesis of cis-Ni(THF)$_2$(C$_6$F$_5$)$_2$

To a cold (−78° C.) slurry of Ni(COD)$_2$ (10.0 g) in a mixture of THF (30 ml) and diethylether (40 ml) was added a solution of C$_6$F$_5$C(O)Cl (8.4 g) in 25 ml of diethylether dropwise. No color change was evident after addition. The mixture was warmed to 0° C. for 1 hour. During this time the color of the solution changed to orange and an orange precipitate formed. After warming to room temperature all of the yellow nickel starting material was consumed to yield an orange solution and solid. The slurry was concentrated in vacuo (to ca. 20 ml) and cyclohexane was added (120 ml) to precipitate out any remaining soluble material. The solvents were decanted and washed with cyclohexane (2×25 ml). The solid was dried in vacuo.

The orange solid was extracted twice with 50 ml of toluene. During the extractions, the initial light orange solution became red-orange. The extractions were combined and cooled to −20° C. to yield orange crystals. The mother liquor was stripped of solvent and extracted once again with toluene (2×50 ml), combined and cooled to −20° C. After a few days, this solution yielded a second batch of orange crystals. The combined yields were 13%. The crystals decomposed at 183° C. and were pure by NMR spectroscopy.

Catalyst C
Synthesis of (Toluene)Ni(C$_6$F$_5$)$_2$

This procedure followed a previously published method found in *Organometallics* 1985, 4, 571. Magnesium turnings (0.945 g) was weighed in a three neck 250 ml flask equipped with gas inlet, stir bar, and addition funnel (a reflux condenser is also recommended). After purging with argon, 10 ml of dry diethylether was added. With stirring, bromopentafluorobenzene (1 ml) was added dropwise at room temperature. Ten minutes after the addition of bromopentafluorobenzene, a light brown color appeared in the ethereal solution. At this point, a solution of bromopentafluorobenzene (3.38 ml) in 15 ml of ether was added dropwise at a rate which maintained reflux of the ether. The brown color became very dark. The mixture was stirred for 1 hour at room temperature.

In the dry box, anhydrous nickel bromide (3.83 g) was weighed into a 200 ml Kjeldahl flask equipped with a stir bar. Only finely divided nickel bromide powder was used. Also in the dry box silver trifluoroacetate (7.78 g) was weighed into a solid addition tube which was subsequently attached to the Kjeldahl. About 75 ml of diethylether was added to the nickel bromide to give an orange slurry. To this slurry was added the solid silver salt which gave a slightly exothermic reaction and a green solution of the soluble nickel salt. The reaction mixture was allowed to continue to stir for three hours. The orange color of the insolubles changed to a dull yellow-orange as silver bromide replaced the nickel bromide. The mixture was filtered to yield a green solution of nickel trifluoroacetate (II) that was used in the step below.

The Grignard solution was cooled to 0° C. and the green nickel trifluoroacetate solution was added dropwise over 30 min. The solution was stirred for one hour at 0° C. and then allowed to warm to room temperature. Then 40 ml of toluene was added to the solution. The resulting dark brown solution was evaporated to dryness. To the resulting dark brown solid was added 100 ml of toluene and the brown solution with a grey solid was stirred overnight. The slurry was concentrated to about 25 ml with heating to 45–50° C. The grey solid was filtered and washed with toluene (2×20 ml). The solutions were combined and the solvent was removed overnight in vacuo. The resulting light brown solid was extracted with 50 ml of toluene and filtered. The insoluble grey solid was washed with 5 ml of toluene and the solutions were combined. Slow evaporation of the dark brown solution to ca. 5 ml gave a crystalline material. The remaining solvent was evaporated and the crystals were washed with heptane and filtered and dried in vacuo to give 4.59 g (54%) of brick red crystals.

Catalyst D
Synthesis of (Ph$_2$NC(O)CH$_2$PPh$_2$)Ni(C$_6$F$_5$)$_2$

Ph$_2$NC(O)CH$_2$PPh$_2$ was prepared as described in *J. Chem. Res.* (S), 1993, 380. ($\eta^6$-toluene)Ni(C$_6$F$_5$)$_2$ (0.10 g, 0.21 mmol) was dissolved in 5 ml of toluene. To this solution Ph$_2$NC(O)CH$_2$PPh$_2$ (0.081 g, 0.21 mmol) in 5 ml of toluene was added dropwise. The color of the solution turned light yellow-brown. After stirring at room temperature for 1 hour, the solvent was removed in vacuo resulting in a light yellow powder.

Catalyst E
Synthesis of (PhC(O)CH$_2$CH$_2$PPh$_2$)Ni(C$_6$F$_5$)$_2$ (PhC(O)CH$_2$CH$_2$PPh$_2$) was prepared as described in *J. Pract. Chem.* 1972, 315. ($\eta^6$-toluene)Ni(C$_6$F$_5$)$_2$ (0.50 g, 1.0 mmol) was dissolved in 20 ml of toluene. To this solution PPh$_2$CH$_2$C(O)Ph (0.33 g, 1.0 mmol) in 10 ml of toluene was added dropwise. The color of the solution turned yellow after 10 m. After 1 hour, the solvent was removed in vacuo to yield a solid.

Catalyst F

Ni(COD)$_2$ (0.60 g) was dissolved in 30 ml of THF. A solution of pentafluorobenzoyl chloride (0.315 ml in 3 ml of THF) was added to the above solution. An immediate color change from yellow to orange occurred. The solution was stirred for 30 min. at room temperature after which the volume of the solution was reduced in vacuo to about 3 ml. To this solution was added cyclohexane to precipitate a pink solid. The solvent was decanted and the product was dried in vacuo for 1 hour. Yield 0.80 g.

Catalyst G

Ni(COD)$_2$ (3.0 g) was dissolved in 100 ml of toluene. To this solution was added a solution of pentafluorobenzoic acid (2.33 g in 30 ml of toluene) was added to the above solution. An immediate color change from yellow to red/brown occurred. The solution was stirred for 1 hour at room temperature after which time the toluene was removed in vacuo. The resulting brown solid was dissolved in hot cyclohexane and allowed to cool resulting in a brown powder. The solvent was decanted and the powder was dried in vacuo. Yield 2.8 g.

Catalyst H

Ni(THF)$_2$(C$_6$F$_5$)$_2$ (0.126 g) was dissolved in about 10 ml of toluene. To this solution was added 0.050 ml of beta-pinene in 2 ml of toluene. The orange color of the starting material changed immediately to blue. The solution was stirred for two hours at room temperature after which time the solvent was removed in vacuo to give a blue, grey solid.

Catalyst I

Ni(COD)$_2$ (0.130 g) was dissolved in 10 ml of THF and cooled to −78° C. To this solution was added a solution of 2,4,6-trifluorobenzoyl chloride (0.092 g) in 4 ml of THF. The solution was allowed to warm to room temperature after which time the solution darkened to a dark orange color. The solution was concentrated to about 2 ml in vacuo and cyclohexane was added (35 ml) to precipitate out a brown solid. The solvent was decanted and the solid was dried in vacuo.

Catalyst J
Synthesis of $Ni(PPh_3)_2(C_6F_5)_2$

To a small Schlenk flask, in the dry box, was added (toluene)$Ni(C_6F_5)_2$ (0.33 g) and $PPH_3$ (0.36 g) followed by toluene (20 ml). The solution was stirred for 20 minutes. The solvent was then removed in vacuo to yield the complex.

Catalyst K
Synthesis of Tris(orthotolylphosphine)$Ni(C_6F_5)_2$

To a small Schlenk flask, in an inert atmosphere box, was added tris(orthotolyl)phosphine (0.52 g, 1.7 mmol) and (toluene)$Ni(C_6F_5)_2$ (0.417 g, 0.85 mmol) followed by toluene (15 ml) which resulted in the formation of a blood red solution. The solvent was removed to afford the phosphine adduct as a red solid.

Catalyst L
Synthesis of (1,2-Dimethoxyethane)Ni(2,4,6-tris(trifluoromethyl)phenyl)$_2$ Preparation of lithium(2,4,6-tris(trifluoromethyl)phenyl). To a clean, dry Kjeldahl flask was added 2,4,6-tris(trifluoromethyl)benzene (1.65 ml, 8.86 mmol) dissolved in a mixture of diethylether (20 ml) and hexane (20 ml). To this solution, cooled to 15° C. under argon, was added n-butyllithium (3.54 ml of a 2.5 molar solution in hexanes, 8.86 mmol). The solution turned yellow immediately. The solution was allowed to warm to ambient temperature and then allowed to stir at this temperature for an additional 60 minutes.

Figure 3:
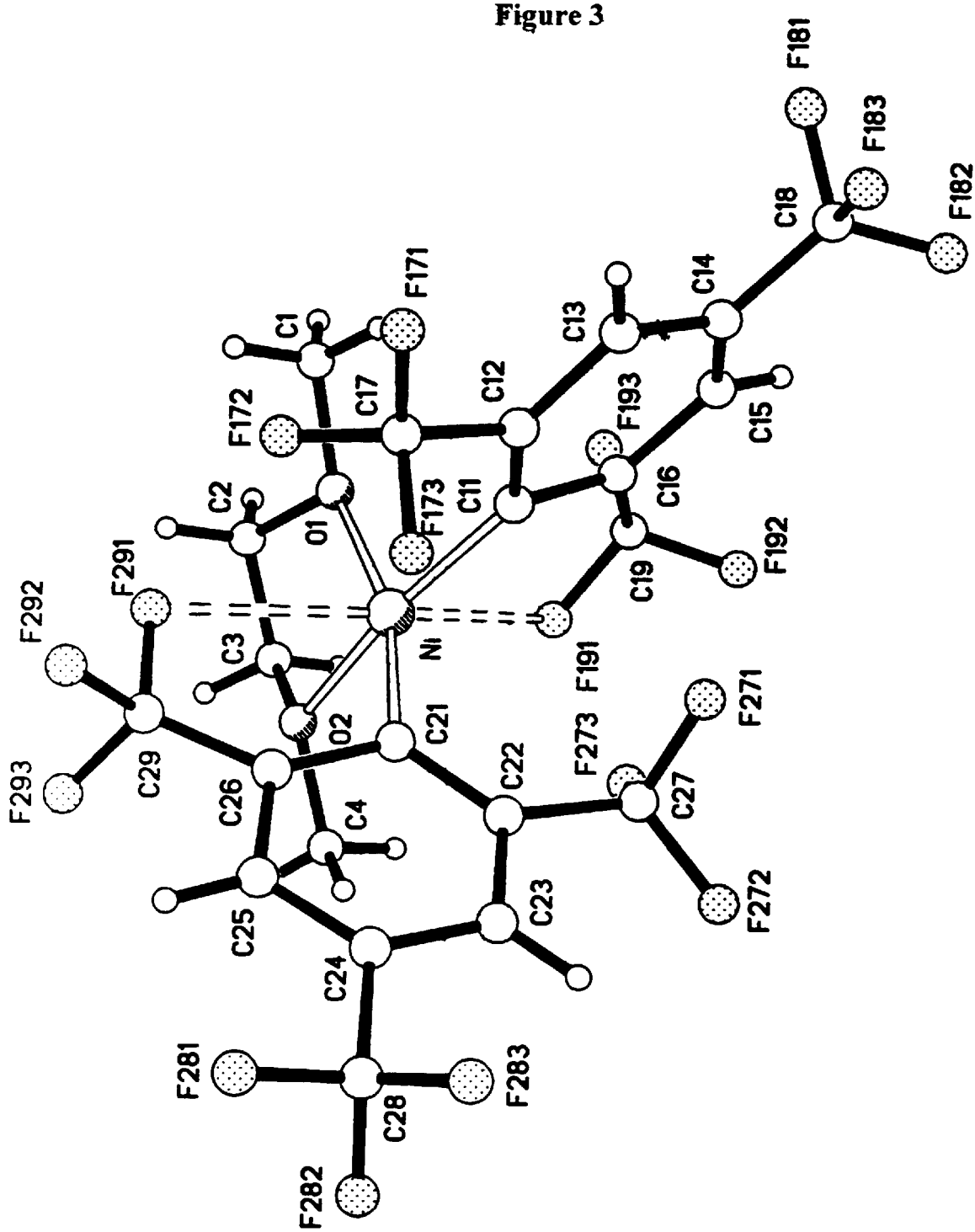
FIG. 3 is a ball and stick molecular representation of the catalyst (1,2-dimethoxyethane)Ni(2,4,6-tris(trifluoromethyl)phenyl)$_2$.

Preparation of (1,2-dimethoxyethane)Ni(2,4,6-tris (trifluoromethyl)phenyl)$_2$. The above solution was transferred (under argon) to a second Kjeldahl flask containing (1,2-dimethoxyethane)$NiCl_2$ (0.973 g, 4.43 mmol) in a mixture of diethylether (20 ml) and hexane (20 ml). The mixture turned red-brown in color within 10 minutes and was allowed to stir at ambient temperature for 48 hours. The solvent was then removed and the solid residue was extracted with toluene (50 ml) and filtered through Celite. The toluene was removed to afford a slightly oily brown residue which was washed with hexane (3 aliquots of 20 ml) to afford the product, a new compound, (1,2-dimethoxyethane)Ni(2,4,6-tris(trifluoromethyl)phenyl)$_2$, as a purple microcrystalline solid. The new compound was characterized fully using NMR and MS techniques. Characteristic of the new compound is a singlet in the $^{19}F$ NMR at −62.6 ppm in deuterobenzene and in the mass spectrum the molecular ion (with essentially no fragmentation) at 710. The x-ray crystal structure of this compound is shown in FIG. 3.

Catalyst M
Synthesis of $(Et_4N)_2[Ni(C_6F_5)_2Cl_2]_2$

The procedure employed was similar to that demonstrated by K. Klabunde et al, *Inorganic Chemistry*, 1989, Volume 28, pages 2414–2419. Tetraethylammonium chloride ($Et_4NCl$) was recrystallized from isopropanol/toluene (1:2) and dried by under vacuum prior to use. At room temperature, a dichloromethane solution of $Et_4NCl$ (0.085 g, 0.516 mmol) was added to ($\eta^6$-toluene)$Ni(C_6F_5)_2$ (0.25 g, 0.516 mmol) dissolved quickly in dichloromethane (5 ml). The red brown solution turned a deeper, brighter red almost immediately after addition of the $Et_4NCl$. The solution was stirred for a four hours and then filtered. The solution was then layered with toluene (10 ml). The dark red crystals of $(Et_4N)_2[Ni(C_6F_5)_2Cl_2]_2$ were collected by filtration. Yield= 0.255 g, 83%). The compound was characterized analyzed by $^1H$ and $^{19}F$ NMR.

Catalyst M
Alternative Synthesis of $(Et_4N)_2[Ni(C_6F_5)_2Cl_2]_2$

At 0° C., $Zn(C_6F_5)_2$(dme) (1.0 g) dissolved in dichloromethane was added to a sample of light blue, $(Et_4N)_2NiCl_4$ (0.942 g) stirring in dichloromethane (15 ml). The light blue suspension slowly reacted to yield an orange red murky solution. The product was stripped to dryness and then redissolved in tetrahydrofuran (THF), filtered to remove the $ZnCl_2$, and reprecipitated with pentane. The $(Et_4N)_2[Ni(C_6F_5)_2Cl_2]_2$ product was collected by filtration and washed with pentane to yield an orange red solid. Recrystallization of this product to a achieve red crystals can be achieved from either dichloromethane/toluene or THF/pentane mixtures. Yield=1.07 g (97%).

Catalyst N
Synthesis of $(\eta^3\text{-}CH_3C(CH)_2)Ni(PPh_3)(C_6F_5)$ $(\eta^3\text{-}CH_3C(CH)_2)Ni(PPh_3)Cl$ was prepared by adding of one equivalent of triphenylphosphine (0.78 g in toluene (10 ml) to $[(\eta^1 3\text{-}CH_3C(CH)_2)NiCl]_2$ (0.5 g) dissolved in toluene (20 ml). After 16 hours of reaction at room temperature an orange brown powder (0.85 g, 83%) was filtered from the reaction. Recrystallization from toluene and pentane at −30° C. yielded orange crystals. The product was characterized by $^1H$ and $^{31}P$ NMR spectroscopies.

A quantity of $Zn(C_6F_5)_2$(dme) (0.030 g) was dissolved in diethyl ether (10 ml) and cooled to −78° C. This reagent was added dropwise into a diethyl ether solution of $(\eta^3\text{-}CH_3C(CH)_2)Ni(PPh_3)Cl$ (0.05 g) held at −78° C. After about 10 minutes the solution colored changed from its original orange to yellow. After 18 hours at room temperature, the solvent was removed leaving a crystalline red-yellow solid. The product was recrystallized from toluene and pentane to give $(\eta^3\text{-}CH_3C(CH)_2)Ni(PPh_3)(C_6F_5)$. The product was characterized as being pure by $^1H$ and $^{31}P$ NMR spectroscopies.

Catalyst O
Synthesis of $(\eta^3\text{-}CH_3C(CH)_2)Ni(PCy_3)(C_6F_5)$ $(\eta^3\text{-}CH_3C(CH)_2)Ni(PCy_3)Cl$ was prepared by adding of one equivalent of tricyclohexylphosphine ($PCy_3$) (1.0 g in diethyl ether) to $[(\eta^3\text{-}CH_3C(CH)_2)NiCl]_2$ (0.532 g) dissolved in diethyl ether (15 ml). After 48 hours of reaction at room temperature an dark yellow solution was obtained. The solids were filtered from the reaction and the yellow solution evaporated to yield a dark yellow powder (1.1 g, 87%). Recrystallization from diethyl ether/pentane at −30° C. yielded yellow-orange crystals. The product was characterized by $^1H$ and $^{31}P$ NMR spectroscopies.

A quantity of $Zn(C_6F_5)_2$(dme) (0.028 g) was dissolved in diethyl ether (15 ml) and cooled to −78° C. This reagent was added dropwise into a diethyl ether solution of $(\eta^3\text{-}CH_3C(CH)_2)Ni(PCy_3)Cl$ (0.05 g) held at −78° C. After about 15 minutes the solution colored changed from its original dark orange to yellow. After 18 hours at room temperature, the solvent was removed leaving a crystalline yellow solid. The product was recrystallized from toluene and pentane to give $(\eta^3\text{-}CH_3C(CH)_2)Ni(PCy_3)(C_6F_5)$. The product was characterized as being pure by $^1H$ and $^{31}P$ NMR spectroscopies.

Catalyst P
Synthesis of Ni(2,4,6-tris(trifluoromethyl)phenyl)$_2$

Preparation of lithium(2,4,6-tris(trifluoromethyl)phenyl). To a clean, dry Kjeldahl flask was added 2,4,6-tris (trifluoromethyl)benzene (5.0 g, 17.72 mmol) dissolved in diethylether (20 ml) and hexane (20 ml). To this solution, cooled to 15° C. under argon, was added n-butyllithium (3.54 ml of a 2.5 molar solution in hexanes, 8.86 mmol). The solution turned yellow immediately. The solution was allowed to warm to ambient temperature and then allowed to stir at this temperature for an additional 60 minutes.

Preparation of Ni(2,4,6-tris(trifluoromethyl)phenyl)$_2$. The above solution was transferred (under argon) to a second Kjeldahl flask containing anhydrous NiCl$_2$ (1.16 g, 9.0 mmol) in a mixture of diethylether (20 ml) and hexane (20 ml). The mixture was allowed to stir at ambient temperature for 96 hours. The solvent was then removed and the solid residue was extracted with toluene (50 ml) and filtered through Celite. The toluene was removed to afford a slightly oily brown residue which was then extracted again with hexane (3 aliquots of 20 ml) to afford the product Ni(2,4, 6-tris(trifluoromethyl)phenyl)$_2$ as a brown solid. The compound was characterized fully using NMR techniques.

Catalyst Component Q
Synthesis of Ni(PhC(O)CHPPh$_2$)(Ph)(PPh$_3$)

This preparation followed a published report in *J. Polym. Sci.* 1987, 25, 1989. A toluene slurry (150 ml) of PPh$_3$ (5.00 g, 19.1 mmol) and the ylid PhC(O)CHPPh$_3$ (7.30 g, 19.1 mmol) was added to a chilled (0° C.) toluene slurry (80 ml) of Ni(COD)$_2$ (5.30 g, 19.1 mmol). Upon completion of the addition, the mixture became a red-brown slurry. The mixture was allowed to warm to room temperature and stirred for 21 hours. The mixture was then heated to 50° C. for 2 hours. The mixture was cooled to room temperature and allowed to stir for an additional 16 hours. The mixture was filtered to give a red-brown filtrate which upon removal of solvent in vacuo gave a brown residue. The residue was dissolved in toluene (50 ml) from which a tan precipitate formed upon addition of 50 mL of hexane. The mixture was stored in the freezer overnight to give a gold-tan solid which was filtered, washed with hexane, and dried. Yield 10.5 g (79%).

Catalyst Component R
Synthesis of Ni(OC(O)(C$_6$H$_4$)PPh$_2$)(H)(PCy$_3$)

Ni(COD)$_2$ (2.00 g, 7.27 mmol) was dissolved in 100 mL of toluene and cooled to −30° C. To this solution was added a toluene solution (50 ml) of 2-(diphenylphosphino)benzoic acid (2.22 g, 7.27 mmol). The mixture was stirred at −30° C. for 30 min. and then warmed to −10° C. and stirred for 1 hour. To this mixture was added triphenylphosphine (2.03 g, 7.27 mmol) in 50 ml of toluene. The mixture was stirred at room temperature for one hour. The solvent was removed in vacuo to give a light yellow-brown solid. Yield of crude product was 2.87 g (61%).

Catalyst Component S
Synthesis of Ni(PhC(O)CHPPh$_2$)(Ph)(pyridine)

This compound was synthesized using a procedure published previously in *J. Polym. Sci.* 1987, 25, 1989.

Catalyst Component T
Synthesis of Ni(PhC(O)CHPPh$_2$)(Ph)(CH$_2$=PPh$_3$)

This compound was synthesized using a procedure published previously in *Angew. Chem., Int. Ed. Engl.* 1985, 24, 599.

Catalyst Component U
Synthesis of [Ni(PhC(O)CHPPh$_2$)(Ph)]$_2$

This compound was synthesized by reacting Ni(PhC(O) CHPPh$_2$)(Ph)(PPh$_3$) (0.76 g) with Rh(acetylacetonate) (C$_2$H$_4$)$_2$ (0.14 g) in a minimum amount of toluene (about 25 ml). After stirring the mixture for 4 hours, the precipitated solid was filtered and dried overnight in vacuo to yield 0.48 g of a yellow-brown solid.

Catalyst Component V (bpy)Ni(NBD)$_2$. Dipyridyl (1.09 g) and bis(1,5-cyclooctadiene) nickel (1.93 g) were dissolved in diethyl ether. The dipyridyl solution was added to the nickel solution with stirring. Immediately a violet color developed. The solution was allowed to react for approximately 5 hours. The solution was cooled to −78° C. and a diethyl ether solution of norbornadiene (2.88 ml) was added slowly. The mixture was allowed to warm to room temperature. No color change was noted after 1.5 hours. An additional 2.88 ml of norbornadiene in diethyl ether was added. The mixture was allowed to stir at room temperature overnight after which time a dark green precipitate resulted which was isolated by filtration, washed with cold ether and heptane, and dried in vacuo to a yield black solid. Yield 2.35 g (84%).

Catalyst Component W

Bis(2,2,6,6-tetramethyl-3,5-heptanedionato)nickel (II), or Ni(dpm)$_2$. This preparation follows a published procedure in *Inorg. Chem.* 1973, 12, 2983. A solution of 2,2,6,6-tetramethyl-3,5-heptanedione (5.00 g) in 13.5 mL of ethanol was prepared. A solution of 3.93 g of nickel(II) nitrate hexahydrate in 35 ml of a 50% ethanol/water mixture was added to the above solution. With stirring, a solution (50% ethanol/water) of 1.08 g of NaOH was added with immediate precipitation of a green solid. The mixture was diluted with 200 mL of a 50% ethanol/water mixture, filtered, and washed with more ethanol/water mixture. The resulting green solid was air dried overnight in oven at 110° C. to a constant weight. The green solid changed to a purple color. The solid was then recrystallized from 1,2-dichloroethane, filtered and dried. Yield 1.91 g of a purple solid.

Catalyst Component X
Synthesis of (Toluene)Ni(SiCl$_3$)$_2$ (Toluene)Ni(SiCl$_3$)$_2$ was prepared following the method of Klabunde et al., Organometallics, 1985, 3, 571.

Catalyst Component Y
Synthesis of [(CH$_3$)(C$_{12}$H$_{25}$)$_3$N]$_2$[NiCl$_4$]

[(CH$_3$)(C$_{12}$H$_{25}$)$_3$N]$_2$[NiCl$_4$] was prepared by reacting NiCl$_2$.6H$_2$O with 2 equivalents of tridodecylmethylammonium chloride in absolute ethanol and removing the solvent. A light blue oil was obtained in 100% yield.

Catalyst Component Z
Synthesis of (Et$_4$N)$_2$[NiCl$_4$]

(Et$_4$N)$_2$[NiCl$_4$] was prepared by reacting NiCl$_2$(dme) with 2 equivalents of tetraethylammonium chloride in anhydrous dimethoxyethane and removing the solvent. A light blue powder was obtained in 100% yield.

Arylating Agent B(C$_6$F$_5$)$_3$.3H$_2$O

The synthesis of reported here is based on a prior publication (see U.S. Pat. No. 5,296,433, 1994). A 3.15 wt % solution of B(C$_6$F$_5$)$_3$ in Isopar®E (50 ml, 2.22 mmol) was placed in a 200 ml Kjeldahl flask equipped with a magnetic stir bar. Approximately 50 ml of cyclohexane was added to this solution followed by 3 equiv of deoxygenated, demineralized water (0.120 ml, 6.67 mmol), which resulted in precipitation of a white, microcrystalline solid. The slurry was stirred for 30 m, the solvent was decanted, and the resulting solid was dried in vacuo. Yield, 0.826 g (66%). $^{19}$F NMR ($C_6D_6$): −134.7 (apparent d, 2F), −154.7 (apparent t, 1F), −162.6 (apparent t, 2F). FI-MS: m/z 512 [M$^+$], evidently loss of water occurred in mass spectrometer. IR (Nujol): 3666 m, 3597 m, 3499 m, 2950 sh, 2920 s, 1647 m, 1602 m, 1520 s, 1468 s, 1379 m, 1288 m, 1111 m, 1098 m, 969 s, 859 w, 797 w, 771 w, 676 w, 614 w.

Arylating Agent $Zn(C_6F_5)_2$.DME

This synthesis method is a modification of the procedures outlined by D. Naumann and H. Lange, *Journal of Fluorine Chemistry*, Volume 26, 1984, pages 435–444. Iodopentafluorobenzene, $C_6F_5I$, (5.88 g, 20 mmoles) and dimethoxyethane (0.9012 g, 10 mmoles) were mixed together in a glass vial and cooled to −30° C. To this solution was added a quantity of diethylzinc (1.235 g, 10 mmoles) that had also been cooled to −30° C. The reaction mixed was slowly warmed to room temperature. The reaction vessel was scraped with the tip of a glass pipette and crystallization immediately occurred. The white powder was washed 3 times with pentane to remove the ethyl iodide reaction product and the $Zn(C_6F_5)_2$(dme) dried to a white microcrystaline powder. Yield=72%. The $Zn(C_6F_5)_2$(dme) sample was analyzed by $^1$H and $^{19}$F NMR spectroscopies and found to be pure. The thermal stability of $Zn(C_6F_5)_2$(dme) was determined by performing a differential scanning calorimetric measurement at a temperature ramping rate of 20° C./min. This method provided a sharp melting point at 108° C. and indicated no decomposition below 300° C.

Arylating Agent Zn(2,4,6-tris(trifluoromethyl) phenyl)$_2$

Zn(2,4,6-tris(trifluoromethyl)phenyl)$_2$ was prepared by a variation of the orginal literature synthesis given by F. Edelmann et al., *Organometallics*, Volume 11, 1992, pages 192–5. ZnCl$_2$ was added to a freshly prepared sample of 2,4,6-tris(trifluoromethyl)phenyllithium in diethyl ether. After refluxing for 6 hours the solvent was removed and the solids extracted with toluene. After removal of the lithium chloride the solvent is removed to yield an off-white solid. In our hands, the vacuum distillation of the crude was deemed unnecessary and the white crystalline product was recrystallized from pentane at −35° C. Yield=53%. The product of Zn(2,4,6-tris(trifluoromethyl)phenyl)$_2$ was characterized by $^1$H and $^{19}$F NMR spectroscopies.

EXAMPLE 1

To a 50 ml glass vial equipped with a Teflon® coated stir bar was added the t-butylester of 5-norbornene-carboxylic acid (carbo-t-butoxynorbornene) (2.0 g, 10.3 mmol, exo, endo 44/56). To this stirred monomer at ambient temperature was added a catalyst solution prepared by adding η$^3$-allylpalladium chloride dimer (38 mg, 103 μmol) in chlorobenzene (5 ml) to silver hexafluoroantimonate (99 mg, 290 μmol) in chlorobenzene (5 ml) for 30 minutes and then filtering through a micropore filter (to remove the precipitated silver chloride). The reaction was allowed to run for 36 hours at which time the mixture had gelled to form a clear yellow gel. Upon adding the gel to excess methanol the polymer precipitated as a white powder. The polymer was washed with excess methanol and dried. The yield of polymer was 1.5 g (75%). The presence of the ester-bearing monomer in the polymer was verified by infra-red analysis which showed strong bands at 1728 cm$^{-1}$ (C=O stretch), 1251 cm$^{-1}$ (C—O—C stretch) and 1369 and 1392 cm$^{-1}$ (characteristic of t-butyl groups) and the absence of unconverted monomer (proton NMR). The polymer was found to have a molecular weight (Mw) of 22,500. Thermogravimetric analysis (TGA) under nitrogen (heating rate 10° C. per minute) showed the polymer to be thermally stable to about 210° C. and then to exhibit approximately 28% weight loss by 260° C. (indicating clean loss of the t-butyl groups as isobutene to afford the homopolymer of 5-norbornene-carboxylic acid) and then degradation of the polymer (90% total weight loss) at around 400° C.

EXAMPLE 2

To a 50 ml glass vial equipped with a Teflon® coated stir bar was added norbornene (0.8 g, 8.6 mmol), 1,2-dichloroethane (8 ml) and the t-butylester of 5-norbornene-carboxylic acid (carbo-t-butoxynorbornene) (0.2 g, 1 mmol, exo,endo 44/56). To this stirred solution at ambient temperature was added nickel ethylhexanoate (3 μmol), trisperfluorophenylboron (23 μmol) and triethylaluminum (27 μmol). There ensued an immediate reaction with white polymer precipitating from solution within less than 10 seconds. The reaction was allowed to run for 60 minutes before the reactor contents were dissolved in cyclohexane and poured into an excess of methanol. The polymer was washed with excess methanol and dried overnight in a vacuum oven at 80° C. The yield of copolymer was 0.9 g (90%). The molecular weight of the copolymer was determined using GPC methods and found to be 535,000 (Mw) with a polydispersity of 4.7.

EXAMPLE 3

To a 50 ml glass vial equipped with a Teflon® coated stir bar was added the t-butylester of 5-norbornene-carboxylic acid (carbo-t-butoxynorbornene) (2.2 g, 11.3 mmol, exo, endo 44/56). To this stirred monomer at ambient temperature was added a catalyst solution prepared by adding η$^3$-allylpalladium chloride dimer (29 mg, 74 μmol) in dichloroethane (6 ml) to silver tetrafluoroborate (61 mg, 311 μmol) in dichloroethane (6 ml) for 30 minutes and then filtering through a micropore filter (to remove the precipitated silver chloride). The reaction was allowed to run for 36 hours at which time the mixture had gelled to form a clear yellow gel. Upon adding the gel to excess methanol the polymer precipitated as a white powder. The polymer was washed with excess methanol and dried. The yield of polymer was 1.4 g (64%). The presence of the ester-bearing monomer in the polymer was verified by infra-red analysis which showed strong bands at 1728 cm$^{-1}$ (C=O stretch), 1251 cm$^{-1}$ (C—O—C stretch) and 1369 and 1392 cm$^{-1}$ (characteristic of t-butyl groups) and the absence of unconverted monomer or carboxylic acid functionality (proton NMR and IR). The polymer was found to have a molecular weight (Mw) of 54,100. Thermogravimetric analysis (TGA) under nitrogen (heating rate 10° C. per minute) showed the polymer to be thermally stable to about 210° C. and then to exhibit approximately 29% weight loss by 250° C. (indicating clean loss of the t-butyl groups as isobutene to afford the homopolymer of 5-norbornene-carboxylic acid) and then degradation of the polymer (80% total weight loss) at around 400° C.

EXAMPLE 4

To a 100 ml glass vial equipped with a Teflon® coated stir bar was added norbornene (1.16 g, 12.3 mmol), 1,2- dichloroethane (50 ml) and the t-butylester of 5-norbornene-carboxylic acid (carbo-t-butoxynorbornene) (0.6 g, 3.1 mmol, exo,endo 44/56). To this stirred solution at ambient temperature was added palladium bis(2,2,6,6-tetramethyl-3,5-pentanedionate) (31 $\mu$mol) and tris(perfluorophenyl)boron (279 $\mu$mol). The reaction was allowed to run for 16 hours before the reactor contents were poured into an excess of methanol. The polymer was washed with excess methanol and dried overnight in a vacuum oven at 80° C. The yield of copolymer was 0.54 g (31%).

EXAMPLE 5

To a 50 ml glass vial equipped with a Teflon® coated stir bar was added the t-butylester of 5-norbornene-carboxylic acid (carbo-t-butoxynorbornene) (4.4 g, 22.7 mmol, exo, endo 44/56). To this stirred monomer at ambient temperature was added a catalyst solution prepared by adding $\eta^3$-allylpalladium chloride dimer (41.5 mg, 113 $\mu$mol) in dichloroethane (7 ml) to silver tetrafluoroborate (42 mg, 215 $\mu$mol) in dichloroethane (7 ml) for 30 minutes and then filtering through a micropore filter (to remove the precipitated silver chloride). The reaction mixture was then warmed in an oil bath to 75° C. After 90 minutes it was observed that the mixture had solidified to a grey polymeric mass. The mass was dissolved in acetone to afford a dark colored solution. Gaseous carbon monoxide was bubbled through the solution for 30 minutes resulting in copious amounts of a finely divided black precipitate (metallic palladium and possibly other catalyst residues). The precipitate was removed via centrifugation, and this process was repeated two more times. Finally the resulting colorless solution was filtered through a 0.45 micron microdisc and the polymer was precipitated by adding the acetone solution to an excess of hexane. The white polymer was separated using a centrifuge and then dried overnight to afford the copolymer as a white powder (2.21 g, 50%). Thermogravimetric analysis (TGA) under nitrogen (heating rate 10° C. per minute) showed the polymer to be thermally stable to about 210° C. and then to exhibit approximately 28% weight loss by 260° C. (indicating clean loss of the t-butyl groups as isobutene to afford the homopolymer of 5-norbornene-carboxylic acid) and then degradation of the polymer (90% total weight loss) at around 400° C. The molecular weight was observed to be Mn=3,300 g/mole and Mw=6,900 g/mole (GPC in THF, polystyrene standards).

EXAMPLE 6

To a 50 ml glass vial equipped with a Teflon® coated stir bar was added the pure exo isomer of the t-butylester of 5-norbornene-carboxylic acid (carbo-t-butoxynorbornene) (0.6 g). To this stirred monomer at ambient temperature was added a catalyst solution prepared by adding $\eta^3$-allyl-palladium chloride dimer (30 mg) in dichloroethane (10 ml) to silver hexafluoroantimonate (50 mg) in dichloroethane (20 ml) for 30 minutes and then filtering through a micropore filter (to remove the precipitated silver chloride). The reaction was allowed to run for 15 hours at which time the mixture was added to excess methanol causing the polymer to precipitate as a white powder. The polymer was washed with excess methanol and dried. The yield of polymer was 0.5 g (85%). The polymer was found to have a molecular weight (Mw) of 46,900, and a polydispersity of 2.4.

EXAMPLE 7

To a 100 ml glass vial equipped with a Teflon® coated stir bar was added norbornene (4.01 g, 42.6 mmol), 1,2-dichloroethane (50 ml) and the t-butylester of 5-norbornene-carboxylic acid (carbo-t-butoxynorbornene) (2 g, 10.3 mmol, exo,endo mixture). To this stirred solution at ambient temperature was added a catalyst solution prepared by reacting $\eta^3$-allylpalladium chloride dimer (10 mg, 27.3 $\mu$mol) with silver hexafluoroantimonate (19.6 mg, 57 $\mu$mol) in 1,2-dichloroethane (3 ml) for 30 minutes and then filtering through a micropore filter. The reaction was allowed to run for 20 hours before the reactor contents were poured into an excess of methanol. The polymer was washed with excess methanol and dried. The yield of copolymer was 4.15 g. The molecular weight of the copolymer was determined using GPC methods and found to be 618,000 (Mw) with a polydispersity of 7.1.

EXAMPLE 8

To a 100 ml glass vial equipped with a Teflon® coated stir bar was added norbornene (3.75 g, 39.8 mmol), 1,2-dichloroethane (50 ml) and the t-butylester of 5-norbornene-carboxylic acid (carbo-t-butoxynorbornene) (2 g, 10.3 mmol, exo,endo mixture). To this stirred solution at ambient temperature was added palladium ethylhexanoate (12 $\mu$mol, tris(perfluorophenyl)boron (108 $\mu$mol) and triethylaluminum (120 $\mu$mol). The reaction was allowed to run for 72 hours before the reactor contents were poured into an excess of methanol. The polymer was washed with excess methanol and dried, redissolved in chlorobenzene and reprecipitated with an excess of methanol, filtered, and washed with methanol before finally drying in a vacuum oven overnight at 80° C. The yield of copolymer was 1.66 g. The molecular weight of the copolymer was determined using GPC methods and found to be 194,000 (Mw) with a polydispersity of 2.3. The presence of the ester-bearing monomer in the copolymer was verified by infra-red analysis which showed bands at 1730 cm$^{-1}$ (C=O stretch) and 1154 cm$^{-1}$ (C—O—C stretch) and the absence of unconverted monomer (proton NMR).

EXAMPLE 9

To a 100 ml glass vial equipped with a Teflon® coated stir bar was added 1,2-dichloroethane (25 ml) and the t-butylester of 5-norbornene-carboxylic acid (carbo-t-butoxynorbornene) (10 g, 51.5 mmol, exo,endo mixture). To this stirred solution at ambient temperature was added a catalyst solution prepared by reacting $\eta^3$-allylpalladium chloride dimer (82 mg, 223 $\mu$mol) with silver hexafluoroantimonate (200 mg, 581 $\mu$mol) in 1,2-dichloroethane (10 ml) for 30 minutes and then filtering through a micropore filter. The reaction was allowed to run for 48 hours before the reactor contents were poured into an excess of methanol. The polymer was washed with excess methanol and dried. The yield of homopolymer was 4.5 g.

EXAMPLE 10

To a 100 ml glass vial equipped with a Teflon® coated stir bar was added 1,2-dichloroethane (50 ml), the t-butylester of 5-norbornene-carboxylic acid (carbo-t-butoxynorbornene) (5 g, 25.8 mmol, exo,endo mixture), norbornene (0.82 g, 8.7 mmol) and 5-triethoxysilylnorbornene (0.47 g, 1.8 mmol). To this stirred solution at ambient temperature was added a catalyst solution prepared by reacting $\eta^3$-allylpalladium chloride dimer (47.2 mg, 128 $\mu$mol) with silver tetrafluoroborate (138 mg, 700 $\mu$mol) in 1,2-dichloroethane (10 ml) for 30 minutes and then filtering through a micropore filter. The reaction was allowed to run for 48 hours before the reactor contents were poured into an excess of methanol.

The polymer was washed with excess methanol and dried. The yield of terpolymer was 5.3 g. The molecular weight of the copolymer was determined using GPC methods and found to be 39,900 (Mw) with a polydispersity of 3.2.

EXAMPLE 11

To a 50 ml glass vial equipped with a Teflon® coated stir bar was added 7.25 g (37.5 mmole) of the t-butylester of norbornene, 1.9 g (12.5 mmole) of methylester of norbornene, 50 ml of freshly distilled dichloroethane and the solution was degassed under argon atmosphere. A 10 ml glass vial equipped with a Teflon® coated stir bar was charged with 0.0365 g (0.1 mmol) of $\eta^3$-allylpalladium chloride dimer (to ultimately give a monomer to catalyst ratio of 500/1) and 2 ml of dichloroethane. Into another 10 ml glass vial was charged with 0.0344 g (0.1 mmol) of silver hexafluoroantimonate and 2 ml of dichloroethane. The catalyst solution was prepared by mixing the allylpalladium chloride dimer solution with silver hexafluoroantimonate solution inside the dry box. Immediate precipitation of the silver chloride salt was observed, which was filtered, to obtain a clear yellow solution. The active yellow catalyst solution was added to the monomer solution via a syringe and the reaction mixture was allowed to stir for 20 hours at 60° C. No appreciable increase in viscosity was observed, but solids had precipitated in the solution, the solution was cooled, concentrated in a rotovap, and precipitated into hexane to obtain a white polymer. Yield=2.3 g, 26%. The polymer was dried in vacuum at room temperature and analyzed using GPC for molecular weight. GPC was obtained in THF using polystyrene standards. The molecular weight was observed to be Mn=1950 g/mole and Mw=3150 g/mole. $^1$H NMR indicated the presence of both methyl and t-butyl ester of norbornene and also a small amount of the t-butyl hydrolyzed product, the acid.

EXAMPLE 12

To a 50 ml glass vial equipped with a Teflon® coated stir bar was added 2.42 g (12.5 mmole) of t-butylester of norbornene, 5.7 g (37.5 mmole) of methylester of norbornene, 50 ml of freshly distilled dichloroethane, and the solution was degassed under argon atmosphere. A 10 ml glass vial equipped with a Teflon® coated stir bar was charged with 0.0365 g (0.1 mmol) of allylpalladium chloride dimer in a monomer to catalyst ratio of 500/1 and 2 ml of dichloroethane. Into another 10 ml glass vial was charged with 0.0344 g (0.1 mmol) of silver hexafluoro antimonate and 2 ml of dichloroethane. The catalyst solution was prepared by mixing the allylpalladium chloride dimer solution with silver hexafluoroantimonate solution inside the dry box. Immediate precipitation of the silver chloride salt was observed, which was filtered, to obtain a clear yellow solution. The active yellow catalyst solution was added to the monomer solution via a syringe and the reaction mixture was allowed to stir for 20 hours at 60° C. No appreciable increase in viscosity was observed, but solids had precipitate in the solution, the solution was cooled, concentrated in a rotovap, and precipitated into hexane to obtain a white polymer. Yield=2.05 g, 25%. The polymer was dried in vacuum at room temperature and analyzed using GPC for molecular weight. GPC was obtained in THF using Polystyrene standards. The molecular weight was observed to be Mn=1440 g/mole and Mw=2000 g/mole. $^1$H NMR indicated the presence of both methyl and t-butyl ester of norbornene and also a small amount of the t-butyl hydrolyzed product, the acid.

EXAMPLE 13

To a 25 ml glass vial equipped with a Teflon® coated stir bar was added 2 g (7.94 mmole) of pure of bicyclo[2.2.]hept-5-ene-exo,-2-t-butyl, exo-3-methyl ester of dicarboxylic acid followed by 15 ml of freshly distilled methylene chloride and 10 ml of methanol, and the solution was degassed under argon atmosphere. A 10 ml glass vial equipped with a Teflon® coated stir bar was charged with 0.00588 g (0.0158 mmol) of $\eta^3$-allylpalladium chloride dimer in a monomer to catalyst ratio of 500/1 and 2 ml of methylene chloride. Into another 10 ml glass vial was charged with 0.0108 g (0.0312 mmol) of silver hexafluoroantimonate and 2 ml of methylene chloride. The catalyst solution was prepared by mixing the $\eta^3$-allylpalladium chloride dimer solution with silver hexafluoroantimonate solution inside the dry box. Immediate precipitation of the silver chloride salt was observed, which was filtered, to obtain a clear yellow solution. The active yellow catalyst solution was added to the monomer solution via a syringe at 50° C. and the reaction mixture was allowed to stir for 16 hours at room temperature. No appreciable increase in viscosity was observed and the solution was filtered through a 0.5µ filter, concentrated using a rotovap. The thick solution was dissolved in methanol and precipitate into methanol/water mixture to obtain a white solid yield (65%). The molecular weight was observed to be Mn=10,250 g/mole and Mw=19,700 g/mole (GPC in the THF, polystyrene standards). $^1$H NMR indicates the presence of both methyl and t-butyl ester of norbornene.

EXAMPLE 14

To a 25 ml glass vial equipped with a Teflon® coated stir bar was added 3.06 g (12.8 mmole) of pure of bicyclo[2.2.1]hept-5-ene-exo,exo-2,3-dicarboxylic acid diethyl ester, 2.5 g (12.8 mmole) of t-butylester of norbornene, followed by 15 ml of freshly distilled methylene chloride and 10 ml of methanol, and the solution was degassed under argon atmosphere. A 10 ml glass vial equipped with a Teflon® coated stir bar was charged with 0.0188 g (0.052 mmol) of allylpalladium chloride dimer (to give a monomer to catalyst ratio of 500/1) and 2 ml of methylene chloride. Into another 10 ml glass vial was charged with 0.0357 g (0.104 mmol) of silver hexafluoroantimonate and 2 ml of methylene chloride. The catalyst solution was prepared by mixing the allylpalladium chloride dimer solution with silver hexafluoroantimonate solution inside the dry box. Immediate precipitation of the silver chloride salt was observed, which was filtered, to obtain a clear yellow solution. The active yellow catalyst solution was added to the monomer solution via a syringe at 50° C. and the reaction mixture was allowed to stir for 16 hours at room temperature. No appreciable increase in viscosity was observed and the solution was filtered through a 0.5µ filter, concentrated using a rotovap. The resulting viscous solution was dissolved in methanol and precipitated into methanol/water mixture to obtain a white solid yield (23%). The molecular weight was observed to be Mn=15,700 g/mole and Mw=32,100 g/mole (GPC in THF, polystyrene standards). $^1$H NMR indicates the presence of both methyl and t-butyl ester of norbornene. Thermogravimetric analysis (TGA) under nitrogen (heating rate 10° C./min.) showed the polymer to be thermally stable to about 155° C. and then to exhibit approximately 20 wt. % loss by 290° C. (indicating clean loss of the t-butyl groups as isobutylene to afford the homopolymer of 5-norbornene-carboxylic acid) and then degradation of the polymer at around 450° C.

EXAMPLE 15
Synthesis of Bicyclo[2.2.]hept-5-ene-exo, exo-2,3-dicarboxylic Acid Diethyl Ester The exo, exo diethyl ester of norbornene was synthesized from exo-5-norbornene-2,3-dicarboxylic acid. The exo isomer was prepared by thermal conversion of the endo-5-norbornene-2,3-dicarboxylic anhydride at 190° C. followed by recrystallization from toluene several times to obtain pure exo-5-norbornene-2,3-dicarboxylic anhydride. Part of the exo-anhydride was hydrolyzed in boiling water and the solution was cooled to obtain pure diacid in almost quantitative yield. The diacid was converted to the diethyl ester using triethyloxonium salts as shown below:

A 250 ml, three necked, round bottomed flask with a magnetic stirring bar was charged with 16.0 g (0.0824 mole) of pure exo norbornene dicarboxylic acid and 35 g (0.1846 mole) of triethyloxonium tetrafluoroborate. The flask was stoppered, and to this 300 ml of dichloromethane was added via a cannula under argon atmosphere. The rubber stopper was replaced with a condenser under argon atmosphere and the other neck was fitted with an additional funnel. To the additional funnel was added 35 ml of ethyldiisopropyl amine and it was allowed to drip into the reaction vessel slowly. A small exotherm was observed and the solution was allowed to reflux lightly. After the complete addition of the amine, the solution was allowed to stand at room temperature for 15 hours. Work-up is initiated by extracting the reaction mixture with three 50 ml portions of HCl solution, followed by three 50 ml extractions with sodium bicarbonate and finally washed two times with water. The organic solution was dried over magnesium sulfate, treated with carbon black, filtered, concentrated on a rotary evaporator. Purification of the residue by distillation at 110° C. provides 15 g (75%) of pure exo-diethyl ester of norbornene as a colorless, viscous, fruity smelling liquid.

$^1$H NMR (CDCl$_3$): d=1.22 (3H; t, CH$_3$), d=1.47 (1H), d=2.15 (1H), d=2.58 (2H; s, CHCOO), d=3.07 (2H; s,bridge head), d=4.10 (2H; m, CH$_2$), d=6.19 (2H; s, C=C), FI-MS (DIP)=M$^+$(238).

EXAMPLE 16
Synthesis of Bicyclo[2.2.1]hept-5-ene-exo-2-t-butyl ester, exo-3-carboxylic Acid To a 50 ml single necked round bottom flask equipped with a Teflon® coated stir bar was added 1.5 g (9.15 mmole) of pure exo-Nadicanhydride, 10 ml of freshly distilled methylenechloride, 20 mL of t-butanol (0.209 moles). To the solution was added 7.5 g (0.061 moles) of dimethylamino pyridine and the solution was refluxed at 75° C. for 8 hours. Initially the anhydride was not soluble, but over the period of time the solids had dissolved and the solution had turned brown. The reaction was cooled, concentrated in a rotovap to remove methylene chloride and the thick solution was added slowly into acidified water (HCl). The solid that precipitated out was filtered, washed with water and further dissolved in ether treated with MgSO$_4$, followed by carbon black and the solution was filtered over Celite. The ether was removed over a rotovap to obtain a white solid (yield 8.5 g 60%).

$^1$H NMR (CDCl$_3$): d=1.47 (9H; s, t-butyl), d=1.60 (1H), d=2.15 (1H), d=2.58 (2H; m, CHCOO), d=3.07 (2H; s,bridge head),d=6.19 (2H; s, C=C), d=10.31 (1H; broad, COOH).

EXAMPLE 17
Synthesis of Bicyclo[2.2.1]hept-5-ene-exo-2-t-butyl,exo-3-methyl Ester of Dicarboxylic Acid A 100 ml, three necked, round bottomed flask with a magnetic stirring bar was charged with 9.7 g (0.0408 mole) of pure exo t-butyl half ester of norbornene dicarboxylic acid and 6.05 g (0.0408 mole) of trimethyloxonium tetrafluoroborate. The flask was stoppered, and to this 100 ml of dichloromethane was added via a cannula under argon atmosphere. The rubber stopper was replaced with a condenser under argon atmosphere and the other neck was fitted with an additional funnel. To the additional funnel was added 7.3 ml of ethyldiisopropyl amine and it was allowed to drip into the reaction vessel slowly. Small exotherm was observed and the solution was observed to reflux lightly. After the complete addition of the amine, the solution was allowed to stand at room temperature for 15 hours. Work-up is initiated by extracting the reaction mixture with three 50 ml portion of HCl solution, followed by three 50 ml extractions with sodium bicarbonate and finally washed two times with water. The organic solution was dried over magnesium sulfate, treated with carbon black, filtered, concentrated on a rotary evaporator. A colorless liquid was obtained which started to crystallize. The solid was washed with cold pentane and the pentane solution was concentrated in a rotovap to obtain a colorless liquid which on cooling crystallized. Yield 5.1 g.

$^1$H NMR (CDCl$_3$): d=1.45 (9H; s, t-butyl), d=1.47 (1H), d=2.15 (1H), d=2.54 (2H; m, CHCOO), d=3.07 (2H; s,bridge head), d=3.65 (3H; s, CH$_3$), d=6.19 (2H; s, C=C).

EXAMPLE 18

To a 50 ml glass vial equipped with a Teflon® coated stir bar was added 5-norbornene-carboxylic acid (2.0 g, 14.5 mmol, exo,endo mixture) and dichloroethane (20 ml). To this stirred mixture at ambient temperature was added a catalyst solution prepared by adding η$^3$-allylpalladium chloride dimer (6 mg, 16 μmol) in dichloroethane (5 ml) to silver hexafluoroantimonate (50 mg, 146 μmol) in dichloroethane (5 ml) for 30 minutes and then filtering through a micropore filter (to remove the precipitated silver chloride). The reaction was allowed to run for 18 hours at which time the mixture had gelled to form a clear yellow gel. Upon adding the gel to excess hexane the polymer precipitated as a white powder. The polymer was washed with excess hexane and dried. The yield of polymer was 1.2 g (60%). The polymer was found to have a molecular weight (M$_w$) of 22,000 and a polydispersity of 2.3.

Upon adding a portion of this polymer (0.5 g) to an 0.1 N stirred aqueous solution of KOH (10 ml) the polymer immediately dissolved to give a non-viscous, colorless solution. This demonstrates the base developability of these materials since none of the homopolymers of the t-butylester of 5-norbornenecarboxylic acid showed any tendency to dissolve under the same conditions.

EXAMPLE 19

The Pinner synthesis of ortho esters is a two-step synthesis:
Step 1.
Synthesis of Imidic Ester Hydrochloride The reaction was carried out in a 1 L two-neck round-bottom flask equipped with a stirrer, an oil bubbler, and a tube with anhydrous calcium chloride. The following reagents were placed in the flask: 100 g (0.84 mol) norbornene carbonitrile (NB-CN), 37 ml (0.91 mol) anhydrous methanol, and 200 mL anhydrous diethyl ether. The flask was placed into the ice-water bath and 61 g (1.67 mol) dry hydrogen chloride was bubbled through the mixture with stirring during 1.5 hours. The flask was placed overnight in a refrigerator at 0° C. In the morning, the mixture solidified into a "cake". It was broken into pieces and additional 200 ml of diethyl ether were added. The flask was kept in refrigerator for another 10 days with occasional stirring. At the end of this period, precipitated imidic ester hydrochloride was filtered by suction and washed 5 times with ~300 mL diethyl ether. Ca. 20 g of unreacted NB-CN were recovered from filtrate.

Yield of imidic ester hydrochloride—76% (120 g, 0.64 mol). Structure of the product was confirmed by $^1$H NMR spectroscopy.

Step 2
Synthesis of Ortho Ester

In a 0.5 L flask, 56.7 g (0.30 mol) imidic ester hydrochloride, 37 ml (0.91 mol) anhydrous methanol, and 250 ml anhydrous petroleum ether were placed. The reaction mixer was kept at room temperature for 5 days with occasional stirring. Precipitated ammonium chloride was filtered off and washed with petroleum ether three times. Filtrate and washes were combined, petroleum ether was distilled off, and product was fractionally distilled in vacuum. A fraction with the boiling point 68–69° C./3 mm Hg was collected. Yield—50% (30 g, 0.15 mol). According to $^1$H NMR spectrum, the product is 97+% 5-norbornene-2-trimethoxymethane (ortho ester).

EXAMPLE 20

To a solution of 2.16 g (10.9 mmol) $C_7H_9C(OCH_3)_3$ (norbornene trimethylorthoester) in 16 ml 1,2-dichloroethane, was added a solution of the reaction product of mixing 1 mole of allylpalladium chloride dimer with 2 moles of silver hexafluoroantimonate in dichloroethane and filtering off the resulting silver chloride precipitate. The amount of catalyst added corresponded to 0.08 mmol of palladium dissolved in 2 ml dichloroethane. The stirred reaction mixture was placed in an oil-bath at 70° C. and allowed to react for 20 hours.

At the end of the reaction, 2 ml methanol was added, solvents removed on a rotary evaporator, and polymer dried to a constant weight in vacuum.

Yield—1.28 g (60%).

EXAMPLE 21

To a 50 ml glass vial equipped with a Teflon® coated stir bar was added bicyclo[2.2.]hept-5-ene-2-methyl acetate (18.44 g, 0.1109 mol) and t-butylester of norbornene (21.55 g, 0.1109 mol) and 75 ml of toluene. A solution of the ickel catalyst [toluene complex of bisperfluorophenyl nickel, (toluene)Ni($C_6F_5$)$_2$] was prepared in the dry box by dissolving 0.5367 g (1.109 mmol) of (toluene)Ni($C_6F_5$)$_2$ in 15 ml of toluene. The active catalyst solution was added to the monomer solution via a syringe at ambient temperature. The reaction was allowed to stir for 6 hours at room temperature. The solution was diluted with toluene and the polymer was precipitated in excess methanol. The precipitated polymer was filtered, washed with acetone, and dried overnight under vacuum. The isolated yield of polymer was 24.9 g (63%). The polymer was characterized using GPC for molecular weight. Mn=21,000 and Mw=52,000. The NMR analysis of the copolymer indicated presence of 51 mole % of the t-butyl groups. IR analysis of the copolymer indicated the absence of acid groups.

EXAMPLE 22

To a 50 ml glass vial equipped with a Teflon® coated stir bar was added bicyclo[2.2.1]hept-5-ene-2-methyl ethylcarbonate (4.03 g, 0.0205 mol) and t-butylester of norbornene (3.98 g, 0.0205 mol) and 50 ml of toluene. A solution of the nickel catalyst [toluene complex of bisperfluorophenyl nickel, (toluene)Ni($C_6F_5$)$_2$] was prepared in the dry box by dissolving 0.0991 g (0.2049 mmol) of (toluene)Ni($C_6F_5$)$_2$ in 15 ml of toluene. The active catalyst solution was added to the monomer solution via a syringe at ambient temperature. The reaction was allowed to stir for 6 hours at room temperature. The solution was diluted with toluene and the polymer was precipitated in excess methanol. The precipitated polymer was filtered, washed with acetone and dried overnight under vacuum. The isolated yield of polymer was 4.16 g (52%). The polymer was characterized using GPC for molecular weight. Mn=22,000 and Mw=58,000. The NMR analysis of the copolymer indicated presence of 50 mole % of the t-butyl groups. IR analysis of the copolymer indicated the absence of acid groups.

EXAMPLE 23

To a 50 ml glass vial equipped with a Teflon® coated stir bar was added bicyclo[2.2.1]hept-5-ene-2-methyl butylcarbonate (17.15 g, 0.0764 mol) and t-butylester of norbornene (14.85 g, 0.0764 mol) and 72 ml of toluene. A solution of the nickel catalyst toluene complex of bisperfluorophenyl nickel, (toluene)Ni($C_6F_5$)$_2$ was prepared in the dry box by dissolving 0.3699 g (0.7644 mmol) of (toluene)Ni($C_6F_5$)$_2$] in 15 ml of toluene. The active catalyst solution was added to the monomer solution via a syringe at ambient temperature. The reaction was allowed to stir for 6 hours at room temperature. The solution was diluted with toluene and the polymer was precipitated in excess methanol. The precipitated polymer was filtered, washed with acetone, and dried overnight under vacuum. The isolated yield of polymer was 17.53 (54%). The polymer was characterized using GPC for molecular weight. Mn 22,000 and Mw=58,000. The NMR analysis of the copolymer indicated presence of 54 mole % of the t-butyl groups. IR analysis of the copolymer indicated the absence of acid groups.

EXAMPLE 24

To a 50 ml glass vial equipped with a Teflon® coated stir bar was added t-butyl ester of norbornene (29.92 g, 0.154 mol), followed by dried maleic anhydride (15.10 g, 0.154 mol) and 90 ml of chlorobenzene. This mixture was degassed three times to remove any trace oxygen. The reaction mixture was then heated to 80° C. A degassed benzoyl peroxide solution consisting of 0.9948 g (0.04 mol) benzoyl peroxide free radical initiator in 10 ml of chlorobenzene was added to the reaction mixture with a dry syringe. The reaction was left to stir for 19 hours. After the reaction, the polymer solution was poured directly into hexane to precipitate the polymer. A white precipitate was obtained. The precipitated polymer was then stripped out of any unreacted maleic anhydride that may have been present. The polymer was then dried overnight in a vacuum oven at room temperature. The weight of dry polymer obtained was 20.62 g, giving a 45.8% yield. The polymer was characterized using GPC for molecular weight. Mn=4,200 and Mw=8,800. The NMR analysis of the copolymer indicated presence of the t-butyl groups. IR analysis of the copolymer indicated the presence of both t-butyl and maleic anhydride groups.

EXAMPLE 25

To a 50 ml glass vial equipped with a Teflon® coated stir bar was added bicyclo[2.2.1]hept-5-ene-2-methyl acetate (13.3 g, 0.0799 mol), t-butyl ester of norbornene (15.70 g, 0.0808 mol), followed by dried maleic anhydride (15.85 g, 0.162 mol) and 90 ml of chlorobenzene. This mixture was degassed three times to remove any trace oxygen. The reaction mixture was then heated to 80° C. A degassed benzoyl peroxide solution consisting of 1.0438 g (0.041 mol) benzoyl peroxide free radical initiator in 10 ml of chlorobenzene was added to the reaction mixture with a dry syringe. The reaction was left to stir for 19 hours. After the reaction, the polymer solution was poured directly into hexane to precipitate the polymer. A white precipitate was obtained. The precipitated polymer was then stripped out of any unreacted maleic anhydride that may have been present. The polymer was then dried overnight in a vacuum oven at room temperature. The weight of dry polymer obtained was 21.89 g, giving a 48.7% yield. The polymer was characterized using GPC for molecular weight. Mn=3,000 and Mw=6600. The NMR analysis of the copolymer indicated presence of the acetate and t-butyl groups. IR analysis of the copolymer indicated presence of acetate, t-butyl and maleic anhydride groups.

EXAMPLE 26
50:50 Copolymer of t-BuNBEster/NB—COOH

To a 50 ml glass vial equipped with a magnetic stirring bar and under a nitrogen atmosphere was added the t-butyl ester of norbornene carboxylic acid (2 g, 10 mmol) and norbornene carboxylic acid (1.38 g, 10 mmol). To this stirred mixture was added, at ambient temperature,the initiator (t-butyl peroxide) (2.9 g) and the resulting mixture was heated to 130° C. and stirring was continued for 16 hours. The resulting polymer (soluble in both THF and toluene) was precipitated into hexane and filtered to afford the product, which on drying weighed 2.91 g (86% conversion). The resulting solid polymer exhibited an Mw of 20,000, Mn 3,000). IR, NMR and TGA analysis of the copolymers confirmed their composition to be random addition copolymers of the two monomers.

EXAMPLE 27
50:50 Copolymer of t-BuNBEster/NB-MeNBEster

To a 50 ml glass vial equipped with a magnetic stirring bar and under a nitrogen atmosphere was added the t-butyl ester of norbornene carboxylic acid (2 g, 10 mmol) and the methyl ester of norbornene carboxylic acid (1.5 g, 10 mmol). To this stirred mixture was added, at ambient temperature,the initiator (t-butyl peroxide) (2.9 g) and the resulting mixture was heated to 130° C. and stirring was continued for 16 hours. The resulting polymer (soluble in toluene) was precipitated into methanol and filtered to afford the product, which on drying weighed 0.82 g (23% conversion). The resulting solid polymer exhibited an Mw of 35,000, Mn 6,000). IR, NMR and TGA analysis of the copolymers confirmed their composition to be random addition copolymers of the two monomers.

EXAMPLE 28
50:50 Copolymer of t-BuNBEster/EtTDEster

To a 100 ml glass vial equipped with a magnetic stirring bar and under a nitrogen atmosphere was added toluene (40 ml), t-butyl ester of norbornene carboxylic acid (1.94 g, 10 mmol) and ethyl ester of tetracyclododecene carboxylic acid (2.32 g, 10 mmol). To this stirred solution was added, at ambient temperature, a solution of bis (tricyclohexylphosphine)-benzylideneruthenium dichloride (34 mg, 0.042 mmol) in 5 ml of toluene. After 1 hour ethyl vinyl ether (0.015 ml, 0.156 mmol) was added and stirred 1 hour. The polymer solution was precipitated by addition to excess MeOH, collected by filtration and dried under vacuum. Recovered 3.46 g (81 % yield) of copolymer was recovered (Mw 221,000, Mn 133,000).

The copolymer was redissolved in toluene and passed through a column of silica gel with a resulting noticeable color (Ru) removal. The polymer was again precipitated in excess MeOH rendering a pure white copolymer.

EXAMPLE 29
50:50 Copolymer of t-BuNBEster/EtTDEster

To a 100 ml glass vial equipped with a magnetic stirring bar and under a nitrogen atmosphere was added toluene (80 ml), t-butyl ester of norbornene carboxylic acid (3.9 g, 20 mmol) and ethyl ester of tetracyclododecene carboxylic acid (4.64 g, 20 mmol). To this stirred solution was added, at ambient temperature, a solution of bis (tricyclohexylphosphine)benzylideneruthenium dichloride (68 mg, 0.083 mmol) in 5 ml of toluene. After 2 hours ethyl vinyl ether (0.030 ml, 0.31 mmol) was added and stirred 2 hours.

The orange-amber solution was passed through silica gel column to obtain a clear colorless solution. The solution was precipitated by addition of excess MeOH, collected by filtration and dried under vacuum. 6.54 g (77% yield) of copolymer was recovered (Mw 244,000, Mn 182,000). The glass transition temperature was measured using DSC methods and determined to be 220° C.

EXAMPLE 30
50:50 Copolymer of t-BuNBEster/EtTDEster

To a 300 ml stainless steel reactor equipped with a mechanical stirrer and containing nitrogen was added toluene (90 ml), t-butyl ester of norbornene carboxylic acid (3.9 g, 20 mmol) and ethyl ester of tetracyclododecene carboxylic acid (4.64 g, 20 mmol). To this stirred solution was added, at ambient temperature, a solution of bis (tricyclohexylphosphine)benzylideneruthenium dichloride (68 mg, 0.083 mmol) in 5 ml of toluene. After 2 hours ethyl vinyl ether (0.030 ml, 0.31 mmol) was added and stirred 16 hours. Hydrogen (350 psig) was added to reactor and the temperature was maintained at 175° C. for 7 hours. Following reaction the solution was passed through a silica gel column and the hydrogenated copolymer was isolated. NMR methods were used to determine that the copolymer was 95% hydrogenated (Mw 237,000, Mn 163,000).

EXAMPLE 31
50:50 Copolymer of t-BuNBEster/EtTDEster

To a 300 ml stainless steel reactor equipped with a mechanical stirrer and containing nitrogen was added toluene (90 ml), t-butyl ester of norbornene carboxylic acid (2.9 g, 15 mmol) and ethyl ester of tetracyclododecene carboxylic acid (3.5 g, 15 mmol). To this stirred solution was added, at ambient temperature, a solution of bis (tricyclohexylphosphine)benzylideneruthenium dichloride (50 mg, 0.060 mmol) in 5 ml of toluene. After 2 hours hydrogen (800 psig) was added to reactor and temperature maintained at 175° C. for 7 hours. Following reaction the solution was passed through silica gel column and the hydrogenated copolymer was isolated. NMR methods were used to determine that the copolymer was 96% hydrogenated (Mw 278,000, Mn 172,000).

EXAMPLE 32
50:50 Copolymer of t-BuNBEster/EtTDEster

To a 100 ml glass vial equipped with a magnetic stirring bar and containing nitrogen was added toluene (40 ml), t-butyl ester of norbornene carboxylic acid (1.94 g, 10 mmol), ethyl ester of tetracyclododecene carboxylic acid (2.32 g, 10 mmol) and 1-hexene (0.050 ml, 0.4 mmol). To this stirred solution was added, at ambient temperature, a solution of bis(tricyclohexylphosphine) benzylideneruthenium dichloride (34 mg, 0.042 mmol) in 5 ml of toluene. After 2 hours the polymer solution was added to an excess of MeOH, collected by filtration and dried under vacuum. 3.1 g (73% yield) of polymer was recovered (Mw 35,000, Mn 22,000).

EXAMPLE 33
50:50 Copolymer of t-BuNBEster/EtTDEster

To a 100 ml glass vial equipped with a magnetic stirring bar and containing nitrogen was added toluene (40 ml), t-butyl ester of norbornene carboxylic acid (1.94 g, 10 mmol), ethyl ester of tetracyclododecene carboxylic acid (2.32 g, 10 mmol) and 1-hexene (0.275 ml, 2.2 mmol). To this stirred solution was added, at ambient temperature, a solution of bis(tricyclohexylphosphine) benzylideneruthenium dichloride (34 mg, 0.042 mmol) in 5 ml of toluene. After 2 hours the polymer solution was added to an excess of MeOH, collected by filtration and dried under vacuum. 3.45 g (81 % yield) of polymer was recovered (Mw 8,000, Mn 6,000).

EXAMPLE 34
50:50 Copolymer of t-BuNBEster/EtTDEster

To a 100 ml glass vial equipped with a magnetic stirring bar and containing nitrogen was added toluene (40ml), t-butyl ester of norbornene carboxylic acid (1.94 g, 10 mmol), ethyl ester of tetracyclododecene carboxylic acid (2.32 g, 10 mmol) and 1-hexene (0.62 ml, 5.0 mmol). To this stirred solution was added, at ambient temperature, a solution of bis(tricyclohexylphosphine)benzylideneruthenium dichloride (34 mg, 0.042 mmol) in 5 ml of toluene. After 2 hours the polymer solution was added to an excess of MeOH, collected by filtration and dried under vacuum. 2.75 g (65% yield) of polymer was recovered.

EXAMPLE 35
50:50 Copolymer of t-BuNBEster/EtTDEster

To a 100 ml glass vial equipped with a magnetic stirring bar and containing nitrogen was added toluene (80 ml), t-butyl ester of norbornene carboxylic acid (3.9 g, 20 mmol), ethyl ester of tetracyclododecene carboxylic acid (4.64 g, 20 mmol) and 1-hexene (0.088 ml, 0.7 mmol). To this stirred solution was added, at ambient temperature, a solution of bis(tricyclohexylphosphine)benzylideneruthenium dichloride (68 mg, 0.083 mmol) in 5 ml of toluene. After 2 hours ethyl vinyl ether (0.030 ml, 0.31 mmol) was added and stirred 2 hours.

The orange-amber polymer solution was passed through silica gel column which removed the dark color (Ru). The solution was precipitated by addition to excess MeOH, collected by filtration and dried overnight at 80° C. under vacuum. 2.6 g (30% yield) of polymer was recovered (Mw 4,000, Mn 3,000).

EXAMPLE 36
50:50 Copolymer of t-BuNBEster/EtTDEster

To a 300 ml stainless steel reactor equipped with a mechanical stirrer and containing nitrogen was added toluene (80 ml), t-butyl ester of norbornene carboxylic acid (3.9 g, 20 mmol), ethyl ester of tetracyclododecene carboxylic acid (4.64 g, 20 mmol) and 1-hexene (0.088 ml, 0.7 mmol). To this stirred solution was added, at ambient temperature, a solution of bis(tricyclohexylphosphine) benzylideneruthenium dichloride (68 mg, 0.042 mmol) in 5 ml of toluene. After 2 hours hydrogen (750 psig) was added to reactor and temperature maintained at 175° C. for 20 hours.

The solution was precipitated by addition to excess methanol, collected by filtration and dried overnight at 80° C. under vacuum. Approximately 5 g (59% yield) of polymer was recovered (Mw 30,000, Mn 20,000). NMR methods were used to determine that the copolymer was greater than 99% hydrogenated.

EXAMPLE 37
65:35 Copolymer of t-BuNBEster/EtTDEster

To a 250 ml round bottomed flask equipped with a magnetic stirring bar and containing nitrogen was added toluene (160 ml), t-butyl ester of norbornene carboxylic acid (10.1 g, 52 mmol), ethyl ester of tetracyclododecene carboxylic acid (6.5 g, 28 mmol) and 1-hexene (0.176 ml, 1.4 mmol). To this stirred solution was added, at ambient temperature, a solution of bis(tricyclohexylphosphine) benzylideneruthenium dichloride (131 mg, 0.160 mmol) in 5 ml of toluene. After 16 hours ethyl vinyl ether (0.060 ml, 0.62 mmol) was added and stirred 1.5 hours. The polymer solution was passed through silica gel column to remove Ru. The solution was added to an excess of methanol, collected by filtration and dried under vacuum. 9.69 g (58% yield) of polymer was recovered (Mw 42,000, Mn 31,000). DSC methods were used to measure the glass transition temperature (110° C.).

EXAMPLE 38

In a 100 ml glass vial containing nitrogen was dissolved 5.0 g of the polymer from Example 37 in THF (80 ml). The solution was transferred to a 300 ml stainless steel reactor. 2.25 g of 5 wt % palladium on alumina catalyst (purchased from Aldrich) was added to reactor. The reactor was then heated to 175° C. and pressurized with 800 psig hydrogen. Temperature and pressure were maintained for 9.5 hrs. The resulting polymer solution was centrifuged and the colorless solution was separated and the polymer was precipitated in excess methanol. NMR methods showed the resulting copolymer to be greater than 99% hydrogenated.

EXAMPLE 39
50:50 Copolymer of t-BuNBEster/EtTDEster

To a 100 ml glass vial equipped with a magnetic stirring bar and containing nitrogen was added toluene (80 ml), t-butyl ester of norbornene carboxylic acid (3.9 g, 20 mmol), ethyl ester of tetracyclododecene carboxylic acid (4.64 g, 20 mmol) and 1-hexene (0.088 ml, 0.7 mmol). To this stirred solution was added, at ambient temperature, a solution of bis(tricyclohexylphosphine)benzylideneruthenium dichloride (68 mg, 0.084 mmol) in 5 ml of toluene. After 2 hours ethyl vinyl ether (30 µl) was added to the reaction to short stop further reactions and the mixture was stirred for 1.5 hours. The polymer solution was passed through a silica gel column to remove Ru residues and the polymer was then recovered as a clean white solid by precipitating into methanol. The polymer was found to have an Mw of 46,600 (Mn 33,700) and was fully characterized by IR, NMR and TGA methods.

EXAMPLE 40

To a stainless steel autoclave with an internal volume of 300 ml was added ethyl 2-methyl-4-pentenoate (99 g, 0.7 mole) and freshly cracked cyclopentadiene (46.4 g, 0.7 mole). The stirred mixture was heated to 200° C. and left overnight. The reactor was then cooled and the contents removed. The resulting functionalized norbornene (NB—$CH_2CH(CH_3)C(O)OC_2H_5$) was purified by vacuum distillation and found to have a boiling point of about 46–7° C. at 0.02 mm Hg. The material was analyzed by GC methods and found to have a purity of 98.4 to 99.3% (different fractions). The isolated yield of high purity product was around 33 g.

EXAMPLE 41

40:60 Copolymer of t-BuNBster (NB—CH$_2$CH(CH$_3$)C(O)OC$_2$H$_5$)

To a 100 ml glass vial equipped with a magnetic stirring bar and under a nitrogen atmosphere was added toluene (50 ml), t-butyl ester of norbornene carboxylic acid (2.7 g, 14 mmol) and the ester from Example 40 (NB—CH$_2$CH(CH$_3$)C(O)OC$_2$H$_5$) (4.4 g, 21 mmol). To this stirred solution was added, at ambient temperature, a solution of (toluene)Ni(C$_6$F$_5$)$_2$ in toluene (1 ml) and the resulting solution was heated to 50° C. and stirring was continued for 3 hours. The polymer was precipitated into methanol and filter ed. The resulting solid was then redissolved in THF, filtered and precipitated again with methanol and filtered. The resulting white solid polymer was dried and found to weigh 2.66 g (Mw 70,000; Mn 39,800), the supernatant was evaporated to dryness to afford a further crop of white polymer which on drying weighed 1.52 g (Mw 60,650; Mn 31,000). The total yield of copolymer represented 59% conversion of the monomers. IR, NMR and TGA analysis of the copolymers confirmed their composition to be random addition copolymers of the two monomers.

EXAMPLE 42

40:60 Copolymer of t-BuNBEster (NB—CH$_2$CH(CH$_3$)C(O)OC$_2$H$_5$)

To a 250 ml glass vial equipped with a magnetic stirring bar and under a nitrogen atmosphere was added dichloroethane (200 ml), t-butyl ester of norbornene carboxylic acid (7.76 g, 40 mmol) and the ester from Example 40 (NB—CH$_2$CH(CH$_3$)C(O)OC$_2$H$_5$) (12.5 g, 60 mmol) and 2,6-di-t-butylpyridine (28.8 mg, 0.26 mmol). To this stirred solution was added, at ambient temperature, a solution of the catalyst resulting from mixing allylpalladium chloride dimer (0.183 g, 0.5 mmol) with silver hexafluoroantimonate (equivalent amount) in dichloroethane (3 ml) and filtering to remove the silver chloride precipitate. The resulting solution was heated to 50° C. and stirring was continued for 16 hours. The polymer solution was treated with carbon monoxide (4 psi pressure) for 48 hours to precipitate the palladium residues, filtered through a 0.45μ filter, reduced in volume and precipitated with excess methanol to afford 7.9 g of the copolymer (39% conversion), Mw 11,600, Mn 7,000. The copolymer was fully characterized using IR, NMR and TGA methods.

EXAMPLE 43

Copolymerization of CO and Norbornene-5-t-butylester

A deoxygenated methanol solution of bipyridine (0.025 g, 0.16 mmol) was added to palladium (II) acetate (0.012 g, 0.053 mmol) dissolved in deoxygenated methanol. To this solution was added p-toluenesulfonic acid (0.045 g, 0.27 mmol) dissolved in deoxygenated methanol. The resulting brown solution was added to a methanol (deoxygenated) solution of benzoquinone (1.72 g, 1.59 mmol). This was added to a stainless steel reactor preheated to 50° C. To this reactor was added norbornene-5-t-butylester (5.14 g, 0.027 mol) in 100 ml of MeOH (deoxygenated with argon). The reactor was pressurized with carbon monoxide to 600 psig and warmed to 65° C. After 4.5 hours, the carbon monoxide was vented and the reactor was allowed to cool. The pink solution from the reactor was filtered to remove palladium residues and allowed to evaporate. The resulting mixture was dissolved in a minimum of THF and poured slowly into a 25:75 mixture of water:methanol to precipitate the polymer. This procedure was repeated twice. The resulting white polymer was filtered and dried at room temperature under vacuum. Yield=2.9 g.

EXAMPLE 44

A deoxygenated, dried THF/methanol (35 ml/15 ml) solution of benzoquinone (0.43 g, 0.40 mmol), bipyridine (0.0062 g, 0.0040 mmol), and Pd(MeCN)$_2$(p-toluenesulfonate)$_2$(0.0070 g, 0.0013 mmol) was added to a dry 500 ml stainless steel reactor warmed to 50° C. To the reactor was added norbornene-5-t-butylester (5.14 g, 0.027 mol) in 100 ml of THF (deoxygenated and dried). The reactor was pressurized with carbon monoxide to 600 psig and warmed to 65° C. After 12.5 hours, the reactor was heated to 90° C. for 1.5 hours. Then the carbon monoxide was vented and the reactor was allowed to cool. The purple solution from the reactor was filtered to remove palladium residues and allowed to evaporate. The resulting mixture was dissolved in a minimum of THF and poured slowly into a 25:75 mixture of water:methanol to precipitate the polymer. This procedure was repeated twice. The resulting white polymer was filtered and dried at room temperature under vacuum. Yield=2.9 g.

EXAMPLES 45 to 51

Optical Density Measurements For Cyclic Olefin Based Homo and Copolymers at 193 nm Optical density is a critical characteristic of an effective photoresist because it determines the uniformity of the energy throughout the film thickness. A typical, lithographically useful, polymer backbone has an optical density of less than 0.2 absorbance units/micron prior to the addition of photoacid generators. (T. Neenan, E. Chandross, J. Kometani and O. Nalamasu, "Styrylmethylsulfonamides: Versatile Base-Solubilizing Components of Photoresist Resins" pg. 199 in Microelectronics Technology, Polymers for Advanced Imaging and Packaging, ACS Symposium Series 614, Eds: E. Reichmanis, C. Ober, S. MacDonald, T. Iwayanagai and T. Nishikubo, April, 1995). Polyhydroxystyrene, the primary component of typical 248 nm DUV photoresists, has an optical density of 2.8 absorbance units/micron at 193 nm and hence is unusable as a resist backbone at this wave length.

Preparing Sample Solution

Samples of various polymers set forth in the foregoing examples (0.016±0.001 g of polymer) were weighed out and dissolved in 4 ml of chloroform. The solutions of the polymers were removed by pipette and thin films were cast on clean uniform quartz slides. The films were allowed to dry overnight. The resulting circular films on the quartz slides were further dried at 70° C. in an oven for 10 minutes under a nitrogen purge.

UV spectra of the films were obtained using a Perkin-Elmer Lambda 9 UV/VIS/IR spectrophotometer, at a scan speed of 120 nm/minute. The spectrum range was set at 300 nm to 180 nm. By measuring the absorbance of the films at 193 nm and normalizing them to the thickness of the films, the optical density of the films at 193 nm were measured. The results are set forth in the table below:

| Example | Polymer | Absorbance at 193 nm(A) | Film Thickness (microns) | Normalized Absorbance at 193 nm (Å/micron) |
|---------|---------|-------------------------|--------------------------|---------------------------------------------|
| 45 | 50/50 Copolymer of bicyclo[2.2.1]hept-5-ene-2-methyl acetate/t-butylester of norbornene (polymer of Example 21) | 1.0173 | 25.39 | 0.0400 |
| 46 | 50/50 Copolymer of bicyclo[2.2.1]hept-5-ene-2-methyl ethyl carbonate/t-butylester of norbornene (polymer of Example 22) | 0.1799 | 30.47 | 0.0059 |
| 47 | 50/50 Copolymer of bicyclo[2.2.1]hept-5-ene-2-methyl butyl carbonate/t-butylester of norbornene (polymer of Example 23) | 0.2808 | 33.01 | 0.0085 |
| 48 | Copolymer of maleicanhydride/t-butylester of norbornene (polymer of Example 24) | 1.1413 | 38.09 | 0.0299 |
| 49 | Terpolymer of bicyclo[2.2.1]hept-5-ene-2-methyl acetate/maleicanhydride/t-butylester of norbornene polymer of Example 25) | 0.8433 | 17.78 | 0.04743 |
| 50 | 50/50 copolymer of t-butyl ester of norbornene/ethyl ester of tetracyclododecene (polymer of Example 29) | 0.4693 | 33.01 | 0.0142 |
| 51 | 50/50 copolymer of t-butyl ester of norbornene/ethyl ester of tetracyclododecene (polymer of Example 30) | 0.4146 | 35.55 | 0.0117 |

Preparation of Resist Solution, Exposure and Development:

The polymers obtained in the above examples were dissolved in propylene glycol monomethyl ether acetate (PGMEA) at 15 w/v % of solids, to which was added the onium salt set forth in the examples at 5 or 10 w/w % to the polymer.

The solutions were filtered through a $0.2\mu$ Teflon® filter. A resist layer was formed from each solution by spin coating it onto a hexamethyldisilazane (HMDS) primed silicon wafer. The coated film was baked at 95° C. for 1 minute. The films were then exposed through a quartz mask to UV radiation from a Karl Suss MJB3 UV 250 instrument between the wave lengths of 230 to 250 nm. The exposed films were heated to 125° C. to 150° C. for 1 minute. The exposed and heated films were then developed in aqueous base to provide high resolution positive tone images without loss of film thickness in the unexposed regions.

The systems can be easily made negative working by development in a nonpolar solvent. These materials can be sensitized to the longer wave lengths (365 nm) by adding a small amount of sensitizers such as pyrene, perylene, or thioxanthones or to shorter wave lengths (193 nm), as these materials have been observed (as shown above) to have very low optical density at 193 nm.

EXAMPLE 52

The copolymer of bicyclo[2.2.1]hept-5-ene-2-methyl acetate/t-butylester of norbornene (the polymer of Example 21) number average molecular weight 21,000) was dissolved in propylene glycol monomethyl ether acetate (PGMEA) at 10 w/v % of solids. Triphenylsulfonium hexafluoroarsenate was added at a loading of 10 w/w % to the polymer. The resist film was filtered through a $0.2\mu$ Teflon® filter and the filtered solution was spin coated from the solution onto a hexamethyldisilazane primed silicon wafer at 500 rpm for 30 seconds followed by 2000 rpm for 25 seconds. This resulted in a $0.7\mu$ thick layer. The film was baked at 95° C. for 1 min over a hot plate and then exposed through a quartz mask to UV radiation (240 nm) at a dose of 50 mJ/cm². After post-baking at 125° C. for 1 minute, high resolution positive images were obtained by development in aqueous base for 60 seconds.

EXAMPLE 53

Copolymerization of Bicyclo[2.2.1]hept-5-ene-2-methyl Ethyl Oxalate/t-butylester of Norbornene To a 50 ml glass vial equipped with a Teflon® coated stir bar was added bicyclo[2.2.1]hept-5-ene-2-methyl ethyl oxalate (8.57 g, 0.0382 mol) and t-butylester of norbornene (7.42 g, 0.0392 mol) and 38 ml of toluene. A solution of the nickel catalyst [toluene complex of bisperfluorophenyl nickel, (toluene)Ni($C_6F_5$)$_2$] was prepared in the dry box by dissolving 0.1854 g (0.382 mmol) of (toluene)Ni($C_6F_5$)$_2$ in 5 ml of toluene. The active catalyst solution was added to the monomer solution via a syringe at ambient temperature. The reaction was allowed to stir for 5 hours at room temperature. The solution was diluted with toluene and the polymer was precipitated in excess methanol. The precipitated polymer was filtered, washed with acetone, and dried overnight under vacuum. The isolated yield of polymer was 7.62 g (48%). The polymer was characterized using GPC for molecular weight. Mn=28,000 and Mw=56,000. The NMR analysis of the copolymer indicated copolymer composition very close to the feed ratio. IR analysis of the copolymer indicated absence of any acid groups.

EXAMPLE 54

The copolymer of bicyclo[2.2.1]hept-5-ene-2-methyl acetate/t-butylester of norbornene (the polymer of Example 21) (number average molecular weight 2 1,000) was dissolved in propylene glycol monomethyl ether acetate (PGMEA) at 10 w/v % of solids. Diaryl iodonium hexafluoroantimonate (Sartomer 1012) was added at a loading of 10 w/w % to the polymer. The resist film was filtered through a $0.2\mu$ Teflon® filter and the filtered solution was spin coated from the solution onto a hexamethyldisilazane primed silicon wafer at 500 rpm for 30 seconds followed by 2000 rpm for 25 seconds. This resulted in a $0.7\mu$ thick layer. The film was baked at 95° C. for 1 min over a hot plate and then exposed through a quartz mask to UV radiation (240 nm) at a dose of 50 mJ/cm². After post-baking at 125° C. for 1 minute, high resolution positive images were obtained by development in aqueous base for 60 seconds.

EXAMPLE 55

Copolymer of bicyclo[2.2.1]hept-5-ene-2-methyl acetate/t-butylester of norbornene (the polymer of Example 21)

(number average molecular weight 21,000) was dissolved in propylene glycol monomethyl ether acetate (PGMEA) at 10 w/v % of solids. Diaryl iodonium hexafluoroantimonate (Sartomer 1012) was added at a loading of 10 w/w % to the polymer. The resist film was filtered through a $0.2\mu$ Teflon® filter and the filtered solution was spin coated from the solution onto a hexamethyldisilazane primed silicon wafer at 500 rpm for 30 seconds followed by 2000 rpm for 25 seconds. This resulted in a $0.7\mu$ thick layer. The film was baked at 95° C. for 1 min over a hot plate and then exposed through a quartz mask to UV radiation (240 nm) at a dose of 100 mJ/cm$^2$. After post-baking at 125° C. for 1 minute, high resolution positive images were obtained by development in aqueous base for 60 seconds.

EXAMPLE 56

Copolymerization of Bicyclo[2.2.1]hept-5-ene-2-methyl Ethyl Oxalate/t-butylester of Norbornene (70/30 Mole Ratio)

To a 50 ml glass vial equipped with a Teflon® coated stir bar was added bicyclo[2.2.1]hept-5-ene-2-methyl ethyl oxalate (14.8 g, 0.0663 mol) and t-butylester of norbornene (5.52 g, 0.0284 mol) and 113 ml of toluene. A solution of the nickel catalyst [toluene complex of bisperfluorophenyl nickel, (toluene)Ni($C_6F_5$)$_2$] was prepared in the dry box by dissolving 0.2296 g (0.474 mmol) of (toluene)Ni($C_6F_5$)$_2$ in 5 ml of toluene. The active catalyst solution was added to the monomer solution via a syringe at ambient temperature. The reaction was allowed to stir for 5 hours at room temperature. The solution was diluted with toluene and the polymer was precipitated in excess methanol. The precipitated polymer was filtered, washed with acetone and dried overnight under vacuum. The isolated yield of polymer was 10.15 g (50%). The polymer was characterized using GPC for molecular weight. Mn=35,000 and Mw=98,000. The NMR analysis of the copolymer indicated copolymer composition very close to the feed ratio. IR analysis of the copolymer indicated absence of any acid groups.

EXAMPLE 57

Copolymer of bicyclo [2.2.1]hept-5-ene-2-methyl acetate/t-butylester of norbornene (the polymer of Example 21) (number average molecular weight 21,000) was dissolved in propylene glycol monomethyl ether acetate (PGMEA) at 10 w/v % of solids. Triphenylsulfonium hexafluoroarsenate was added at a loading of 10 w/w % to the polymer. The resist film was filtered through a $0.2\mu$ Teflon® filter and the filtered solution was spin coated from the solution onto a hexamethyldisilazane primed silicon wafer at 500 rpm for 30 seconds followed by 2000 rpm for 25 seconds. This resulted in a $0.7\mu$ thick layer. The film was baked at 95° C. for 1 minute over a hot plate and then exposed through a quartz mask to UV radiation (240 mm) at a dose of 10 mJ/cm$^2$. After post-baking at 125° C. for 1 minute, high resolution positive images were obtained by development in aqueous base for 60 seconds.

EXAMPLE 58

Copolymer of bicyclo[2.2.1]hept-5-ene-2-methyl acetate/t-butylester of norbornene (the polymer of Example 21) (number average molecular weight 21,000) was dissolved in propylene glycol monomethyl ether acetate (PGMEA) at 10 w/v % of solids. Triphenylsulfonium hexafluoroarsenate was added at a loading of 10 w/w % to the polymer. The resist film was filtered through a $0.2\mu$ Teflon® filter and the filtered solution was spin coated from the solution onto a hexamethyldisilazane primed silicon wafer at 500 rpm for 30 seconds followed by 2000 rpm for 25 seconds. This resulted in a $0.7\mu$ thick layer. The film was baked at 95° C. for 1 minute over a hot plate and then exposed through a quartz mask to UV radiation (240 nm) at a dose of 30 mJ/cm$^2$. After post-baking at 125° C. for 1 minute, high resolution positive images were obtained by development in aqueous base for 60 seconds.

EXAMPLE 59

Copolymerization of Bicyclo[2.2.1]hept-5-ene-2-methyl Ethyl Oxalate/1-(1-ethoxy)ethyl 5-norbornene-2-carboxylated (50/50 Mole Ratio) Using NiArf catalyst To a 50 ml glass vial equipped with a Teflon® coated stir bar was added bicyclo[2.2.1]hept-5-ene-2-methyl ethyl oxalate (0.5166 g, 2.304 mmol) and 1-(1-ethoxy)ethyl 5-norbornene-2-carboxylate (0.4885 g, 2.304 mol) and 2.25 ml of cyclohexane. A solution of the nickel catalyst [toluene complex of bisperfluorophenyl nickel, (toluene)Ni($C_6F_5$)$_2$] was prepared in the dry box by dissolving 0.0112 g (0.023 mmol) of (toluene)Ni($C_6F_5$)$_2$] in 0.65 ml of ethyl acetate. The active catalyst solution was added to the monomer solution via a syringe at ambient temperature. The reaction was allowed to stir for 5 hours at room temperature. The solution was diluted with toluene and the polymer was precipitated in excess methanol. The precipitated polymer was filtered, washed with acetone, and dried overnight under vacuum. The isolated yield of polymer was 0.0315 g (3%). The polymer was characterized using GPC for molecular weight. Mn=52,000 and Mw=100,000.

EXAMPLE 60

The copolymer of maleicanhydride/t-butylester of norbornene obtained via free radical polymerization (the polymer of Example 24) (number average molecular weight 4,000) was dissolved in propylene glycol monomethyl ether acetate (PGMEA) at 15 w/v % of solids. Triarylsulfonium hexafluoroantimonate (Sartomer CD 1010, 50% solution in propylene carbonate) was added at a loading of 5 w/w % to the polymer. The resist film was filtered through a $0.2\mu$ Teflon® filter and the filtered solution was spin coated from the solution onto a hexamethyldisilazane primed silicon wafer at 500 rpm for 30 seconds followed by 2000 rpm for 25 seconds. This resulted in a $0.6\mu$ thick layer. The film was baked at 95° C. for 1 minute over a hot plate and then exposed through a quartz mask to UV radiation (240 nm) at a dose of 30 mJ/cm$^2$. After post-baking at 125° C. for 1 minute, high resolution positive images were obtained by development in aqueous base for 60 seconds.

EXAMPLE 61

The copolymer of maleic anhydride/t-butylester of norbornene obtained via free radical polymerization (the polymer of Example 24) (number average molecular weight 4,000) was dissolved in propylene glycol monomethyl ether acetate (PGMEA) at 15 w/v % of solids. Triarylsulfonium hexafluoroantimonate (Sartomer CD 1010, 50% solution in propylene carbonate) was added at a loading of 5 w/w % to the polymer. The resist film was filtered through a $0.2\mu$ Teflon® filter and the filtered solution was spin coated from the solution onto a hexamethyldisilazane primed silicon wafer at 500 rpm for 30 seconds followed by 2000 rpm for 25 seconds. This resulted in a $0.6\mu$ thick layer. The film was baked at 95° C. for 1 minute over a hot plate and then exposed through a quartz mask to UV radiation (240 nm) at a dose of 30 mJ/cm$^2$. After post-baking at 95° C. for 1 minute, high resolution positive images were obtained by development in aqueous base for 60 seconds.

EXAMPLE 62

Copolymerization of Bicyclo[2.2.1]hept-5-ene-2-methyl Ethyl Oxalate/trimethylsilyl Ester of Norbornene (50/50 Mole Ratio)

To a 50 ml glass vial equipped with a Teflon® coated stir bar was added bicyclo[2.2.1]hept-5-ene-2-methyl ethyl oxalate (1.5484 g, 6.904 mmol) trimethyl silyl ester of norbornene (1.4523 g, 6.905 mol) and 6.75 ml of cyclohexane. A solution of the nickel catalyst [toluene complex of bisperfluorophenyl nickel, (toluene)Ni($C_6F_5$)$_2$] was prepared in the dry box by dissolving 0.0335 g (0.0691 mmol of (toluene)Ni($C_6F_5$)$_2$ in 1.95 ml of ethyl acetate. The active catalyst solution was added to the monomer solution via a syringe at ambient temperature. The reaction was allowed to stir for 5 hours at room temperature. The polymer was precipitated in excess methanol. The precipitated polymer was filtered, washed with acetone, and dried overnight under vacuum. The isolated yield of polymer was 0.2675 g (9%). It indicated the presence of acid functionality, arising from the deprotection of the trimethyl silyl groups.

EXAMPLE 63

The terpolymer of maleic anhydride/bicyclo[2.2.1]hept-5-ene-2-methyl acetate/t-butylester of norbornene obtained via free radical polymerization (the polymer of Example 25) (number average molecular weight 3000) was dissolved in propylene glycol monomethyl ether acetate (PGMEA) at 10 w/v % of solids. Diaryl iodonium hexafluoroantimonate (Sartomer 1012) was added at a loading of 10 w/w % to the polymer. The resist film was filtered through a 0.2μ Teflon® filter and the filtered solution was spin coated from the solution onto a hexamethyldisilazane primed silicon wafer at 500 rpm for 30 seconds followed by 2000 rpm for 25 seconds. This resulted in a 0.5μ thick layer. The film was baked at 95° C. for 1 minute over a hot plate and then exposed through a quartz mask to UV radiation (240 nm) at a dose of 50 mJ/cm$^2$. After post-baking at 125° C. for 1 minute, high resolution positive images were obtained by development in aqueous base for 60 seconds.

EXAMPLE 64

The copolymer of bicyclo[2.2.1]hept-5-ene-2-methyl ethylcarbonate/t-butylester of norbornene (the polymer of Example 22) (number average molecular weight 22,000) was dissolved in propylene glycol monomethyl ether acetate (PGMEA) at 15 w/v % of solids. Triarylsulfonium hexafluoroantimonate (Sartomer CD 1010, 50% solution in propylene carbonate) was added at a loading of 5 w/w % to the polymer. The resist film was filtered through a 0.2μ Teflon® filter and the filtered solution was spin coated from the solution onto a hexamethyldisilazane primed silicon wafer at 500 rpm for 30 seconds followed by 2000 rpm for 25 seconds. This resulted in a 1.1μ thick layer. The film was baked at 95° C. for 1 minute over a hot plate and then exposed through a quartz mask to UV radiation (240 nm) at a dose of 30 mJ/cm$^2$. After post-baking at 95° C. for 1 minute, high resolution positive images were obtained by development in aqueous base for 60 seconds.

EXAMPLE 65

Copolymerization of Bicyclo[2.2.1]hept-5-ene-2-methyl Ethyl Oxalate/t-butylester of Norbornene To a 50 ml glass vial equipped with a Teflon® coated stir bar is added 2.42 g (12.5 mmole) of t-butylester of norbornene, 8.57 g (38.2 mmole) of bicyclo[2.2.1]hept-5-ene-2-methyl ethyl oxalate, 50 ml of freshly distilled dichloroethane and the solution is degassed under argon atmosphere. A 10 ml glass vial equipped with a Teflon® coated stir bar is charged with 0.0365 g (0.1 mmol) of allylpalladium chloride dimer in a monomer to catalyst ratio of 500/1 and 2 ml of dichloroethane. In another 10 ml glass vial is charged with 0.0344 g (0.1 mmol) of silver hexafluoro antimonate and 2 ml of dichloroethane. The catalyst solution is prepared by mixing the allylpalladium chloride dimer solution with silver hexafluoro antimonate solution inside the dry box. Immediate precipitation of the silver chloride salt is observed, which is filtered, to obtain active catalyst solution. The active catalyst solution is then added to the monomer solution via a syringe and the reaction mixture allowed to stir for 20 hours at 60° C. The polymer solution is cooled, concentrated in a rotovap, and precipitated into methanol.

EXAMPLE 66

The copolymer of bicyclo[2.2.1]hept-5-ene-2-methyl ethylcarbonate/t-butylester of norbornene (the polymer of Example 22) (number average molecular weight 22,000) was dissolved in propylene glycol monomethyl ether acetate (PGMEA) at 15 w/v % of solids. Triphenylsulfonium hexafluoroantimonate (Sartomer CD 1010, 50% solution in propylene carbonate) was added at a loading of 5 w/w % to the polymer. The resist film was filtered through a 0.2μ Teflon® filter and the filtered solution was spin coated from the solution onto a hexamethyldisilazane primed silicon wafer at 500 rpm for 30 seconds followed by 2000 rpm for 25 seconds. This resulted in a 1.1 μ thick layer. The film was baked at 95° C. for 1 minute over a hot plate and then exposed through a quartz mask to UV radiation (240 nm) at a dose of 15 mJ/cm$^2$. After post-baking at 95° C. for 1 minute, high resolution positive images were obtained by development in aqueous base for 60 seconds.

EXAMPLE 67

The copolymer of bicyclo [2.2.1]hept-5-ene-2-methyl butylcarbonate/t-butylester of norbornene (the polymer of Example 23) (number average molecular weight 22,000) was dissolved in propylene glycol monomethyl ether acetate (PGMEA) at 15 w/v % of solids. Triarylsulfonium hexafluoroantimonate (Sartomer CD 1010, 50% solution in propylene carbonate) was added at a loading of 5 w/w % to the polymer. The resist film was filtered through a 0.2μ Teflon® filter and the filtered solution was spin coated from the solution onto a hexamethyldisilazane primed silicon wafer at 500 rpm for 30 seconds followed gby 2000 rpm for 25 seconds. This resulted in a 1.0 11 thick layer. The film was baked at 95° C. for 1 minute over a hot plate and then exposed through a quartz mask to UV radiation (240 nm) at a dose of 30 mJ/cm$^2$. After post-baking at 125° C. for 0.5 minute, high resolution positive images were obtained by development in aqueous base for 60 seconds.

EXAMPLE 68

The copolymer of bicyclo[2.2.1]hept-5-ene-2-methyl butylcarbonate/t-butylester of norbornene (the polymer of Example 23) (number average molecular weight 22,000) was dissolved in propylene glycol monomethyl ether acetate (PGMEA) at 15 w/v % of solids. Triarylsulfonium hexafluoroantimonate (Sartomer CD 1010, 50% solution in propylene carbonate) was added at a loading of 5 w/w % to the polymer. The resist film was filtered through a 0.2μ Teflon® filter and the filtered solution was spin coated from the solution onto a hexamethyldisilazane primed silicon wafer at 500 rpm for 30 seconds followed by 2000 rpm for 25 seconds. This resulted in a 1.0μ thick layer. The film was baked at 95° C. for 1 minute over a hot plate and then exposed through a quartz mask to UV radiation (240 nm) at a dose of 30 mJ/cm². After post-baking at 150° C. for 0.5 minute, high resolution positive images were obtained by development in aqueous base for 60 seconds.

EXAMPLE 69

A 35/65 mole % hydrogenated copolymer of ethylester of tetracyclodecene/t-butylester of norbornene (the polymer of Example 37) (number average molecular weight 23,000) obtained via ring opening metathesis polymerization was dissolved in propylene glycol monomethyl ether acetate (PGMEA) at 15 w/v % of solids. Triarylsulfonium hexafluoroantimonate (Sartomer CD 1010, 50% solution in propylene carbonate) was added at a loading of 5 w/w % to the polymer. The resist film was filtered through a 0.2μ Teflon® filter and the filtered solution was spin coated from the solution onto a hexamethyldisilazane primed silicon wafer at 500 rpm for 30 seconds followed by 2000 rpm for 25 seconds. This resulted in a 1.1μ thick layer. The film was baked at 95° C. for 1 minute over a hot plate and then exposed through a quartz mask to UV radiation (240 nm) at a dose of 30 mJ/cm². After post-baking at 125° C. for 1.0 minute, high resolution positive images were obtained by development in aqueous base for 30 seconds.

EXAMPLE 70

A 50/50 mole % nonhydrogenated copolymer of ethylester of tetracyclodecene/t-butylester of norbornene (the polymer of Example 39) (number average molecular weight 34,000) obtained via ring opening metathesis polymerization was dissolved in propylene glycol monomethyl ether acetate (PGMEA) at 15 w/v % of solids. Triarylsulfonium hexafluoroantimonate (Sartomer CD 1010, 50% solution in propylene carbonate) was added at a loading of 5 w/w % to the polymer. The resist film was filtered through a 0.2μ Teflon® filter and the filtered solution was spin coated from the solution onto a hexamethyldisilazane primed silicon wafer at 500 rpm for 30 seconds followed by 2000 rpm for 25 seconds. This resulted in a 1.25μ thick layer. The film was baked at 95° C. for 1 minute over a hot plate and then exposed through a quartz mask to UV radiation (240 nm) at a dose of 50 mJ/cm². After post-baking at 150° C. for 30 seconds, high resolution positive images were obtained by development in aqueous base for 60 seconds.

EXAMPLE 71

To a 50 ml glass vial equipped with a Teflon® coated stir bar was added bicyclo[2.2.1]hept-5-ene-2-methyl ethyl oxalate (8.57 g, 0.0382 mol) and t-butylester of norbornene (7.42 g, 0.0392 mol) and 38 ml of toluene. A solution of the nickel catalyst [toluene complex of bisperfluorophenyl nickel, (toluene)Ni($C_6F_5$)$_2$] was prepared in the dry box by dissolving 0.1854 g [0.382 mmol) of (toluene)Ni($C_6F_5$)$_2$ in 5 ml of toluene. The active catalyst solution was added to the monomer solution via a syringe at ambient temperature. The reaction was allowed to stir for 5 hours at room temperature. The solution was diluted with toluene and the polymer was precipitated in excess methanol. The precipitated polymer was filtered, washed with acetone, and dried overnight under vacuum. The isolated yield of polymer was 7.62 g (48%). The polymer was characterized using GPC for molecular weight. Mn=28,000 and Mw=56,000. The NMR analysis of the copolymer indicated copolymer composition very close to the feed ratio. IR analysis of the copolymer indicated absence of any acid groups.

EXAMPLE 72

Copolymerization of Bicyclo [2.2.1]hept-5-ene-2-methyl Acetate/t-butylester of Norbornene (Monomer/cat Ratio 100/1, 30 wt % Solids)

To a 25 ml glass vial equipped with a Teflon® coated stir bar was added bicyclo[2.2.1]hept-5-ene-2-methyl acetate (1.399 g, 8.418 mmol) and t-butylester of norbornene (1.6217 g, 8.34 mmol) and 5 ml of toluene. A solution of the nickel catalyst (toluene complex of bisperfluorophenyl nickel, (toluene)Ni($C_6F_5$)$_2$) was prepared in the dry box by dissolving 0.0811 g (0.1673 mmol) of (toluene)Ni($C_6F_5$)$_2$) in 3 ml of toluene. The active catalyst solution was added to the monomer solution via a syringe at ambient temperature. The reaction was allowed to stir for 6 hours at room temperature. The solution was diluted with toluene and the polymer was precipitated in excess methanol. The precipitated polymer was filtered, washed with acetone, and dried overnight under vacuum. The isolated yield of polymer was 2.743 g (90%). The polymer was characterized using GPC for molecular weight. Mn 33,000 and Mw=74,000.

EXAMPLE 73

Copolymerization of Bicyclo[2.2.1]hept-5-ene-2-methyl acetate/t-butylester of Norbornene (Monomer/cat Ratio 200/1, 30 wt % Solids)

To a 25 ml glass vial equipped with a Teflon® coated stir bar was added bicyclo[2.2.1]hept-5-ene-2-methyl acetate (1.388 g, 8.353 mmol) and t-butylester of norbornene (1.6245 g, 8.3 mmol) and 5 ml of toluene. A solution of the nickel catalyst (toluene complex of bisperfluorophenyl nickel, (toluene)Ni($C_6F_5$)$_2$) was prepared in the dry box by dissolving 0.0406 g (0.0836 mmol) of (toluene)Ni($C_6F_5$)$_2$) in 3 ml of toluene. The active catalyst solution was added to the monomer solution via a syringe at ambient temperature. The reaction was allowed to stir for 6 hours at room temperature. The solution was diluted with toluene and the polymer was precipitated in excess methanol. The precipitated polymer was filtered, washed with acetone, and dried overnight under vacuum. The isolated yield of polymer was 1.72 g (57%). The polymer was characterized using GPC for molecular weight. Mn=30,000 and Mw=68,000.

EXAMPLE 74

Copolymerization of Bicyclo[2.2.1]hept-5-ene-2-methyl Acetate/t-butylester of Norbornene (Monomer/cat Ratio 500/1, 30 wt. % Solids)

To a 25 ml glass vial equipped with a Teflon® coated stir bar was added bicyclo[2.2.1]hept-5-ene-2-methyl acetate (1.3957 g, 8.397 mmol) and t-butylester of norbornene (1.6235 g, 8.354 mmol) and 5 ml of toluene. A solution of the nickel catalyst (toluene complex of bisperfluorophenyl nickel, (toluene)Ni($C_6F_5$)$_2$) was prepared in the dry box by dissolving 0.04162 g (0.0335 mmol) of (toluene)Ni($C_6F_5$)$_2$) in 3 ml of toluene. The active catalyst solution was added to the monomer solution via a syringe at ambient temperature. The reaction was allowed to stir for 6 hours at room temperature. The solution was diluted with toluene and the polymer was precipitated in excess methanol. The precipitated polymer was filtered, washed with acetone, and dried overnight under vacuum. The isolated yield of polymer was 0.734 g (24%). The polymer was characterized using GPC for molecular weight. Mn=35,000 and Mw=75,000.

EXAMPLE 75

Copolymerization of Bicyclo[2.2.1]hept-5-ene-2-methyl Acetate/t-butylester of Norbornene (Monomer/cat Ratio 100/1, 20 wt. % Solids)

To a 25 ml glass vial equipped with a Teflon® coated stir bar was added bicyclo[2.2.1]hept-5-ene-2-methyl acetate (1.3917 g, 8.373 mmol) and t-butylester of norbornene (1.6241 g, 8.36 mmol) and 9 ml of toluene. A solution of the nickel catalyst (toluene complex of bisperfluorophenyl nickel, (toluene)Ni($C_6F_5$)$_2$) was prepared in the dry box by dissolving 0.0811 g (0.167 mmol) of (toluene)Ni($C_6F_5$)$_2$ in 5 ml of toluene. The active catalyst solution was added to the monomer solution via a syringe at ambient temperature. The reaction was allowed to stir for 6 hours at room temperature. The solution was diluted with toluene and the polymer was precipitated in excess methanol. The precipitated polymer was filtered, washed with acetone, and dried overnight under vacuum. The isolated yield of polymer was 2.577 g (85.4%). The polymer was characterized using GPC for molecular weight. Mn=27,000 and Mw=51,000.

EXAMPLE 76

Copolymerization of Bicyclo[2.2.1]hept-5-ene-2-methyl Acetate/t-butylester of Norbornene (Monomer/cat Ratio 100/1, 10 wt. % Solids)

To a 25 ml glass vial equipped with a Teflon® coated stir bar was added bicyclo[2.2.1]hept-5-ene-2-methyl acetate (1.4041 g, 8.447 mmol) and t-butylester of norbornene (1.6251 g, 8.365 mmol) and 26 ml of toluene. A solution of the nickel catalyst (toluene complex of bisperfluorophenyl nickel, (toluene)Ni($C_6F_5$)$_2$) was prepared in the dry box by dissolving 0.0811 g (0.167 mmol of (toluene)Ni($C_6F_5$)$_2$) in 5 ml of toluene. The active catalyst solution was added to the monomer solution via a syringe at ambient temperature. The reaction was allowed to stir for 6 hours at room temperature. The solution was diluted with toluene and the polymer was precipitated in excess methanol. The precipitated polymer was filtered, washed with acetone, and dried overnight under vacuum. The isolated yield of polymer was 2.3035 g (75.4%). The polymer was characterized using GPC for molecular weight. Mn=18,000 and Mw=40,000.

EXAMPLE 77

Copolymerization of Bicyclo[2.2.1]hept-5-ene-2-methyl Acetate/t-butylester of Norbornene (Monomer/cat Ratio 200/1, 30 wt. % Solids)

To a 25 ml glass vial equipped with a Teflon® coated stir bar was added bicyclo[2.2.1]hept-5-ene-2-methyl acetate (1.3881 g, 8.353 mmol) and t-butylester of norbornene (1.6265 g, 8.372 mmol) and 6.7 ml of cyclohexane. A solution of the nickel catalyst (toluene complex of bisperfluorophenyl nickel, (toluene)Ni($C_6F_5$)$_2$) was prepared in the dry box by dissolving 0.0405 g (0.0836 mmol of (toluene)Ni($C_6F_5$)$_2$) in 1.9 ml of ethylacetate. The active catalyst solution was added to the monomer solution via a syringe at ambient temperature. The reaction was allowed to stir for 6 hours at room temperature. The solution was diluted with toluene and the polymer was precipitated in excess methanol. The precipitated polymer was filtered, washed with acetone, and dried overnight under vacuum. The isolated yield of polymer was 2.1345 g (70.8%). The polymer was characterized using GPC for molecular weight. Mn=31,000 and Mw 69,000.

EXAMPLE 78

Copolymerization of Bicyclo[2.2.1]hept-5-ene-2-methyl Acetate/t-butylester of Norbornene (Monomer/cat Ratio 200/1, 30 wt. % Solids)

To a 25 ml glass vial equipped with a Teflon® coated stir bar was added bicyclo[2.2.1]hept-5-ene-2-methyl acetate (1.3967 g, 8.404 mmol) and t-butylester of norbornene (1.6233 g, 8.356 mmol) and 4.5 ml of cyclohexane. A solution of the nickel catalyst (toluene complex of bisperfluorophenyl nickel, (toluene)Ni($C6F_5$)$_2$) was prepared in the dry box by dissolving 0.0405 g (0.0836 mmol of (toluene)Ni($C_6F_5$)$_2$) in 3.5 ml of ethylacetate. The active catalyst solution was added to the monomer solution via a syringe at ambient temperature. The reaction was allowed to stir for 6 hours at room temperature. The solution was diluted with toluene and the polymer was precipitated in excess methanol. The precipitated polymer was filtered, washed with acetone, and dried overnight under vacuum. The isolated yield of polymer was 1.7617 g (58%). The polymer was characterized using GPC for molecular weight. Mn=27,000 and Mw=71,000.

EXAMPLES 72–78

| Example | Solvent | Catalyst/ Monomer Ratio | Wt % of Monomer in Solution | Mn/Mw ($10^3$) | Theoretical Mn ($10^3$) | Yield (%) |
|---|---|---|---|---|---|---|
| 72 | toluene | 100/1 | 30 | 33.4/74.2 | 18 | 91 |
| 73 | toluene | 200/1 | 30 | 30.5/68.6 | 36 | 57 |
| 74 | toluene | 500/1 | 30 | 34.8/74.8 | 90 | 25 |
| 75 | toluene | 100/1 | 10 | 18.4/48 | 18 | 75 |
| 76 | toluene | 100/1 | 20 | 27.3/51 | 18 | 85 |
| 77 | cyclohexane/ ethyl acetate (75/25) | 200/1 | 30 | 31/68 | 36 | 71 |
| 78 | cyclohexane/ ethyl acetate (50/50) | 200/1 | 30 | 27/71 | 36 | 58 |

EXAMPLE 79

Copolymerization of Bicyclo[2.2.1]hept-5-ene-2-methyl Acetate/t-butylester of Norbornene CHA/EtOAc (50/50) Solvent Mixture (Monomer/cat Ratio 100/1, 30 wt. % Solids)

To a 25 ml glass vial equipped with a Teflon® coated stir bar was added bicyclo[2.2.1]hept-5-ene-2-methyl acetate (1.3933 g, 8.382 mmol) and t-butylester of norbornene (1.6230 g, 8.354 mmol) and 4.5 ml of cyclohexane. A solution of the nickel catalyst (toluene complex of bisperfluorophenyl nickel, (toluene)Ni($C_6F_5$)$_2$) was prepared in the dry box by dissolving 0.0405 g (0.0836 mmol) of (toluene)Ni($C_6F_5$)$_2$) in 3.9 ml of ethylacetate. The active catalyst solution was added to the monomer solution via a syringe at ambient temperature. The reaction was allowed to stir for 6 hours at room temperature. The solution was diluted with toluene and the polymer was precipitated in excess methanol. The precipitated polymer was filtered, washed with acetone, and dried overnight under vacuum. The isolated yield of polymer was 2.6918 g (89%). The polymer was characterized using GPC for molecular weight. Mn=19,000 and Mw=48,000.

EXAMPLE 80

Molecular Weight Control of Norbornene in the Presence of an Ether Based Electron Donor And Using Allyl Trifluoroacetate as Chain Transfer Agent 1) Norbornene polymerization with 1 mole % of allyl trifluoroacetate as chain transfer agent:

To a 100 ml glass vial equipped with a teflon coated stir bar was added norbornene (5.0 g, 53 mmol), cyclohexane (55 ml) and allyltrifluoro acetate (0.082 g, 0.0005 mol) as chain transfer agent to control molecular weight. The solution was heated to 50° C. and to this stirred solution, dimethyl diethoxysilane (0.392 g, 2.64 mmol) was added as an ether based electron donor ligand. To the above solution a mixture of tris(pentafluorophenyl) boron (234 $\mu$mol in petroleum naphtha) and triethylaluminum (0.154 ml of a 1.7 molar solution in cyclohexane, 260 $\mu$mol ) was added followed by nickel ethylhexanoate (0.02 ml of an 8 weight % nickel solution in mineral spirits, 26 $\mu$mol). The reaction was allowed to run for 6 hours and then the reaction was quenched with methanol. The solution was diluted and the polymer was precipitated in excess acetone. The precipitated polymer was filtered, washed with acetone and dried overnight under vacuum. The yield of polymer was 4.45 g (89%). The polymer was characterized using GPC and these results are provided in Table 1.

2) Norbornene polymerization with 2 mole % of allyl trifluoroacetate as chain transfer agent:

To a 100 ml glass vial equipped with a teflon coated stir bar was added norbornene (5.0 g, 53 mmol), cyclohexane (55 ml) and allyltrifluoro acetate (0.163 g, 0.0011 mol) as chain transfer agent to control molecular weight. The solution was heated to 50° C. and to this stirred solution, dimethyl diethoxysilane (0.392 g, 2.64 mmol) was added as an ether based electron donor ligand. To the above solution a mixture of tris(pentafluorophenyl) boron (234 $\mu$mol in petroleum naphtha) and triethylaluminum (0.154 ml of a 1.7 molar solution in cyclohexane, 260 $\mu$mol) was added followed by nickel ethylhexanoate (0.02 ml of an 8 weight % nickel solution in mineral spirits, 26$\mu$mol). The reaction was allowed to run for 6 hours and then the reaction was quenched with methanol. The solution was diluted and the polymer was precipitated in excess acetone. The precipitated polymer was filtered, washed with acetone and dried overnight under vacuum. The yield of polymer was 4.9 g (97%). The polymer was characterized using GPC and these results are provided in Table 1.

3) Norbornene polymerization with 3 mole % of allyl trifluoroacetate as chain transfer agent:

To a 100 ml glass vial equipped with a teflon coated stir bar was added norbornene (5.0 g, 53 mmol), cyclohexane (55 ml) and allyltrifluoro acetate (0.245 g, 0.0016 mol) as chain transfer agent to control molecular weight. The solution was heated to 50° C. and to this stirred solution, dimethyl diethoxysilane (0.392 g, 2.64 mmol) was added as an ether based electron donor ligand. To the above solution a mixture of tris(pentafluorophenyl) boron (234 $\mu$mol in petroleum naphtha) and triethylaluminum (0.154 ml of a 1.7 molar solution in cyclohexane, 260 $\mu$mol) was added followed by nickel ethylhexanoate (0.02 ml of an 8 weight % nickel solution in mineral spirits, 26 $\mu$mol). The reaction was allowed to run for 6 hours and then the reaction was quenched with methanol. The solution was diluted and the polymer was precipitated in excess acetone. The precipitated polymer was filtered, washed with acetone and dried overnight under vacuum. The yield of polymer was 4.65 g (93%). The polymer was characterized using GPC and these results are provided in Table 1.

4) Norbornene polymerization with 5 mole % of allyl trifluoroacetate as chain transfer agent:

To a 100 ml glass vial equipped with a teflon coated stir bar was added norbornene (25.0 g, 265 mmol), cyclohexane (280 ml) and allyltrifluoro acetate (2.04 g, 0.013 mol) as chain transfer agent to control molecular weight. The solution was heated to 50° C. and to this stirred solution, dimethyl diethoxysilane (1.96 g, 13.2 mmol) was added as an ether based electron donor ligand. To the above solution a mixture of tris(pentafluorophenyl) boron (1.170 mmol in petroleum naphtha) and triethylaluminum (0.77 ml of a 1.7 molar solution in cyclohexane, 1.30 mmol) was added followed by nickel ethylhexanoate (0.1 ml of an 8 weight % nickel solution in mineral spirits, 0.13 mmol). The reaction was allowed to run for 6 hours and then the reaction was quenched with methanol. The solution was diluted and the polymer was precipitated in excess acetone. The precipitated polymer was filtered, washed with acetone and dried overnight under vacuum. The yield of polymer was 24 g (96%). The polymer was characterized using GPC and these results are provided in Table 1.

5) Norbornene polymerization with 10 mole % of allyl trifluoroacetate as chain transfer agent:

To a 100 ml glass vial equipped with a teflon coated stir bar was added norbornene (25.0 g, 265 mmol), cyclohexane (280 ml) and allyltrifluoro acetate (4.08 g, 0.026 mol) as chain transfer agent to control molecular weight. The solution was heated to 50° C. and to this stirred solution, dimethyl diethoxysilane (1.96 g, 13.2 mmol) was added as an ether based electron donor ligand. To the above solution a mixture of tris(pentafluorophenyl) boron (1.170 mmol in petroleum naphtha) and triethylaluminum (0.77 ml of a 1.7 molar solution in cyclohexane, 1.30 mmol) was added followed by nickel ethylhexanoate (0.1 ml of an 8 weight % nickel solution in mineral spirits, 0.13 mmol). The reaction was allowed to run for 6 hours and then the reaction was quenched with methanol. The solution was diluted and the polymer was precipitated in excess acetone. The precipitated polymer was filtered, washed with acetone and dried overnight under vacuum. The yield of polymer was 21.7 g (87%). The polymer was characterized using GPC and these results are provided in Table 1.

6) Norbornene polymerization with 20 mole % of allyl trifluoroacetate as chain transfer agent:

To a 100 ml glass vial equipped with a teflon coated stir bar was added norbornene (5.0 g, 53 mmol), cyclohexane (55 ml) and allyltrifluoro acetate (1.63 g, 0.011 mol) as chain transfer agent to control molecular weight. The solution was heated to 50° C. and to this stirred solution, dimethyl diethoxysilane (0.392 g, 2.64 mmol) was added as an ether based electron donor ligand. To the above solution a mixture of tris(pentafluorophenyl) boron (234 $\mu$mol in petroleum naphtha) and triethylaluminum (0.154 ml of a 1.7 molar solution in cyclohexane, 260 $\mu$mol) was added followed by nickel ethylhexanoate (0.02 ml of an 8 weight % nickel solution in mineral spirits, 26$\mu$mol). The reaction was allowed to run for 6 hours and then the reaction was quenched with methanol. The solution was diluted and the polymer was precipitated in excess acetone. The precipitated polymer was filtered, washed with acetone and dried overnight under vacuum. The yield of polymer was 2.85 g (57%). The polymer was characterized using GPC and these results are provided in Table 1.

TABLE 1

| Sample # | Mole % of Allyl trifluoroacetate | Yield of polymer (%) | Molecular weight ($10^3$) | | Poly-dispersity |
|---|---|---|---|---|---|
| | | | Mn | Mw | |
| 1 | 1 | 89 | Could not measure | Could not measure | — |
| 2 | 2 | 97 | 148 | 476 | 3.2 |
| 3 | 3 | 93 | 118 | 348 | 2.9 |
| 4 | 5 | 97 | 93 | 281 | 3.0 |
| 5 | 10 | 87 | 65 | 196 | 3.0 |
| 6 | 20 | 57 | 33 | 90 | 2.7 |

EXAMPLE 81
Molecular Weight Control of Norbornene in the Presence of an Ether Based Electron Donor And Using Allyl Chloride as Chain Transfer Agent 1) Norbornene polymerization with 1 mole % of allyl chloride as chain transfer agent:

To a 100 ml glass vial equipped with a teflon coated stir bar was added norbornene (5.0 g, 53 mmol), cyclohexane (55 ml) and allyl chloride (0.04 g, 0.0005 mol) as chain transfer agent to control molecular weight. The solution was heated to 50° C. and to this stirred solution, dimethyl diethoxysilane (0.392 g, 2.64 mmol) was added as an ether based electron donor ligand. To the above solution a mixture of tris(pentafluorophenyl) boron (234 µmol in petroleum naphtha) and triethylaluminum (0.154 ml of a 1.7 molar solution in cyclohexane, 260 µmol) was added followed by nickel ethylhexanoate (0.02 ml of an 8 weight % nickel solution in mineral spirits, 26 µmol). The reaction was allowed to run for 6 hours and then the reaction was quenched with methanol. The solution was diluted and the polymer was precipitated in excess acetone. The precipitated polymer was filtered, washed with acetone and dried overnight under vacuum. The yield of polymer was 4.55 g (92%). The polymer was characterized using GPC and these results are provided in Table 2.

2) Norbornene polymerization with 2 mole % of allyl chloride as chain transfer agent:

To a 100 ml glass vial equipped with a teflon coated stir bar was added norbornene (5.0 g, 53 mmol), cyclohexane (55 ml) and allyl chloride (0.081 g, 0.001 mol) as chain transfer agent to control molecular weight. The solution was heated to 50° C. and to this stirred solution, dimethyl diethoxysilane (0.392 g, 2.64 mmol) was added as an ether based electron donor ligand. To the above solution a mixture of tris(pentafluorophenyl) boron (234 µmol in petroleum naphtha) and triethylaluminum (0.154 ml of a 1.7 molar solution in cyclohexane, 260 µmol) was added followed by nickel ethylhexanoate (0.02 ml of an 8 weight % nickel solution in mineral spirits, 26 µmol). The reaction was allowed to run for 6 hours and then the reaction was quenched with methanol. The solution was diluted and the polymer was precipitated in excess acetone. The precipitated polymer was filtered, washed with acetone and dried overnight under vacuum. The yield of polymer was 4.25 g (85%). The polymer was characterized using GPC and these results are provided in Table 2.

3) Norbornene polymerization with 3 mole % of allyl chloride as chain transfer agent:

To a 100 ml glass vial equipped with a teflon coated stir bar was added norbornene (5.0 g, 53 mmol), cyclohexane (55 ml) and allyl chloride (0.121 g, 0.0016 mol) as chain transfer agent to control molecular weight. The solution was heated to 50° C. and to this stirred solution, dimethyl diethoxysilane (0.392 g, 2.64 mmol) was added as an ether based electron donor ligand. To the above solution a mixture of tris(pentafluorophenyl) boron (234 µmol in petroleum naphtha) and triethylaluminum (0.154 ml of a 1.7 molar solution in cyclohexane, 260 µmol) was added followed by nickel ethylhexanoate (0.02 ml of an 8 weight % nickel solution in mineral spirits, 26 µmol). The reaction was allowed to run for 6 hours and then the reaction was quenched with methanol. The solution was diluted and the polymer was precipitated in excess acetone. The precipitated polymer was filtered, washed with acetone and dried overnight under vacuum. The yield of polymer was 4.28 g (86%). The polymer was characterized using GPC and these results are provided in Table 2.

4) Norbornene polymerization with 5 mole % of allyl chloride as chain transfer agent:

To a 100 ml glass vial equipped with a teflon coated stir bar was added norbornene (5.0 g, 53 mmol), cyclohexane (55 ml) and allyl chloride(0.203 g, 0.0026 mol) as chain transfer agent to control molecular weight. The solution was heated to 50° C. and to this stirred solution, dimethyl diethoxysilane (0.392 g, 2.64 mmol) was added as an ether based electron donor ligand. To the above solution a mixture of tris(pentafluorophenyl) boron (234 µmol in petroleum naphtha) and triethylaluminum (0.154 ml of a 1.7 molar solution in cyclohexane, 260µmol) was added followed by nickel ethylhexanoate (0.02 ml of an 8 weight % nickel solution in mineral spirits, 26µmol). The reaction was allowed to run for 6 hours and then the reaction was quenched with methanol. The solution was diluted and the polymer was precipitated in excess acetone. The precipitated polymer was filtered, washed with acetone and dried overnight under vacuum. The yield of polymer was 4.05 g (81%). The polymer was characterized using GPC and these results are provided in Table 2.

5) Norbornene polymerization with 10 mole % of allyl chloride as chain transfer agent:

To a 100 ml glass vial equipped with a teflon coated stir bar was added norbornene (5.0 g, 53 mmol), cyclohexane (55 ml) and allyl chloride (0.406 g, 0.0053 mol) as chain transfer agent to control molecular weight. The solution was heated to 50° C. and to this stirred solution, dimethyl diethoxysilane (0.392 g, 2.64 mmol) was added as an ether based electron donor ligand. To the above solution a mixture of tris(pentafluorophenyl) boron (234 µmol in petroleum naphtha) and triethylaluminum (0.154 ml of a 1.7 molar solution in cyclohexane, 260µmol) was added followed by nickel ethylhexanoate (0.02 ml of an 8 weight % nickel solution in mineral spirits, 26µmol). The reaction was allowed to run for 6 hours and then the reaction was quenched with methanol. The solution was diluted and the polymer was precipitated in excess acetone. The precipitated polymer was filtered, washed with acetone and dried overnight under vacuum. The yield of polymer was 3.55 (71%). The polymer was characterized using GPC and these results are provided in Table 2.

TABLE 2

| Sample # | Mole % of Allyl chloride | Yield of polymer (%) | Molecular weight ($10^3$) | | Polydispersity |
|---|---|---|---|---|---|
| | | | Mn | Mw | |
| 1 | 1 | 91 | — | — | — |
| 2 | 2 | 85 | 109 | 294 | 2.7 |
| 3 | 3 | 86 | 51 | 148 | 2.9 |
| 4 | 5 | 81 | 26 | 120 | 4.7 |
| 5 | 10 | 71 | 20 | 96 | 4.8 |

EXAMPLE 82

Alkyl Norbornene/norbornene Copolymers Using Tech II Catalyst With And Without Ether as an Electron Donor Ligand 1) Copolymer of norbornene/hexyl norbornene (95/5 mole ratio).

To a 100 ml glass vial equipped with a teflon coated stir bar was added norbornene (4.56 g, 48.4 mmol), cyclohexane (50 ml) and Hexyl norbornene (0.456 g, 2.5 mmol). The solution was heated to 70° C. and to this stirred solution, a mixture of tris(pentafluorophenyl) boron (222 μmol in petroleum naphtha) and triethylaluminum (0.148 ml of a 1.7 molar solution in cyclohexane, 247 μmol) was added followed by nickel ethylhexanoate (0.019 ml of an 8 weight % nickel solution in mineral spirits, 24.7 μmol). The reaction was allowed to run for 6 hours and then the reaction was quenched with methanol. The solution was diluted and the polymer was precipitated in excess acetone. The precipitated polymer was filtered, washed with acetone and dried overnight under vacuum. The yield of polymer was 4.5 (90%). The polymer was characterized using GPC for molecular weight and $^{13}$C NMR for copolymer composition and these results are provided in Table 3.

2) Copolymer of norbornene/hexyl norbornene (90/10 mole ratio).

To a 100 ml glass vial equipped with a teflon coated stir bar was added norbornene (4.15 g, 44.1 mmol), cyclohexane (50 ml) and Hexyl norbornene (0.877 g, 4.90 mmol). The solution was heated to 70° C. and to this stirred solution, a mixture of tris(pentafluorophenyl) boron (214 μmol in petroleum naphtha) and triethylaluminum (0.143 ml of a 1.7 molar solution in cyclohexane, 238 μmol) was added followed by nickel ethylhexanoate (0.018 ml of an 8 weight % nickel solution in mineral spirits, 23.8 μmol). The reaction was allowed to run for 6 hours and then the reaction was quenched with methanol. The solution was diluted and the polymer was precipitated in excess acetone. The precipitated polymer was filtered, washed with acetone and dried overnight under vacuum. The yield of polymer was 4.15 (83%). The polymer was characterized using GPC for molecular weight and $^{13}$C NMR for copolymer composition and these results are provided in Table 3.

3) Copolymer of norbornene/hexyl norbornene (85/15 mole ratio).

To a 100 ml glass vial equipped with a teflon coated stir bar was added norbornene (3.76 g, 39.9 mmol), cyclohexane (50 ml) and Hexyl norbornene (1.26 g, 7.0 mmol). The solution was heated to 70° C. and to this stirred solution, a mixture of tris(pentafluorophenyl) boron (214 μmol in petroleum naphtha) and triethylaluminum (0.143 ml of a 1.7 molar solution in cyclohexane, 238 μmol) was added followed by nickel ethylhexanoate (0.018 ml of an 8 weight % nickel solution in mineral spirits, 23.8 μmol). The reaction was allowed to run for 6 hours and then the reaction was quenched with methanol. The solution was diluted and the polymer was precipitated in excess acetone. The precipitated polymer was filtered, washed with acetone and dried overnight under vacuum. The yield of polymer was 4.35 (87%). The polymer was characterized using GPC for molecular weight and $^{13}$C NMR for copolymer composition and these results are provided in Table 3.

4) Copolymer of norbornene/hexyl norbornene (80/20 mole ratio).

To a 100 ml glass vial equipped with a teflon coated stir bar was added norbornene (3.39 g, 36 mmol), cyclohexane (50 ml) and Hexyl norbornene (1.61 g, 9.0 mmol). The solution was heated to 70° C. and to this stirred solution, a mixture of tris(pentafluorophenyl) boron (196 μmol in petroleum naphtha) and triethylaluminum (0.131 ml of a 1.7 molar solution in cyclohexane, 218 μmol) was added followed by nickel ethylhexanoate (0.017 ml of an 8 weight % nickel solution in mineral spirits, 21.8 μmol). The reaction was allowed to run for 6 hours and then the reaction was quenched with methanol. The solution was diluted and the polymer was precipitated in excess acetone. The precipitated polymer was filtered, washed with acetone and dried overnight under vacuum. The yield of polymer was 4.35 (87%). The polymer was characterized using GPC for molecular weight and $^{13}$C NMR for copolymer composition and these results are provided in Table 3.

5) Copolymer of norbornene/hexyl norbornene (75/25 mole ratio).

To a 100 ml glass vial equipped with a teflon coated stir bar was added norbornene (3.0 g, 31.9 mmol), cyclohexane (50 ml) and Hexyl norbornene(1.9 g, 10.6 mmol). The solution was heated to 70° C. and to this stirred solution, a mixture of tris(pentafluorophenyl) boron (172 μmol in petroleum naphtha) and triethylaluminum (0.12 ml of a 1.7 molar solution in cyclohexane, 192 μmol) was added followed by nickel ethylhexanoate (0.015 ml of an 8 weight % nickel solution in mineral spirits, 19.2 μmol). The reaction was allowed to run for 6 hours and then the reaction was quenched with methanol. The solution was diluted and the polymer was precipitated in excess acetone. The precipitated polymer was filtered, washed with acetone and dried overnight under vacuum. The yield of polymer was 4.2 g (87%). The polymer was characterized using GPC for molecular weight and mechanical properties of the copolymer and these results are provided in Table 3.

6) Copolymer of norbornene/hexyl norbornene (50/50 mole ratio).

To a 100 ml glass vial equipped with a teflon coated stir bar was added norbornene (1.7 g, 18.1 mmol), cyclohexane (50 ml) and hexyl norbornene (3.3 g, 18.1 mmol). The solution was heated to 70° C. and to this stirred solution, a mixture of tris(pentafluorophenyl) boron (149 μmol in petroleum naphtha) and triethylaluminum (0.10 ml of a 1.7 molar solution in cyclohexane, 166 μmol) was added followed by nickel ethylhexanoate (0.013 ml of an 8 weight % nickel solution in mineral spirits, 16.6 μmol). The reaction was allowed to run for 6 hours and then the reaction was quenched with methanol. The solution was diluted and the polymer was precipitated in excess acetone. The precipitated polymer was filtered, washed with acetone and dried overnight under vacuum. The yield of polymer was 3.65 g (73%). The polymer was characterized using GPC for molecular weight and mechanical properties of the copolymer and these results are provided in Table 3.

7) Copolymer of norbornene/hexyl nobornene (75/25 mole ratio).

To a 100 ml glass vial equipped with a teflon coated stir bar was added norbornene (0.7 g, 7.4 mmol), cyclohexane (50 ml) and Hexyl norbornene (4.0 g, 22.3 mmol). The solution was heated to 70° C. and to this stirred solution, a mixture of tris(pentafluorophenyl) boron (126 μmol in petroleum naphtha) and triethylaluminum (0.09 ml of a 1.7 molar solution in cyclohexane, 140 μmol) was added followed by nickel ethylhexanoate (0.011 ml of an 8 weight % nickel solution in mineral spirits, 14 μmol). The reaction was allowed to run for 6 hours and then the reaction was quenched with methanol. The solution was diluted and the polymer was precipitated in excess acetone. The precipitated polymer was filtered, washed with acetone and dried overnight under vacuum. The yield of polymer was 4.0 g (87%).

The polymer was characterized using GPC for molecular weight and mechanical properties of the copolymer and these results are provided in Table 3.

8) Homopolymer of hexyl norbornene (100 mole %).

To a 100 ml glass vial equipped with a teflon coated stir bar was added cyclohexane (50 ml) and hexyl norbornene (3.0 g, 16.8 mmol). The solution was heated to 70° C. and to this stirred solution, a mixture of tris(pentafluorophenyl) boron (72.9 μmol in petroleum naphtha) and triethylaluminum (0.049 ml of a 1.7 molar solution in cyclohexane, 81 μmol) was added followed by nickel ethylhexanoate (0.006 ml of an 8 weight % nickel solution in mineral spirits, 8.1 μmol). The reaction was allowed to run for 6 hours and then the reaction was quenched with methanol. The solution was diluted and the polymer was precipitated in excess acetone. The precipitated polymer was filtered, washed with acetone and dried overnight under vacuum. The yield of polymer was 2.61 (87%). The polymer was characterized using GPC for molecular weight and mechanical properties of the copolymer and these results are provided in Table 3.

9) Copolymer of norbornene/hexyl norbornene (50/50 mole ratio) in the presence of ether as an electron donor ligand.

To a 100 ml glass vial equipped with a teflon coated stir bar was added norbornene (1.7 g, 18.1 mmol), cyclohexane (50 ml) and hexyl norbornene (3.3 g, 18.1 mmol). The solution was heated to 70° C. and dimethyl diethoxysilane (0.54 g, 3.65 mmol) was added as an ether based electron donor ligand. To the above solution, a mixture of tris (pentafluorophenyl) boron (149 μmol in petroleum naphtha) and triethylaluminum (0.10 ml of a 1.7 molar solution in cyclohexane, 166 μmol) was added followed by nickel ethylhexanoate (0.013 ml of an 8 weight % nickel solution in mineral spirits, 16.6 μmol). The reaction was allowed to run for 6 hours and then the reaction was quenched with methanol. The solution was diluted and the polymer was precipitated in excess acetone. The precipitated polymer was filtered, washed with acetone and dried overnight under vacuum. The yield of polymer was 4.75 (95%). The polymer was characterized using GPC for molecular weight and mechanical properties of the copolymer and these results are provided in Table 3.

10) Copolymer of norbornene/hexyl norbornene (50/50 mole ratio) in the presence of ether as an electron donor ligand and allyl trifluoro acetate as chain transfer agent.

To a 100 ml glass vial equipped with a teflon coated stir bar was added norbornene (1.7 g, 18.1 mmol), cyclohexane (50 ml) and hexyl norbornene (3.3 g, 18.1 mmol). The solution was heated to 70° C. allyl trifluoroacetate (0.095 ml, 0.73 mmol) was added as chain transfer agent to control molecular weight and dimethyl diethoxysilane (0.54 g, 3.65 mmol) was added as an ether based electron donor ligand. To the above solution, a mixture of tris(pentafluorophenyl) boron (149 μmol in petroleum naphtha) and triethylaluminum (0.10 ml of a 1.7 molar solution in cyclohexane, 166 μmol) was added followed by nickel ethylhexanoate (0.013 ml of an 8 weight % nickel solution in mineral spirits, 16.6 μmol). The reaction was allowed to run for 6 hours and then the reaction was quenched with methanol. The solution was diluted and the polymer was precipitated in excess acetone. The precipitated polymer was filtered, washed with acetone and dried overnight under vacuum. The yield of polymer was 3.65 (73%). The polymer was characterized using GPC for molecular weight and mechanical properties of the copolymer and these results are provided in Table 3.

TABLE 3

| Sample # | NB/Hex.NB feed ratio (moles) | NB/Hex.NB ratio in polymer (moles) | Mn/Mw($10^3$) | conversion % | Mechanical Properties (% elongation on film cast from $CHCl_3$) |
|---|---|---|---|---|---|
| 1 | 95/5 | 95.5/4.5 | 165/482 | 90 | Film Cracked |
| 2 | 90/10 | 91/9 | 70/426 | 83 | Film Cracked |
| 3 | 85/15 | 86/14 | 149/800 | 87 | Film Cracked |
| 4 | 80/20 | 78/22 | 75/460 | 87 | Film Cracked |
| 5 | 75/25 | — | 157/546 | 87 | 2.8 ± 0.3 |
| 6 | 50/50 | — | 188/524 | 73 | 12.5 ± 0.7 |
| 7 | 25/75 | — | 151/470 | 59 | 34.8 ± 0 |
| 8 | 0/100 | — | 165/482 | 87 | 40 ± 9 |
| 9* | 50/50 | — | 346/1,269 | 73 | 22 ± 4 |
| 10* | 50/50 | — | 124/382 | 60 | 24 ± 3 |

*9 & 10 were performed in the presence of an ether based electron donor ligand.

Film Preparation for DMA Analysis

Polynobornene copolymer films were cast from a dilute solution (10%) of the copolymer in chloroform onto a glass plate and allowing the samples to dry slowly at room temperature for 15 hours. The samples were then removed from the glass plate and heated to 180° C. for 1 hour followed by heating the polymer films to 300° C. at 5° C./min. and maintaining this temperature for 1 hour in a nitrogen atmosphere for complete removal of solvent. The films were then cooled to room temperature and samples were then cut for stress-strain analysis. Thin film stress-strain analyses was performed on the above samples using a portable universal tester at a strain rate of 0.1 inches/min.

EXAMPLE 83

Alkyl Norbornene/norbornene Copolymers

1) Copolymer of norbornene/hexyl nobornene (50/50 mole ratio).

To a 50 ml glass vial equipped with a teflon coated stir bar was added norbornene (1.04 g, 11.1 mmol), cyclohexane (25 ml) and hexyl norbornene (2.0 g, 11.2 mmol). A solution of the nickel catalyst [toluene complex of bisperfluorophenyl nickel,(toluene)Ni($C_6F_5$)$_2$] was prepared in the dry box by dissolving 0.0053 g [0.011 mmol of (toluene)Ni($C_6F_5$)$_2$] in 5 ml of toluene. The active catalyst solution was added to the monomer solution via a syringe at ambient temperature. The reaction was allowed to stir for 6 hours at room temperature. The solution was diluted with THF and the polymer was precipitated in excess acetone. The precipitated polymer was filtered, washed with acetone and dried overnight under vacuum. The yield of polymer was 2.9 (96%). The polymer was characterized using GPC for molecular weight. Mn=348,000 and Mw=1.061,000.

EXAMPLE 84

Alkyl Norbornene/norbornene Methylacetate Copolymers

1) Copolymer of hexyl norbornene/norbornene methylacetate (bicyclo[2.2.1]hept-5-ene-2-methyl acetate (80/20 mole ratio) in chlorinated solvent.

To a 50 ml glass vial equipped with a teflon coated stir bar was added hexyl norbornene (4.0 g, 22.1 mmol), chlorobenzene (30 ml) and norbornene methylacetate (0.95 g, 5.7 mmol). The solution was heated to 70° C. and to the above solution, a mixture of tris(pentafluorophenyl) boron (120.6 μmol in petroleum naphtha) and triethylaluminum (0.08 ml of a 1.7 molar solution in cyclohexane, 134 μmol) was added followed by nickel ethylhexanoate (0.010 ml of an 8 weight % nickel solution in mineral spirits, 13.4 μmol). The reaction was allowed to run for 12 hours and then the reaction was quenched with methanol. The solution was diluted and the polymer was precipitated in excess acetone. The precipitated polymer was filtered, washed with acetone and dried overnight under vacuum. The yield of polymer was 3.25 (63%). The polymer was characterized using GPC for molecular weight. Mn=231,000 and Mw=523,000. $^1$H NMR indicated the presence of the methylacetate, and the copolymer composition was very close to that of the feed ratio.

2) Copolymer of hexyl nobornene/nobornene methylacetate (bicyclo[2.2.1]hept-5-ene-2-methyl acetate (75/25 mole ratio) in chlorinated solvent.

To a 50 ml glass vial equipped with a teflon coated stir bar was added hexyl nobornene (39.6 g, 0.22 mol), chlorobenzene (175 ml) and nobornene methylacetate (12.3 g, 74 mmol). The solution was heated to 70° C. and to the above solution, a mixture of tris(pentafluorophenyl) boron (1206 mmol in petroleum naphtha) and triethylaluminum (0.85 ml of a 1.7 molar solution in cyclohexane, 1340 mmol ) was added followed by nickel ethylhexanoate (0.105 ml of an 8 weight % nickel solution in mineral spirits, 134 mmol). The reaction was allowed to run for 12 hours and then the reaction was quenched with methanol. The solution was diluted and the polymer was precipitated in excess acetone. The precipitated polymer was filtered, washed with acetone and dried overnight under vacuum. The yield of polymer was 29 g (56%). The polymer was characterized using GPC for molecular weight. Mn=167,000 and Mw=349,000. $^1$H NMR indicated the presence of the methylacetate, and the copolymer composition was very close to that of the feed ratio.

3) Copolymer of hexyl nobornene/nobornene methylacetate (bicyclo[2.2.1]hept-5-ene-2-methyl acetate (70/30 mole ratio) in chlorinated solvent.

To a 50 ml glass vial equipped with a teflon coated stir bar was added hexyl nobornene (4.0 g, 22.1 mmol), chlorobenzene (30 ml) and nobornene methylacetate (1.6 g, 9.6 mmol). The solution was heated to 70° C. and to the above solution, a mixture of tris(pentafluorophenyl) boron (145 µmol in petroleum naphtha) and triethylaluminum (0.092 ml of a 1.7 molar solution in cyclohexane, 161 µmol) was added followed by nickel ethylhexanoate (0.010 ml of an 8 weight % nickel solution in mineral spirits, 16.1 µmol). The reaction was allowed to run for 12 hours and then the reaction was quenched with methanol. The solution was diluted and the polymer was precipitated in excess acetone. The precipitated polymer was filtered, washed with acetone and dried overnight under vacuum. The yield of polymer was 2.9 (53%). The polymer was characterized using GPC for molecular weight. Mn=52,000 and Mw=375,000. $^1$H NMR indicated the presence of the methylacetate, and the copolymer composition was very close to that of the feed ratio.

4) Copolymer of hexyl norbornene/norbornene methylacetate (bicyclo[2.2.1]hept-5-ene-2-methyl acetate (70/30 mole ratio) in hydrocarbon solvent.

To a 50 ml glass vial equipped with a teflon coated stir bar was added hexyl norbornene (4.0 g, 22.1 mmol), cyclohexane (30 ml) and norbornene methylacetate (1.6 g, 9.6 mmol). The solution was heated to 70° C. and to the above solution, a mixture of tris(pentafluorophenyl) boron (145 µmol in petroleum naphtha) and triethylaluminum (0.092 ml of a 1.7 molar solution in cyclohexane, 161 µmol) was added followed by nickel ethylhexanoate (0.010 ml of an 8 weight % nickel solution in mineral spirits, 16.1 µmol). The reaction was allowed to run for 12 hours and then the reaction was quenched with methanol. The solution was diluted and the polymer was precipitated in excess acetone. The precipitated polymer was filtered, washed with acetone and dried overnight under vacuum. The yield of polymer was 2.1 g (39%). The polymer was characterized using GPC for molecular weight. Mn=122,000 and Mw=523,000. $^1$H NMR indicated the presence of the methylacetate, and the copolymer composition was very close to that of the feed ratio.

EXAMPLE 85

Alkyl Norbornene/norbornene Methylacetate Copolymers

1) Copolymer of hexyl norbornene/norbornene methylacetate (bicyclo[2.2.1]hept-5-ene-2-methyl acetate (80/20 mole ratio) in hydrocarbon solvent.

To a 50 ml glass vial equipped with a teflon coated stir bar was added hexyl norbornene (2.44 g, 13.68 mmol), cyclohexane (25 ml) nobornene methylacetate (0.576 g, 3.47 mmol). A solution of the nickel catalyst [toluene complex of bisperfluorophenyl nickel, (toluene)Ni($C_6F_5$)$_2$] was prepared in the dry box by dissolving 0.0041 g [0.0085 mmol of (toluene)Ni($C_6F_5$)$_2$] in 5 ml of toluene. The active catalyst solution was added to the monomer solution via a syringe at ambient temperature. The reaction was allowed to stir for 20 hours at room temperature. The solution was diluted with THF and the polymer was precipitated in excess acetone. The precipitated polymer was filtered, washed with acetone and dried overnight under vacuum. The yield of polymer was 2.4 (79.5%). The polymer was characterized using GPC for molecular weight. Mn=177,000 and Mw=401,000. $^1$H NMR indicated the presence of the methylacetate, and the copolymer composition was very close to that of the feed ratio.

2) Copolymer of hexyl norbornene/nobornene methylacetate (bicyclo[2.2.1]hept-5-ene-2-methyl acetate (70/30 mole ratio) in hydrocarbon solvent.

To a 50 ml glass vial equipped with a teflon coated stir bar was added hexyl norbornene (2.15 g, 12.1 mmol), cyclohexane (25 ml) nobornene methylacetate (0.885 g, 5.32 mmol). A solution of the nickel catalyst [toluene complex of bisperfluorophenyl nickel, (toluene)Ni($C_6F_5$)$_2$] was prepared in the dry box by dissolving 0.0042 g [0.0086 mmol of (toluene)Ni($C_6F_5$)$_2$] in 5 ml of toluene. The active catalyst solution was added to the monomer solution via a syringe at ambient temperature. The reaction was allowed to stir for 20 hours at room temperature. The solution was diluted with THF and the polymer was precipitated in excess acetone. The precipitated polymer was filtered, washed with acetone and dried overnight under vacuum. The yield of polymer was 1.82 g (60%). The polymer was characterized using GPC for molecular weight. Mn=197,000 and Mw=375,000. $^1$H NMR indicated the presence of the methylacetate, and the copolymer composition was very close to that of the feed ratio.

EXAMPLE 86

Alkyl Norbornene/norbornene Methylacetate Copolymers

1) Copolymer of butyl norbornene/norbornene methylacetate (bicyclo[2.2.1]hept-5-ene-2-methyl acetate (70/30 mole ratio) catalyst in chlorinated solvent.

To a 50 ml glass vial equipped with a teflon coated stir bar was added butyl norbornene (3.0 g, 20.0 mmol), chlorobenzene (30 ml) and norbornene methylacetate (1.45 g, 8.7 mmol). The solution was heated to 70° C. and to the above solution, a mixture of tris(pentafluorophenyl) boron (120.6 µmol in petroleum naphtha) and triethylaluminum (0.08 ml of a 1.7 molar solution in cyclohexane, 134 µmol) was added followed by nickel ethylhexanoate (0.010 ml of an 8 weight % nickel solution in mineral spirits, 13.4 µmol). The reaction was allowed to run for 12 hours and then the reaction was quenched with methanol. The solution was diluted and the polymer was precipitated in excess acetone. The precipitated polymer was filtered, washed with acetone and dried overnight under vacuum. The yield of polymer was 2.1 g (49%). The polymer was characterized using GPC for molecular weight. Mn=164,000 and Mw=383,000. $^1$H NMR indicated the presence of the methylacetate, and the copolymer composition was very close to that of the feed ratio.

2) Copolymer of butyl norbornene/norbornene methylacetate (bicyclo[2.2.1]hept-5-ene-2-methyl acetate (80/20 mole ratio) in chlorinated solvent.

To a 50 ml glass vial equipped with a teflon coated stir bar was added butyl norbornene (3.0 g, 20.0 mmol), chlorobenzene (30 ml) and norbornene methylacetate (0.85 g, 5.1 mmol). The solution was heated to 70° C. and to the above solution, a mixture of tris(pentafluorophenyl) boron (116 μmol in petroleum naphtha) and triethylaluminum (0.07 ml of a 1.7 molar solution in cyclohexane, 129 μmol) was added followed by nickel ethylhexanoate (0.009 ml of an 8 weight % nickel solution in mineral spirits, 12.9 μmol). The reaction was allowed to run for 12 hours and then the reaction was quenched with methanol. The solution was diluted and the polymer was precipitated in excess acetone. The precipitated polymer was filtered, washed with acetone and dried overnight under vacuum. The yield of polymer was 2.1 g (55%). The polymer was characterized using GPC for molecular weight. Mn=205,000 and Mw=507,000. $^1$H NMR indicated the presence of the methylacetate, and the copolymer composition was very close to that of the feed ratio.

EXAMPLE 87
Alkyl Norbornene/norbornene Methylbenzoate Copolymers.

1) Copolymer of hexyl norbornene/norbornene methylbenzoate (bicyclo[2.2.1]hept-5-ene-2-methyl benzoate (90/10 mole ratio) in hydrocarbon solvent.

To a 50 ml glass vial equipped with a teflon coated stir bar was added hexyl norbornene (2.63 g, 14.7 mmol), cyclohexane (30 ml) and norbornene methylbenzoate (0.37 g, 1.64 mmol). The solution was heated to 70° C. and to the above solution, a mixture of tris(pentafluorophenyl) boron (72 μmol in petroleum naphtha) and triethylaluminum (0.047 ml of a 1.7 molar solution in cyclohexane, 80 μmol) was added followed by nickel ethylhexanoate (0.006 ml of an 8 weight % nickel solution in mineral spirits, 8.04 μmol). The reaction was allowed to run for 12 hours and then the reaction was quenched with methanol. The solution was diluted and the polymer was precipitated in excess acetone. The precipitated polymer was filtered, washed with acetone and dried overnight under vacuum. The yield of polymer was 2.55 g (83%). The polymer was characterized using GPC for molecular weight. Mn=189,000 and Mw=523,000. $^1$H NMR indicated the presence of the methylbenzoate, and the copolymer composition was very close to that of the feed ratio.

2) Copolymer of hexyl norbornene/norbornene methylbenzoate (bicyclo[2.2.1]hept-5-ene-2-methyl benzoate (90/10 mole ratio) in hydrocarbon solvent.

To a 50 ml glass vial equipped with a teflon coated stir bar was added hexyl norbornene (2.63 g, 14.7 mmol), cyclohexane (30 ml) norbornene methylbenzoate (0.37 g, 1.64 mmol) and and triethylaluminum (0.024 ml of a 1.7 molar solution in cyclohexane). A solution of the nickel catalyst [toluene complex of bisperfluorophenyl nickel, (toluene)Ni (C$_6$F$_5$)$_2$] was prepared in the dry box by dissolving 0.004 g [0.0083 mmol of (toluene)Ni(C$_6$F$_5$)$_2$] in 5 ml of toluene. The active catalyst solution was added to the monomer solution via a syringe at ambient temperature. The reaction was allowed to stir for 20 hours at room temperature. The solution was diluted with THF and the polymer was precipitated in excess acetone. The precipitated polymer was filtered, washed with acetone and dried overnight under vacuum. The yield of polymer was 2.25 g (75%). The polymer was characterized using GPC for molecular weight. Mn=389,000 and Mw=872,000. $^1$H NMR indicated the presence of the methylbenzoate, and the copolymer composition was very close to that of the feed ratio.

EXAMPLE 88
Alkyl Norbornene/norbornene Methyl Ethylcarbonate Copolymer

1) Copolymer of hexyl nobornene/nobornene methyl ethylcarbonate (bicyclo[2.2.1]hept-5-ene-2-methyl ethylcarbonate (80/20 mole ratio) in hydrocarbon solvent.

To a 50 ml glass vial equipped with a teflon coated stir bar was added hexyl nobornene (2.35 g, 13.1 mmol), cyclohexane (30 ml) nobornene methyl ethylcarbonate (0.64 g, 3.3 mmol). A solution of the nickel catalyst [toluene complex of bisperfluorophenyl nickel, (toluene)Ni(C$_6$F$_5$)$_2$] was prepared in the dry box by dissolving 0.004 g [0.0083 mmol of (toluene)Ni(C$_6$F$_5$)$_2$] in 5 ml of toluene. The active catalyst solution was added to the monomer solution via a syringe at ambient temperature. The reaction was allowed to stir for 5 hours at room temperature. The solution was diluted with THF and the polymer was precipitated in excess acetone. The precipitated polymer was filtered, washed with acetone and dried overnight under vacuum. The yield of polymer was 2.1 g (70%). The polymer was characterized using GPC for molecular weight. Mn=356,000 and Mw=906,000. $^1$H NMR indicated the presence of the methyl ethylcarbonate, and the copolymer composition was very close to that of the feed ratio.

EXAMPLE 89
Alkyl Norbornene/norbornene Methyl Methoxyacetate Copolymer

1) Copolymer of hexyl norbornene/norbornene methyl methoxyacetate (bicyclo[2.2.1]hept-5-ene-2-methyl methoxyacetate (80/20 mole ratio) in hydrocarbon solvent.

To a 50 ml glass vial equipped with a teflon coated stir bar was added hexyl nobornene (2.35 g, 13.1 mmol), cyclohexane (30 ml) nobornene methyl methoxyacetate (0.64 g, 3.3 mmol). A solution of the nickel catalyst [toluene complex of bisperfluorophenyl nickel, (toluene)Ni(C$_6$F$_5$)$_2$] was prepared in the dry box by dissolving 0.004 g [0.0083 mmol of (toluene)Ni(C$_6$F$_5$)$_2$] in 5 ml of toluene. The active catalyst solution was added to the monomer solution via a syringe at ambient temperature. The reaction was allowed to stir for 5 hours at room temperature. The solution was diluted with THF and the polymer was precipitated in excess acetone. The precipitated polymer was filtered, washed with acetone and dried overnight under vacuum. The yield of polymer was 1.5 g (70%). The polymer was characterized using GPC for molecular weight. Mn=312,000 and Mw=616,000. $^1$H NMR indicated the presence of the methyl methoxyacetate, and the copolymer composition was very close to that of the feed ratio.

EXAMPLE 90
Alkyl Nobornene/trimethyl Silyl Protected Norbornene Methanol Copolymer 1) Copolymer of hexyl norbornene/trimethylsilyl protected nobornene methanol (trimethylsilyl protected bicyclo [2.2.1]hept-5-ene-2-methanol (80/20 mole ratio) in hydrocarbon solvent.

To a 50 ml glass vial equipped with a teflon coated stir bar was added hexyl nobornene (2.43 g, 13.6 mmol), cyclohexane (30 ml) trimethylsilyl protected norbornene methanol (0.57 g, 3.41 mmol). A solution of the nickel catalyst [toluene complex of bisperfluorophenyl nickel, (toluene)Ni $(C_6F_5)_2$] was prepared in the dry box by dissolving 0.004 g [0.0083 mmol of (toluene)Ni$(C_6F_5)_2$] in 5 ml of toluene. The active catalyst solution was added to the monomer solution via a syringe at ambient temperature. The reaction was allowed to stir for 20 hours at room temperature. The solution was diluted with THF and the polymer was precipitated in excess acetone. The precipitated polymer was filtered, washed with acetone and dried overnight under vacuum. The yield of polymer was 2.7 (90%). The polymer was characterized using GPC for molecular weight. Mn=372,000 and Mw=660,000. $^1$H NMR indicated the presence of the trimethylsilyl groups, and the copolymer composition was very close to that of the feed ratio.

EXAMPLE 91
Homopolymerization of Bicyclo[2.2.1]hept-5-ene-2-methyl Butyl Ether To a 50 ml glass vial equipped with a teflon coated stir bar was bicyclo[2.2.1]hept-5-ene-2-methyl butyl ether (3.0 g, 16.6 mmol), and cyclohexane (30 ml). A solution of the nickel catalyst [toluene complex of bisperfluorophenyl nickel, (toluene)Ni$(C_6F_5)_2$] was prepared in the dry box by dissolving 0.004 g [0.0083 mmol of(toluene)Ni$(C_6F_5)_2$] in 5 ml of toluene. The active catalyst solution was added to the monomer solution via a syringe at ambient temperature. The reaction was allowed to stir for 20 hours at room temperature. The solution was diluted with THF and the polymer was precipitated in excess acetone. The precipitated polymer was filtered, washed with acetone and dried overnight under vacuum. The yield of polymer was 0.96 g (32%). The polymer was characterized using GPC for molecular weight. Mn=285,000 and Mw=721,000.

EXAMPLE 92
Homopolymerization of Trimethylsilyl Protected Bicyclo [2.2.1]hept-5-ene-2-methanol.

To a 50 ml glass vial equipped with a teflon coated stir bar was bicyclo[2.2.1]hept-5-ene-2-methanol (3.0 g, 18.03 mmol), and cyclohexane (30 ml). A solution of the nickel catalyst [toluene complex of bisperfluorophenyl nickel, (toluene)Ni$(C_6F_5)_2$] was prepared in the dry box by dissolving 0.0044 g [0.0090 mmol of (toluene)Ni$(C_6F_5)_2$] in 5 ml of toluene. The active catalyst solution was added to the monomer solution via a syringe at ambient temperature. The reaction was allowed to stir for 20 hours at room temperature. The solution was diluted with THF and the polymer was precipitated in excess acetone. The precipitated polymer was filtered, washed with acetone and dried overnight under vacuum. The yield of polymer was 1.95 g (65%). The polymer was characterized using GPC for molecular weight. Mn=448,000 and Mw=650,000.

EXAMPLE 93
Homopolymerization of Bicyclo[2.2.1]hept-5-ene-2-methyl Ethylcarbonate To a 50 ml glass vial equipped with a teflon coated stir bar was added bicyclo[2.2.1]hept-5-ene-2-methyl ethylcarbonate (2.06 g, 10.5 mmol). A solution of the nickel catalyst [toluene complex of bisperfluorophenyl nickel, (toluene)Ni $(C_6F_5)_2$] was prepared in the dry box by dissolving 0.0247 g [0.0525 mmol of (toluene)Ni$(C_6F_5)_2$] in 7 ml of toluene. The active catalyst solution was added to the monomer solution via a syringe at ambient temperature. The reaction was allowed to stir for 6 hours at room temperature. The solution was diluted with toluene and the polymer was precipitated in excess methanol. The precipitated polymer was filtered, washed with acetone and dried overnight under vacuum. The yield of polymer was 1.68 g (84%). The polymer was characterized using GPC for molecular weight. Mn=132,000 and Mw=748,000.

EXAMPLE 94
Homopolymerization of Bicyclo[2.2.1]hept-5-ene-2-methyl Acetate

To a 50 ml glass vial equipped with a teflon coated stir bar was added bicyclo[2.2.1]hept-5-ene-2-methyl acetate (2.06 g, 12.2 mmol). A solution of the nickel catalyst [toluene complex of bisperfluorophenyl nickel, (toluene)Ni$(C_6F_5)_2$] was prepared in the dry box by dissolving 0.0291 g [0.0602 mmol of (toluene)Ni$(C_6F_5)_2$] in 7 ml of toluene. The active catalyst solution was added to the monomer solution via a syringe at ambient temperature. The reaction was allowed to stir for 6 hours at room temperature. The solution was diluted with toluene and the polymer was precipitated in excess methanol. The precipitated polymer was filtered, washed with acetone and dried overnight under vacuum. The yield of polymer was 1.76 (88%). The polymer was characterized using GPC for molecular weight. Mn=48,000 and Mw=201,000.

EXAMPLE 95
Copolymerization of Bicyclo[2.2.1]hept-5-ene-2-methyl Acetate/t-butylester of Norbornene To a 50 ml glass vial equipped with a teflon coated stir bar was added bicyclo[2.2.1]hept-5-ene-2-methyl acetate (4.63 g, 27.91 mmol) and t-butylester of norbornene (5.42 g, 27.93 mmol) and 15 ml of toluene. A solution of the nickel catalyst [toluene complex of bisperfluorophenyl nickel, (toluene)Ni $(C_6F_5)_2$] was prepared in the dry box by dissolving 0.1339 g [0.276 mmol of (toluene)Ni$(C_6F_5)_2$] in 10 ml of toluene. The active catalyst solution was added to the monomer solution via a syringe at ambient temperature. The reaction was allowed to stir for 6 hours at room temperature. The solution was diluted with toluene and the polymer was precipitated in excess methanol. The precipitated polymer was filtered, washed with acetone and dried overnight under vacuum. The isolated yield of polymer was 5.5 g (55%). The polymer was characterized using GPC for molecular weight. Mn=43,000 and Mw=89,000.

EXAMPLE 96
Comopolymerization of Bicyclo[2.2.1]hept-5-ene-2-methyl Ethylcarbonate/t-butylester of Norbornene To a 50 ml glass vial equipped with a teflon coated stir bar was added bicyclo[2.2.1]hept-5-ene-2-methyl ethylcarbonate (5.03 g, 25.65 mmol) and t-butylester of norbornene (4.988 g, 25.68 mmol) and 15 ml of toluene. A solution of the nickel catalyst [toluene complex of bisperfluorophenyl nickel, (toluene)Ni$(C_6F_5)_2$] was prepared in the dry box by dissolving 0.1239 g [0.255 mmol of (toluene)Ni$(C_6F_5)_2$] in 10 ml of toluene. The active catalyst solution was added to the monomer solution via a syringe at ambient temperature. The reaction was allowed to stir for 6 hours at room temperature. The solution was diluted with toluene and the polymer was precipitated in excess methanol. The precipitated polymer was filtered, washed with acetone and dried overnight under vacuum. The isolated yield of polymer was 4.5 g (45%). The polymer was characterized using GPC for molecular weight. Mn=44,000 and Mw=87,000.

EXAMPLE 97
Synthesis of ($\eta^3$-methallyl)nickel(norbornene) Chloride

This nickel species was generated in a manner similar to that described by T. L. Hanlon et al., *Journal of Organo-* metallic Chemistry, Volume 33, 1971, pages C45–46. To a solution of norbornene (0.52 g) dissolved in 2.5 g of toluene was added all at once a solid [($\eta^3$-CH$_3$C(CH)$_2$)NiCl]$_2$ (0.012 g). After stirring overnight at room temperature for overnight the solution changed from a clear red orange to a murky red orange brown sludge. The red orange powder obtained by filtration was washed with dried pentane. If stirring is stopped after addition and dissolution of the solid [($\eta^3$-CH$_3$C(CH)$_2$)NiCl]$_2$ bright red crystals are obtained by filtration. Yield 0.78 g (95%). Reaction of ($\eta^3$-methallyl) nickel(norbornene) chloride with Zn(C$_6$F$_5$)$_2$(dme). To ($\eta^3$-CH$_3$C(CH)$_2$)Ni(norbornene)Cl$_2$ (0.102 g) stirring in d$_6$-benzene (0.6 ml) was added Zn(C$_6$F$_5$)$_2$(dme) (0.71 g). The reaction mixture immediately turned from orange red suspension to a dark brown mixture. The solution was stirred at room temperature for 48 hours and then filtered to yield a pale orange solution. Analysis of the product by proton NMR indicated that the major reaction product was 2-methyl-2-propenylpentafluorobenzene. A mass spectrum recorded on the reaction product confirmed the major product as 2-methyl-2-propenyl pentafluorobenzene (mw=222), and showed that mono-inserted product, C$_6$F$_5$-norbornene-CH$_2$C(CH$_3$)=CH$_2$ (mw=316), and bis-inserted product C$_6$F$_5$-(norbornene)$_2$-CH$_2$C(CH$_3$)=CH$_2$ (mw=410) were also formed. This example provides evidence of pentafluorophenyl transfer from the zinc reagent, nobornene insertion (as a way to polymerize monomer), and a reductive elimination process, involving pentafluorophenyl, to yield the product.

EXAMPLE 98
NB Polymerization Using Catalyst A

Norbornene (5.0 g, 53 mmol) was added to a vial in the glove box equipped with a stir bar. The vial was sealed with a Teflon®-lined rubber septum cap. The nobornene was dissolved in the toluene to a total volume of 60 ml. To this vial was added a toluene solution (5 ml) (PhC(O)CH$_2$PPh$_2$) Ni(C$_6$F$_5$)$_2$ (0.018 g, 0.026 mmol). The mixture was allowed to stir for 1 hour at room temperature. The resulting mixture was then poured into an excess of methanol to precipitate the polymer. The polymer was filtered and dried in the vacuum oven overnight. Yield 1.94 g (39%).

EXAMPLE 99
NB Polymerization Using Catalyst D

Norbornene (2.5 g, 27 mmol) was added to a vial in the glove box equipped with a stir bar. The vial was sealed with a Teflon®-lined rubber septum cap. The nobornene was dissolved in the toluene to a total volume of 30 ml. To this vial was added (Ph$_2$NC(O)CH$_2$PPh$_2$)Ni(C$_6$F$_5$)$_2$ (0.010 g, 0.017 mmol). The mixture was allowed to stir for 1 hour at 70° C. The resulting mixture was then poured into an excess of methanol to precipitate the polymer. The polymer was filtered and dried in the vacuum oven overnight. Yield 0.27 g (11%).

EXAMPLE 100
NB-type Monomer Polymerization Using Catalyst E

Norbornene (2.0 g, 21 mmol) and triethoxysilylnobornene (1.6 g, 7.5 mmol) was added to a vial in the glove box equipped with a stir bar. The vial was sealed with a Teflon-lined rubber septum cap. The norbornene monomers were dissolved in cyclohexane to a total volume of 30 ml. To this vial was added (PhC(O)CH$_2$CH$_2$PPh$_2$)Ni(C$_6$F5)$_2$ (0.0102 g, 0.014 mmol). The mixture was allowed to stir overnight. The resulting mixture was then poured into an excess of methanol to precipitate the polymer. The polymer was filtered and dried in the vacuum oven overnight. Yield 0.78 g (21%).

EXAMPLE 101
NB-type Monomer Polymerization Using Catalyst J

Norbornene (2.5 g, 27 mmol) was added to a vial in the glove box equipped with a stir bar. The vial was sealed with a Teflon®-lined rubber septum cap. The norbornene monomer was dissolved in toluene to a total volume of 30 ml. To this vial was added Ni(PPh$_3$)$_2$(C$_6$F$_5$)$_2$ (0.012 g, 0.013 mmol). The mixture was allowed to stir for 2 hours at 70° C. The resulting mixture was then poured into an excess of methanol to precipitate the polymer. The polymer was filtered and dried in the vacuum oven overnight. Yield 0.15 g (7%).

EXAMPLES 102–144
Polymerization Procedure Using Catalyst B

Norbornene (5.0 g, 53 mmol) (or the appropriate amount of norbornene-type monomer, see table below) was added to a vial in the glove box equipped with a stir bar. The vial was sealed with a Teflon®-lined rubber septum cap. The norbornene was dissolved in the solvent of choice (see table below) to a total volume of 30 ml. To this vial was added a (minumum amount of the solvent of choice, either THF or toluene, see comments table below) solution of an appropriate amount of the nickel catalyst (see table below). The mixture was allowed to stir for the allotted time at the temperature given in table below. The resulting mixture was then poured into an excess of methanol to precipitate the polymer. The polymer was filtered and dried in the vacuum oven overnight. The conversions were then determined gravimetrically.

| | | | | | | | | | | |
|---|---|---|---|---|---|---|---|---|---|---|
| | | NB-type monomer polymerizations using Catalyst B | | | | | | | | |
| Example | [Ni] (mM) | Monomer: Ni (monomer) | Solv | Time (h) | Temp (° C.) | Conv (%) | CTA (mol %) | Mw (× 10$^{-3}$) | Mn (× 10$^{-3}$) | Comments |
| 102 | 0.43 | 2000:1 (NB) | CH | 1 | amb | 97 | — | — | — | Ni(THF)$_2$(C$_6$F$_5$)$_2$ delivered in THF |
| 103 | 0.43 | 2000:1 (NB) | CH | 1 | amb | 93 | — | — | — | Ni(THF)$_2$(C$_6$F$_5$)$_2$ delivered in THF |
| 104 | 0.43 | 2000:1 (NB) | CH | 1 | amb | 89 | — | — | — | Ni(THF)$_2$(C$_6$F$_5$)$_2$ delivered in THF |
| 105 | 0.43 | 2000:1 (80:20 NB:MeEsNB) | CH | 1 | amb | 100 | — | 709 | 252 | Ni(THF)$_2$(C$_6$F$_5$)$_2$ delivered in THF |
| 106 | 0.43 | 2000:1 (50:50 NB:MeEsNB) | CH | 1 | amb | 19 | — | 428 | 138 | Ni(THF)$_2$(C$_6$F$_5$)$_2$ delivered in THF |

-continued

NB-type monomer polymerizations using Catalyst B

| Example | [Ni] (mM) | Monomer: Ni (monomer) | Solv | Time (h) | Temp (° C.) | Conv (%) | CTA (mol %) | Mw (× 10⁻³) | Mn (× 10⁻³) | Comments |
|---|---|---|---|---|---|---|---|---|---|---|
| 107 | 3.43 | 200:1 (50:50 NB:t-BuEsNB) | CH | 16 | 50 | 50 | — | 64.7 | 33.7 | Ni(THF)$_2$(C$_6$F$_5$)$_2$ delivered in THF |
| 108 | 0.43 | 2000:1 (50:50 NB:t-BuEsNB) | CH | 16 | 50 | 5 | — | 105 | 51.6 | Ni(THF)$_2$(C$_6$F$_5$)$_2$ delivered in THF |
| 109 | 0.43 | 2100:1 (78:22 NB:TESNB) | CH | 1 | amb | 83 | — | 1078 | 318 | Ni(THF)$_2$(C$_6$F$_5$)$_2$ delivered in THF |
| 110 | 0.21 | 4200:1 (78:22 NB:TESNB) | CH | 1 | amb | 44 | — | 1148 | 392 | Ni(THF)$_2$(C$_6$F$_5$)$_2$ delivered in THF |
| 111 | 0.11 | 8500:1 (78:22 NB:TESNB) | CH | 1 | amb | 13 | — | 1029 | 374 | Ni(THF)$_2$(C$_6$F$_5$)$_2$ delivered in THF |
| 112 | 0.11 | 8500:1 (78:22 NB:TESNB) | CH | 14.5 | 50 | 21 | — | 1071 | 392 | Ni(THF)$_2$(C$_6$F$_5$)$_2$ delivered in THF |
| 113 | 0.11 | 17000:1 (78:22 NB:TESNB) | CH | 14.5 | 50 | trace | — | — | — | Ni(THF)$_2$(C$_6$F$_5$)$_2$ delivered in THF |
| 114 | 0.21 | 4200:1 (78:22 NB:TESNB) | Tol | 1 | 50 | 43 | — | 819 | 251 | Ni(THF)$_2$(C$_6$F$_5$)$_2$ delivered in toluene |
| 115 | 0.21 | 4200:1 (78:22 NB:TESNB) | Tol | 1 | 50 | 47 | — | 1004 | 339 | Ni(THF)$_2$(C$_6$F$_5$)$_2$ delivered in toluene |
| 115 | 0.21 | 4200:1 (78:22 NB:TESNB) | Tol | 1 | 100 | trace | — | — | — | Ni(THF)$_2$(C$_6$F$_5$)$_2$ delivered in toluene |
| 115 | 0.9 | 1000:1 (78:22 NB:TESNB) | Tol | 1 | 70 | 87 | — | 646 | 170 | Ni(THF)$_2$(C$_6$F$_5$)$_2$ delivered in toluene |
| 118 | 0.9 | 1000:1 (78:22 NB:TESNB) | Tol | 1 | 50 | 89 | — | 855 | 157 | Ni(THF)$_2$(C$_6$F$_5$)$_2$ delivered in toluene |
| 119 | 0.11 | 8500:1 (78:22 NB:TESNB) | Tol | 1 | 60 | 29 | — | 969 | 356 | Ni(THF)$_2$(C$_6$F$_5$)$_2$ delivered in toluene |
| 120 | 0.11 | 8500:1 (78:22 NB:TESNB) | Tol | 1 | 70 | 25 | — | 924 | 349 | Ni(THF)$_2$(C$_6$F$_5$)$_2$ delivered in toluene |
| 121 | 0.47 | 2000:1 (78:22 NB:TESNB) | Tol | 1 | amb | 83 | — | 1037 | 229 | Ni(THF)$_2$(C$_6$F$_5$)$_2$ delivered in toluene |
| 122 | 0.47 | 2000:1 (78:22 NB TESNB) | Tol | 1 | 60 | 75 | — | 900 | 301 | Ni(THF)$_2$(C$_6$F$_5$)$_2$ delivered in toluene |
| 123 | 0.47 | 2000:1 (78:22 NB:TESNB) | Tol | 1 | 70 | 73 | — | 846 | 222 | Ni(THF)$_2$(C$_6$F$_5$)$_2$ delivered in toluene |
| 124 | 0.43 | 2100:1 (78:22 NB:TESNB) | Tol | 1 | amb | 73 | hexene (1) | 708 | 205 | Ni(THF)$_2$(C$_6$F$_5$)$_2$ delivered in toluene |
| 125 | 0.43 | 2100:1 (78:22 NB:TESNB) | Tol | 1 | amb | 64 | hexene (3) | 511 | 200 | Ni(THF)$_2$(C$_6$F$_5$)$_2$ delivered in toluene |
| 126 | 0.43 | 2100:1 (78:22 NB:TESNB) | Tol | 1 | amb | 52 | hexene (5) | 397 | 155 | Ni(THF)$_2$(C$_6$F$_5$)$_2$ delivered in toluene |
| 127 | 0.43 | 2100:1 (78:22 NB:TESNB) | Tol | 1 | amb | 10 | allyl bromide (1) | 117 | 52 | Ni(THF)$_2$(C$_6$F$_5$)$_2$ delivered in toluene |
| 128 | 0.43 | 2100:1 (78:22 NB:TESNB) | Tol | 1 | amb | trace | allyl bromide (3) | — | — | Ni(THF)$_2$(C$_6$F$_5$)$_2$ delivered in toluene |
| 129 | 0.43 | 2100:1 (78:22 NB:TESNB) | Tol | 1 | amb | trace | allyl bromide (5) | — | — | Ni(THF)$_2$(C$_6$F$_5$)$_2$ delivered in toluene |
| 130 | 0.43 | 2100:1 (78:22 NB:TESNB) | Tol | 1 | amb | 50 | betapinene (1) | 501 | 209 | Ni(THF)$_2$(C$_6$F$_5$)$_2$ delivered in toluene |
| 131 | 0.43 | 2100:1 (78:22 NB:TESNB) | Tol | 1 | amb | 36 | betapinene (3) | 214 | 89 | Ni(THF)$_2$(C$_6$F$_5$)$_2$ delivered in toluene |
| 132 | 0.43 | 2100:1 (78:22 NB:TESNB) | Tol | 1 | amb | trace | betapinene (5) | — | — | Ni(THF)$_2$(C$_6$F$_5$)$_2$ delivered in toluene |
| 133 | 0.43 | 2100:1 (78:22 NB:TESNB) | CH | 5 | 50 | 60 | hexene (1) | 870 | 301 | Ni(THF)$_2$(C$_6$F$_5$)$_2$ delivered in THF |
| 134 | 0.43 | 2100:1 (78:22 NB:TESNB) | CH | 5 | 50 | 56 | hexene (3) | 540 | 201 | Ni(THF)$_2$(C$_6$F$_5$)$_2$ delivered in THF |
| 135 | 0.43 | 2100:1 (78:22 NB:TESNB) | CH | 5 | 50 | 49 | hexene (5) | 475 | 176 | Ni(THF)$_2$(C$_6$F$_5$)$_2$ delivered in THF |
| 136 | 0.43 | 2100:1 (78:22 NB:TESNB) | CH | 5 | amb | 79 | hexene (1) | 878 | 269 | Ni(THF)$_2$(C$_6$F$_5$)$_2$ delivered in THF |
| 137 | 0.43 | 2100:1 (78:22 NB:TESNB) | CH | 5 | amb | 68 | hexene (3) | 642 | 237 | Ni(THF)$_2$(C$_6$F$_5$)$_2$ delivered in THF |
| 138 | 0.43 | 2100:1 (78:22 NB:TESNB) | CH | 5 | amb | 57 | hexene (5) | 524 | 212 | Ni(THF)$_2$(C$_6$F$_5$)$_2$ delivered in THF |
| 139 | 0.43 | 2100:1 (78:22 NB:TESNB) | CH | 1 | amb | 67 | hexene (1) | 861 | 322 | Ni(THF)$_2$(C$_6$F$_5$)$_2$ delivered in THF |
| 140 | 0.43 | 2100:1 (78:22 NB:TESNB) | CH | 1 | amb | 59 | hexene (3) | 683 | 258 | Ni(THF)$_2$(C$_6$F$_5$)$_2$ delivered in THF |
| 141 | 0.43 | 2100:1 (78:22 NB:TESNB) | CH | 1 | amb | 50 | hexene (5) | 555 | 184 | Ni(THF)$_2$(C$_6$F$_5$)$_2$ delivered in THF |

-continued

NB-type monomer polymerizations using Catalyst B

| Example | [Ni] (mM) | Monomer: Ni (monomer) | Solv | Time (h) | Temp (° C.) | Conv (%) | CTA (mol %) | Mw (× 10⁻³) | Mn (× 10⁻³) | Comments |
|---|---|---|---|---|---|---|---|---|---|---|
| 142 | 0.2100 | 4200:1 (78:22 NB:TESNB) | CH | 5 | 50 | 37 | hexene (1) | 642 | 249 | Ni(THF)$_2$(C$_6$F$_5$)$_2$ delivered in THF |
| 143 | 0.21 | 4200:1 (78:22 NB:TESNB) | CH | 5 | 50 | 34 | hexene (3) | 736 | 233 | Ni(THF)$_2$(C$_6$F$_5$)$_2$ delivered in THF |
| 144 | 0.21 | 4200:1 (78:22 NB:TESNB) | CH | 5 | 50 | 7 | hexene (5) | — | — | Ni(THF)$_2$(C$_6$F$_5$)$_2$ delivered in THF |

Tol = toluene, CH = cyclohexane, NB = norbornene, TESNB = 5-triethoxysilylnorbornene, MeEsNB = methylester of 5-norbornene carboxylic acid, t-BuEsNB = t-butylester of 5-norbornene carboxylic acid, amb = ambient temperature

EXAMPLES 145–162
Generic Polymerization Procedure Using Catalyst C

Norbornene (2.0 g) and triethoxysilylnorbornene (1.6 g), unless otherwise specified, was added to a vial in the glove box equipped with a stir bar. The vial was sealed with a Teflon®-lined rubber septum cap. The norbornene monomers were dissolved in cyclohexane to a total volume of 30 ml. To this vial was added an appropriate amount of (toluene)Ni(C$_6$F$_5$)$_2$ in a 60/40 mixture of cyclohexane and toluene, unless otherwise specified (see table below). The mixture was allowed to stir for the allotted time at the temperature given in the Table below. The resulting mixture was then poured into an excess of methanol to precipitate the polymer. The polymer was filtered and dried in the vacuum oven overnight. The conversions were then determined gravimetrically.

NB-type monomer polymerizations using Catalyst C

| Example | [Ni] (mM) | monomer:Ni (monomer) | Solv | Time (h) | Temp (° C.) | Conv (%) | Comments |
|---|---|---|---|---|---|---|---|
| 145 | 0.23 | 4000:1 (78:22 NB:TESNB) | CHA | 5 | amb. | 46 | Catalyst delivered as 0.02M solution (40% toluene in CHA) |
| 146 | 0.11 | 8000:1 (78:22 NB:TESNB) | CHA | 5 | amb. | 29 | Catalyst delivered as 0.02M solution (40% toluene in CHA) |
| 147 | 0.045 | 20000:1 (78:22 (NB:TESNB) | CHA | ON | amb. | 12 | Catalyst delivered as 0.02M solution (40% toluene in CHA) |
| 148 | 0.23 | 4000:1 (78:22 NB:TESNB) | CHA | 5 | amb. | 23 | Catalyst delivered as 0.02M solution (40% toluene in CHA). CTA = 1 mol % (on monomers) allyltrifluoroacetate |
| 149 | 0.11 | 8000:1 (8:22 NB:TESNB) | CHA | 5 | amb. | 11 | Catalyst delivered as 0.02M solution (40% toluene in CHA). CTA = 1 mol % (on monomers) allyltrifluoroacetate |
| 150 | 0.23 | 4000:1 (78:22 NB:TESNB) | CHA | 5 | amb. | 7 | Catalyst delivered as 0.02M solution (40% toluene in CHA). CTA = 3 mol % (on monomers) allyltrifluoroacetate |
| 151 | 0.45 | 2000:1 (50:50 NB:MeEsNB) | CHA | 4 | amb. | 54 | Catalyst delivered as 0.02M solution (10% toluene in CHA) |
| 152 | 0.45 | 2000:1 (50:50 NB:BuEsNB) | CHA | 4 | amb. | 22 | Catalyst delivered as 0.02M solution (10% toluene in CHA) |
| 153 | 0.47 | 2000:1 (78:22 NB:TESNB) | CHA | 3 | amb. | 32 | Catalyst delivered as 0.02M solution (in toluene), CTA = 1 mol % styrene on monomers |
| 154 | 0.47 | 2000:1 (78:22 NB:TESNB) | CHA | 3 | amb. | 29 | Catalyst delivered as 0.02M solution (in toluene), CTA = 5 mol % styrene on monomers |

-continued

NB-type monomer polymerizations using Catalyst C

| Example | [Ni] (mM) | monomer:Ni (monomer) | Solv | Time (h) | Temp (° C.) | Conv (%) | Comments |
|---|---|---|---|---|---|---|---|
| 155 | 0.47 | 2000:1 (78:22 NB:TESNB) | CHA | 21 | amb. | 59 | Catalyst delivered as 0.02M solution (in toluene), CTA = 1 mol % styrene on monomers. Mw = 737,000, Mn = 145,000 |
| 156 | 0.47 | 2000:1 (78:22 NB:TESNB) | CHA | 21 | amb. | 43 | Catalyst delivered as 0.02M solution (in toluene), CTA = 5 mol % styrene on monomers. Mw = 499,000, Mn = 239,000 |
| 157 | 0.47 | 2000:1 (78:22 NB:TESNB) | CHA | 3 | amb. | 84 | Catalyst delivered as 0.02M solution (in toluene), CTA = 1 mol % cyclopentene on monomers. Mw = 690,000, Mn = 247,000 |
| 158 | 0.47 | 2000:1 (78:22 NB:TESNB) | CHA | 3 | amb. | 40 | Catalyst delivered as 0.02M solution (in toluene), CTA = 5 mol % cyclopentene on monomers. Mw = 355,000, Mn = 135,000 |
| 159 | 0.47 | 2000:1 (78:22 NB:TESNB) | CHA | 3 | amb. | 83 | Catalyst delivered as 0.02M solution (in toluene), CTA = 1 mol % cyclohexene on monomers. Mw = 707,000, Mn = 220,000 |
| 160 | 0.47 | 2000:1 (78:22 NB:TESNB) | CHA | 3 | amb. | 54 | Catalyst delivered as 0.02M solution (in toluene), CTA = 5 mol % cyclohexene on monomers. Mw = 472,000, Mn = 223,000 |
| 161 | 0.47 | 2000:1 (78:22 NB:TESNB) | CHA | 3 | amb. | 62 | Catalyst delivered as 0.02M solution (in toluene), CTA = 1 mol % cyclooctadiene on monomers. Mw = 605,000, Mn = 255,000 |
| 162 | 0.47 | 2000:1 (78:22 NB:TESNB) | CHA | 3 | amb. | 10 | Catalyst delivered as 0.02M solution (in toluene), CTA = 5 mol % cyclooctadiene on monomers. Mw = 292,000, Mn = 122,000 |

Tol = toluene, CHA = cyclohexane, NB = norbornene, TESNB = 5-triethoxysilylnorbornene, MeEsNB = 5-methylester of 5-norbornene carboxylic acid, t-BuEsNB = t-butylester of 5-norbornene carboxylic acid, amb. = ambient temperature, ON = overnight, CTA = chain transfer agent.

EXAMPLES 163–166

Polymerization of NB-type Monomers Using Catalyst C

To a 100 ml glass vial fitted with an airtight crimptop cap and a Teflon® stir bar was added at ambient temperature nobornene (4.0 g, 42.4 mmol), triethoxysilylnobornene (2.8 ml, 10.4 mmol) and toluene or chlorobenzene (35 ml) and butadiene as MW control agent as indicated in the following table. Thereafter was added (toluene)Ni($C_6F_5$)$_2$ (6.3 mg, 13 μmol) dissolved in toluene (3 ml). After 120 min. reaction time at ambient temperature the viscous solution was diluted with toluene (50 ml) and poured into an excess of methanol. The precipitated copolymer was filtered, dried in a vacuum oven at ambient temperature for 24 hours (constant weight) and weighed.

| Example | Solvent, type | Butadiene, mmol | Yield, g | Conversion, % | Mw | Mn |
|---|---|---|---|---|---|---|
| 163 | toluene | 1.06 | 2.6 | 38 | 593,000 | 258,000 |
| 164 | toluene | 2.12 | 1.9 | 28 | 419,000 | 176,000 |
| 165 | chlorobenzene | 1.06 | 2.8 | 42 | 786,000 | 340,000 |
| 166 | chlorobenzene | 2.12 | 2.9 | 43 | 586,000 | 137,000 |

EXAMPLES 167–175
Polymerization Procedure Using Catalysts B and C

Norbornene (2.0 g) and triethoxysilylnobornene (1.6 g) was added to a vial in the glove box equipped with a stir bar. The vial was sealed with a Teflon®-lined rubber septum cap. The norbornene was dissolved in cyclohexane to a total volume of 30 ml. To this vial was added an appropriate amount of a 0.02 M solution of either (toluene)Ni($C_6F_5$)$_2$ or cis-Ni(THF)$_2$($C_6F_5$)$_2$ in a 90/10 mixture of cyclohexane and toluene (see table below). The mixture was allowed to stir for the allotted time at the temperature given in the table below. The resulting mixture was then poured into an excess of methanol to precipitate the polymer. The polymer was filtered and dried in the vacuum oven overnight. The conversions were then determined gravimetrically.

| Example | [Catalyst] | NB (22% TESNB):Ni | Conv (%) | Mw ($10^{-3}$) | Mw/Mn |
|---|---|---|---|---|---|
| 167 | Catalyst C 0.45 mM | 2000:1 | 79 | 676 | 2.42 |
| 168 | Catalyst C 0.45 mM | 2000:1 | 73 | 738 | 2.63 |
| 169 | Catalyst C 0.45 mM | 2000:1 | 78 | 684 | 2.92 |
| 170 | Catalyst B 0.45 mM | 2000:1 | 78 | 716 | 3.21 |
| 171 | Catalyst B 0.45 mM | 2000:1 | 74 | 671 | 2.8 |
| 172 | Catalyst B 0.45 mM | 2000:1 | 79 | 708 | 3.01 |
| 173 | Catalyst C 0.23 mM | 4000:1 | 55 | 757 | 2.17 |
| 174 | Catalyst C 0.23 mM | 4000:1 | 54 | 799 | 2.23 |
| 175 | Catalyst C 0.23 mM | 4000:1 | 53 | 810 | 2.28 |

EXAMPLE 176
NB Polymerization Using Catalyst F

Approximately 10 mg of Catalyst F was dissolved in about 2 ml of toluene. This solution was added to a solution of norbornene (4.7 g) in cyclohexane (50 ml). The resulting pale orange solution began to visibly increase in viscosity. After 1 hour the viscous solution was added to 300 ml of methanol to precipitate the polymer. The polymer was filtered and dried. Yield 1.21 g (26%).

EXAMPLE 177
NB Polymerization Using Catalyst F

Approximately 10 mg of Catalyst F was dissolved in about 3 ml of toluene. This solution was added to a solution of nobornene (3.0 g) and triethoxysilylnobornene (2.0 g) in cyclohexane (50 ml). The resulting pale orange solution began to visibly increase in viscosity. After 1 hour the viscous solution was added to 300 ml of methanol to precipitate the polymer. The polymer was filtered and dried. Yield 0.56 g (11%). Mw=907,000 and Mn=241,000 determined by GPC methods.

EXAMPLE 178
NB Polymerization Using Catalyst G

Approximately 10 mg of Catalyst G was dissolved in about 2 ml of toluene. This solution was added to a solution of nobornene (5.0 g) in cyclohexane (50 ml). After one hour the viscous solution was added to 300 ml of methanol to precipitate the polymer. The polymer was filtered and dried.

EXAMPLE 179
NB Polymerization Using Catalyst H

Approximately 10 mg of Catalyst H was dissolved in about 2 ml of toluene to form a dark blue solution. This solution was added to a solution of nobornene (3.0 g) and triethoxysilylnobornene (2.0 g) in cyclohexane (50 ml). The resulting light blue solution began to visibly increase in viscosity. After 1 hour the viscous solution was added to 300 ml of methanol to precipitate the polymer. The polymer was filtered and dried. Yield 2,72 g (54%). Mw=945,000 and Mn=306,000 determined by GPC methods.

EXAMPLE 180
NB Polymerization Using Catalyst I

Approximately 150 mg of Catalyst I in 5 ml of toluene was added to a cyclohexane solution (10 ml) of norbornene (1.0 g). After one hour the solution was added to methanol (300 ml) to precipitate the polymer.

EXAMPLE 181
NB Polymerization Using Catalyst K

To a 50 ml glass vial fitted with an airtight crimptop cap and a Teflon® stir bar was added at ambient temperature the norbornene (4.0 g, 4.25 mmol and toluene (35 ml). Thereafter was added Catalyst K (106.4 mg, 10.6 μmol) dissolved in toluene (5 ml). Within two minutes the solution became so viscous that stirring stopped. After 100 minutes the reaction was stopped by opening the vial, diluting with toluene and precipitating the polymer into excess methanol (400 ml). The polymer was filtered, washed with methanol and dried overnight in a vacuum oven at 80° C. The isolated yield of the polymer was 2.34 grams, representing 59% conversion. The polymer was characterized by NMR methods.

EXAMPLE 182
NB Polymerization Using Catalyst L

To a 100 ml glass vial fitted with an airtight crimptop cap and a Teflon® stir bar was added at ambient temperature norbornene (5.0 g, 53.1 mmol) and toluene (35 ml). Thereafter was added (1,2-dimethoxyethane)Ni(2,4,6-tris (trifluoromethyl)phenyl)$_2$ (13 μmol) dissolved in toluene (2 ml). Within three seconds the contents of the bottle became a very viscous, nonstirring mass and there was much heat evolution. When the bottle was opened, after 60 minutes, the gel was so hard that it was almost impossible to remove it from the bottle. The gel was dried in a vacuum oven (80° C.) overnight and then cryogenically ground. The weight of dried, pulverized polymer indicated that the nobornene had been quantitatively converted.

EXAMPLE 183
NB-type Monomer Polymerization Using Catalyst L

To a 100 ml glass vial fitted with an airtight crimptop cap and a Teflon® stir bar was added at ambient temperature nobornene (4.0 g, 42.4 mmol), triethylsilylnobornene (2.8 ml, 10.6 mmol) and toluene (35 ml). Thereafter was added (dimethoxyethane)Ni(2,4,6-tris(trifluoromethyl)phenyl)$_2$ (13 μmol) dissolved in toluene (2 ml). After 30 minutes there was noticeable viscosity, and after 90 minutes reaction time the viscous solution was diluted with toluene (50 ml) and poured into an excess of methanol. The preciptated copolymer was filtered, dried in a vacuum oven at ambient temperature for 24 hours (constant weight) and weighed. The yield of copolymer was 2.5 g. The proton and carbon NMR spectra revealed the product to be a copolymer. GPC analysis showed the copolymer to have a very high molecular weight (Mw 1,640,000, Mn 227,000).

EXAMPLE 184
Norbornene Polymerization Using Catalyst M

To a solution of nobornene (2.5 g) dissolved in 15 ml dichloromethane was added $(Et_4N)_2[Ni(C_6F_5)_2Cl_2]_2$ (0.05 g dissolved in 2 ml of dichloromethane). The polymerization occurred immediately to give an addition polymerized polynobornene which was recovered in 100% yield upon addition of the solution to methanol.

EXAMPLE 185
NB Polymerization Using Catalyst N

A quantity of $(\eta^3\text{-}CH_3C(CH)_2)Ni(PPh_3)(C_6F_5)$ (0.025 g) was added to a sample of hexylnorbornene (2 g) in toluene (5 ml) and the reaction stirred for 16 hours. A yellow gelled solution was obtained.

EXAMPLE 186
NB Polymerization Using Catalyst O

A quantity of $(\eta^3\text{-}CH_3C(CH)_2)Ni(PCy_3)(C_6F_5)$ (0.025 g) was added to a sample of hexylnorbornene (2 g) in toluene (5 ml) and the reaction stirred for 16 hours. A yellow gelled solution was obtained after this time.

EXAMPLE 187
NB Polymerization Using Catalyst P

To a 100 ml glass vial fitted with an airtight crimptop cap and a Teflon® stir bar was added at ambient temperature norbornene (5.0 g, 53.1 mmol) and toluene (35 ml). Thereafter was added Ni(2,4,6-tris(trifluoromethyl)phenyl)$_2$, the catalyst from example 66 (13 μmol), dissolved in toluene (3 ml). Within 5 seconds the contents of the bottle became a very viscous, nonstirring mass and there was much heat evolution. When the bottle was opened, after 60 minutes, the gel was so hard that it was almost impossible to remove it from the bottle. The gel was dried in a vacuum oven (80° C.) overnight and then cryogenically ground. The weight of dried, pulverized polymer indicated that the norbornene had been quantitatively converted.

EXAMPLE 188

To a solution of norbornene (2.5 g) in toluene (30 ml) was added a solution of catalyst B (0.05 ml of a 0.3 M solution in THF) which was made in situ from NiBr$_2$ and pentafluorophenylmagnesium bromide in THF. Within 10–15 s, an unstirrable mixture formed. After 15 m, the polymer was precipitated with ethanol, filtered, and dried overnight at 80° C. in a vacuum oven to give a quantitative yield of homopolynobornene.

EXAMPLE 189

To a solution of nobornene (4.0 g) in cyclohexane (50 ml) was added a solution of Ni(COD)$_2$ (0.0058 g) in about 2 ml of toluene, pentafluorobenzoyl chloride (0.003 ml) and 0.048 g of a 25 wt % solution of AlEt$_3$ in cyclohexane. The solution was allowed to stir for 1 hour after which time the solution was poured into methanol (300 ml). The polymer was filtered and dried.

EXAMPLE 190

To a cyclohexane solution (50 ml) of nobornene (3.0 g) and triethoxylsilylnobornene (2.0 g) was added 0.13 g of nickel ethylhexanoate (8 wt % in mineral spirits). The mixture was then deoxygenated by bubbling argon through the solution. A solution of pentafluorobenzoyl chloride (0.025 ml in 2 ml of cyclohexane) was added followed by 0.407 g of a 25 wt % solution of triethylaluminum. The mixture was stirred for 2 hours at room temperature. The mixture was poured into 300 ml of methanol. The resulting precipitated polymer was filtered and dried. Yield 0.47 g (9%). Mw=156,000 and Mn=71,000 determined by GPC methods.

EXAMPLE 191

Norbornene (4.0 g) was dissolved in 50 ml of cyclohexane. A solution of Ni(COD)$_2$ (0.0058 g) and tri-tert-butylphosphine (0.0043 g) in toluene (2 ml) was made. To this mixture was added pentafluorobenzoyl chloride (0.0036 ml). Then this mixture was added to the nobornene solution. The mixture was allowed to stir for 1 hour at room temperature and then poured into 300 ml of methanol. A small amount of polymer was filtered and dried.

EXAMPLE 192

Norbornene (4.0 g) was dissolved in 50 ml of cyclohexane. A solution of Ni(COD)$_2$ (0.0058 g) and tris(pentafluorophenyl)phosphine (0.0112 g) in toluene (2 ml) was made. To this mixture was added pentafluorobenzoyl chloride (0.0072 ml). Then this mixture was added to the norbornene solution. The mixture was allowed to stir for 1 hour at room temperature and then poured into 300 ml of methanol. A small amount of polymer was filtered and dried.

EXAMPLE 193

Norbornene (4.0 g) was dissolved in 50 ml of cyclohexane. A solution of Ni(COD)$_2$ (0.0058 g) and trichlorophosphine (0.0018 ml) in toluene (2 ml) was made. To this mixture was added pentafluorobenzoyl chloride (0.0036 ml). Then this mixture was added to the norbornene solution. The mixture was allowed to stir for 1 hour at room temperature and then poured into 300 ml of methanol. A small amount of polymer was filtered and dried.

EXAMPLE 194

Ni(THF)$_2$(C$_6$F$_5$)$_2$ (0.020 g) was dissolved in about 2 ml of toluene containing 0.0079 ml of beta-pinene. The resulting mixture was stirred for about 30 min. during which time the orange color changed to blue. This solution was then added to a cyclohexane solution (50 ml) or norbornene (3.85 g). Within 5 sec. there was a noticeable increase in viscosity. After 10–15 sec. the solution gelled. After 1 hour the mixture was transferred to a beaker after additional toluene was added to aid in the transfer. Addition of methanol caused precipitation of the polymer.

EXAMPLE 195

Norbornene (2.0 g) was dissolved in 50 ml of cyclohexane. An ether solution of 2,4,6-trifluorobenzoyl chloride (0.708 g) was added to a THF (10 ml) of Ni(COD)$_2$ (1.0 g). The intially yellow solution became orange. After thirty minutes, the volatiles were removed in vacuo to yield a yellow solid. A portion of this solid was dissolved in ether and added to a nobornene (2.0 g, 57:1 norbornene:nickel ratio) solution in cyclohexane (25 ml). After thirty minutes the mixture became black. After two days, addition of MeOH (300 ml) gave a grey solid which was redissolved in chlorobenzene warmed to 50° C. and stirred with a 95:5 water:acetic acid solution. The layers were separated and the organic layer was added to MeOH (300 ml) to yield white powder. The powder was dried in vacuo at 70° C. Yield 1.30 g (65%). Mw=170,000; Mn=78,900.

EXAMPLE 196

Norbornene (2.5 g) was dissolved in 30 ml of toluene. A toluene solution (1 ml) of (PPh$_3$)$_2$Ni(C$_6$Cl$_5$)Cl (0.012 g) and

[Cu(Mesityl)]$_5$ (0.0024 g) was added to the norbornene solution. After stirring the mixture for 2 hours at 70° C., addition of 300 ml of methanol induced precipitation of polymer in about 6% conversion after filtering and drying.

EXAMPLE 197

Norbornene (2.5 g) was dissolved in 30 ml of toluene. A toluene solution (1 ml) of (PPh$_3$)$_2$Ni(C$_6$F$_5$)Br (0.011 g) and [Cu(Mesityl)]$_5$ (0.0024 g) was added to the norbornene solution. After stirring the mixture for 2 hours at 70° C., addition of 300 ml of methanol induced precipitation of polymer in about 31% conversion after filtering and drying.

EXAMPLE 198

NB-type monomer polymerization using Catalyst C in the presence of a ligand reagent. Norbornene (2.5 g) was dissolved in 30 mL of toluene. A toluene solution (1 mL) of Catalyst C (0.0065 g) and C$_6$F$_5$—CH═N—(o-NMe$_2$)C$_6$H$_4$ (0.0042 g) was added to the nobornene solution. After stirring the mixture for 14 hours, addition of 300 ml of methanol induced precipitation of polymer in about 20% conversion after filtering and drying.

EXAMPLE 199

NB-type monomer polymerization using Catalyst B and in the presence of a ligand reagent. Triphenylphosphine oxide (0.20 g) in 10 ml THF was added to a 20 ml THF solution of Ni(THF)$_2$(C$_6$F$_5$)$_2$ (0.20 g). The mixture was allowed to stir for 30 min. The solvent was removed in vacuo to give an orange oil. Approximately 17.5 ml of 1,2-dichloroethane was added to the oil. Removal of the solvent in vacuo gave an orange powder. To this orange powder was added 17.5 ml of toluene to give a slurry. Approximately 0.6 ml of this slurry was added to nobornene (2.0 g) and triethoxysilylnobornene (1.6 g) in 30 ml of cyclohexane. The mixture was heated to 50° C. for 1 hour. The mixture was poured into 500 ml of acetone to precipitate the polymer. After filtration and drying under vacuum 0.73 g of polymer was isolated.

EXAMPLE 200

NB-type monomer polymerization using Catalyst B in the presence of a ligand reagent. Tri-n-butylphosphine oxide (0.17 g) in 10 ml THF was added to a 20 ml THF solution of Ni(THF)$_2$(C$_6$F$_5$)$_2$ (0.20 g). The mixture was allowed to stir for 30 min. The solvent was removed in vacuo to give an orange oil. Approximately 17.5 ml of toluene was added to the oil to give an orange solution. Three polymerization was carried out using this solution.

Approximately 0.65 ml of this solution was added to added to nobornene (2.0 g) and triethoxysilylnobornene (1.6 g) in 30 ml of cyclohexane and was allowed to stir for 5 hours at room temperature. After precipitation into acetone, filtration, and drying under vacuum, 1.0 g of polymer was isolated.

Approximately 0.65 ml of the same solution was added to added to nobornene (2.0 g) and triethoxysilylnobornene (1.6 g) in 30 ml of cyclohexane and was allowed to stir for 5 hours at 50° C. After precipitation into acetone, filtration, and drying under vacuum, 0.87 g of polymer was isolated. Mw=710,000 and Mn=232,000 by GPC methods.

Approximately 0.65 ml of the same solution was added to added to norbornene (2.0 g), triethoxysilylnobornene (1.6 g), and 0.063 g of methylaluminum bis(2,6-di-tert-butyl-4-methylphenoxide)$_2$ in 30 ml of cyclohexane and was allowed to stir 5 min. at room temperature. After precipitation into acetone, filtration, and drying under vacuum, 1.28 g of polymer was isolated. Mw=1,076,000 and Mn=393,000 by GPC methods.

EXAMPLES 201–202

NB Polymerization using Catalyst C in the presence of a ligand reagent. To a 100 ml glass vial fitted with an airtight crimptop cap and a Teflon® stir bar was added at ambient temperature norbornene (5.0 g, 53.1 mmol) and toluene (35 ml). Thereafter was added (toluene)Ni(C$_6$F$_5$)$_2$ (6.3 mg, 13 μmol) dissolved in toluene (3 ml) to which tris(2,2,2-trifluoroethyl)phosphite had been added, the resulting solution being allowed to stir at ambient temperature for 10 minutes prior to adding to the monomer solution. In both cases the polymerization ensued very rapidly. After 60 minutes reaction time at ambient temperature the viscous solution was diluted with toluene (50 ml) and poured into an excess of methanol. The precipitated homopolymer was filtered, dried in a vacuum oven at 80° C. overnight (constant weight) and weighed.

| Example | Phosphite, mol/mol Ni | Yield, g | Conversion, % | Mw | Mn |
|---|---|---|---|---|---|
| 201 | 1 | 4.9 | 98 | 1,242,000 | 607,000 |
| 202 | 2 | 4.4 | 88 | 1,213,000 | 591,000 |

EXAMPLE 203

NB Polymerization using Catalyst C in the presence of a ligand reagent. To a 100 ml glass vial fitted with an airtight crimptop cap and a Teflon® stirbar was added at ambient temperature norbornene (5.0 g, 53.1 mmol) and toluene (35 ml). Thereafter was added (toluene)Ni(C$_6$F$_5$)$_2$ (6.3 mg, 13 μmol) dissolved in toluene (3 ml) to which the ligand illustrated below had been added (13 μmol, 1:1 mol/mol on nickel), the resulting solution being allowed to stir at ambient temperature for 3 minutes prior to adding to the monomer solution. After 60 minutes reaction time at ambient temperature the solution was poured into an excess of methanol. The precipitated homopolymer was filtered, dried in a vacuum oven at 80° C. overnight (constant weight) and weighed, the polymer yield was 1.1 g (22% conversion).

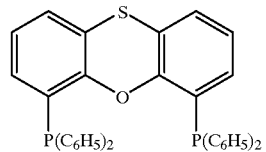

EXAMPLE 204

NB Polymerization using Catalyst C in the presence of a ligand reagent. To a 100 ml glass vial fitted with an airtight crimptop cap and a Teflon® stir bar was added at ambient temperature norbornene (5.0 g, 53.1 mmol) and toluene (35 ml). Thereafter was added (toluene)Ni(C$_6$F$_5$)$_2$ (6.3 mg, 13 μmol) dissolved in toluene (3 ml) to which (C$_6$H$_5$)$_2$P(o-(OCH$_3$)C$_6$H$_4$) had been added (13 μmol, 1:1 mol/mol on nickel) had been added, the resulting solution being allowed to stir at ambient temperature for 3 minutes prior to adding to the monomer solution. After 10 minutes reaction time at ambient temperature the viscous solution was diluted with toluene (50 ml) and poured into an excess of methanol. The precipitated homopolymer was filtered, dried in a vacuum oven at 80° C. overnight (constant weight) and weighed, indicating quantitative conversion.

EXAMPLE 205–248

The monomers were added to a vial in the glove box equipped with a stir bar. The vial was sealed with a Teflon®-lined rubber septum cap. The norbornene was dissolved in toluene. To this vial was added the appropriate amount of catalyst and cocatalyst (see table below). The mixture was allowed to stir for the allotted time at the temperature given in table below. The resulting mixture was then poured into an excess of methanol to precipitate the polymer. The polymer was filtered and dried in the vacuum oven overnight. The conversions were then determined gravimetrically.

| Example | Monomer (mmol) | catalyst (mMol) | co-cat (mMol) | mon:Ni:Zn | Time/Temp | Conv (%) | Comments |
|---|---|---|---|---|---|---|---|
| 205 | NB (26.6) | P(o-tol)$_3$PdCl$_2$ (0.43) | Zn(C$_6$F$_5$)$_2$.DME (0.43) | 2001:1:1 | 18/65° C. | 1.6 | |
| 206 | NB (26.6) | (NBD)PdCl$_2$ (0.43) | Zn(C$_6$F$_5$)$_2$.DME (0.43) | " | " | 30 | |
| 207 | NB (26.6) | (allyl-PdCl)$_2$ (0.43) | Zn(C$_6$F$_5$)$_2$.DME (0.43) | " | " | 1.6 | |
| 208 | NB (26.6) | (dme)NiCl$_2$ (0.43) | Zn(C$_6$F$_5$)$_2$.DME (0.43) | " | 18/80° C. | 39 | |
| 209 | NB (26.6) | (dme)NiBr$_2$ (0.43) | Zn(C$_6$F$_5$)$_2$.DME (0.43) | " | " | 97 | |
| 210 | NB (26.6) | (dppe)NiCl$_2$ (0.43) | Zn(C$_6$F$_5$)$_2$.DME (0.43) | " | " | 5.6 | |
| 211 | NB (26.6) | (DPM)$_2$Ni (0.43) | Zn(C$_6$F$_5$)$_2$.DME (0.43) | " | " | 96 | |
| 212 | NB (26.6) | (t-octdab)NiCl$_2$ (0.43) | Zn(C$_6$F$_5$)$_2$.DME (0.43) | " | " | 97 | |
| 213 | BuNB/TESNB 90:10 | (DPM)$_2$Ni (0.45) | Zn(C$_6$F$_5$)$_2$.DME (0.45) | " | 5/60° C. | 83 | |
| 214 | BuNB/TESNB 90:10 | (DPM)$_2$Ni (0.45) | Zn(C$_6$F$_5$)$_2$.DME (0.45) | " | " | 31 | |
| 215 | BuNB/TESNB 90:10 | (DPM)$_2$Ni (0.45) | Zn(C$_6$F$_5$)$_2$.DME (0.45) | " | " | 15 | |
| 216 | BuNB/TESNB 90:10 | (t-octdab)NiCl$_2$ (0.45) | Zn(C$_6$F$_5$)$_2$.DME (0.45) | " | " | 87 | |
| 217 | BuNB/TESNB 90:10 | (t-octdab)NiCl$_2$ (0.45) | Zn(C$_6$F$_5$)$_2$.DME (0.45) | " | " | 41 | |
| 218 | BuNB/TESNB 90:10 | (t-octdab)NiCl$_2$ (0.45) | Zn(C$_6$F$_5$)$_2$.DME (0.45) | " | " | 34 | |
| 219 | BuNB/TESNB 90:10 | (Pph$_2$CHC(O)Ph)$_2$Ni (0.43) | Zn(C$_6$F$_5$)$_2$.DME (0.45) | " | " | 8.4 | |
| 220 | BuNB/TESNB 90:10 | (t-octdab)NiCl$_2$ (0.43) | Zn(C$_6$F$_5$)$_2$.DME (0.43) | 2000:1:1 | 18/60° C. | 65 | |
| 221 | BuNB/TESNB 90:10 | (t-octdab)NiCl$_2$ (0.23) | Zn(C$_6$F$_5$)$_2$.DME (0.23) | 4000:1:1 | " | 31.5 | |
| 222 | BuNB/TESNB 90:10 | (t-octdab)NiCl$_2$ (0.12) | Zn(C$_6$F$_5$)$_2$.DME (0.23) | 4000:2:1 | " | 10.5 | |
| 223 | BuNB/TESNB 90:10 | Cp$_2$TiCl$_2$ (0.43) | Zn(C$_6$F$_5$)$_2$.DME (0.23) | " | " | 1.6 | |
| 224 | BuNB/TESNB 90:10 | Sm-Ethyl hexanoate (0.43) | Zn(C$_6$F$_5$)$_2$.DME (0.23) | " | " | 5 | |
| 225 | BuNB/TESNB 90:10 | (dme)Zn(C$_6$F$_5$)$_2$ (0.43) | — | 2000:1:1 | " | 0 | control experiment |
| 226 | NB (26.6) | Cp$_2$ZrCl$_2$ (0.43) | Zn(C$_6$F$_5$)$_2$.DME (0.23) | " | " | 4 | |
| 227 | NB (26.6) | Eu(DPM)$_3$ (0.43) | Zn(C$_6$F$_5$)$_2$.DME (0.23) | " | " | 6 | |
| 228 | NB (26.6) | (t-budab)CoBr$_2$ (0.43) | Zn(C$_6$F$_5$)$_2$.DME (0.23) | " | " | 6 | |
| 229 | NB (26.6) | VO(acac)$_2$ (0.43) | Zn(C$_6$F$_5$)$_2$.DME (0.23) | " | 14/65° C. 48/amb | 0.4 | |
| 230 | NB (26.6) | SnBr$_{2(acac)2}$ (4.3) | Zn(C$_6$F$_5$)$_2$.DME (22) | 200:1:5 | 24/90° C. | 8 | |
| 231 | NB (26.6) | [(NBD)RhCl]$_2$ (4.3) | Zn(C$_6$F$_5$)$_2$.DME (22) | " | 18/65° C. | 2 | |
| 232 | NB (26.6) | (t-budab(CuBr$_2$ (4.3) | Zn(C$_6$F$_5$)$_2$.DME (22) | " | 18/65° C. | 8 | |
| 233 | NB (26.6) | (t-budab)FeBr$_3$ (4.3) | Zn(C$_6$F$_5$)$_2$.DME (22) | " | 1.5/65° C. | 0.4 | |
| 234 | NB (26.6) | GeBr$_4$ (4.3) | Zn(C$_6$F$_5$)$_2$.DME (22) | " | 1.5/65° C. | 31 | |

-continued

| Example | Monomer (mmol) | catalyst (mMol) | co-cat (mMol) | mon:Ni:Zn | Time/Temp | Conv (%) | Comments |
|---|---|---|---|---|---|---|---|
| 235 | NB (26.6) | $SiCl_4$ (4.3) | $Zn(C_6F_5)_2$.DME (22) | " | 18/65° C. | 20 | |
| 236 | NB/TESNB (80:20) (27 mmol) | $GeBr_4$ (4.3) | $Zn(C_6F_5)_2$.DME (22) | " | 18/65° C. | 11 | |
| 237 | NB/TESNB (80:20) (27 mmol) | $SiCl_4$ (4.3) | $Zn(C_6F_5)_2$.DME (22) | " | 18/65° C. | 16 | |
| 238 | NB/MeEsNB (50:50) (27 mmol) | $SiCl_4$ (4.3) | $Zn(C_6F_5)_2$.DME (22) | " | 18/65° C. | 9 | |
| 239 | NB/MeEsNB (50:50) (27 mmol) | $GeBr_4$ (4.3) | $Zn(C_6F_5)_2$.DME (22) | " | 18/65° C. | 13 | |
| 240 | NB (27 mmol) | $Zn(C_6F_5)_2$.DME (4.3) | — | 40:1 | 18/65° C. | 0 | control experiment |
| 241 | NB (27 mmol) | $SiBr_4$ (4.3) | $Zn(C_6F_5)_2$.DME (22) | " | 64/65° C. | 0.8 | |
| 242 | NB (27 mmol) | $Me_3SiBr$ (4.3) | $Zn(C_6F_5)_2$.DME (22) | " | 64/65° C. | 0.4 | |
| 243 | NB (27 mmol) | $SiBr_4$ (4.3) | $Zn(C_6F_5)_{2eDME}$ (22) | " | 64/65° C. | 23 | |
| 244 | NB (27 mmol) | $Sn(acac)_2Br_2$ (4.3) | $B(C_6F_5)_3$ (22) | " | 18/65° C. | 47 | |
| 245 | NB (27 mmol) | $Pb(dpm)_2$ (4.3) | $B(C_6F_5)_3$ (22) | 40:1:1 | 18/65° C. | 12 | |
| 246 | NB (27 mmol) | $(C_6F_5)SiClMe_2$ (4.3) | $Zn(C_6F_5)_2$.DME (22) | " | 64/65° C. | 8 | |
| 247 | NB (27 mmol) | $Zn(C_6F_5)_2$.DME (22) | $B(C_6F_5)_3$ (22) | 40:1:1 | 18/65° C. | 6 | |
| 248 | NB (27 mmol) | — | $B(C_6F_5)_3$ (11) | 82:1:1 | 18/65° C. | 0 | control experiment |

P(o-tol)$_3$ = P(orthotolyl)$_3$, NBD = norbornadiene, dme = dimethoxyethane, dpm = 2,2,6,6-tetramethyl-3,5-heptanedionate or dipivaloylmethane, t-octdab = tert-octyldiazabutadiene, t-budab = tert-butyldiazabutadiene, Cp* = pentamethylcyclopentadienyl, Cp = cyclopentadienyl, NB = norbornene, TESNB = 5-triethoxysilylnorbornene, MeEsNB = methylester of 5-norbornene carboxylic acid, acac = acetylacetonate

EXAMPLE 249

Polymerization of NB using reaction product of silicon tetrachloride and pentafluorophenyl Grignard. The reaction of $SiCl_4$ and $(C_6F_5)MgBr$ as reported by Wittingham and Jarvie (*J. Organometal. Chem.* 1968, 13, 125) was repeated. According to this report, this reaction yields a mixture of $Si(C_6F_5)_4$, $SiCl_2(C_6F_5)_2$, and $SiCl_3(C_6F_5)$. Addition of this mixture to NB in toluene yields 54% conversion to polynobornene after 3 h at 65° C. and subsequent precipitation from methanol and drying. Subsequent $^{19}F$ NMR analysis of the initiator mixture showed resonances consistent with the formation of pentafluorophenyl silane complexes, and some unreacted Grignard reagent.

EXAMPLE 250

Polymerization of norbornene employing ($\eta^3$-methallyl) nickel chloride. In a dry box, norbornene (2 g) admixed with [($\eta^3$-CH$_3$C(CH)$_2$)NiCl]$_2$ (0.012 g) was liquified by the addition of 0.15 ml of dried toluene. The solution was then stirred with a magnetic stir bar to dissolve the nickel procatalyst. To this solution was added Zn(C$_6$F$_5$)$_2$(dme) dissolved in a minimum of toluene (0.25 ml). Upon addition of the Zn(C$_6$F$_5$)$_2$(dme) there was an instant reaction and the polymer gelled and polymerized into a dark black foamy mass with a thin film attached. The thin film was quite flexible. Given the boiling point of norbornene and toluene, evaporation of material from the vessel was expected to be caused by the spontaneous polymerization exotherm. This polynorbornene material was dissolved in boiling o-dichlorobenzene and precipitated into methanol. Yield 1.2 g (60%).

EXAMPLE 251

Polymerization of norbornene employing ($\eta^3$-methallyl) nickel chloride and Zn(2,4,6-tris(trifluoromethyl)phenyl)$_2$. To a solution of norbornene (5 g) dissolved in toluene (25 ml) was added [($\eta^3$-CH$_3$C(CH)$_2$)NiCl]$_2$(0.0137 g). The orange red solution was stirred for 16 hours. To this solution was added a quantity of solid (2,4,6-tris(trifluoromethyl) phenyl) (0.0166 g). Upon addition of the (2,4,6-tris (trifluoromethyl)phenyl) there was an instant reaction and the solution turned black and the reaction warmed as the polymerization proceeded. Within 2 minutes norbornene was completely polymerized and the polymer solution gelled. This polynorbornene material could not be dissolved in boiling o-dichlorobenzene.

EXAMPLE 252

Polymerization of norbornene employing ($\eta^3$-methallyl) nickel chloride and Zn(2,4,6-tris(trifluoromethyl)phenyl)$_2$. To a solution of norbornene (1.24 g) dissolved in toluene (15 ml) was added [($\eta^3$-CH$_3$C(CH)$_2$)NiCl]$_2$ (0.0137 g). The orange red solution was stirred for 2 hours. To this solution was added solid2,4,6-tris(trifluoromethyl)phenyl)$_2$(0.0166 g) and the solution stirred for 2 hours at room temperature. This polynorbornene material generated was precipitated in methanol. Yield 1.20 (83%).

EXAMPLE 253

Norbornene polymerization employing [(CH$_3$)(C$_{12}$H$_{25}$)$_3$N]$_2$[NiCl$_4$] and Zn(C$_6$F$_5$)$_2$(dme). Norbornene (2.5 g) and

[(CH$_3$)(C$_{12}$H$_{25}$)$_3$N]$_2$[NiCl$_4$](0.074 g) were dissolved in 1,2-dichloromethane (40 ml). Upon injection of a Zn(C$_6$F$_5$)$_2$(dme) solution (0.024 g in 1,2-dichloroethane (2 ml)) a white polymer was generated immediately. The polymer was immediately recovered by precipitation into methanol. Yield 1.44 g (58%).

for the allotted time (see table for time) at room temperature (unless otherwise noted in table below). The resulting mixture was then poured into an excess of ethanol to precipitate the polymer. The polymer was filtered and dried in the vacuum oven overnight. The conversions were then determined gravimetrically.

| Example | Catalyst | NB:Ni | B(C$_6$F$_5$)$_3$:Ni | Conv. (%) | Time (h) | Tg (° C.) | Mw (× 10$^3$) | Mn (× 10$^3$) | Comments |
|---|---|---|---|---|---|---|---|---|---|
| 256 | Q | 500:1 | | 0 | 48 | | | | Control experiment |
| 257 | Q | 500:1 | | 0 | 48 | | | | Control experiment, at 70° C. |
| 258 | Q | 500:1 | | 0 | 48 | | | | added equimolar amount of Ni(COD)$_2$ |
| 259 | Q | 500:1 | 1:1 | 50 | 24 | — | 987 | 450 | |
| 260 | Q | 500:1 | 1:1 | 12 | 48 | — | — | | |
| 261 | — | — | — | 0 | 48 | | | | Control experiment, no nickel added; 500:1 monomer:B(C$_6$F$_5$)$_3$ |
| 262 | Q | 500:1 | 1:1 | 4 | 1 | — | — | — | |
| 263 | Q | 500:1 | 1:1 | 4 | 1 | — | — | — | |
| 264 | Q | 500:1 | 1:1 | 4 | 1 | — | — | — | |
| 265 | Q | 500:1 | 1:1 | 1 | 1 | — | — | — | in dichloroethane |
| 266 | Q | 500:1 | 1:1 | 33 | 1 | — | 181 | 124 | at 70° C. |
| 267 | Q | 500:1 | 10:1 | 89 | 1 | 349 | 805 | 384 | |
| 268 | Q | 500:1 | 10:1 | 90 | 1 | 351 | 675 | 300 | |
| 269 | R | 500:1 | 1:1 | 0 | 1 | — | — | — | |
| 270 | R | 500:1 | 10:1 | 61 | 1 | — | 693 | 312 | |
| 271 | Q | 500:1 | 10:1 | 100 | 1 | — | — | — | |
| 272 | Q | 500:1 | 10:1 | 98 | 1 | — | — | — | 0.01 equiv of H$_2$O in toluene added to B(C$_6$F$_5$)$_3$ |
| 273 | Q | 5000:1 | 100:1 | 94 | 1 | — | 338 | 79.6 | |
| 274 | Q | 5000:1 | 10:1 | 96 | 1 | — | 542 | 242 | |
| 275 | Q | — | — | — | 1 | — | — | — | Control reaction, no Ni. NB:B(C$_6$F$_5$)$_3$ – 50:1 |
| 276 | Q | 500:1 | 10:1 | 98 | 1 | — | 473 | 193 | 1 mol % of 1-hexane added to reaction |
| 277 | Q | 500:1 | 10:1 | 97 | 1 | — | 351 | 177 | 3 mol % of 1-hexane added to reaction |

EXAMPLE 254

Norbornene polymerization employing [(CH$_3$)(C$_{12}$H$_{25}$)$_3$N]$_2$[NiCl$_4$] and Zn(C$_6$F$_5$)$_2$(dme). Norbornene (3.0 g) and ((CH$_3$)(C$_{12}$H$_{25}$)$_3$N)$_2$[NiCl$_4$] (0.009 g) were dissolved in 1,2-dichloromethane (40 ml). After injection of a Zn(C$_6$F$_5$)$_2$(dme) solution (0.003 g in 1,2-dichloroethane (2 ml)) the solution was stirred at room temperature for 2 hours. The polymer was recovered by precipitation into methanol. Yield 1.61 g (54%).

EXAMPLE 255

Norbornene Polymerization Using Cd(CF$_3$)$_2$(dme). To a solution of norbornene (2 g in 10 ml of toluene) was added [(η$^3$-CH$_3$C(CH)$_2$)NiCl]$_2$ (0.055 g). After stirring the dark red solution for 20 minutes Cd(CF$_3$)$_2$(dme) (0.036 g) was added. The reaction medium turned cloudy after 10 minutes and a solid precipitated was observed. The reaction mixture was reacted for 24 hours and then poured into ethanol to yield a white polymer. Yield=0.28 g (14%).

EXAMPLE 256–277

Norbornene (2.5 g, 26.5 mmol) was added to a vial in the glove box equipped with a stir bar. The vial was sealed with a Teflon® lined rubber septum cap. The norbornene was dissolved in the solvent of choice (see table below) to a total volume of 30 ml. To this vial was added a toluene (minimum amount) solution of the appropriate amount of the nickel compound (see table below). Then the appropriate amount of tris(perfluorophenyl)boron (as a 3.15 wt. % solution in mineral spirits) was added. The mixture was allowed to stir

EXAMPLES 278–284

Norbornene (2.5 g, 26.5 mmol) was added to a vial in the glove box equipped with a stir bar. The vial was sealed with a Teflon® lined rubber septum cap. The norbornene was dissolved in the solvent of choice to a total volume of 30 ml. To this vial was added a toluene (minumum amount) solution of an appropriate amount of the nickel catalyst (see table below). Then the appropriate amount of tris(perfluorophenyl)boron (as a 3.15 wt % solution in mineral spirits) was added. The mixture was allowed to stir for 1 hour at room temperature. The resulting mixture was then poured into an excess of methanol to precipitate the polymer. The polymer was filtered and dried in the vacuum oven overnight. The conversions were then determined gravimetrically.

| Example | Catalyst (mM) | Cocatalyst (mM) | Conv (%) | Mw (× 10$^{-3}$) | Mn (× 10$^{-3}$) | Comments |
|---|---|---|---|---|---|---|
| 278 | S (0.17 mM) | B(C$_6$F$_5$)$_3$ (1.7 mM) | 70 | 1900 | 571 | |
| 279 | S (0.17 mm) | B(C$_6$F$_5$)$_3$.3H$_2$O (0.34 mM) | 74 | 1698 | 615 | Catalyst components premixed. |
| 280 | T (0.17 mM) | B(C$_6$F$_5$)$_3$.3H$_2$O (0.34 mM) | 48 | — | — | Catalyst components premixed. |
| 281 | U (0.17 mM) | B(C$_6$F$_5$)$_3$ (1.7 mM) | 17 | 2239 | 545 | |

-continued

| Example | Catalyst (mM) | Cocatalyst (mM) | Conv (%) | Mw (× 10⁻³) | Mn (× 10⁻³) | Comments |
|---|---|---|---|---|---|---|
| 282 | Q (0.17 mM) | $B(C_6F_5)_3 \cdot 3H_2O$ (0.34 mM) | 86 | 1406 | 601 | Catalyst components premixed. |
| 283 | Q (0.17 mM) | $B(C_6F_5)_3$ (1.7 mM) | 96 | 542 | 242 | |
| 284 | Q (0.17 mM) | $B(C_6F_5)_3 \cdot 3H_2O$ (0.34 mM) | 8 | 356 | 151 | Catalyst components premixed. |

EXAMPLES 286–290

Norbornene (25 ml of a 1.0M solution in chlorobenzene) was added vial equipped with a stirbar and a Teflon®-lined rubber septum cap. To this vial was added 1 mL of a 0.0066M solution of (bpy)Ni(NBD)$_2$ in chlorobenzene. Then the appropriate amount of $B(C_6F_5)_3$ (1.35 ml of a 0.043 M solution in naphtha) was added. The mixture was allowed to stir for the allotted time (see table below for time) at room temperature. The resulting mixture was then poured into an excess of methanol to precipitate the polymer. The polymer was filtered and dried in the vacuum oven overnight. The conversions were then determined gravimetrically.

| Examples | $B(C_6F_5)_3$:Ni | Norbornene Ni | Time (h) | Conv. (%) | Mw (× 10³) | Mn (× 10³) |
|---|---|---|---|---|---|---|
| 286 | 9:1 | 4000:1 | 1 | 0 | — | — |
| 287 | 9:1 | 4000.1 | 2 | 2.3 | 296 | 155 |
| 288 | 9:1 | 4000:1 | 4 | 7 | 823 | 492 |
| 289 | 9:1 | 4000:1 | 8 | 13.2 | 449 | 168 |
| 290 | 9.1 | 4000:1 | 24 | 46 | 685 | 353 |

EXAMPLES 291–298

Norbornene (10 ml of a 1.1M solution in chlorobenzene) was added vial equipped with a stirbar and a Teflon®-lined rubber septum cap. To this vial was added 1 ml of a 0.0055M solution of (bpy)Ni(NBD)$_2$ in chlorobenzene. Then the appropriate amount of $B(C_6F_5)_3$ (1.1 ml of a 0.043M solution in naphtha, 0.000047 mol) was added. The mixture was allowed to stir for the allotted time (see table below for time) at room temperature (unless otherwise noted in table below). The resulting mixture was then poured into an excess of methanol to precipitate the polymer. The polymer was filtered and dried in the vacuum oven overnight. The conversions were then determined gravimetrically.

| Examples | $B(C_6F_5)_3$:Ni | NB:Ni | Time (h) | Conv (%) |
|---|---|---|---|---|
| 291 | 9:1 | 2000:1 | 0.25 | 22 |
| 292 | 9:1 | 2000:1 | 0.25 | 18 |
| 293 | 9:1 | 2000:1 | 0.5 | 26 |
| 294 | 9:1 | 2000:1 | 0.5 | 30 |
| 295 | 9:1 | 2000:1 | 1 | 36 |
| 296 | 9:1 | 2000:1 | 1 | 36 |
| 297 | 9:1 | 2001:1 | 2 | 37 |
| 298 | 9:1 | 2001:1 | 2 | 52 |

EXAMPLES 299–318

Norbornene (5.0 g, 53 mmol) was added to a vial in the glove box equipped with a stir bar. The vial was sealed with a Teflon®-lined rubber septum cap. The norbornene was dissolved in the solvent of choice (see table below) to a total volume of 60 ml. To this vial was added a (minumum amount of the solvent of choice) solution of an appropriate amount of the nickel catalyst (see table below). Then the appropriate amount of FAB (as a 3.15 wt % solution in mineral spirits) or the Lewis acid listed in table below was added. The mixture was allowed to stir for 1 hour at room temperature. The resulting mixture was then poured into an excess of methanol to precipitate the polymer. The polymer was filtered and dried in the vacuum oven overnight. The conversions were then determined gravimetrically.

| Example | Catalyst | Cocatalyst | Sol | Temp (° C.) | Time (h) | Conv (%) | Comments |
|---|---|---|---|---|---|---|---|
| 299 | Ni(DPM)$_2$ 0.22 mM | $B(C_6F_5)_3$ 1.95 mM | DCE | RT | 1 | 97 | 2.16 mM triethylaluminum |
| 300 | Ni(DPM)$_2$ 0.22 mM | $B(C_6F_5)_3$ 1.95 mM | DCE | amb | 1 | 95 | |
| 301 | Ni ethylhexanoate 0.22 mM | $B(C_6F_5)_3$ 1.95 mM | DCE | amb | 1.5 | 97 | |
| 302 | Ni ethylhexanoate 0.22 mM | $B(C_6F_5)_3$ 1.95 mM | DCE | amb | 1.5 | 99 | |
| 303 | Ni(DPM)$_2$ 0.22 mM | $B(C_6F_5)_3$ 0.22 mM | DCE | amb | 1 | 23 | |
| 304 | Ni(DPM)$_2$ 0.22 mM | $B(C_6F_5)_3$ 0.22 mM | CHA | amb | 1 | 73 | |
| 305 | Ni(DPM)$_2$ 0.22 mM | $B(C_6F_5)_3$ 0.22 mM | DCE | amb | 1 | 34 | |
| 306 | Ni(DPM)$_2$ 0.22 mM | $B(C_6F_5)_3$ 0.22 mM | DCE | amb | 1 | 42 | 2 equiv. H$_2$O added to Ni |
| 307 | Pd(DPM)$_2$ 0.22 mM | $B(C_6F_5)_3$ 1.95 mM | DCE | amb | 1 | 95 | |

-continued

| Example | Catalyst | Cocatalyst | Sol | Temp (° C.) | Time (h) | Conv (%) | Comments |
|---------|----------|------------|-----|-------------|----------|----------|----------|
| 308 | Ni(acac)$_3$ 0.22 mM | B(C$_6$F$_5$)$_3$ 1.95 mM | DCE | amb | 1 | 98 | |
| 309 | Ni(tfacac)$_2$.2H$_2$O 0.22 mM | B(C$_6$F$_5$)$_3$ 1.95 mM | DCE | amb | 1 | 99 | |
| 310 | Ni(DPM)$_2$ 0.22 mM | B(C$_6$F$_5$)$_3$.3H$_2$O 1.25 mM | DCE | amb | 1 | 86 | |
| 311 | Ni(DPM)$_2$.2H$_2$O 0.22 mM | B(C$_6$F$_5$)$_3$ 0.22 mM | DCE | amb | 1 | 67 | |
| 312 | Ni(DPM)$_2$ 0.22 mM | B(C$_6$F$_5$)$_3$ 0.22 mM | DCE | amb | 1 | 48 | |
| 313 | Ni(DPM)$_2$ 0.22 mM | B(C$_6$F$_5$)$_3$ 0.22 mM | DCE | amb | 1 | 54 | |
| 314 | Ni(DPM)$_2$ 0.22 mM | B(C$_6$F$_5$)$_3$ 0.22 mM | DCE | amb | 1 | 46 | |
| 315 | Ni(DPM)$_2$ 0.22 mM | dimethylanilinium tetrakisperfluorophenylborate | DCE | amb | 1 | 6 | |
| 316 | Ni(acac)Et(Pph$_3$) 0.22 mM | B(C$_6$F$_5$)$_3$ 1.95 mM | DCE | amb | 1 | 100 | |
| 317 | Nik(DPM)$_2$ 0.22 mM | B(C$_6$F$_5$)$_3$.3H$_2$O 0.22 mM | DCE | amb | 1 | 91 | |
| 318 | Ni(DPM)$_2$ 0.22 mM | B(C$_6$F$_5$)$_3$.3H$_2$O 0.22 mM | DCE | amb | 1 | 87 | |

EXAMPLE 319

This reaction was carried out in a 10 ml stainless steel, high pressure, cylindrical reactor with sapphire windows at each end. The reactor was placed in a horizontal position and stirred using a magnetic stirbar. The norbornene (1.8 g, 19 mmol) and nickel (II) 2,2,6,6-tetramethyl-3,5-heptanedionate (2 mg, 4.7 μmol) were added to the open end of the argon purged reactor after which the window was immediately replaced and tightened to seal the reactor. Carbon dioxide was charged to 1000 psig dissolving the norbornene and forming a homogeneous liquid layer in the vessel. To this solution was added a solution of tris (perfluorophenyl)boron (22 μmol) in octanes (0.5 ml) using additional carbon dioxide pressure to afford a supercritical condition in the reactor. There ensued an exothermic reaction (temperature increased from 20° C. to 31° C. within 2 minutes) and the pressure stabilized at 1800 psig. The reactor was vented after 30 minutes and the white polymer was dissolved in toluene and then poured into excess acetone to afford the product which was isolated by filtration, washed with excess acetone and dried overnight in a vacuum oven at 80° C. The isolated yield of the poly (norbornene) was 0.73 grams, representing 41% conversion.

EXAMPLE 320

NB-type monomer polymerization using (toluene)Ni (SiCl$_3$)$_2$ and B(C$_6$F$_5$)$_3$. To a 100 ml glass vial fitted with an airtight crimptop cap and a Teflon® stir bar was added at ambient temperature norbornene (4.0 g, 42.4 mmol), triethoxy silylnorbornene (2.8 ml, 10.6 mmol) and toluene (35 ml). Thereafter was added (toluene)Ni(SiCl$_3$)$_2$ (13 μmol) dissolved in toluene (3 ml) and tris(pentafluorophenyl)boron (13 μmol). After 24 hours reaction time at ambient temperature the viscous solution was diluted with toluene (50 ml) and poured into an excess of methanol. The preciptated copolymer was filtered, dried in a vacuum oven at ambient temperature for 24 hours (constant weight) and weighed. The yield of copolymer was 1.4 g. GPC analysis showed the copolymer to have a very high molecular weight (Mw 1,437,000, Mn 195,000).

EXAMPLE 321

To a 100 ml glass vial fitted with an airtight crimptop cap and a Teflon® stir bar was added at ambient temperature norbornene (5.0 g, 53.1 mmol) dissolved in cyclohexane (35 ml) followed by nickel ethylhexanoate (13 μmol). To this stirred solution, at ambient temperature, was added a mixture of tris(perfluorophenyl)boron (117 μmol, in 2 ml octanes) and dimethyldiethoxysilane (0.041 ml, 234 μmol) which had been allowed to stand at ambient temperature for 5 minutes, finally followed by triethylaluminum (130 μmol, 0.13 ml of a 1.0 Molar solution in cyclohexane). There was an immediate exotherm and viscosity increase. Within 5 minutes the whole solution had set up to afford a nonflowing colorless gel. After 60 minutes the vial was opened and the contents were dissolved in an excess of toluene (300 ml) and then poured into excess methanol to afford the product as a pure white polymer which was isolated by filtration, washed with excess methanol and dried overnight in a vacuum oven at 80° C. The isolated yield of the poly(norbornene) was 5 grams, representing quantitative conversion. GPC showed the polymer to have a high molecular weight (M$_w$ 790,000, M$_n$ 236,000).

EXAMPLE 322

To a 100 ml glass vial fitted with an airtight crimptop cap and a Teflon® stirbar was added at ambient temperature norbornene (5.0 g, 53.1 mmol) dissolved in cyclohexane (35 ml) followed by nickel ethylhexanoate (13 μmol), tridecafluoro-1,1,2,2-tetrahydrooctyltriethoxysilane (0.20 ml, 0.53 mmol), tris(perfluorophenyl)boron (117 μmol, in 2 ml octanes), followed by triethylaluminum (130 μmol, 0.13 ml of a 1.0 Molar solution in cyclohexane).

There was an immediate exotherm and viscosity increase. Within 30 seconds the whole solution had set up to afford a nonflowing colorless gel. After 60 minutes the vial was opened and the contents were dissolved in an excess of toluene (200 ml) and then poured into excess acetone to afford the product as a pure white polymer which was isolated by filtration, washed with excess acetone and dried overnight in a vacuum oven at 80° C. The isolated yield of the poly(norbornene) was 5 grams, representing quantitative conversion.

EXAMPLE 323

To a 100 ml glass vial fitted with an airtight crimptop cap and a Teflon® stirbar was added at ambient temperature norbornene (5.4 g, 57.3 mmol) dissolved in cyclohexane (35 ml) followed by nickel ethylhexanoate (13 µmol), dimethyldiethoxysilane (0.09 ml, 0.53 mmol), tris(perfluorophenyl)boron (117 µmol, in 2 ml octanes), followed by triethylaluminum (130 µmol, 0.077 ml of a 1.7 Molar solution in cyclohexane). There was an immediate exotherm and viscosity increase. Within 30 seconds the whole solution had set up to afford a nonflowing colorless gel. After 60 minutes the vial was opened and the contents were dissolved in an excess of toluene (200 ml) and then poured into excess acetone to afford the product as a pure white polymer which was isolated by filtration, washed with excess acetone and dried overnight in a vacuum oven at 80° C. The isolated yield of the poly(norbornene) was 5.4 g representing quantitative conversion.

EXAMPLE 324

To a 100 ml glass vial fitted with an airtight crimptop cap and a Teflon® stir bar was added at ambient temperature norbornene (5.0 g, 53.1 mmol) dissolved in cyclohexane (35 ml) followed by nickel ethylhexanoate (13 µmol), tetraethoxysilane (0.0275 ml, 0.132 mmol), tris(perfluorophenyl)boron (117 µmol, in 2 ml octanes), followed by triethylaluminum (130 µmol, 0.077 ml of a 1.7 Molar solution in cyclohexane). There was an immediate exotherm and viscosity increase. Within 30 seconds the whole solution had set up to afford a nonflowing colorless gel. After 60 minutes the vial was opened and the contents were dissolved in an excess of toluene (200 ml) and then poured into excess acetone to afford the product as a pure white polymer which was isolated by filtration, washed with excess acetone and dried overnight in a vacuum oven at 80° C. The isolated yield of the poly(norbornene) was 4.8 grams, representing 96% isolated conversion.

EXAMPLE 325

The procedure used in Example 324 was duplicated except the amount of tetraethoxysilane was reduced to 0.0137 ml (0.066 mmol). Within 30 seconds the whole solution had set up to afford a nonflowing colorless gel. After 60 minutes the vial was opened and the contents were dissolved in an excess of toluene (200 ml) and then poured into excess acetone to afford the product as a pure white polymer which was isolated by filtration, washed with excess acetone and dried overnight in a vacuum oven at 80° C. The isolated yield of the poly(norbornene) was 5.0 grams, representing quantitative conversion.

EXAMPLE 326

To a 100 ml glass vial fitted with an airtight crimptop cap and a Teflon® stir bar was added at ambient temperature decylnorbornene (14.5 ml, 53.1 mmol) dissolved in cyclohexane (40 ml) followed by nickel ethylhexanoate (13 µmol), tetraethoxysilane (0.11 ml, 0.53 mmol), tris(perfluorophenyl)boron (117 µmol, in 2 ml octanes), followed by triethylaluminum (130 µmol, 0.077 ml of a 1.7 Molar solution in cyclohexane). There was an exotherm and gradual viscosity increase. After 120 minutes the vial was opened and the contents were dissolved in an excess of toluene (100 ml) and then poured into excess acetone to afford the product as a pure white polymer which was isolated by filtration, washed with excess acetone and dried overnight in a vacuum oven at 80° C. The isolated yield of the poly(decylnorbornene) was 7.4 grams, representing 59% isolated conversion.

EXAMPLE 327

To a 100 ml glass vial fitted with an airtight crimptop cap and a Teflon® stirbar was added at ambient temperature norbornene (5.0 g, 53.1 mmol) dissolved in cyclohexane (35 ml) followed by tetraethoxysilane (0.11 ml, 0.53 mmol), nickel ethylhexanoate (13 µmol), boron trifluoride etherate (104 µmol), tris(perfluorophenyl)boron (13 µmol, in 0.3 ml octanes), followed by triethylaluminum (130 µmol, 0.077 ml of a 1.7 Molar solution in cyclohexane). The solution became noticeably viscous within 3 minutes and stopped stirring after 10 minutes. After 60 minutes the vial was opened and the contents were dissolved in an excess of toluene (100 ml) and then poured into excess acetone to afford the product as a pure white polymer which was isolated by filtration, washed with excess acetone and dried overnight in a vacuum oven at 80° C. The isolated yield of the poly(norbornene) was 2.1 grams, representing 42% isolated conversion.

EXAMPLE 328

To a 100 ml glass vial fitted with an airtight crimptop cap and a Teflon® stirbar was added at ambient temperature norbornene (5.0 g, 53.1 mmol) dissolved in 1,2-dichloroethane (35 ml) followed by tetraethoxysilane (0.11 ml, 0.53 mmol), $\eta^3$-crotylnickelbromide (26 µmol) dissolved in 1,2-dichloroethane (1.5 ml) and tris(perfluorophenyl)boron (117 µmol, in 2.3 ml octanes. The solution immediately developed a large exotherm and formed a solid mass of white polymer. After 60 minutes the vial was opened and the contents were dissolved in an excess of toluene (100 ml) and then poured into excess acetone to afford the product as a pure white polymer which was isolated by filtration, washed with excess acetone and dried overnight in a vacuum oven at 80° C. The isolated yield of the poly(norbornene) was 4.3 grams, representing 86% isolated conversion.

EXAMPLE 329

To a 100 ml glass vial fitted with an airtight crimptop cap and a Teflon® stirbar was added at ambient temperature norbornene (5.0 g, 53.1 mmol) dissolved in 1,2-dichloroethane (35 ml) followed by tetraethoxysilane (0.11 ml, 0.53 mmol), nickel ethylhexanoate (13 µmol), tris(perfluorophenyl)boron (117 µmol, in 2.3 ml octanes), followed by triethylaluminum (130 µmol, 0.077 ml of a 1.7 Molar solution in cyclohexane). There was an immediate exotherm and precipitation of polymer within a second. After 60 minutes the vial was opened and the contents were poured into excess acetone to afford the product as a pure white polymer which was isolated by filtration, washed with excess acetone, and dried overnight in a vacuum oven at 80° C. The isolated yield of the poly(norbornene) was 5 g representing quantitative conversion.

EXAMPLE 330

The procedure used in Example 329 was followed except that a higher level of tetraethoxysilane was employed (2.25 ml, 10.8 mmol). The reaction was slower than Example 329 with polymer precipitating from solution after 10 minutes and the reactor contents becoming a solid mass after 15 minutes. After 60 minutes the vial was opened and the contents were poured into excess acetone to afford the product as a pure white polymer which was isolated by filtration, washed with excess acetone and dried overnight in a vacuum oven at 80° C. The isolated yield of the poly(norbornene) was 4.6 g representing 92% conversion.

EXAMPLE 331

To a 100 ml glass vial fitted with an airtight crimptop cap and a Teflon® stir bar was added at ambient temperature norbornene (5.0 g, 53.1 mmol) dissolved in cyclohexane (35 ml) followed by nickel ethylhexanoate (13 μmol), tetraethoxygermane (0.1 ml, 0.53 mmol), tris(perfluorophenyl)boron (117 μmol, in 2 ml octanes), followed by triethylaluminum (130 μmol, 0.077 ml of a 1.7 Molar solution in cyclohexane). After 60 minutes the vial was opened and then poured into excess acetone to afford the product as a pure white polymer which was isolated by filtration, washed with excess acetone and dried overnight in a vacuum oven at 80° C. The isolated yield of the poly(norbornene) was 0.25 grams, representing 5% conversion.

EXAMPLE 332

To a 100 ml glass vial fitted with an airtight crimptop cap and a Teflon® stir bar was added at ambient temperature norbornene (5.0 g, 53.1 mmol) dissolved in cyclohexane (35 ml) followed by nickel ethylhexanoate (13 μmol), bis(dimethylamino)dimethylsilane (0.53 mmol), tris(perfluorophenyl)boron (117 μmol, in 2 ml octanes), followed by triethylaluminum (130 μmol, 0.13 ml of a 1.0 Molar solution in cyclohexane). After 60 minutes the vial was opened and then poured into excess acetone to afford the product as a pure white polymer which was isolated by filtration, washed with excess acetone and dried overnight in a vacuum oven at 80° C. The isolated yield of the poly(norbornene) was 0.1 grams, representing 2% conversion.

EXAMPLE 333

The procedure used in Example 322 was duplicated except that trimethylorthoformate was used (0.058 ml, 0.53 mmol,1 mol % on monomer) in place of tridecafluoro-1,1,2,2-tetrahydrooctyltriethoxysilane. Within 5 minutes the whole solution had set up to afford a nonflowing colorless gel. After 60 minutes the vial was opened and the contents were dissolved in an excess of toluene (200 ml) and then poured into excess acetone to afford the product as a pure white polymer which was isolated by filtration, washed with excess acetone and dried overnight in a vacuum oven at 80° C. The isolated yield of the poly(norbornene) was 5.0 grams, representing quantitative conversion.

EXAMPLE 334

To a 100 ml glass vial fitted with an airtight crimptop cap and a Teflon® stir bar was added at ambient temperature norbornene (5.0 g, 53.1 mmol) dissolved in 1,2-dichloroethane (35 ml) followed by trimethylorthoformate (1.16 ml, 10.6 mmol), nickel ethylhexanoate (13 μmol), tris(perfluorophenyl)boron (117 μmol, in 2 ml octanes) and triethylaluminum (130 μmol, 0.077 ml of a 1.7 Molar solution in cyclohexane). There was an immediate exotherm and polymer precipitated as a white mass. Within 30 seconds the vial was filled with a solid white mass. After 60 minutes the vial was opened and the contents were poured into excess acetone to afford the product as a pure white polymer which was isolated by filtration, washed with excess acetone and dried overnight in a vacuum oven at 80° C. The isolated yield of the poly(norbornene) was 5.0 grams, representing quantitative conversion. GPC indicated the polymer to have a high molecular weight (Mw 625,000, Mn 191,000).

EXAMPLE 335

To a 100 ml glass vial fitted with an airtight crimptop cap and a Teflon® stir bar was added at ambient temperature norbornene (5.0 g, 53.1 mmol) dissolved in cyclohexane (35 ml) followed by triethoxyboron (0.09 ml, 0.53 mmol), nickel ethylhexanoate (13 μmol), tris(perfluorophenyl)boron (117 μmol, in 2 ml octanes) and triethylaluminum (130 μmol, 0.077 ml of a 1.7 Molar solution in cyclohexane). There was an immediate exotherm and viscosity increase. Within 2 minutes the whole solution had set up to afford a nonflowing colorless gel. After 60 minutes the vial was opened and the contents were dissolved in an excess of toluene (200 ml) and then poured into excess acetone to afford the product as a pure white polymer which was isolated by filtration, washed with excess acetone and dried overnight in a vacuum oven at 80° C. The isolated yield of the poly(norbornene) was 5.0 grams, representing quantitative conversion.

EXAMPLE 336

To a 100 ml glass vial fitted with an airtight crimptop cap and a Teflon® stir bar was added at ambient temperature norbornene (5.0 g, 53.1 mmol) dissolved in cyclohexane (35 ml) followed by dimethoxyethane (0.055 ml, 0.53 mmol), nickel ethylhexanoate (13 μmol), tris(perfluorophenyl)boron (117 μmol, in 2 ml octanes) and triethylaluminum (130 μmol, 0.077 ml of a 1.7 Molar solution in cyclohexane). There was an exotherm and gradual viscosity increase. After 60 minutes the vial was opened and the contents were dissolved in an excess of toluene (100 ml) and then poured into excess acetone to afford the product as a pure white polymer which was isolated by filtration, washed with excess acetone and dried overnight in a vacuum oven at 80° C. The isolated yield of the poly(norbornene) was 1.6 grams, representing 32% conversion.

EXAMPLE 337

To a 100 ml glass vial fitted with an airtight crimptop cap and a Teflon® stir bar was added at ambient temperature norbornene (5.0 g, 53.1 mmol) dissolved in cyclohexane (35 ml) followed by nickel ethylhexanoate (13 μmol), tris(perfluorophenyl)boron (117 μmol, in 2 ml octanes) and di-n-butylmagnesium (130 μmol, 0.13 ml of a 1.0 Molar solution in heptane). There was an immediate exotherm and viscosity increase. Within 3 minutes the whole solution had set up to afford a nonflowing colorless gel. After 60 minutes the vial was opened and the contents were dissolved in an excess of toluene (200 ml) and then poured into excess acetone to afford the product as a pure white polymer which was isolated by filtration, washed with excess acetone and dried overnight in a vacuum oven at 80° C. The isolated yield of the poly(norbornene) was 4.1 grams, representing 82% isolated conversion.

EXAMPLE 338

To a 5 ml serum bottle fitted with an airtight crimptop cap at ambient temperature was added tetraethoxysilane (0.11 ml, 0.53 mmol), nickel ethylhexanoate (13 μmol), tris(perfluorophenyl)boron (117 μmol, in 2 ml octanes) and triethylaluminum (130 μmol, 0.077 ml of a 1.7 Molar solution in cyclohexane). The resulting mixture comprised a viscous brown oil dispersed in colorless solvent. The mixture was shaken vigorously for 30 seconds and then injected into a 100 ml glass vial fitted with an airtight crimptop cap and a Teflon® stir bar containing norbornene (5.0 g, 53.1 mmol) dissolved in toluene (35 ml). There were immediate signs of catalyst encapsulation due to the catalysts high activity. However after 10 minutes the contents became viscous and nonflowing indicating high conversion to polymer. After 60 minutes the vial was opened and a sample of the contents were dissolved in toluene and then poured into excess acetone to afford the product as a pure white polymer which was isolated by filtration, washed with excess acetone and dried overnight in a vacuum oven at 80° C.

There remained a very small amount of the brown oil in the serum bottle. This oil was dissolved in chlorobenzene (2 ml) and allowed to stand at ambient temperature for 10 minutes. This solution was then added to a 50 ml glass vial fitted with an airtight crimptop cap and a Teflon® stir bar containing norbornene (2.5 g, 26.5 mmol) dissolved in chlorobenzene (35 ml). There were immediate signs of catalyst encapsulation due to the catalysts very high activity. The reaction was obviously extremely fast and exothermic. After 60 minutes the vial was opened and a sample of the contents were dissolved in toluene and then poured into excess acetone to afford the product as a pure white polymer which was isolated by filtration, washed with excess acetone and dried overnight in a vacuum oven at 80° C. The small quantity of catalyst used and the rapidity of the reaction emphasizes the high activity of this premixed catalyst system.

EXAMPLE 339

To a 100 ml glass vial fitted with an airtight crimptop cap and a Teflon® stir bar was added at ambient temperature norbornene (5.0 g, 53.1 mmol) dissolved in cyclohexane (35 ml) followed by nickel ethylhexanoate (13 μmol), anhydrous n-propanol (0.04 ml, 0.53 mmol), tris(perfluorophenyl) boron (117 μmol, in 2 ml octanes) and triethylaluminum (130 μmol, 0.077 ml of a 1.7 Molar solution in cyclohexane). There was an immediate exotherm and viscosity increase. After 60 minutes the vial was opened and the contents were dissolved in an excess of toluene (200 ml) and then poured into excess acetone to afford the product as a pure white polymer which was isolated by filtration, washed with excess acetone and dried overnight in a vacuum oven at 80° C. The isolated yield of the poly(norbornene) was 4.95 grams, representing 99% conversion.

EXAMPLE 340

To a 100 ml glass vial fitted with an airtight crimptop cap and a Teflon® stirbar was added at ambient temperature norbornene (5.0 g, 53.1 mmol) dissolved in cyclohexane (35 ml) followed by diethylether (0.055 ml, 0.53 mmol), nickel ethylhexanoate (13 μmol), tris(perfluorophenyl)boron (117 μmol, in 2 ml octanes) and triethylaluminum (130 μmol, 0.077 ml of a 1.7 Molar solution in cyclohexane). There was an immediate exotherm and viscosity increase. After 60 minutes the vial was opened and the contents were dissolved in an excess of toluene (200 ml) and then poured into excess acetone to afford the product as a pure white polymer which was isolated by filtration, washed with excess acetone and dried overnight in a vacuum oven at 80° C. The isolated yield of the poly(norbornene) was 3.9 grams, representing 78% conversion.

EXAMPLE 341

The same procedure was used as in Example 340 except that a higher level of diethylether was applied (0.55 ml, 5.3 mmol). There was an immediate exotherm and viscosity increase. After 60 minutes the vial was opened and the contents were dissolved in an excess of toluene (200 ml) and then poured into excess acetone to afford the product as a pure white polymer which was isolated by filtration, washed with excess acetone and dried overnight in a vacuum oven at 80° C. The isolated yield of the poly(norbornene) was 4.1 grams, representing 82% conversion.

EXAMPLE 342

To a 100 ml glass vial fitted with an airtight crimptop cap and a Teflon® stir bar was added at ambient temperature norbornene (5.0 g, 53.1 mmol) dissolved in cyclohexane (35 ml) followed by trimethylethoxysilane (0.083 ml, 0.53 mmol), nickel ethylhexanoate (13 μmol), tris (perfluorophenyl)boron (117 μmol, in 2 ml octanes) and triethylaluminum (130 μmol, 0.077 ml of a 1.7 Molar solution in cyclohexane). There was an immediate exotherm and viscosity increase. After 60 minutes the vial was opened and the contents were dissolved in an excess of toluene (200 ml) and then poured into excess acetone to afford the product as a pure white polymer which was isolated by filtration, washed with excess acetone and dried overnight in a vacuum oven at 80° C. The isolated yield of the poly(norbornene) was 5.0 grams, representing quantitative conversion. A very high molecular weight (Mw 1,006,000 Mn 160,000) polymer was obtained.

EXAMPLE 343

To a 100 ml glass vial fitted with an airtight crimptop cap and a Teflon® stirbar was added at ambient temperature norbornene (5.0 g, 53.1 mmol) dissolved in cyclohexane (35 ml) followed by β-pinene (1.0 ml, 6.3 mmol), tetraethoxysilane (011 ml, 0.53 mmol), nickel ethylhexanoate (13 μmol), tris(perfluorophenyl)boron (117 μmol, in 2 ml octanes) and triethylaluminum (130 μmol, 0.077 ml of a 1.7 Molar solution in cyclohexane). After 48 hours the vial was opened and the contents were dissolved in an excess of toluene (100 ml) and then poured into excess acetone to afford the product as a pure white polymer which was isolated by filtration, washed with excess acetone and dried overnight in a vacuum oven at 80° C. The isolated yield of the poly(norbornene) was 1.3 grams, representing 26% conversion. The polymer had a greatly reduced molecular weight ($M_w$ 65,300 $M_n$ 26,000).

EXAMPLE 344

The above experiment was repeated except chlorobenzene was used in place of cyclohexane. After 6 hours the vial was opened and the contents were dissolved in an excess of toluene (200 ml) and then poured into excess acetone to afford the product as a pure white polymer which was isolated by filtration, washed with excess acetone and dried overnight in a vacuum oven at 80° C. The isolated yield of the poly(norbornene) was 4.4 grams, representing 88% conversion. A greatly reduced molecular weight ($M_w$ 81,000 $M_n$ 33,900) polymer was obtained.

EXAMPLE 345

To a 100 ml glass vial fitted with an airtight crimptop cap and a Teflon® stir bar was added at ambient temperature norbornene (5.0 g, 53.1 mmol) dissolved in cyclohexane (35 ml) followed by 4-methylcyclohexene (1.0 ml), tetraethoxysilane (0.11 ml, 0.53 mmol), nickel ethylhexanoate (13 μmol), tris(perfluorophenyl)boron (117 μmol, in 2 ml octanes) and triethylaluminum (130 μmol, 0.077 ml of a 1.7 Molar solution in cyclohexane). After 60 minutes the vial was opened and the contents were dissolved in an excess of toluene (100 ml) and then poured into excess acetone to afford the product as a pure white polymer which was isolated by filtration, washed with excess acetone and dried overnight in a vacuum oven at 80° C. The isolated yield of the poly(norbornene) was 4.1 grams, representing 82% conversion. A polymer having a greatly reduced molecular weight (Mw 312,000 Mn 96,000) was obtained.

EXAMPLE 346

To a 100 ml glass vial fitted with an airtight crimptop cap and a Teflon® stir bar was added at ambient temperature 7-methylnorbornene (2.15 g, 19.5 mmol) dissolved in cyclohexane (35 ml) followed by tetraethoxysilane (0.04 ml, 0.195 mmol), nickel ethylhexanoate (26 μmol), tris (perfluorophenyl)boron (234 μmol, in 2 ml octanes) and triethylaluminum (260 μmol, 0.077 ml of a 1.7 Molar solution in cyclohexane). After 90 minutes the vial was opened and the contents were dissolved in an excess of toluene (100 ml) and then poured into excess methanol to afford the product as a pure white polymer which was isolated by filtration, washed with excess methanol and dried overnight in a vacuum oven at 80° C. The isolated yield of the poly(7-methylnorbornene) was 0.47 g.

EXAMPLE 347

To a 100 ml glass vial fitted with an airtight crimptop cap and a Teflon® stir bar was added at ambient temperature norbornene (5.0 g, 53.1 mmol) dissolved in cyclohexane (35 ml) followed by nickel ethylhexanoate (13 μmol), tris (perfluorophenyl)boron (117 μmol, in 2 ml octanes) and diethylzinc (130 μmol, 0.013 ml). There was an immediate pink hue, exotherm and viscosity increase. Within 20 minutes the whole solution had set up to afford a nonflowing cement. After 60 minutes the vial was opened and the contents were dissolved in an excess of toluene (200 ml) and then poured into excess acetone to afford the product as a pure white polymer which was isolated by filtration, washed with excess acetone and dried overnight in a vacuum oven at 80° C. The isolated yield of the poly(norbornene) was 5.0 grams, representing quantitative conversion. The polymer was found to have a very high molecular weight (Mw 1,107,000, Mn 323,000).

EXAMPLE 348

To a 100 ml glass vial fitted with an airtight crimptop cap and a Teflon® stir bar was added at ambient temperature norbornene (5.0 g, 53.1 mmol) dissolved in cyclohexane (35 ml) followed by nickel ethylhexanoate (13 μmol). Thereafter was added a mixture (which had first been allowed to stand at ambient temperature for 5 minutes) of tris (perfluorophenyl)boron (117 μmol, in 2 ml octanes), triethylaluminum (97.5 μmol, 0.058 ml) and diethylzinc (32.5 μmol, 0.0032 ml). There was an immediate color change to a tan/yellow, large exotherm and viscosity increase. The solution remained freeflowing throughout the polymerization. After 60 minutes the vial was opened and the contents were dissolved in an excess of toluene (200 ml) and then poured into excess acetone to afford the product as a pure white polymer which was isolated by filtration, washed with excess acetone and dried overnight in a vacuum oven at 80° C. The isolated yield of the poly(norbornene) was 5.0 grams, representing quantitative conversion.

EXAMPLE 349

To a stainless steel autoclave with an internal volume of 300 ml was added ethyl 2-methyl-4-pentenoate (99 g, 0.7 Mole) and freshly cracked cyclopentadiene (46.4 g, 0.7 Mole). The stirred mixture was heated to 200° C. and left overnight. The reactor was then cooled and the contents removed. The resulting norbornene (NBCH$_2$CH(CH$_3$)C(O)OC$_2$H$_5$) was purified by vacuum distillation and found to have a boiling point of about 467° C at 0.02 mm Hg. The material was analyzed by GC methods and found to have a purity of 98.4 to 99.3% (different fractions). The isolated yield of high purity product was around 33 g.

Note: In this and all subsequent examples where reference is made to NBR' (where R' refers to a substituent attached to the norbornene ring (CH$_2$CH(CH$_3$)C(O)OC$_2$H$_5$ in this example)) it is to be understood that R' is attached to the carbon atom in the 5 position on the norbornene moeity and is in the form of a mixture of the endo and exo isomers thereof.

EXAMPLE 350

To a 100 ml glass vial fitted with an airtight crimptop cap and a Teflon® stir bar was added at ambient temperature the monomer from example 30 (2.0 g, 10.0 mmol) dissolved in dichloroethane (50 ml) followed by nickel ethylhexanoate (0.01 mmol). Thereafter was added tris(perfluorophenyl) boron (0.09 mmol), triethylaluminum (0. 1 mmol). The vessel was heated to 50° C. and allowed to stir for 16 hours. The solution remained freeflowing throughout the polymerization. The solution was concentrated by removing half of the solvent by vacuum methods and then added to hexane which caused the homopolymer to precipitate. The polymer was filtered, washed with hexane and dried overnight in a vacuum oven at 80° C. The isolated yield of the polymer was 1.23 grams, representing 63% conversion. The molecular weight was determined using GPC methods (M$_w$ 700,000, M$_n$ 242,000).

EXAMPLE 351

To a 100 ml glass vial fitted with an airtight crimptop cap and a Teflon® stirbar was added at ambient temperature the monomer from Example 349 (2.0 g, 10.0 mmol) dissolved in dichloroethane (5 0 ml) followed by nickel (II) bis(2,2, 6,6-tetramethyl-3,5-heptanedionate) (4.3 mg, 0.01 mmol). Thereafter was added tris(perfluorophenyl)boron (0.09 mmol). The vessel was heated to 50° C. and allowed to stir for 16 hours. The solution remained freeflowing throughout the polymerization. The solution was concentrated by removing half of the solvent by vacuum methods and then added to hexane which caused the homopolymer to precipitate. The polymer was filtered, washed with hexane and dried overnight in a vacuum oven at 80° C. The isolated yield of the polymer was 1.5 grams, representing 75% conversion. The molecular weight was determined using GPC methods (M$_w$ 500,000, M$_n$ 171,000).

EXAMPLE 352

To a stainless steel autoclave with an internal volume of 300 ml was added 5-hexene-2-one (69 g, 0.7 Mole) and freshly cracked cyclopentadiene (46.4 g, 0.7 mole). The stirred mixture was heated to 150° C. for 3 hours and then the temperature was raised to 170° C. and the reaction was left overnight. The reactor was then cooled and the contents removed. The resulting norbornene (NBCH$_2$CH$_2$C(O)CH$_3$) was purified by vacuum distillation and found to have a boiling point of about 46–49° C. at 0.2 mm Hg. The material was analyzed by GC methods and found to have a purity of 99 to 99.3% (different fractions). The isolated yield of high purity product was around 32 g.

EXAMPLE 353

To a stainless steel autoclave with an internal volume of 300 ml was added 4-penten-1-ylacetate (96.13 g, 0.75 mole) and freshly cracked cyclopentadiene (24.81 g, 0.375 mole). The stirred mixture was heated to 170° C. for 2 hours and then the temperature was raised to 190° C. and the reaction was left overnight. The reactor was then cooled and the contents removed. The resulting norbornene (NBCH$_2$CH$_2$OC(O)CH$_3$) was purified by vacuum distillation and found to have a boiling point of about 40–50° C. at 0.080.14 mm Hg. The material was analyzed by GC methods and found to have a purity of 92.5 to 93.1% (different fractions). The isolated yield of the relatively high purity product was around 22 g.

EXAMPLE 354

To a stainless steel autoclave with an internal volume of 300 ml was added ethyl undecylenate (138 g, 0.65 Mole) and freshly cracked cyclopentadiene (21.45 g, 0.325 mole). The stirred mixture was heated to 170° C. for 2 hours and then the temperature was raised to 190° C. and the reaction was left overnight. The reactor was then cooled and the contents removed. The resulting norbornene ($NB(CH_2)_8C(O)OCH_2CH_3$) was purified by vacuum distillation and found to have a boiling point of about 97° C. at 0.01 mm Hg. The material was analyzed by GC methods and found to have a purity of 92 to 97% (different fractions). The isolated yield of high purity product was around 40 g.

EXAMPLE 355

To a stainless steel autoclave with an internal volume of 300 ml was added allyl glycidyl ether (91.4 g, 0.8 Mole) and freshly cracked cyclopentadiene (52.8 g, 0.8 mole). The stirred mixture was heated to 190° C. for 2 hours and then the temperature was raised to 200° C. and the reaction was left overnight. The reactor was then cooled and the contents removed. The resulting norbornene ($NBCH_2O.CH_2CHOCH_2$) was purified by vacuum distillation and found to have a boiling point of about 50–51° C. at 0.02 mm Hg. The material was analyzed by GC methods and found to have a purity of 94 to 95% (different fractions). The isolated yield of high purity product was around 71 g.

EXAMPLE 356

To a stainless steel autoclave with an internal volume of 300 ml was added allyl butyl ether (73.1 g, 0.64 mole) and freshly cracked cyclopentadiene (42.2 g, 0.64 mole). The stirred mixture was heated to 190° C. for 6 hours and samples were taken as a function of time to follow the course of the reaction by GC methods. After 6 hours the reaction was essentially complete in that the cyclopentadiene was almost completely reacted and the ether was roughly 70% converted. The reactor was then cooled and the contents removed. The resulting norbornene ($NBCH_2O(CH_2)_3CH_3$) was purified by vacuum distillation in the usual way.

EXAMPLE 357

To a stainless steel autoclave with an internal volume of 300 ml was added allyl succinic anhydride (100 g, 0.71 mole) and dicyclopentadiene (47 g, 0.35 mole). The stirred mixture was heated to 190° C. for 2 hours and then the temperature was raised to 200° C. and the reaction was left overnight. The reactor was then cooled and the contents removed. The resulting norbornene was purified by vacuum distillation and found to have a boiling point of about 130° C. at 0.05 mm Hg. The material was analyzed by GC methods and found to have a purity of 89%. The isolated yield of relatively high purity product was around 38 g.

EXAMPLE 358

To a stainless steel autoclave with an internal volume of 300 ml was added diethyl allyl malonate (88 g, 0.44 mole) and dicyclopentadiene (0.26 Mole). The stirred mixture was heated to 190° C. for 2 hours and then the temperature was raised to 200° C. and the reaction was left overnight. The reactor was then cooled and the contents removed. The resulting norbornene was purified by vacuum distillation and found to have a boiling point of about 85° C. at 0.03 mm Hg. The material was analyzed by GC methods and found to have a purity of 98%. The isolated yield of high purity product was around 31 g.

EXAMPLE 359

To a 100 ml glass vial fitted with an airtight crimptop cap and a Teflon® stir bar was added at ambient temperature the monomer from Example 352 (0.85 g, 5.3 mmol), norbornene (2.0 g, 21.25 mmol) in toluene (2 ml) and toluene (35 ml). Thereafter was added (toluene)Ni($C_6F_5$)$_2$ (catalyst from example 33; 6.44 mg, 13.3 μmol) dissolved in toluene (1 ml). The vessel was heated to 50° C. and allowed to stir for 2.5 hours. The resulting polymer solution was diluted with further toluene and then precipitated from solution by adding to a large excess of methanol. The polymer was filtered, washed with methanol and dried overnight in a vacuum oven at 80° C. The isolated yield of the polymer was 1.2 grams, representing 41% conversion. The molecular weight was determined using GPC methods ($M_w$ 745,000, $M_n$ 238,000).

EXAMPLE 360

To a 100 ml glass vial fitted with an airtight crimptop cap and a Teflon® stirbar was added at ambient temperature the monomer from Example 353 (1.05 g, 5.3 mmol), norbornene (2.0 g, 21.25 mmol) in toluene (2 ml) and toluene (35 ml). Thereafter was added (toluene)Ni($C_6F_5$)$_2$(6.44 mg, 13.3 μmol) dissolved in toluene (1 ml). The vessel was heated to 50° C. and allowed to stir for 3 hours. The resulting sparingly soluble polymer was precipitated with methanol and then redissolved in hot o-dichlorobenzene. The polymer was then reprecipitated in methanol, filtered, washed with methanol and dried overnight in a vacuum oven at 80° C. The isolated yield of the polymer was 1.37 grams, representing 45% conversion. The relatively poor solubility of the sample precluded determining the molecular weight using GPC methods. NMR analysis indicated that the resulting polymer contained roughly 10 mol % of the ester monomer.

EXAMPLE 361

To a 100 ml glass vial fitted with an airtight crimptop cap and a Teflon® stirbar was added at ambient temperature the monomer from Example 357 (0.05 g, 0.265 mmol), norbornene (2.45 g, 26.25 mmol) in toluene (2.3 ml) and toluene (35 ml). Thereafter was added (toluene)Ni($C_6F_5$)$_2$ (6.43 mg, 13.3 μmol) dissolved in toluene (1 ml). The vessel was heated to 50° C. and allowed to stir for 3 hours. The resulting polymer solution was diluted with further toluene and then precipitated from solution by adding to a large excess of methanol. The polymer was filtered, washed with methanol and dried overnight in a vacuum oven at 80° C. The yield of polymer was 0.63 g, representing a conversion of 25%. The relatively poor solubility of the sample precluded determining the molecular weight using GPC methods.

EXAMPLE 362

To a 100 ml glass vial fitted with an airtight crimptop cap and a Teflon® stirbar was added at ambient temperature the monomer from Example 352 (0.44 g, 2.7 mmol), butylnorbornene (3.65 g, 24.3 mmol) and toluene (35 ml). Thereafter was added (toluene)Ni($C_6F_5$)$_2$(6.54 mg, 13.5 μmol) dissolved in toluene (1 ml). The vessel was heated to 60° C. and allowed to stir for 3 hours. The resulting polymer solution was diluted with further toluene and then precipitated from solution by adding to a large excess of methanol. The polymer was filtered, washed with methanol and dried overnight in a vacuum oven at 80° C. The isolated yield of the polymer was 0.73 grams, representing 18% conversion. The molecular weight was determined using GPC methods (Mw 408,000, Mn 165,000).

EXAMPLE 363

To a 100 ml glass vial fitted with an airtight crimptop cap and a Teflon® stirbar was added at ambient temperature the monomer from Example 353 (0.52 g, 2.7 mmol), butylnorbornene (3.65 g, 24.3 mmol) and toluene (35 ml). Thereafter was added (toluene)Ni($C_6F_5$)$_2$(6.5 mg, 13.5 $\mu$mol) dissolved in toluene (1 ml). The vessel was heated to 60° C. and allowed to stir for 3 hours. The resulting polymer solution was diluted with further toluene and then precipitated from solution by adding to a large excess of methanol. The polymer was filtered, washed with methanol and dried overnight in a vacuum oven at 80° C. The isolated yield of the polymer was 1.3 grams, representing 31.2% conversion. The molecular weight was determined using GPC methods (Mw 541,000, Mn 223,000).

EXAMPLE 364

To a 100 ml glass vial fitted with an airtight crimptop cap and a Teflon® stir bar was added at ambient temperature the monomer from Example 354 (0.75 g, 2.7 mmol), butylnorbornene (3.65 g, 24.3 mmol) and toluene (35 ml). Thereafter was added (toluene)Ni($C_6F_5$)$_2$(6.5 mg, 13.5 $\mu$mol) dissolved in toluene (1 ml). The vessel was heated to 60° C. and allowed to stir for 3 hours. The resulting polymer solution was diluted with further toluene and then precipitated from solution by adding to a large excess of methanol. The polymer was filtered, washed with methanol and dried overnight in a vacuum oven at 80° C. The isolated yield of the polymer was 0.57 grams, representing 13% conversion. The molecular weight was determined using GPC methods (Mw 367,000, Mn 158,000).

EXAMPLE 365

To a 100 ml glass vial fitted with an airtight crimptop cap and a Teflon® stirbar was added at ambient temperature the monomer from Example 349 (0.56 g, 2.7 mmol), butylnorbornene (3.65 g, 24.3 mmol) and toluene (35 ml). Thereafter iwas added (toluene)Ni($C_6F_5$)$_2$(6.54 mg, 13.5 $\mu$mol) dissolved in toluene (1 ml). The vessel was heated to 60° C. and allowed to stir for 3 hours. The resulting polymer solution was diluted with further toluene and then precipitated from solution by adding to a large excess of methanol. The polymer was filtered, washed with methanol and dried overnight in a vacuum oven at 80° C. The isolated yield of the polymer was 0.81 grams, representing 19% conversion. The molecular weight was determined using GPC methods (Mw 460,000, Mn 188,000).

EXAMPLE 366

To a 100 ml glass vial fitted with an airtight crimptop cap and a Teflon® stir bar was added at ambient temperature the monomer from Example 358 (0.72 g, 2.7 mmol), butylnorbornene (3.65 g, 24.3 mmol) and toluene (35 ml). Thereafter was added (toluene)Ni($C_6F_5$)$_2$(6.54 mg, 13.5 $\mu$mol) dissolved in toluene (1 ml). The vessel was heated to 60° C. and allowed to stir for 3 hours. The resulting polymer solution was diluted with further toluene and then precipitated from solution by adding to a large excess of methanol. The polymer was filtered, washed with methanol and dried overnight in a vacuum oven at 80° C. The isolated yield of the polymer was 1.02 grams, representing 23.3% conversion. The molecular weight was determined using GPC methods (Mw 537,000, Mn 230,000). NMR spectroscopy showed the copolymer to contain approximately 8% of the ester monomer.

EXAMPLE 367

To a 100 ml glass vial fitted with an airtight crimptop cap and a Teflon® stir bar was added at ambient temperature the methyl ester of 5-norbornenecarboxylic acid (0.41 g, 2.7 mmol), butylnorbornene (3.65 g, 24.3 mmol) and toluene (35 ml). Thereafter was added (toluene)Ni($C_6F_5$)$_2$(6.54 mg, 13.5 $\mu$mol) dissolved in toluene (1 ml). The vessel was heated to 60° C. and allowed to stir for 3 hours. The resulting polymer solution was diluted with further toluene and then precipitated from solution by adding to a large excess of methanol. The polymer was filtered, washed with methanol and dried overnight in a vacuum oven at 80° C. The isolated yield of the polymer was 0.47 grams, representing 12% conversion. The molecular weight was determined using GPC methods ($M_w$ 204,000, $M_n$ 82,000). NMR spectroscopy showed the copolymer to contain approximately 8% of the ester monomer.

EXAMPLE 368

To a 100 ml glass vial fitted with an airtight crimptop cap and a Teflon® stirbar was added at ambient temperature the monomer from Example 355 (0.49 g, 2.7 mmol), butylnorbornene (3.65 g, 24.3 mmol) and toluene (35 ml). Thereafter was added (toluene)Ni($C_6F5$)$_2$(6.54 mg, 13.5 $\mu$mol) dissolved in toluene (1 ml). The vessel was heated to 60° C. and allowed to stir for 3 hours. The resulting polymer solution was diluted with further toluene and then precipitated from solution by adding to a large excess of methanol. The polymer was filtered, washed with methanol and dried overnight in a vacuum oven at 80° C. The isolated yield of the polymer was 1.33 grams, representing 32% conversion. The molecular weight was determined using GPC methods (Mw 528,000, Mn 222,000). IR analysis showed the copolymer to contain significant levels of epoxide functionality.

EXAMPLE 369

To a 100 ml glass vial fitted with an airtight crimptop cap and a Teflon® stirbar was added at ambient temperature the monomer from Example 353 (0.52 g, 2.7 mmol), hexylnorbornene (4.33 g, 24.3 mmol) and toluene (35 ml). Thereafter was added (toluene)Ni($C_6F_5$)$_2$(6.44 mg, 13.3 $\mu$mol) dissolved in toluene (1 ml). The vessel was heated to 60° C. and allowed to stir for 3 hours. The resulting polymer solution was diluted with further toluene and was then reprecipitated in methanol, filtered, washed with methanol and dried overnight in a vacuum oven at 80° C. The isolated yield of the polymer was 2.61 grams, representing 54% conversion. The molecular weight was determined using GPC methods (Mw 1,185,000, Mn 518,000).

EXAMPLE 370

To a 100 ml glass vial fitted with an airtight crimptop cap and a Telfon® stir bar was added at ambient temperature norbornene (4.0 g, 42.5 mmol) dissolved in cyclohexane (4 ml), the monomer from Example 349 (2.20 g, 10.6 mmol) dissolved in cyclohexane (35 ml) followed by nickel ethylhexanoate (0.026 mmol). Thereafter was added tris (perfluorophenyl)boron (0.234 mmol) and triethylaluminum (0.26 mmol). The vessel was heated to 50° C. and allowed to stir for 3 hours. The solution became so viscous during the polymerization that the entire mass became gelled. The resulting polymer was dissolved in THF and precipitated by adding to a large excess of methanol. The copolymer was filtered, washed with methanol and dried overnight in a vacuum oven at 80° C. The isolated yield of the copolymer was 5.25 grams, representing 85% conversion.

EXAMPLE 371

To a 100 ml glass vial fitted with an airtight crimptop cap and a Telfon® stir bar was added at ambient temperature butylnorbornene (3.2 g, 21.3 mmol) and the monomer from Example 349 (1.1 g, 5.3 mmol) dissolved in cyclohexane (35 ml) followed by nickel ethylhexanoate (0.013 mmol). Thereafter was added tris(perfluorophenyl)boron (0.117 mmol) and triethylaluminum (0.136 mmol). The vessel was heated to 50° C. and allowed to stir for 3 hours. The polymer produced remained in solution and was precipitated by adding to a large excess of acetone. The copolymer was filtered, washed with acetone and dried overnight in a vacuum oven at 80° C. The isolated yield of the copolymer was 1.31 grams, representing 30% conversion. The molecular weight was determined using GPC methods ($M_w$ 269,000, $M_n$ 138,000).

EXAMPLE 372

To a 100 ml glass vial fitted with an airtight crimptop cap and a Teflon® stir bar was added at ambient temperature butylnorbornene (1.6 g, 10.63 mmol), decylnorbornene (2.5 g, 10.63 mmol) and the monomer from Example 349 (1.1 g, 5.3 mmol) dissolved in cyclohexane (35 ml) followed by nickel ethylhexanoate (0.013 mmol). Thereafter was added tris(perfluorophenyl)boron (0.117 mmol) and triethylaluminum (0.136 mmol). The vessel was heated to 50° C. and allowed to stir for 3 hours. The polymer produced remained in solution and was precipitated by adding to a large excess of acetone. The copolymer was filtered, washed with acetone and dried overnight in a vacuum oven at 80° C. The isolated yield of the copolymer was 0.93 grams, representing 23% conversion. The molecular weight was determined using GPC methods (Mw 334,000, Mn 175,000).

EXAMPLE 373

To a 100 ml glass vial fitted with an airtight crimptop cap and a Teflon® stirbar was added at ambient temperature norbornene (4.0 g, 42.5 mmol) dissolved in cyclohexane (4 ml) and the monomer from Example 349 (2.2 g, 10.6 mmol) dissolved in cyclohexane (35 ml) followed by allyl bromide (64 mg, 0.53 mmol) and nickel ethylhexanoate (0.026 mmol). Thereafter was added tris(perfluorophenyl)boron (0.234 mmol) and triethylaluminum (0.26 mmol). The vessel was heated to 50° C. and allowed to stir for 3 hours. The copolymer produced was precipitated by adding to a large excess of acetone. The copolymer was filtered, washed with acetone and dried overnight in a vacuum oven at 80° C. The isolated yield of the copolymer was 2.53 grams, representing 41% conversion. The molecular weight was determined using GPC methods (Mw 224,000, Mn 110,000).

EXAMPLE 374

To a 100 ml glass vial fitted with an airtight crimptop cap and a Telfon® stirbar was added at ambient temperature norbornene (4.0 g, 42.5 mmol) dissolved in cyclohexane (4 ml) and the methyl ester of 5-norbornene carboxylic acid (1.6 g, 10.6 mmol) dissolved in cyclohexane (35 ml) followed by allyl bromide (16 mg, 0.13 mmol) and nickel ethylhexanoate (0.026 mmol). Thereafter was added tris (perfluorophenyl)boron (0.234 mmol) and triethylaluminum (0.26 mmol). The vessel was heated to 50° C. and allowed to stir for 3 hours. The copolymer produced was precipitated by adding to a large excess of acetone. The copolymer was filtered, washed with acetone and dried overnight in a vacuum oven at 80° C. The isolated yield of the copolymer was 3.85 grams, representing 69% conversion. The molecular weight was determined using GPC methods (Mw 89,600, Mn 37,400).

EXAMPLE 375

To a 100 ml glass vial fitted with an airtight crimptop cap and a Teflon® stir bar was added at ambient temperature norbornene (4.5 g, 47.8 mmol) dissolved in cyclohexane (4 ml) and the methyl ester of 5-norbornene carboxylic acid (0.8 g, 5.3 mmol) dissolved in cyclohexane (35 ml) followed by allyl bromide (16 mg, 0.13 mmol) and nickel ethylhexanoate (0.026 mmol). Thereafter was added tris (perfluorophenyl)boron (0.234 mmol) and triethylaluminum (0.26 mmol). The vessel was heated to 50° C. and allowed to stir for 3 hours. The copolymer produced was precipitated by adding to a large excess of methanol. The copolymer was filtered, washed with methanol and dried overnight in a vacuum oven at 80° C. The isolated yield of the copolymer was 4.51 grams, representing 85% conversion. The molecular weight was determined using GPC methods (Mw 173,000, Mn 65,400).

EXAMPLE 376

To a 100 ml glass vial fitted with an airtight crimptop cap and a Telfon® stir bar was added at ambient temperature norbornene (3.5 g, 37.2 mmol) dissolved in cyclohexane (4 ml) and the methyl ester of 5-norbornene carboxylic acid (1.9 g, 15.9 mmol) dissolved in cyclohexane (35 ml) followed by allyl bromide (16 mg, 0.13 mmol) and nickel ethylhexanoate (0.026 mmol). Thereafter was added tris (perfluorophenyl)boron (0.234 mmol) and triethylaluminum (0.26 mmol). The vessel was heated to 50° C. and allowed to stir for 3 hours. The copolymer produced was precipitated by adding to a large excess of methanol. The copolymer was filtered, washed with methanol and dried overnight in a vacuum oven at 80° C. The isolated yield of the copolymer was 2.4 grams, representing 44% conversion. The molecular weight was determined using GPC methods (Mw 114,000, Mn 48,000).

EXAMPLE 377

To a 100 ml glass vial fitted with an airtight crimptop cap and a Teflon® stirbar was added at ambient temperature norbornene (4.7 g, 50.4 mmol) dissolved in cyclohexane (4 ml) and the monomer described in Example 357 (0.5 g, 2.6 mmol) dissolved in cyclohexane (35 ml) followed by nickel ethylhexanoate (0.026 mmol). Thereafter was added tris (perfluorophenyl)boron (0.234 mmol) and triethylaluminum (0.26 mmol). The vessel was heated to 50° C. and allowed to stir for 3 hours during which time the reactor contents set up to form a solid mass. The copolymer produced was insoluble in toluene, THF and dichlorobenzene.

EXAMPLE 378

To a 100 ml glass vial fitted with an airtight crimptop cap and a Teflon® stir bar was added at ambient temperature norbornene (4.9 g, 52.5 mmol) dissolved in cyclohexane (4 ml) and the monomer described in Example 357 (0.1 g, 0.53 mmol) dissolved in cyclohexane (35 ml) followed by (toluene)Ni($C_6F_5$)$_2$(6.43 mg, 13.3 μmol) dissolved in toluene (1 ml). The vessel was heated to 50° C. and allowed to stir for 3 hours during which time the reactor contents became viscous. The copolymer produced was diluted in toluene and precipitated into methanol, filtered and washed with methanol followed by drying overnight in a vacuum oven at 80° C. The isolated yield of the copolymer was 0.9 grams, representing 18% conversion. Infrared analysis showed the copolymer to contain low levels of anhydride functionality (stretches at 1792 and 1868 $cm^{-1}$).

EXAMPLE 379

To a 100 ml glass vial fitted with an airtight crimptop cap and a Telfon® stir bar was added at ambient temperature endo nadic anhydride (0.646 g, 4.25 mmol), norbornene (3.6 g, 38.2 mmol) and chlorobenzene (35 ml). Thereafter was added (toluene)Ni($C_6F_5$)$_2$(20.4 mg, 42.5 μmol) dissolved in chlorobenzene (1 ml). The solution became so viscous that stirring stopped within 12 minutes. The resulting polymer solution precipitated from solution by adding to a large excess of acetone. The polymer was filtered, washed with acetone and dried overnight in a vacuum oven at 80° C. The isolated yield of the polymer was 3.66 grams, representing 86% conversion. The molecular weight was determined using GPC methods (Mw 867,000, Mn 331,000). NMR and IR characterization indicated that the resulting polymer was a copolymer of norbornene and nadic anhydride.

EXAMPLE 380

To a 100 ml glass vial fitted with an airtight crimptop cap and a Telfon® stir bar was added at ambient temperature butylnorbornene 6.375 g, 42.5 mmol), 5-phenylnorbornene (1.35 g, 7.95 mmol) and 5-triethoxysilylnorbornene (0.7 g, 2.65 mmol) dissolved in toluene (50 ml) followed by nickel ethylhexanoate (26 μmol). To this stirred solution, at ambient temperature, was added a mixture of tris (perfluorophenyl)boron (238 μmol, in 4 ml octanes) and triethylaluminum (265 μmol). There was an immediate exotherm and viscosity increase. Within 5 minutes the whole solution had set up to afford a nonflowing colorless gel. After 60 minutes the vial was opened and the contents were dissolved in an excess of toluene (300 ml) and then poured into excess methanol to afford the product as a pure white polymer which was isolated by filtration, washed with excess methanol and dried overnight in a vacuum oven at 80° C. The isolated yield of the polymer was 8.22 grams, representing virtually quantitative conversion. GPC showed the polymer to have a high molecular weight (Mw 865,000, Mn 143,000) and NMR showed the polymer to be a terpolymer of all three monomers.

EXAMPLE 381

To a 100 ml glass vial fitted with an airtight crimptop cap and a Teflon® stirbar was added at ambient temperature butylnorbornene 6.375 g, 42.5 mmol), 5-phenylnorbornene (1.35 g, 7.95 mmol) and 5-triethoxysilylnorbornene (0.7 g, 2.65 mmol) dissolved in toluene (50 ml). To this stirred solution, at ambient temperature, was added (toluene)Ni ($C_6F_5$)$_2$(26 mg, 53.1 μmol) in toluene (3 ml). There was an immediate exotherm and viscosity increase. Within 5 minutes the whole solution had set up to afford a nonflowing colorless gel. After 60 minutes the vial was opened and the contents were dissolved in an excess of toluene (300 ml) and then poured into excess methanol to afford the product as a pure white polymer which was isolated by filtration, washed with excess methanol and dried overnight in a vacuum oven at 80° C. The isolated yield of the polymer was 8.08 grams, representing 96% conversion. GPC showed the polymer to have a high molecular weight (Mw 1,120,000, Mn 285,000) and NMR showed the polymer to be a terpolymer of all three monomers.

EXAMPLE 382

To a 100 ml glass vial fitted with an air-tight crimp-top cap and a Teflon® stir bar was added at ambient temperature norbornene (5.1 g, 54.2 mmol) and toluene (50 ml). Thereafter the solution was flushed with ethylene and pressurized to 5 psi with ethylene, then was added (toluene)Ni($C_6F_5$)$_2$ (52.7 mg, 108 μmol) dissolved in toluene (10 ml). The solution was stirred at ambient temperature for 1 hour. The resulting solution was poured into methanol (300 ml) and the precipitated low molecular weight polymer was isolated and dried (yield 400 mg, 7.8%) and characterized a polynorbornene by NMR methods. The methanol soluble fraction was isolated by evaporation of the methanol solution to dryness affording approximately 50 mg of low oligomers. These oligomers were characterized by proton and $^{13}C$ NMR methods and also by mass spectrometry. These oligomers were found to comprise dimers, trimers, tetramers, pentamers, hexamers and heptamers of norbornene. Furthermore each oligomer was found to bear one pentafluorophenyl head group and one vinyl end group.

EXAMPLE 383

(Toluene)Ni($C_6F_5$)$_2$ (1.5 g) was dissolved in toluene (3 ml). This solution was added to the methyl ester of 5-norbornene carboxylic acid (1.0 g) which was dissolved in cyclohexane (10 ml). After stirring overnight, the resulting polymer (Mw=10,700, Mn=6,800) was isolated and subjected to matrix assisted laser desorption ionization - time of flight mass spectrometry which showed that each polymer chain contained a $C_6F_5$ end group. Broad resonances (−130 to 142 and −155 to −165 ppm) were observed in the 19F NMR spectrum of the polymer consistent with the presence of $C_6F_5$ end groups.

What is claimed is:

1. A method for preparing a polycyclic polymer comprising polymerizing a monomeric reaction composition comprising at least two types of polycyclic monomers one of which containing a pendant acid labile group and another of which containing a pendant polar functional group in the presence of a catalyst represented by the formula:

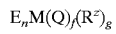

$E_nM(Q)_f(R^z)_g$ wherein M is a Group VIII transition metal, Q is an electron withdrawing ligand selected from the group consisting of linear and branched ($C_1$ to $C_{10}$) perhaloalkyl, ($C_7$ to $C_{24}$) perhaloalkaryl and perhaloaryl groups, n is an integer of 0, 1, 2 or 3; f is an integer of 1, 2 or 3; g is an integer of 0 or 1; when f is 1, $R^z$ must be present; and E when present is selected from a monodentate or bidentate ligand wherein said monodentate ligand is selected from the group consisting of p-arenes; ethers and thioethers of the formulae $R^i$—O—$R^i$ and $R^i$—S—$R^i$ wherein $R^i$ can be the same or different and represents a linear and branched ($C_1$ to $C_{10}$) alkyl group, the $R^i$ groups that are connected to the oxygen or sulfur heteroatom can be taken together to represent heterocyclic ring containing 4 to 8 carbon atoms; cyclic diethers containing 3 to 6 carbon atoms; ketones represented by the formula $R^i$—C(O)—$R^i$ wherein $R^i$ is as defined above; substituted or unsubstituted cyclic ketones containing 5 to 8 carbon atoms wherein said substituents are selected from linear or branched ($C_1$ to $C_{10}$) alkyl and ($C_6$ to $C_{24}$) aryl groups; amines of the formula N($R^d$)$_3$ wherein $R^d$ independently represents linear or branched ($C_1$ to $C_{10}$) alkyl, ($C_7$ to $C_{10}$) aralyl, ($C_6$ to $C_{24}$) aryl and cycloaliphatic groups containing 5 to 8 carbon atoms, wherein said alkyl, aryl and cycloaliphatic substituents optionally contain halogen atoms selected from chlorine, bromine, fluorine and iodine; pyridine, and substituted pyridine containing linear and branched ($C_1$ to $C_{10}$) alkyl groups; phosphines of the formula P($R^d$)$_3$, phosphine oxides of the formula ($R^d$)$_3$PO; phosphites of the formula P(O$R^d$)$_3$ wherein $R^d$ in each of the phosphine, phosphine oxide and phosphite formulae is as defined above; ester compounds of the formula $R^i$C(O)O$R^i$ wherein $R^i$ is defined above; lactones and linear and branched ($C_1$ to $C_6$) alkyl and ($C_6$ to $C_{15}$) aryl substituted lactones wherein the lactone ring contains 3 to 8 carbon atoms; and said bidentate ligand is selected from a hemilabile chelating ligand containing phosphorus, oxygen, nitrogen and sulfur represented by the formula:

wherein Y and Z independently represent phosphorus, oxygen, carbonyl, nitrogen and sulfur which are optionally substituted with linear and branched($C_1$ to $C_1$) alkyl and ($C_6$ to $C_{24}$) aryl groups and K represents an unsubstituted and substituted hydrocarbon backbone moiety containing from 2 to 25 carbon atoms, or a divalent alkylene ether moiety wherein the alkylene radicals independently contain from 1 to 10 carbon atoms, said substituents if present are selected from linear and branched ($C_1$ to $C_{10}$) alkyl, ($C_5$ to $C_{15}$) alicyclic and ($C_6$ to $C_{24}$) aryl), halides, and amine; and $R^z$ is a substituted or unsubstituted allyl ligand represented by the formula:

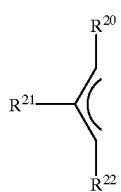

wherein $R^{20}$, $R^{21}$, and $R^{22}$ independently represent hydrogen, linear or branched ($C_1$ to $C_5$) alkyl, ($C_6$ to $C_{14}$) aryl, ($C_7$ to $C_{10}$) aralkyl such as benzyl, —COO$R^{38}$, —(CH$_2$)$_n$O$R^{38}$, Cl and ($C_5$ to $C_6$) cycloaliphatic, wherein $R^{38}$ is linear and branched ($C_1$ to $C_5$) alkyl, and n is 1 to 5, any two of $R^{20}$, $R^{21}$, and $R^{22}$ may be linked together to form an alicyclic group and wherein said polycyclic monomers are represented by the formulae:

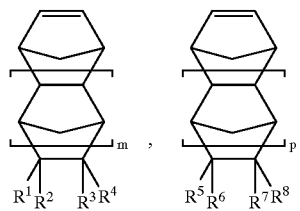

wherein $R^1$ to $R^4$ independently represent a substituent selected from the group consisting of hydrogen, linear and branched ($C_1$ to $C_{10}$) alkyl, —(A)$_n$C(O)OR*, —(A)$_n$—C(O)OR, —(A)$_n$—OR, —(A)$_n$—OC(O)R, —(A)$_n$—C(O)R, —(A)$_n$—OC(O)OR, —(A)$_n$—OCH$_2$C(O)OR*, —(A)$_n$—C(O)O—A'—OCH$_2$C(O)OR*, —(A)$_n$—OC(O)—A'—C(O)OR*, —(A)$_n$C(R)$_2$CH(R)(C(O)OR), and —(A)$_n$C(R)$_2$CH(C(O)OR)$_2$ wherein n is 0 or 1, m is an integer from 0 to 5, —A— and —A'— independently represent a divalent radical selected from the group consisting of linear and branched ($C_1$ to $C_{10}$) alkylene, ($C_2$ to $C_{10}$) alkylene ethers, polyethers, or a divalent cyclic group of the formula:

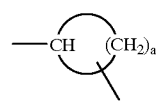

wherein a is an integer from 2 to 7, and the diagonal bond projecting from the center of the cyclic structure represents the divalent nature of the cyclic moiety and can be connected to anyone of the carbocyclic atoms (—CH$_2$—) in the ring with the proviso that the carbocyclic atom to which the bond is connected will have one less hydrogen atom to satisfy the valance of carbon, R represents hydrogen or linear and branched ($C_1$ to $C_{10}$) alkyl, and R* represents an acid labile group that is cleavable by a photoacid initiator and is selected from the group consisting of —C(CH$_3$)$_3$, —Si(CH$_3$)$_3$, —CH($R^P$)OCH$_2$CH$_3$, —CH($R^P$)OC(CH$_3$)$_3$, or the following cyclic groups:

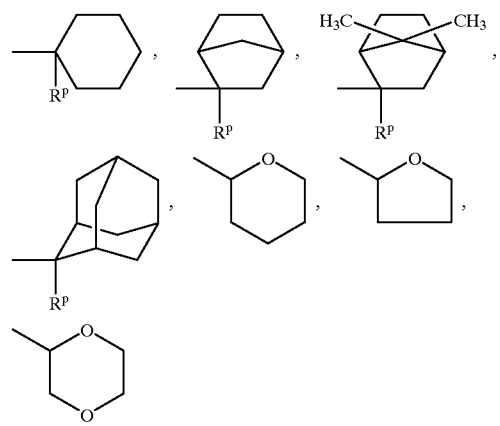

wherein $R^P$ represents hydrogen or a linear or branched ($C_1$ to $C_5$) alkyl group, R** independently represents R and R* and at least one of $R^1$ to $R^4$ must be selected from a substituent containing said acid labile group; and wherein $R^5$ to $R^8$ independently represent a substituent selected from the group consisting of hydrogen, linear and branched ($C_1$ to $C_{10}$) alkyl, and a polar substituent represented as follows: —(A)$_n$—C(O)OR", —(A)$_n$—OR", —(A)$_n$—OC(O)R", —(A)$_n$—OC(O)OR", —(A)$_n$—C(O)R", —(A)$_n$—OC(O)C(O)OR", —(A)$_n$—O—A'—C(O)OR", —(A)$_n$—OC(O)—A'—C(O)OR", —(A)$_n$—C(O)O—A'—C(O)OR", —(A)$_n$—C(O)—A'—OR", —(A)$_n$—C(O)O—A'—OC(O)OR", —(A)$_n$—C(O)O—A'—O—A'—C(O)OR", —(A)$_n$—C(O)O—A'—OC(O)C(O)OR", —(A)$_n$—C(R")$_2$CH(R")(C(O)OR"), and —(A)$_n$—C(R")$_2$CH(C(O)OR")$_2$, wherein n is 0 or 1, p is an integer from 0 to 5, R" represents a substituent selected from hydrogen, linear and branched ($C_1$ to $C_{10}$) alkyl, linear and branched ($C_1$ to $C_{10}$) alkoxyalkylene, polyethers, monocyclic and polycyclic ($C_4$ to $C_{20}$) cycloaliphatic moieties, cyclic ethers, cyclic diethers, cyclic ketones, and cyclic esters (lactones), with the proviso that when R" is an alkyl, lactone, cycloaliphatic or cyclic ketone group —A— must be present and can not represent an alkylene radical.

2. The method of claim 1 wherein said monomer composition further includes one or more monomers represented by the following structures:

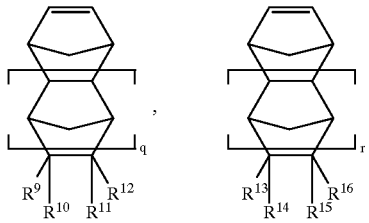

wherein $R^9$ to $R^{16}$ independently represent hydrogen and linear and branched ($C_1$ to $C_{10}$) alkyl, with the proviso that at least one of $R^9$ to $R^{12}$ is —(CH$_2$)$_n$SO$_3$H, —(CH$_2$)$_n$C(O)O$^{-X+}$, —(CH$_2$)$_n$SO$_3^-$X$^+$, or —(CH$_2$)$_n$C(O)OH wherein X represents a tetraalkylammonium cation; n is an integer from 0 to 10; and q and r are integers from 0 to 5.

3. The method of claim 1 or 2 wherein M is selected from the group consisting of nickel, palladium, platinum, iron, rhodium and cobalt; Q is selected from a ligand selected from the group consisting of trifluoromethyl, pentafluorophenyl, pentachlorophenyl, and pentabromophenyl, 2,4,6-tris(trifluoromethylphenyl); and E is selected from the group consisting of benzene, toluene, and mesitylene, methyltertbutylether, diethylether, furan, glyme, diglyme, triglyme, tetraglyme, tetrahydrofuran, thiophene, tetrahydrothiophene, dioxane, acetone, methylethylketone and methylphenylketone, pyridine, trialkyl, triperfluoroalkyl, and triaryl phosphines phosphites and phosphine oxides, ethyl acetate, β-propiolactone and γ-butyrolactone, and allyl.

4. The method of claim 2 wherein said catalyst is selected from the group consisting of bis(2,4,6-tris(trifluoromethylphenyl)) nickel, (toluene)bis(perfluorophenyl) nickel, (mesitylene)bis(perfluorophenyl) nickel, (benzene)bis(perfluorophenyl) nickel, bis(tetrahydrofuran)bis(perfluorophenyl) nickel, (dimethylethoxyethane)bis(perfluorophenyl)nickel, (dimethoxyethane)bis(2,4,6-tris(trifluoromethylphenyl)) nickel bis(dioxane)bis(perfluorophenyl) nickel, bis(diethylether)bis(perfluorophenyl) nickel, (methallyl)nickel(pentafluorophenyl)(triphenylphosphine), (methallyl)nickel(pentafluorophenyl)(tricyclohexylphosphine), and the compound [Ni(C$_6$F$_5$)$_2$Cl]$_2^{2-}$.

5. The method of claim 4 wherein the monomer to catalyst ratio ranges from 2000:1 to 50:1.

6. The method of claim 5 wherein the reaction composition further comprises a mixed solvent system comprising a dual component solvent system containing a non-polar hydrocarbon diluent in combination with a polar organic solvent in a ratio of non-polar hydrocarbon solvent to polar organic solvent ranging from 75:25 w/w to 25:75 w/w.

7. The method of claim 6 wherein the monomer to solvent concentration ranges from 5 to 50 weight percent (monomer in solvent).

8. The method of claim 7 wherein the monomer to catalyst ratio ranges from 500:1 to 100:1 and the monomer to solvent concentration ranges from 10 weight percent to 30 weight percent (monomer in solvent).

9. A method of appending an electron withdrawing ligand onto a terminal end of a polycyclic polymer comprising homopolymerizing or copolymerizing a polycyclic monomer of the formula:

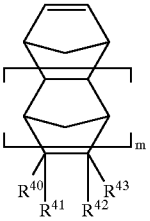

in the presence of a catalyst of the formula:

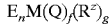

$E_nM(Q)_f(R^z)_g$ wherein M is a Group VIII transition metal, Q is an electron withdrawing ligand selected from the group consisting of linear and branched ($C_1$ to $C_{10}$) perhaloalkyl, ($C_7$ to $C_{24}$) perhaloalkaryl and perhaloaryl groups, n is an integer of 0, 1, 2 or 3; f is an integer of 1, 2 or 3; g is an integer of 0 or 1; when f is 1, $R^z$ must be present; and E when present is selected from a monodentate or bidentate ligand wherein said monodentate ligand is selected from the group consisting of p-arenes; ethers and thioethers of the formulae $R^i$—O—$R^i$ and $R^i$—S—$R^i$ wherein $R^i$ can be the same or different and represents a linear and branched ($C_1$ to $C_{10}$) alkyl group, the $R^i$ groups that are connected to the oxygen or sulfur heteroatom can be taken together to represent heterocyclic ring containing 4 to 8 carbon atoms; cyclic diethers containing 3 to 6 carbon atoms; ketones represented by the formula $R^i$—C(O)—$R^i$ wherein $R^i$ is as defined above; substituted or unsubstituted cyclic ketones containing 5 to 8 carbon atoms wherein said substituents are selected from linear or branched ($C_1$ to $C_{10}$) alkyl and ($C_6$ to $C_{24}$) aryl groups; amines of the formula $N(R^d)_3$ wherein $R^d$ independently represents linear or branched ($C_1$ to $C_{10}$) alkyl, ($C_7$ to $C_{10}$) aralyl, ($C_6$ to $C_{24}$) aryl and cycloaliphatic groups containing 5 to 8 carbon atoms, wherein said alkyl, aryl and cycloaliphatic substituents optionally contain halogen atoms selected from chlorine, bromine, fluorine and iodine; pyridine, and substituted pyridine containing linear and branched ($C_1$ to $C_{10}$) alkyl groups; phosphines of the formula $P(R^d)_3$; phosphine oxides of the formula $(R^d)_3PO$; phosphites of the formula $P(OR^d)_3$ wherein $R^d$ in each of the phosphine, phosphine oxide and phosphite formulae is as defined above; ester compounds of the formula $R^iC(O)OR^i$ wherein $R^i$ is defined above; lactones and linear and branched ($C_1$ to $C_6$) alkyl and ($C_6$ to $C_{15}$) aryl substituted lactones wherein the lactone ring contains 3 to 8 carbon atoms; and said bidentate ligand is selected from a hemilabile chelating ligand containing phosphorus, oxygen, nitrogen and sulfur represented by the formula:

wherein Y and Z independently represent phosphorus, oxygen, carbonyl, nitrogen and sulfur which are optionally substituted with linear and branched ($C_1$ to $C_{10}$) alkyl and ($C_6$ to $C_{24}$) aryl groups and K represents an unsubstituted and substituted hydrocarbon backbone moiety containing from 2 to 25 carbon atoms, or a divalent alkylene ether moiety wherein the alkylene radicals independently contain from 1 to 10 carbon atoms, said substituents if present are selected from linear and branched ($C_1$ to $C_{10}$) alkyl, ($C_5$ to $C_{15}$) alicyclic and ($C_6$ to $C_{24}$) aryl), halides, and amine; and $R^z$ is a substituted or unsubstituted allyl ligand represented by the formula:

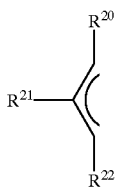

wherein $R^{20}$, $R^{21}$, and $R^{22}$ independently represent hydrogen, linear or branched ($C_1$ to $C_5$) alkyl, ($C_6$ to $C_{14}$) aryl, ($C_7$ to $C_{10}$) aralkyl such as benzyl, —COOR$^{38}$, —(CH$_2$)$_n$OR$^{38}$, Cl and ($C_5$ to $C_6$) cycloaliphatic, wherein $R^{38}$ is linear and branched ($C_1$ to $C_5$) alkyl, and n is 1 to 5, any two of $R^{20}$, $R^2$, and $R^{22}$ may be linked together to form an alicyclic group, wherein $R^{40}$, $R^{41}$, $R^{42}$, and $R^{43}$ independently represent hydrogen, linear and branched ($C_1$ to $C_{20}$) alkyl, hydrocarbyl substituted and unsubstituted ($C_5$ to $C_{12}$) cycloalkyl, ($C_7$ to $C_{15}$) aralkyl, ($C_3$ to $C_{20}$) alkynyl, linear and branched ($C_3$ to $C_{20}$) alkenyl, vinyl; any of $R^{40}$ and $R^{41}$ or $R^{42}$ and $R^{43}$ can be taken together to form a ($C_1$ to $C_{10}$) alkylidenyl group, $R^{40}$ and $R^{43}$ can be taken together with the two ring carbon atoms to which they are attached can represent saturated and unsaturated cyclic groups containing 4 to 12 carbon atoms or an aromatic ring containing 6 to 17 carbon atoms, or an anhydride or dicarboxyimide group; —(B)$_n$—SiR$^{34}$R$^{35}$R$^{36}$ wherein B is a divalent bridging or spacer radical selected from linear and branched ($C_1$ to $C_{10}$) alkylene, n is an integer of 0 or 1, $R^{34}$, $R^{35}$, and $R^{36}$ independently represent halogen, linear or branched ($C_1$ to $C_{20}$) alkyl, linear or branched ($C_1$ to $C_{20}$) alkoxy, substituted or unsubstituted ($C_6$ to $C_{20}$) aryloxy, linear or branched ($C_1$ to $C_{20}$) alkyl carbonyloxy, and ($C_1$ to $C_{20}$) alkyl peroxy; —(A)$_n$—C(O)OR", —(A)$_n$—OR", —(A)$_n$—OC(O)R", —(A)$_n$—OC(O)OR", —(A)$_n$—C(O)R", —(A)$_n$—OCH$_2$C(O)OR*, —(A)$_n$—C(O)O—A'—OCH$_2$C(O)OR*, —(A)$_n$—OC(O)C(O)OR", —(A)$_n$—O—A'—C(O)OR", —(A)$_n$—OC(O)—A'—C(O)OR, —(A)$_n$—C(O)O—A'—C(O)OR", —(A)$_n$—C(O)—A'—OR", —(A)$_n$—C(O)O—A'—OC(O)OR", —(A)$_n$—C(O)O—A'—O—A'—C(O)OR",—(A)$_n$—C(O)O—A'—OC(O)C(O)OR", —(A)$_n$—C(R")$_2$CH(R")(C(O)OR"), and —(A)$_n$—C(R")$_2$CH(C(O)OR")$_2$,—(A)$_n$—R"

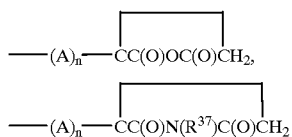

wherein $R^{37}$ is hydrogen, linear and branched ($C_1$ to $C_{10}$) alkyl, or ($C_6$ to $C_{15}$) aryl, wherein n is 0 or 1, m is an integer from 0 to 5, —A— and —A'— independently represent a divalent radical selected from the group consisting of linear and branched ($C_1$ to $C_{10}$) alkylene, ($C_2$ to $C_{10}$) alkylene ethers, polyethers, or a cyclic group of the formula:

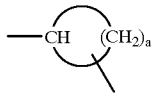

wherein a is an integer from 2 to 7, R" represents hydrogen or linear and branched ($C_1$ to $C_{10}$) alkyl, —C(CH$_3$)$_3$, —Si(CH$_3$)$_3$, —CH(R$^P$)OCH$_2$CH$_3$, —CH(R$^P$)OC(CH$_3$)$_3$,

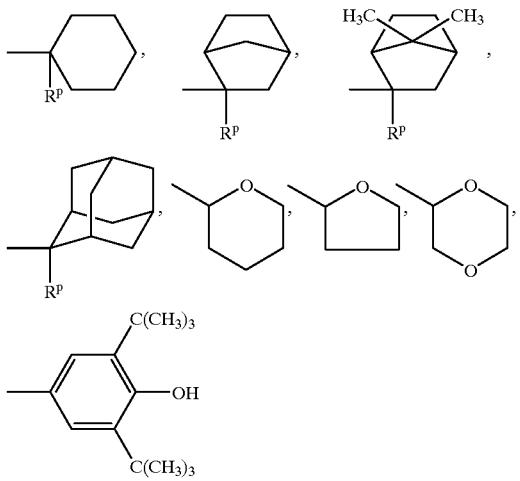

wherein $R^P$ represents hydrogen or a linear or branched ($C_1$ to $C_5$) alkyl group; linear and branched ($C_1$ to $C_{10}$) alkoxyalkylene, polyethers, monocyclic and polycyclic ($C_4$ to $C_{20}$) cycloaliphatic moieties, cyclic ethers, cyclic diethers, cyclic ketones, and cyclic esters (lactones), when any of $R^{40}$ to $R^{43}$ represent a succinic or carboxyimide moiety and n is 1 A can only represent a linear or branched ($C_1$ to $C_{10}$) alkylene group.

10. The catalyst of claim 9 wherein said catalyst is selected from the group consisting of bis(2,4,6-tris(trifluoromethylphenyl)) nickel, (toluene)bis(perfluorophenyl) nickel, (mesitylene)bis(perfluorophenyl) nickel, (benzene)bis(perfluorophenyl) nickel, bis(tetrahydrofuran)bis(perfluorophenyl) nickel, (dimethylethoxyethane)bis(perfluorophenyl)nickel, (dimethoxyethane)bis(2,4,6-tris(trifluoromethylphenyl)) nickel bis(dioxane)bis(perfluorophenyl) nickel, bis(diethylether)bis(perfluorophenyl) nickel, (methallyl)nickel (pentafluorophenyl)(triphenylphosphine), (methallyl)nickel (pentafluorophenyl)(tricyclohexylphosphine), and the compound [Ni(C$_6$F$_5$)$_2$Cl]$_2^{2-}$.

11. The method of claim 6 wherein at least one of $R^{40}$, $R^{41}$, $R^{42}$, and $R^{43}$ of said polycyclic monomer represents the group —(A)$_n$—C(O)OR", wherein R" is a lactone.

12. The method of claim 11 wherein m and n are 0.

13. The method of claim 9 wherein said ligand is a perfluorophenyl group.

* * * * *

UNITED STATES PATENT AND TRADEMARK OFFICE
CERTIFICATE OF CORRECTION

PATENT NO.   : 6,232,417 B1
DATED        : May 15, 2001
INVENTOR(S)  : Rhodes et al.

It is certified that error appears in the above-identified patent and that said Letters Patent is hereby corrected as shown below:

<u>Title page,</u>
Please add: -- Related U.S. Application Data
[60] Continuation-in-part of Application No. 08/812,418, March 6, 1997, now Patent No. 6,136,499, which claims benefit of Provisional Application No. 60/025,174, March 7, 1996. --

Signed and Sealed this

Nineteenth Day of November, 2002

*Attest:*

*Attesting Officer*

JAMES E. ROGAN
*Director of the United States Patent and Trademark Office*